United States Patent
Miyamoto et al.

(10) Patent No.: US 9,013,921 B2
(45) Date of Patent: Apr. 21, 2015

(54) SEMICONDUCTOR MEMORY DEVICE

(71) Applicant: Samsung Electronics Co., Ltd., Suwon-Si, Gyeonggi-Do (KR)

(72) Inventors: Tomohisa Miyamoto, Yokohama (JP); Makoto Hirano, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/097,783

(22) Filed: Dec. 5, 2013

(65) Prior Publication Data
US 2014/0169092 A1   Jun. 19, 2014

(30) Foreign Application Priority Data

Dec. 6, 2012 (JP) .................... 2012-267081
Dec. 10, 2012 (JP) .................... 2012-269696
Jan. 22, 2013 (JP) .................... 2013-008915

(51) Int. Cl.
| | |
|---|---|
| *G11C 29/04* | (2006.01) |
| *G11C 29/42* | (2006.01) |
| *G11C 16/24* | (2006.01) |
| *G11C 5/06* | (2006.01) |
| *G11C 16/26* | (2006.01) |
| *G06F 11/10* | (2006.01) |
| *G11C 29/00* | (2006.01) |
| *G11C 16/34* | (2006.01) |

(Continued)

(52) U.S. Cl.
CPC *G11C 16/26* (2013.01); *G11C 5/06* (2013.01); *G11C 16/3454* (2013.01); *G11C 2029/1204* (2013.01); *G11C 29/04* (2013.01); *G11C 2029/0411* (2013.01); *G11C 7/1045* (2013.01); *G11C 7/1048* (2013.01); *G11C 2207/105* (2013.01); *G06F 11/1048* (2013.01); *G11C 16/24* (2013.01); *G11C 29/82* (2013.01)

(58) Field of Classification Search
CPC ............... G11C 29/04; G11C 16/3454; G11C 2029/1204; G11C 16/24; G11C 5/06
USPC .................... 365/185.09, 185.12, 51, 63
See application file for complete search history.

(56) References Cited

U.S. PATENT DOCUMENTS

| | | |
|---|---|---|
| 5,802,399 A | 9/1998 | Yumoto et al. |
| 6,072,749 A | 6/2000 | Nakamura et al. |
| 2002/0012282 A1 | 1/2002 | Saito et al. |

(Continued)

FOREIGN PATENT DOCUMENTS

| | | |
|---|---|---|
| JP | H06-250935 A | 9/1994 |
| JP | H09-091197 A | 4/1997 |

(Continued)

*Primary Examiner* — Ly D Pham
(74) *Attorney, Agent, or Firm* — Volentine & Whitt, PLLC

(57) ABSTRACT

A semiconductor memory device includes a first data bus having a first width, and a second data bus which is separate from the first data bus and which has a second width which is different from the first width. The semiconductor memory device further includes a data transfer unit configured for transferring data from memory cells connected to a plurality of bit lines. In a first operational mode, the data transfer unit connects a first number of bit lines from among the plurality of bit lines to the first data bus to transfer the data, the first number being equal to the first width. In a second operational mode, the data transfer unit connects a second number of bit lines from among the plurality of bit lines to the second data bus to transfer the data, the second number being equal to the second width.

20 Claims, 67 Drawing Sheets

(51) Int. Cl.
  *G11C 29/12* (2006.01)
  *G11C 7/10* (2006.01)

(56) References Cited

U.S. PATENT DOCUMENTS

| | | |
|---|---|---|
| 2002/0039311 A1 | 4/2002 | Takeuchi et al. |
| 2004/0196696 A1 | 10/2004 | Yamauchi |
| 2005/0018260 A1 | 1/2005 | Hirao et al. |
| 2006/0218467 A1 | 9/2006 | Sibigtroth |
| 2011/0231724 A1 | 9/2011 | Hara |
| 2012/0155178 A1 | 6/2012 | Ohta et al. |
| 2012/0159284 A1 | 6/2012 | Ohta |
| 2012/0307560 A1 | 12/2012 | Lee et al. |

FOREIGN PATENT DOCUMENTS

| | | |
|---|---|---|
| JP | H11-212876 A | 8/1999 |
| JP | H11-242899 A | 9/1999 |
| JP | H11-283385 A | 10/1999 |
| JP | 2000-349652 A | 12/2000 |
| JP | 2001-052495 A | 2/2001 |
| JP | 2002-117692 A | 4/2002 |
| JP | 2004-310904 A | 11/2004 |
| JP | 2005-017909 A | 1/2005 |
| JP | 2006-127749 A | 5/2006 |
| JP | 2007-052884 A | 3/2007 |
| JP | 2007-207425 A | 8/2007 |
| JP | 2008-535131 A | 8/2008 |
| JP | 2011-197819 A | 10/2011 |
| JP | 2012-133843 A | 7/2012 |
| JP | 2012128921 A | 7/2012 |

Fig. 40

| | | | | | | |
|---|---|---|---|---|---|---|
| Column Repair for Data | CR0 | CR0 | ... | CR0 | | |
| 27 | P432 | P433 | ... | P437 | PCR15 | |
| Int. ECC Parity 28B×16=448B | ⋮ | ⋮ | ... | ⋮ | ⋮ | Parity's Column Repair |
| 1 | P16 | P16 | ... | P16 | PCR1 | |
| 0 | P0 | P0 | ... | P0 | PCR0 | |
| 3 | A2096 | A2097 | ... | A2111 | | |
| Spare Data 4B×16=64B  2 | A2080 | A2081 | ... | A2095 | | |
| 1 | A2064 | A2065 | ... | A2079 | | |
| 0 | A2048 | A2049 | ... | A2063 | | |
| 127 | A2032 | A2033 | ... | A2047 | | |
| | ⋮ | ⋮ | ... | ⋮ | | |
| Main Data 128B×16=2048B | | | | | | |
| 3 | A48 | A49 | ... | A63 | | |
| 2 | A32 | A33 | ... | A47 | | |
| 1 | A16 | A17 | ... | A31 | | |
| 0 | A0 | A1 | ... | A15 | | |
| Add_B | B0 | B1 | ... | B15 | | |

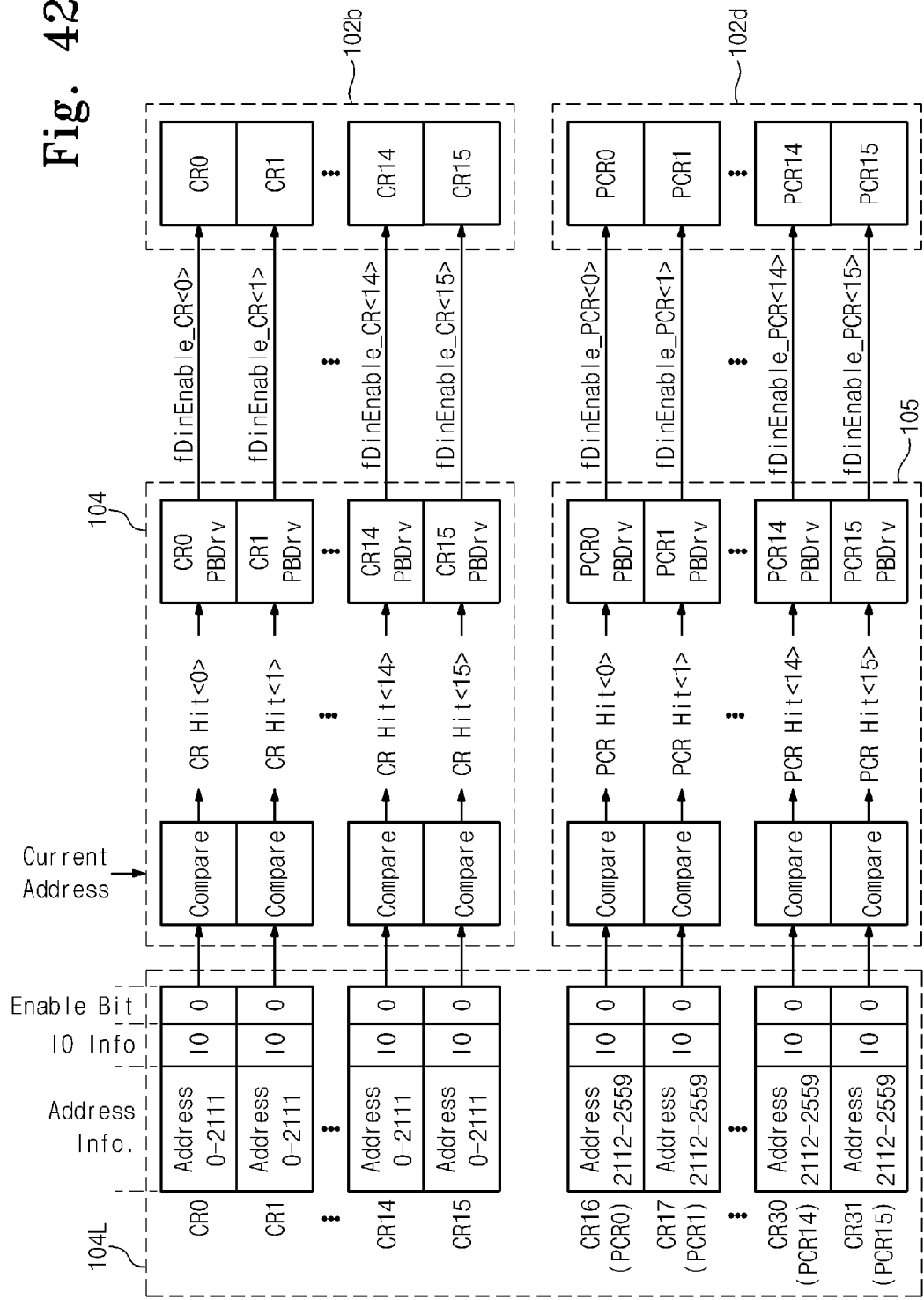

Fig. 43B

| Product<br>Address | Pure NAND | EM NAND |
|---|---|---|
| A0~A2111 | Ycr | Ycr |
| A2112~A2559 | Ycr | Ypcr |

SEMICONDUCTOR MEMORY DEVICE

CROSS-REFERENCE TO RELATED APPLICATIONS

A claim for priority under 35 U.S.C. §119 is made to JP Patent Application Nos. 2012-267081 filed Dec. 6, 2012, 2012-269696 filed Dec. 10, 2012, and 2013-008915 filed Jan. 22, 2013, in the Japan Intellectual Property Office, the entire contents of which are hereby incorporated by reference.

BACKGROUND

The inventive concepts described herein relate to electronic devices, and more particularly, to semiconductor memory devices.

Semiconductor memory devices are generally classified as either volatile memory devices or nonvolatile memory devices. Examples of volatile memory in dynamic random access memory (DRAM) and static RAM (SRAM). Examples of nonvolatile memory include electrically erasable programmable read only memory (EEPROM), ferroelectric RAM (FRAM), phase-change RAM (PRAM), magnetoresistive (MRAM), and flash memory. Volatile memory devices are characterized by the loss of data stored therein at a power-off condition, while the nonvolatile memory devices are characterized by the retention of data stored therein at a power-off condition.

Among the aforementioned examples of nonvolatile memory, flash memory (which was development from EEPROM technology) has proven to be particular popular due to its relatively high programming speed, low power consumption, and mass storage capacity. As such, flash memory has been widely adopted in the marketplace, and is implemented within a myriad of different types of data storage devices, such as solid state drives (SSD), SD cards, and memory cards, just to name a few.

SUMMARY

One aspect of embodiments of the inventive concept is directed to provide a semiconductor memory device which includes a first data bus having a first width, and a second data bus which is separate from the first data bus and which has a second width which is different from the first width. The semiconductor memory device further includes a data transfer unit configured to operate in a first operational mode for transferring data from memory cells and a second operational mode for transferring data from the memory cells, where the memory cells are connected to a plurality of bit lines. In the first operational mode, the data transfer unit connects a first number of bit lines from among the plurality of bit lines to the first data bus to transfer the data, the first number being equal to the first width. In the second operational mode, the data transfer unit connects a second number of bit lines from among the plurality of bit lines to the second data bus to transfer the data, the second number being equal to the second width.

The first width may be p and the second width may q, where p and q are natural numbers and p>q, and the plurality of bit lines may be n bit lines, where n is a natural number and a common multiple of p and q. When (n/p) address signals are received, the data transfer unit may connect p bit lines to the first data bus in the first operational mode, and when (n/q) address signals are received, the data transfer unit may connect q bit lines to the second data bus in the second operational mode.

The semiconductor memory device may further include a memory array, a page buffer which reads data from the memory array in a page unit and stores the read data, an ECC unit which corrects an error of the read data provided from the page buffer and writes the corrected data back in the page buffer, and an interface unit which outputs the read data written back in the page buffer. The first data bus may be connected to the ECC unit and the second data bus may be connected to the interface unit. Further, the page buffer may store write data provided to the interface unit, and the ECC unit may generate parity data on the write data transferred from the page buffer and write the parity data and the write data back in the page buffer. Also, the memory array may be a NAND flash memory cell array.

Another aspect of embodiments of the inventive concept is directed to provide a semiconductor memory device which includes a first data bus having a first width, and a second data bus which is separate from the first data bus and which has a second width which is different from the first width. The semiconductor memory device further includes a data transfer unit configured to operate in a first operational mode for transferring data from memory cells and a second operational mode for transferring data from the memory cells, where the memory cells are connected to a plurality of bit lines. In the first operational mode, the data transfer unit connects a first number of bit lines from among the plurality of bit lines to the first data bus to transfer the data, the first number being equal to the first width. In the second operational mode, the data transfer unit connects a second number of bit lines from among the plurality of bit lines to the second data bus to transfer the data, the second number being equal to the second width. The data transfer unit includes a first page buffer which amplifies a voltage of a bit line connected to a normal memory cell and latches the amplified result, a second page buffer which is replaced together with a normal memory cell and a bit line when a normal memory cell or a bit line connected to the first page buffer is defective, and a third page buffer which amplifies a voltage of a bit line connected to a parity memory cell and latches the amplified result. The second data bus is connected to the first and second page buffers and the first data bus is connected to the first to third page buffers.

The semiconductor memory device may further include a fourth page buffer which is connected to the first data bus and is replaced together with a parity memory cell and a bit line when a parity memory cell or a bit line connected to the first page buffer is defective, a first repair circuit which is connected to the second data bus and replaces a page buffer, associated with a defective memory cell or bit line, of the first page buffer with the second page buffer, a second repair circuit which is connected to the first data bus and replaces a page buffer, associated with a defective memory cell or bit line, of the third page buffer with the fourth page buffer, and an ECC circuit which is connected to the first data bus and corrects an error of data from the first and second page buffers based on data from the third and fourth page buffers. The semiconductor memory device may still further includes a page buffer control circuit which outputs fixed data as an output of a page buffer, associated with a defective memory cell or bit line, of the first page buffer. The page buffer control circuit may not allow a write operation from the first data bus when a memory cell or a bit line is defective.

The first operational mode may be a mode of operation in which input data of the ECC circuit is output as output data without repairing on a page buffer, associated with a defective memory cell or bit line, from among the first page buffer and the second page buffer used for a repair at the second operational mode.

The first width may be p and the second width may be q, where p and q are natural numbers and p>q, and the plurality of bit lines may be n bit lines, where n is a natural number and a common multiple of p and q. When (n/p) address signals are received, the data transfer unit may connect p bit lines to the first data bus in the first operational mode, and when (n/q) address signals are received, the data transfer unit may connect q bit lines to the second data bus in the second operational mode.

Still another aspect of embodiments of the inventive concept is directed to provide a semiconductor memory device which includes a first data bus having a first width, and a second data bus which is separate from the first data bus and which has a second width which is different from the first width. The semiconductor memory device further includes a data transfer unit configured to operate in a first operational mode for transferring data from memory cells and a second operational mode for transferring data from the memory cells, where the memory cells are connected to a plurality of bit lines. In the first operational mode, the data transfer unit connects a first number of bit lines from among the plurality of bit lines to the first data bus to transfer the data, the first number being equal to the first width. In the second operational mode, the data transfer unit connects a second number of bit lines from among the plurality of bit lines to the second data bus to transfer the data, the second number being equal to the second width. The data transfer unit includes a first page buffer which latches data of a bit line connected to a normal memory cell; and a second page buffer which latches data of a bit line connected to a parity memory cell, and the first data bus and the second data bus are connected to the first page buffer and the second page buffer. The semiconductor memory device further includes an ECC circuit which is connected to the first data bus and corrects an error of output data of the first page buffer based on output data of the second page buffer. The first operational mode is a mode of operation in which the first page buffer is accessed and is also a mode of operation for execution of ECC processing where at a data write operation, the ECC circuit generates parity data based on output data of the first page buffer and writes the parity data at the second page buffer and, at a data read operation, the ECC circuit corrects an error of data of the first page buffer based on parity data of the second page buffer and writes the corrected data back in the first page buffer. The second operational mode is a mode of operation in which the ECC processing is not executed and the second page buffer is not accessed and the first page buffer is accessed. Further, selection and execution one of the first operational mode and the second operational mode is electrically switchable.

The second page buffer may be accessed through the second data bus at the second operational mode.

The semiconductor memory device may further include a mask circuit which outputs fixed data instead of data output to an external device through the second data bus when the second page buffer is accessed at the second operational mode.

The semiconductor memory device may further include a third page buffer which is connected to the first and second data buses and is replaced together with a normal memory cell and a bit line when a normal memory cell or a bit line connected to the first page buffer is defective, a fourth page buffer which is connected to the first and second data buses and is replaced together with a parity memory cell and a bit line when a parity memory cell or a bit line connected to the second page buffer is defective, a first repair circuit which is connected to the second data bus and replaces a page buffer, associated with a defective memory cell or bit line, of the first page buffer with the third page buffer at the second operational mode, and a second repair circuit which is connected to the first data bus and replaces a page buffer, associated with a defective memory cell or bit line, of the second page buffer with the fourth page buffer. At the second operational mode, the first repair circuit may replace a page buffer, associated with a defective memory cell or bit line, of the second page buffer with the fourth page buffer. Further, the first repair circuit may store a column address indicating a location of a page buffer to repair a page buffer, associated with a defective memory cell or bit line, of the first page buffer and selects a page buffer to be replaced by the stored column address, and the second repair circuit may store a column address indicating a location of a page buffer to repair a page buffer, associated with a defective memory cell or bit line, of the second page buffer and selects a page buffer to be replaced by the stored column address. Further, the semiconductor memory may further include a bit conversion circuit which converts a column address that the first repair circuit stores into a column address that the second repair circuit stores. The third page buffer and the fourth page buffer may be selected by the first repair circuit and the second repair circuit, based on a switching signal indicating whether the semiconductor memory device operates in either one of the first and second operational modes.

The semiconductor memory device may further include a page buffer control circuit which outputs fixed data as an output of a page buffer, associated with a defective memory cell or bit line, from among the first to fourth page buffers, and the page buffer control circuit may not allow a write operation from the first data bus when a memory cell or a bit line is defective.

The first width may be p and the second width may be q, where p and q are natural numbers and p>q, and the plurality of bit lines may be n bit lines, where n is a natural number and a common multiple of p and q. When (n/p) address signals are received, the data transfer unit may connect p bit lines to the first data bus in the first operational mode, and when (n/q) address signals are received, the data transfer unit may connect q bit lines to the second data bus in the second operational mode.

BRIEF DESCRIPTION OF THE FIGURES

The above and other aspects and features will become apparent from the detailed description that follows, with reference to the following figures, in which like reference numerals refer to like parts throughout the various figures unless otherwise specified, and in which:

FIG. 40 is diagram for describing address mapping by a column address Add_B;

FIG. 42 is a diagram showing a transfer path of defect bit information from a latch circuit 104L of a column repair circuit 104 to a PB 8IO unit according to an embodiment of the inventive concepts;

FIGS. 43A and 43B are diagrams for describing a transfer path of defect bit information from a latch circuit 104L of a column repair circuit 104 to a PB 8IO unit according to another embodiment of the inventive concepts.

DETAILED DESCRIPTION

Figure 1:
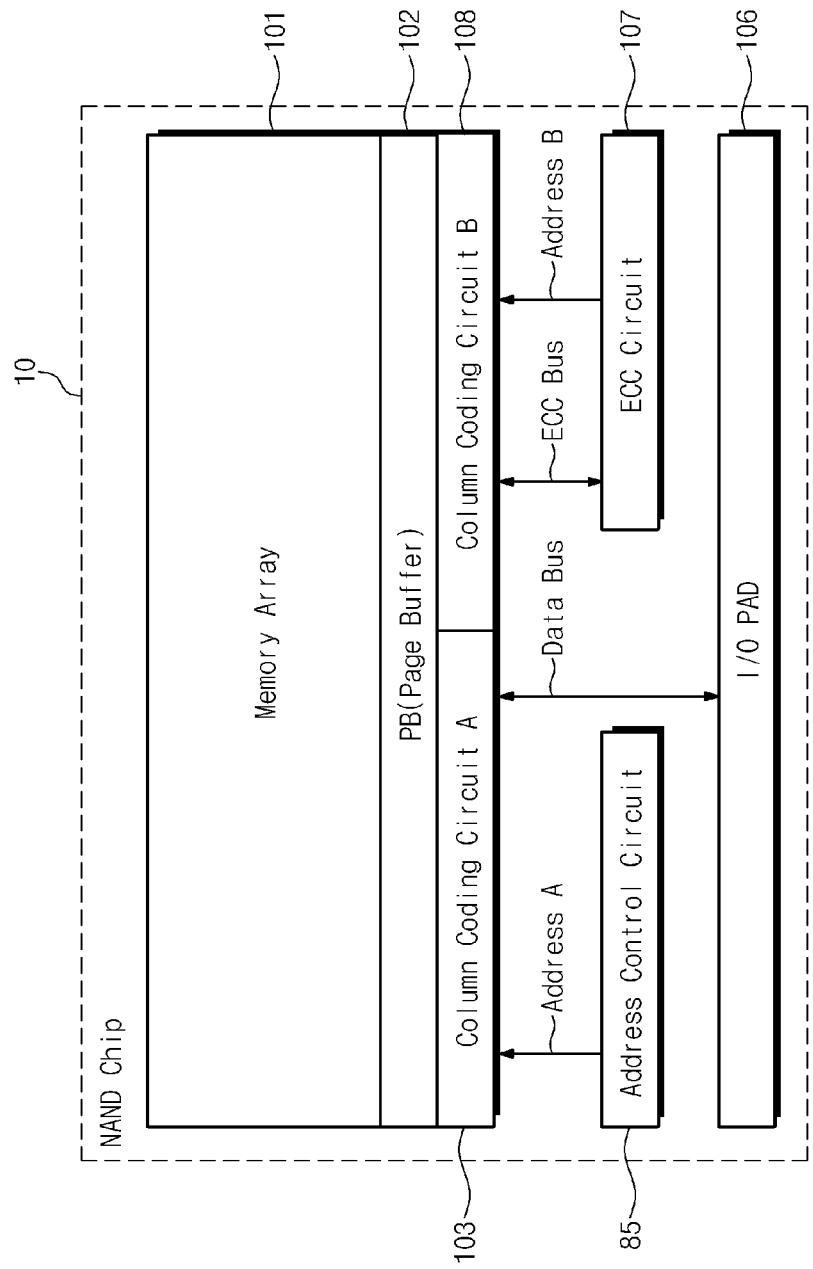
FIG. 1 is a diagram showing a NAND flash memory according to an embodiment of the inventive concepts.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

First Embodiment

In a conventional semiconductor memory device, a so-called data bus connecting an I/O pad (e.g., an interface unit) and a memory array is formed of a single bus when seen from a sense amplifier (referred to as a page buffer in a flash memory).

Figure 7:
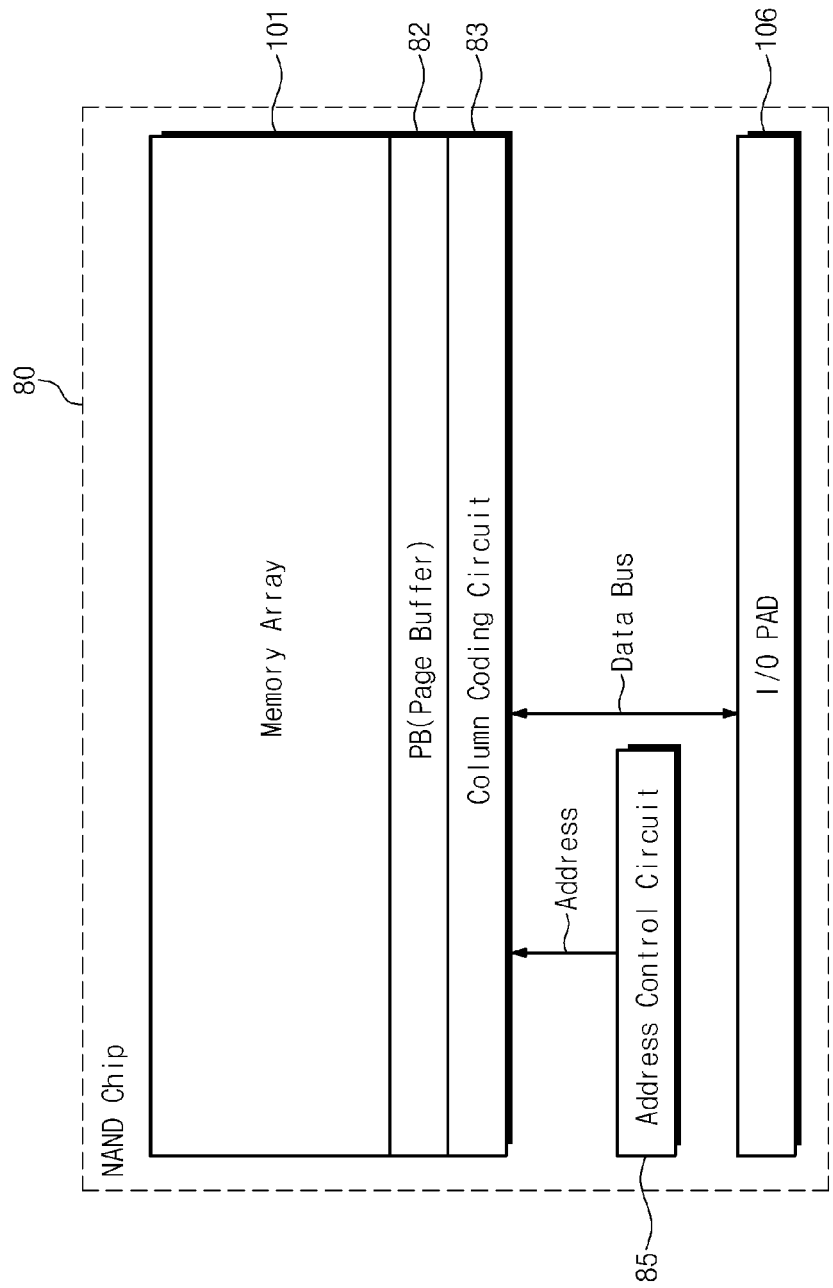
FIG. 7 is a block diagram showing a general NAND flash memory.

FIG. 7 is a block diagram schematically illustrating a conventional flash memory device. A NAND flash memory 80 shown in FIG. 7 includes a memory array 101, a page buffer 82, a column coding circuit 83, an address control circuit 85, and an I/O pad 106.

The memory array 101 is configured to include a plurality of memory cell transistors. Each of the memory cell transistors stores 1-bit data. A plurality of memory cell transistors of the memory array 101 connected to the same word line forms a page. Data is written at and read from memory cell transistors in a page at the same time.

Figure 8:
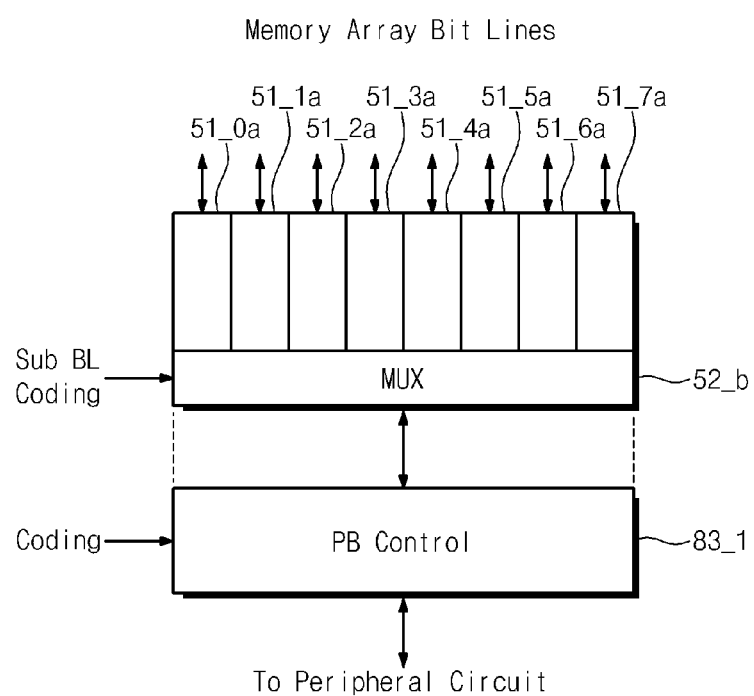
FIG. 8 is a diagram for describing a page buffer unit of a page buffer 82 shown in FIG. 7.
Figure 9:
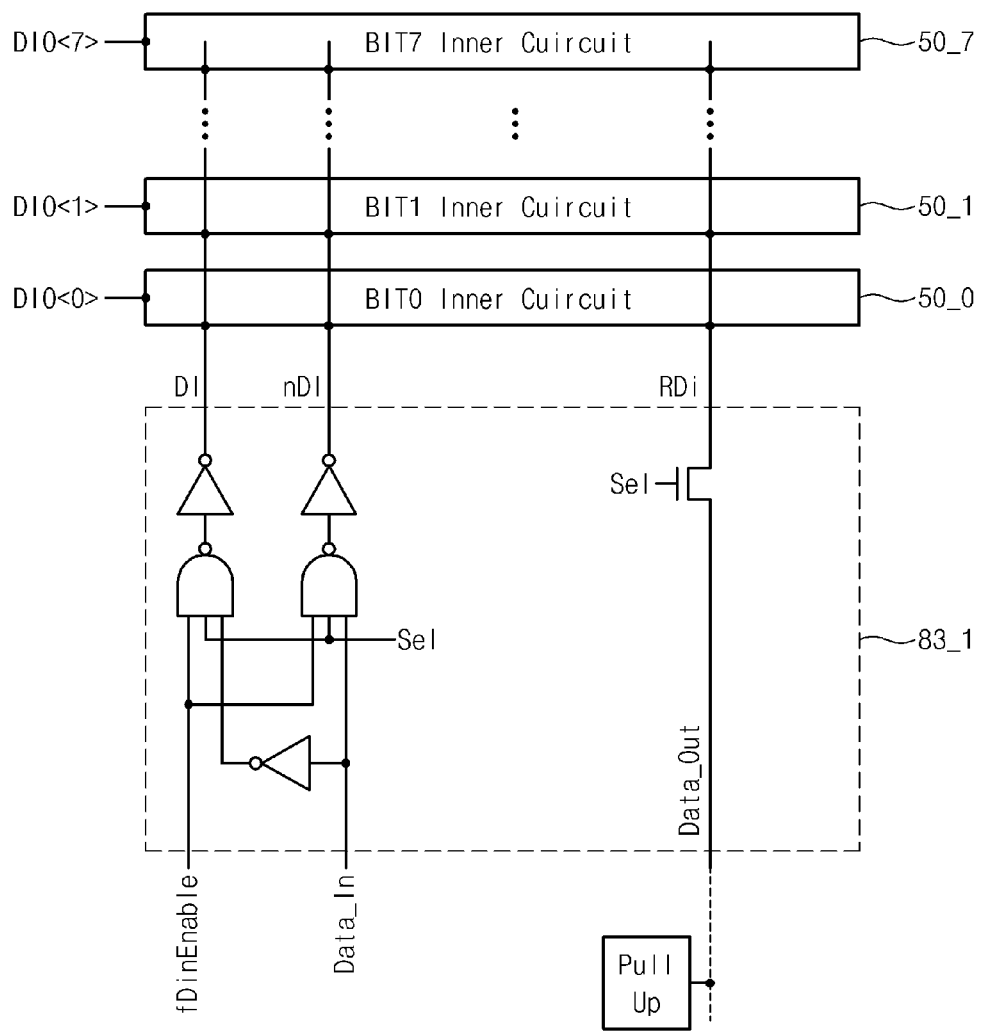
FIG. 9 is a circuit diagram showing a conventional page buffer unit.

The page buffer 82 is configured to store data corresponding to a page of the memory array 101. FIG. 8 is a diagram schematically illustrating a page buffer unit of a page buffer 82. FIG. 9 is a circuit diagram of a conventional page buffer unit.

The page buffer 82 includes a page buffer unit shown in FIG. 8 in plurality. The page buffer unit comprises bit circuits 51_0a to 51_7a that are respectively connected to bit lines and store data read from memory cells through the bit lines or data to be written at memory cells through the bit lines.

A multiplexer 52_b receives a column address (Sub BL Coding) from a column coding circuit 83 shown in FIG. 7 and selects one of the bit circuits 51_0a to 51_7a based on the column address (indicating DIO<i> in FIG. 9). That is, the multiplexer 52_b connects one of eight bit lines to a PB control circuit 83_1.

The PB control circuit 83_1 (a transfer unit) receives a column address (indicating a selection signal Sel in FIG. 9) from the column coding circuit 83 shown in FIG. 7 and connects a bit circuit selected by the multiplexer 52_b to an I/O pad 106 as a peripheral circuit through a data bus.

With the above-described structure, each memory cell transistor in a page is connected to a bit circuit of the page buffer 82 through a bit line. One, selected by a column address, from among the bit lines is connected to a data bus such that a data writing or reading operation on a memory cell is performed.

Returning to FIG. 7, the column coding circuit 83 receives an address from the address control circuit 85. The column coding circuit 83 generates column address signals (Sub BL Coding and Coding shown in FIG. 8) based on a column address to select a page buffer unit in the page buffer 82 corresponding to the column address. Thereby, data is written at a memory cell transistor through the I/O pad 106, the data bus, the bit circuit and the bit line. Also, data read from a memory cell is output to the exterior of the I/O pad 106 through the bit line, the bit circuit and the data bus.

The data bus is a wiring used to input and output data between the page buffer 82 and the I/O pad 106 and is formed of 8 or 16 lines.

The I/O pad (an interface unit) 106 is an external terminal for data input/output between the NAND flash memory 80 and the exterior.

In a NAND flash memory, as a storage characteristic of a memory element (a memory cell transistor) disappears during data preservation due to deterioration of a tunnel oxide film caused by a plurality of write operations, an error bit generation rate (an error rate) increases. In particular, in the NAND flash memory, an error rate increases in proportion to an increase in storage capacity of a memory cell, that is, scale-down of a fabrication process. For this reason, redundancy data (parity data) of an error correcting code (ECC) is added to data to be written, and the redundancy data is together written in a flash memory as a data stream. During a read operation, data is corrected using the redundancy data of the error correcting code. When an error bit is generated, data is corrected. The ECC may be processed outside or inside the NAND flash memory. In the event that the ECC is processed outside the NAND flash memory 80, a memory controller connected through the I/O pad 106 processes the ECC.

Meanwhile, in the event that the ECC is processed inside the NAND flash memory 80, the NAND flash memory 80 necessitates an error detecting and correcting circuit (an ECC unit).

Figure 10:
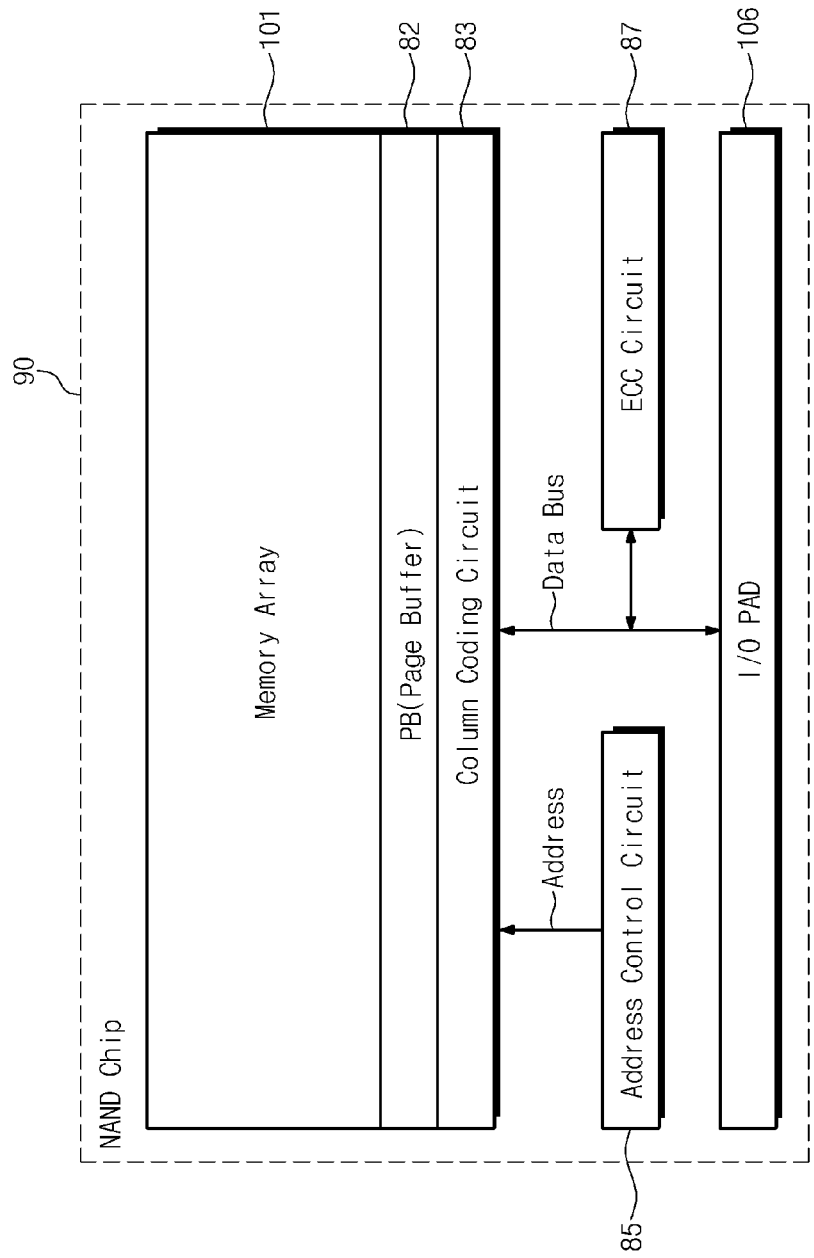
FIG. 10 is a block diagram schematically illustrating an example of a NAND flash memory including an ECC circuit.

FIG. 10 is a block diagram schematically illustrating a NAND flash memory including an ECC circuit. In FIG. 10, constituent elements that are the same as those in FIG. 7 are marked by the same reference numerals, and a description thereof is thus omitted. A NAND flash memory 90 shown in FIG. 10 further comprises an ECC circuit 87 as compared with a NAND flash memory 80 shown in FIG. 7. The ECC circuit 87 is connected to a data bus.

When data is read from memory cell transistors, the ECC circuit 87 sequentially receives data (including normal data and redundancy data) corresponding to a page of memory cell transistors and to be stored in the page buffer 82 through the data bus, and determines whether an error exists at each bit, based on the page data. The ECC circuit 87 corrects data when an error exists, and sequentially writes corrected data in each bit circuit of the page buffer 82 through the data bus. Afterwards, the address control circuit 85 provides a column address to the column coding circuit 83, the column coding circuit 83 selects a page buffer unit of the page buffer 82, and the corrected data stored in the page buffer 82 is read from the I/O pad 106.

When data is written at memory cell transistors, a page of normal data is provided from the page buffer 82 to the ECC circuit 87 and new data is simultaneously provided to the ECC circuit 87 from the I/O pad 106. Redundancy data is generated based on the page of normal data including the new data, the normal data and the redundancy data are written at the page buffer 82, and data is written at memory cell transistors through a write (program) operation.

In the NAND flash memory 90, when the ECC is processed, data is not output to the exterior using a bus width of the I/O pad 106 at a data read mode. For this reason, a time necessitates to process the ECC. To reduce a time taken to process the ECC, such a manner that a bus width is widened at processing of the ECC may be considered. For example, in a patent reference 1, there is disclosed a semiconductor memory device including a transfer unit that performs a data transfer between a page buffer and an ECC circuit using a first data bus at a first mode of operation and performs a data transfer using a part of the first data bus at a second mode of operation where the ECC is not processed.

Figure 11:
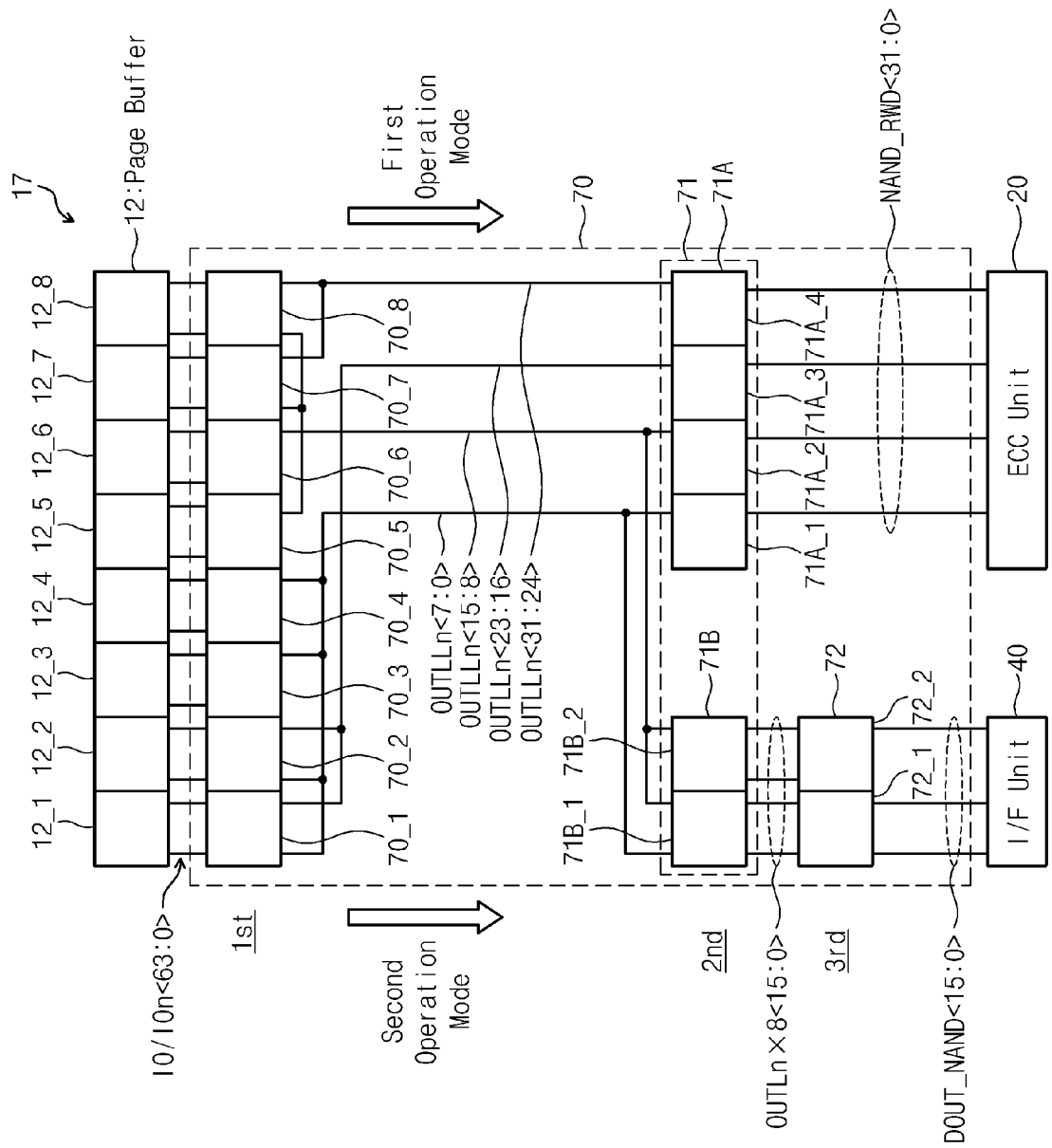
FIG. 11 is a block diagram schematically illustrating another example of a NAND flash memory including an ECC circuit.

FIG. 11 is a block diagram schematically illustrating another example of a NAND flash memory including an ECC circuit. FIG. 11 shows a transfer unit 17 disclosed in FIG. 3 of the aforementioned patent reference 1. In FIG. 11, modes of operation indicated by arrows are respectively referred to as a first mode of operation and a second mode of operation. For ease of description, page buffers respectively corresponding to 8 bits are marked by reference numerals 12_1 to 12_8, respectively. In FIG. 11, a box including a first latch circuit 70, a second latch circuit 71 (including 71A and 71B), and a third latch circuit 72 indicates an 8-bit latch circuit.

Below, an operation of the transfer unit 17 when a data read operation is performed will be described. The transfer unit 17 transfers read data from the page buffers 12_1 to 12_8 to latch circuits 71_1 to 70_8 through a data bus IO/IOn<63:0> during either one of a first mode of operation using an ECC unit 20 and a second mode of operation not using the ECC unit 20. Here, the latch circuit 70_1 is connected to the data bus IO/IOn<7:0>, the latch circuit 70_2 is connected to the data bus IO/IOn<15:8>, the latch circuit 70_3 is connected to the data bus IO/IOn<23:16>, and the latch circuit 70_4 is connected to the data bus IO/IOn<31:24>. The latch circuit 70_5 is connected to the data bus IO/IOn<39:32>, the latch circuit 70_6 is connected to the data bus IO/IOn<47:40>, the latch circuit 70_7 is connected to the data bus IO/IOn<55:48>, and the latch circuit 70_8 is connected to the data bus IO/IOn<63:56>.

At the second mode of operation, a column address is provided to the latch circuits 70_1 to 70_8 four times such that 64-bit data supplied to the latch circuits 70_1 to 70_8 is output to an 8-bit data bus OUTLLn<7:0> and an 8-bit data bus OUTLLn<15:8>. Here, column addresses supplied four times are called as follows. That is, column addresses supplied to the latch circuit 70_1 to 70_4 is referred to as column addresses CA1 to CA4. That is, the column addresses CA1 to CA4 are sequentially supplied to the latch circuit 70_1 to 70_4, so that each of 8-bit data stored in the latch circuit 70_1, 8-bit data stored in the latch circuit 70_2, 8-bit data stored in the latch circuit 70_3, and 8-bit data stored in the latch circuit 70_4 is transferred to the latch circuit 71_B1 through the 8-bit data bus OUTLLn<7:0>.

Also, the column addresses CA1 to CA4 are sequentially supplied to the latch circuit 70_5 to 70_8, so that each of 8-bit data stored in the latch circuit 70_5, 8-bit data stored in the latch circuit 70_6, 8-bit data stored in the latch circuit 70_7, and 8-bit data stored in the latch circuit 70_8 is transferred to the latch circuit 71B_2 through the 8-bit data bus OUTLLn<15:8>.

At the first mode of operation, a bus width is doubled to transfer data of the latch circuits 70_1 to 70_8 to the ECC unit 20. That is, a data bus OUTLLn<23:16> and a data bus OUTLLn<31:24> are installed to be substantially the same as the data buses OUTLLn<7:0> and OUTLLn<15:8>.

With the above description, at the first mode of operation, the latch circuits 70_1 to 70_8 transfer stored data to the latch circuits 71A_1 to 71A_4 when the column addresses CA1 to CA4 are received. The column addresses CA1 and CA3 are first supplied to the latch circuits 70_1 to 70_8, and the column addresses CA2 and CA4 are then supplied to the latch circuits 70_1 to 70_8.

First, when the column addresses CA1 and CA3 are supplied at the same time, the latch circuits 70_1, 70_3, 70_5, and 70_7 transfer data. The latch circuit 70_1 transfers 8-bit data to the data bus OUTLLn<23:16> in response to the column address CA1 so as to be transferred to the latch circuit 71A_3.

The latch circuit 70_3 transfers 8-bit data to the data bus OUTLLn<7:0> in response to the column address CA3 so as to be transferred to the latch circuit 71A_1. The latch circuit 70_5 transfers 8-bit data to the data bus OUTLLn<15:8> in response to the column address CA1 so as to be transferred to the latch circuit 71A_2. The latch circuit 70_7 transfers 8-bit data to the data bus OUTLLn<31:24> in response to the column address CA3 so as to be transferred to the latch circuit 71A_4.

When there are simultaneously received the column addresses CA2 and CA4 following the column addresses CA1 and CA3, the latch circuits 70_2, 70_4, 70_6, and 70_8 transfer data. The latch circuit 70_2 transfers 8-bit data to the data bus OUTLLn<23:16> in response to the column address CA2 so as to be transferred to the latch circuit 71A_3. The latch circuit 70_4 transfers 8-bit data to the data bus OUTLLn<7:0> in response to the column address CA4 so as to be transferred to the latch circuit 71A_1. The latch circuit 70_6 transfers 8-bit data to the data bus OUTLLn<15:8> in response to the column address CA2 so as to be transferred to the latch circuit 71A_1. The latch circuit 70_8 transfers 8-bit data to the data bus OUTLLn<31:24> in response to the column address CA4 so as to be transferred to the latch circuit 71A_4.

In the first mode of operation, the transfer unit 17 includes the first latch circuit 70 to latch data (e.g., 64-bit data of memory cell transistors) output from the page buffer 12 using the data bus IO/IOn<63:0> operating at the second mode of operation. As the number of column addresses supplied at the second mode of operation is set to be two times more than the number of column addresses supplied at the first mode of operation, the transfer unit 17 transfers data to the next-stage latch circuits 71A_1 to 71A_4 using a part of the data bus used at the second mode of operation.

It is possible to output data in high speed by using a data bus for the second mode of operation in common and widening a bus width at the first mode of operation. For this reason, a delay caused to operate a circuit (e.g., the latch circuit 70) for switching the second mode of operation (i.e., a normal mode) and the first mode of operation (i.e., an ECC mode) arises. As described above, at the ECC mode, an address decided to an address of a normal mode is supplied such that data is output to a bus the width of which is widened. A high-speed data transfer is delayed by a time needed for processing.

Also, when data is transferred, since an address of data transferred to a data bus is decided using an address of a normal mode, it is impossible to transfer data of an address selected by a user at the ECC mode. For example, referring to the above description, when all column addresses CA1 to CA4 are simultaneously selected, data of IO/IOn<63:32> or IO/IOn<31:0> is not transferred to the ECC circuit at the same time. In a conventional technique, when data is transferred, addresses are not controlled independently with respect to two modes of operation. That is, freedom on address control is low.

Further, in the event that a design of a NAND flash memory including such an ECC circuit is changed to a design of a NAND flash memory 80 (refer to FIG. 7) not including the ECC circuit, a design change is made to delete a function of the first mode of operation on the latch circuit 70 (e.g., to prevent data corresponding to two column addresses from being output at the same time). A design change is made such that data corresponding to two column addresses are prevented from being output at the same time. This is achieved through a design change of an address control circuit. In a conventional technique, a part of a data bus is shared with respect to the first mode of operation and the second mode of operation. For this reason, a design is complicated when a design change is made to delete an ECC function.

The inventive concepts is directed to provide a semiconductor memory device including a transfer unit capable of improving freedom on address control together with a high-speed data transfer when a bus width for the first mode of operation is widened with respect to a bus width for the second mode of operation.

A semiconductor memory device of the inventive concepts comprises a first data bus, a second data bus being different in number from the first data bus and independent from the first data bus, and a data transfer unit. When a data transfer with memory cells is performed at the first mode of operation, the data transfer unit connects bit lines, being equal in number to the first data bus, from among a plurality of bit lines to the first data bus to transfer data. When a data transfer with memory cells is performed at the second mode of operation, the data transfer unit connects bit lines, being equal in number to the second data bus, from among a plurality of bit lines to the second data bus to transfer data.

Also, the semiconductor memory device of the inventive concepts includes n bit lines (n being a common multiple of p and q being a natural number, p>q). The first data bus is q, and the second data bus is q. If (n/p) address signals are received at the first mode of operation, the data transfer unit connects p bit lines to the p first data bus. If (n/q) address signals are received at the second mode of operation, the data transfer unit connects q bit lines to the second data bus. Although the number n of physical bit lines is not a common multiple of p and q, the remaining may be used as dummy bit lines.

Also, in the semiconductor memory device of the inventive concepts, data is read from a memory array by the page unit, read data read from the memory array is stored in a page buffer, an ECC unit corrects an error on the read data transferred from the page buffer is corrected, and the error-corrected data is written back in the page buffer, the read data written back in the page buffer is output through an interface unit. A first data bus is connected to the ECC unit, and a second data bus is connected to the interface unit.

The page buffer of the semiconductor memory device according to the inventive concepts stores write data provided through the interface unit, and the ECC unit generates parity data on the write data transferred from the page buffer and writes the parity data and the write data back in the page buffer.

The semiconductor memory device of the inventive concepts comprises a first data bus and a second data bus installed to be independent from the first data bus. The second data bus is different from the first data bus.

When a data transfer with memory cells is performed at the first mode of operation, a data transfer unit connects bit lines, being equal in number to the first data bus, from among a plurality of bit lines to the first data bus to transfer data. When a data transfer with memory cells is performed at the second mode of operation, the data transfer unit connects bit lines, being equal in number to the second data bus, from among a plurality of bit lines to the second data bus to transfer data.

A data bus connected to an output of the page buffer is prepared independently for the first mode of operation (i.e., an ECC mode) and the second mode of operation (i.e., a normal mode). For this reason, in the event that data is transferred to an ECC circuit at the first mode of operation like the above-described conventional technique, data does not pass through an unnecessary circuit. Thus, a data transfer is executed in high speed by widening a data width from the second data bus to the first data bus.

In the transfer unit, an output of the page buffer is independent from a data bus for the first mode of operation and the second mode of operation, and an address supplied for a data transfer at the first mode of operation is independent from an address supplied for a data transfer at the second mode of operation. Thus, it is possible to improve freedom on address control and freedom on address mapping. For example, when transferred at the second mode of operation, portions where normal data and parity data are respectively stored are physically spaced apart from each other, and their column addresses are different from each other. For this reason, at the second mode of operation, normal data is read using a column address on the normal data, and parity data is read using a column address on the parity data. However, since data is transferred at the first mode of operation with a bus width being widened, address control and address mapping are executed such that the normal data and the parity data are provided to an ECC circuit using one column address.

Also, since a data bus for the first mode of operation and a data bus for the second mode of operation are independent from an output of the page buffer, it is possible to easily delete an ECC function (i.e., an ECC circuit) using the first mode of operation and including the first data bus. That is, a design change for deleting the ECC function is easily made.

FIG. 1 is a block diagram schematically illustrating a NAND flash memory according to an embodiment of the inventive concepts. Referring to FIG. 1, a NAND flash memory 10 comprises a memory array 101, a page buffer 102, a column coding circuit 103, a column coding circuit 108, an address control circuit 85, an I/O pad 106, and an ECC circuit 107. In FIG. 1, constituent elements that are substantially identical to those in FIGS. 7 and 10 are marked by the same reference numerals, and a description thereof is thus omitted.

As compared with a NAND flash memory 90 shown in FIG. 10, the NAND flash memory 10 comprises the column coding circuits 103 and 108 instead of a column coding circuit 83. A column address provided to the column coding circuit 103 is different from a column address provided to the column coding circuit 108. As will be more fully described, the column coding circuit 108 connects an output of a page buffer (corresponding to a data bus IO/IOn in a conventional technique) to one of an ECC bus (e.g., a first data bus) and a data bus (e.g., a second data bus) from a portion directly connected to the page buffer 102 by outputting a selection signal Sel_A or Sel_B to a PB control circuit 60 of the page buffer 102.

In particular, the column coding circuit 108 is provided with a column address Address B from the ECC circuit 107. The column address Address B is independent from a column address Address A provided to the column coding circuit 103 from a conventional address control circuit 85. The column coding circuit 108 outputs the selection signal Sel_B to the PB control circuit 60 and connects an output of the page buffer 102 to the ECC bus. Thus, address control is independently executed when an output of the page buffer 102 is connected to the ECC bus or the data bus.

In a NAND flash memory shown in FIG. 11, a transfer unit 17 connects an output of a page buffer to a first latch circuit 70 through a data bus IO/IOn. That is, the transfer unit 17 shares a data bus at a first mode of operation and a second mode of operation. The NAND flash memory 10 according to the inventive concepts prepares an output of a page buffer independently from the first and second modes of operation, without sharing.

In this case, a path between an output of the page buffer and the ECC circuit 107 does not include a circuit (e.g., a latch circuit, etc.) influencing a high-speed data transfer. Thus, it is possible to implement a high-speed data transfer. In the event that a design of the NAND flash memory 10 is changed to a design of a NAND flash memory 80 (refer to FIG. 7) not including an ECC circuit, a design change is easily made by only eliminating the column coding circuit 108, the ECC bus, and the ECC circuit 107.

Figure 2:
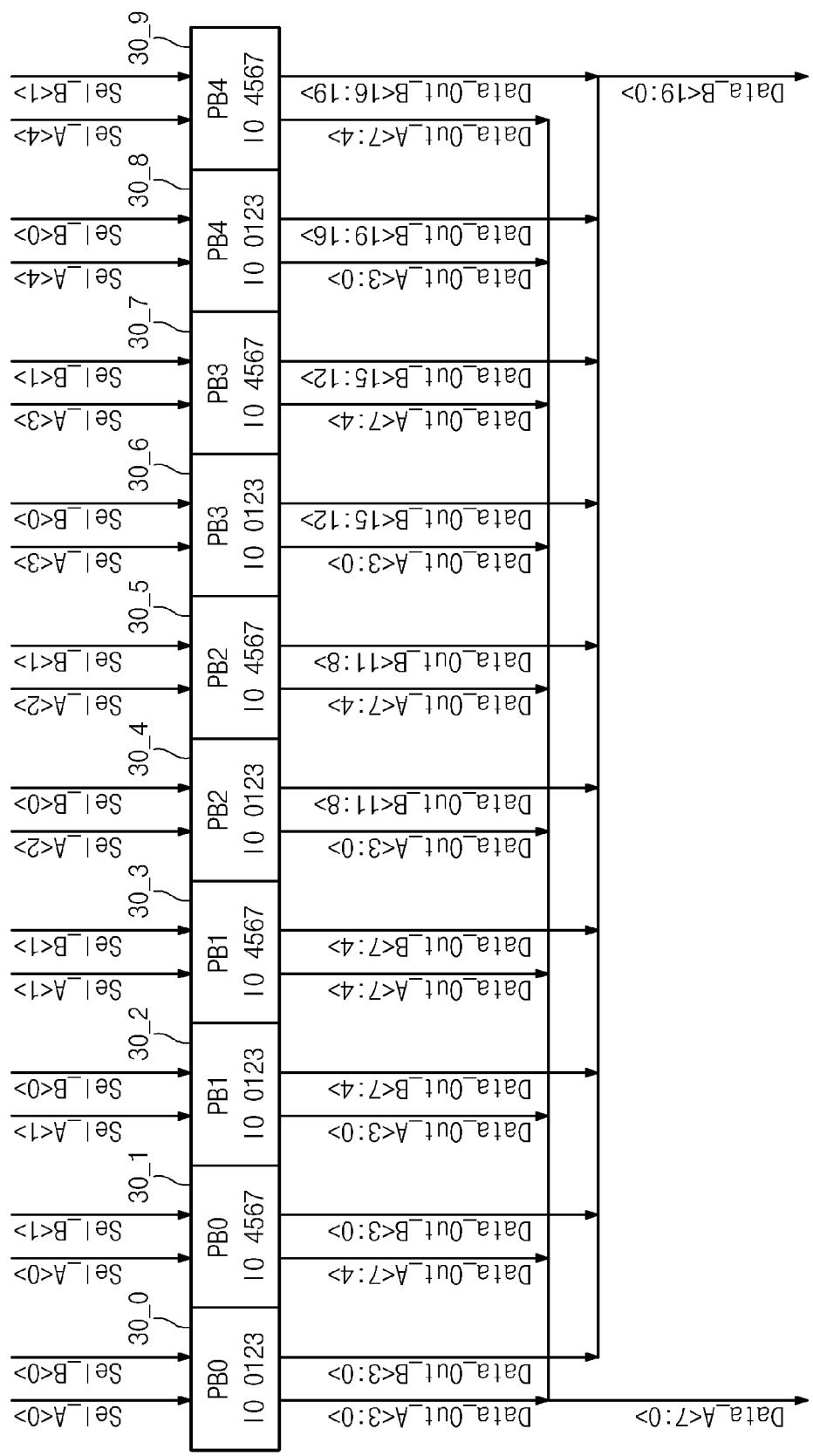
FIG. 2 is a diagram for reference in describing a data read operation associated with a page buffer 102, a column coding circuit 103, and a column coding circuit 108 shown in FIG. 1.
Figure 3A:
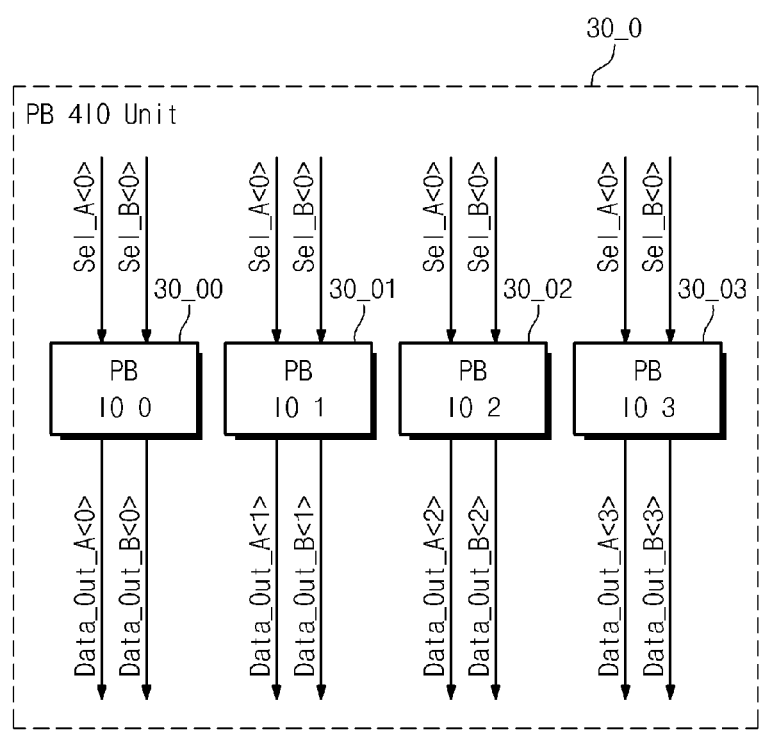
FIGS. 3A and 3B are diagrams for describing an example of a diagram showing page buffer (PB) unit shown in FIG. 2.
Figure 3B:
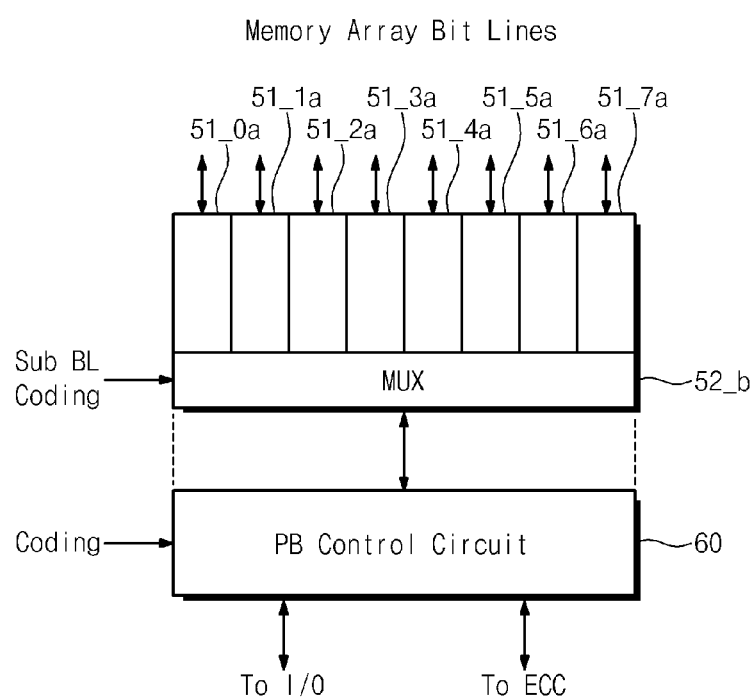
Figure 4:
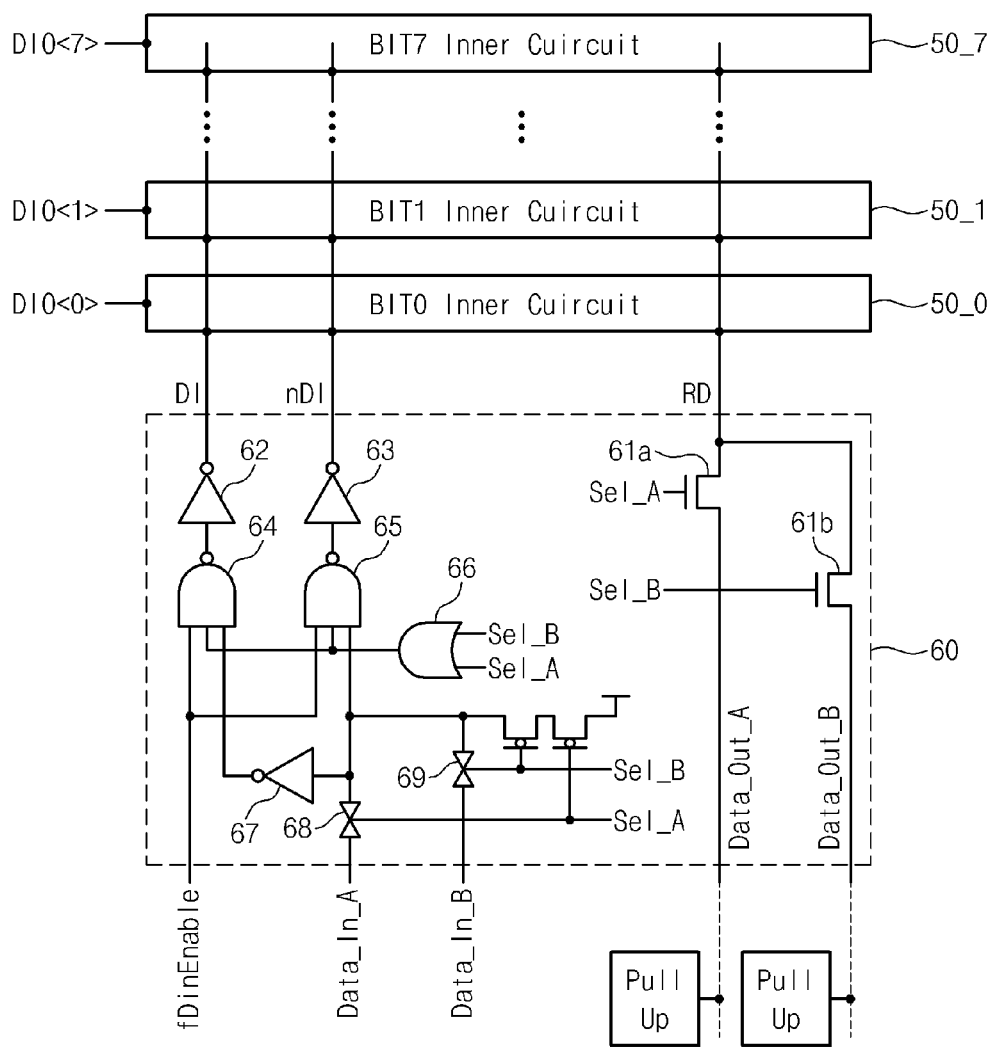
FIG. 4 is a circuit diagram showing an example of a PB unit shown in FIG. 2.
Figure 5:
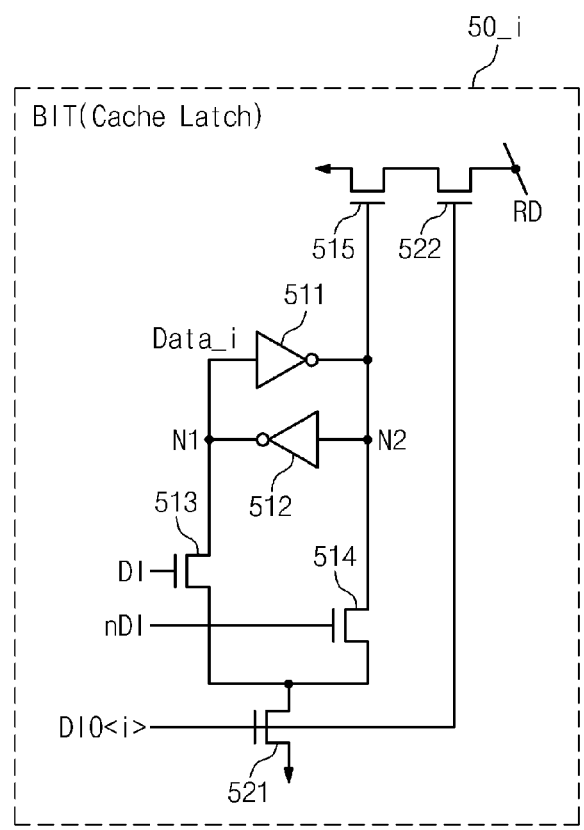
FIG. 5 is a circuit diagram showing an example of a bit internal circuit 50_i (i being an integer of 0 to 7) shown in FIG. 4.

A page buffer 102 including a transfer unit will be more fully described with reference to FIGS. 2 to 5. FIG. 2 is a diagram for reference in describing a data read operation associated with a page buffer 102, a column coding circuit 103, and a column coding circuit 108 shown in FIG. 1. FIGS. 3A and 3B are diagrams schematically illustrating a PB 410 unit and a PB unit shown in FIG. 2. FIG. 4 is a circuit diagram schematically illustrating a PB unit. FIG. 5 is a circuit diagram schematically illustrating a bit internal circuit 50_$i$ (i being an integer of 0 to 7).

Referring to FIG. 2, a portion corresponding to a page buffer 102, a column coding circuit 103, and a column coding circuit 108 shown in FIG. 1 has a PB4IO unit that latches four data from four IO lines and reads the latched data from a first data bus or a second data bus or writes data on the first or second data bus with respect to four IO lines.

In FIG. 2, there are shown ten PB4 IOs, that is, PB0 IO 0123 (PB 4IO unit) 30_0, PB0 IO 4567 (PB 4IO unit) 30_1, PB1 IO 0123 (PB 4IO unit) 30_2, PB1 IO 4567 (PB 4IO unit) 30_3, PB2 IO 0123 (PB 4 IO unit) 30_4, PB2 IO 4567 (PB 4IO unit) 30_5, PB3 IO 0123 (PB 4IO unit) 30_6, PB3 IO 4567 (PB 4IO unit) 30_7, PB4 IO 0123 (PB 4IO unit) 30_8, and PB4 IO 4567 (PB 4IO unit) 30_9.

Here, an IO line is an input/output line installed between a multiplexer 52$b$ and a PB control circuit 60 with respect to a PB unit as will be more fully described below. In exemplary embodiments, the IO line is electrically connected to any one of eight bit lines through a multiplexer 52_$b$ and eight bit circuits 51_0$a$ to 51_7$a$. That is, the IO line is a signal line through which memory cell transistor data or data read from a memory cell transistor is transferred.

Since PB 4IO units shown in FIG. 2 have the same structure, a PB 4IO unit 30_0 shown in FIG. 2 is illustrated in FIG. 3A. The PB 4IO unit 30_0 is formed of four PB units 30_00 to 30_03.

When an active level (e.g., a high level) of selection signal Sel_A<0> is provided from a column coding circuit 103, each of the PB units 30_00 to 30_03 connects an IO line and a data bus (e.g., a second bus) (as will be described below, a data bus Data_A<7:0>). In this case, as illustrated in FIG. 3A, four read data bits Data_Out_A<0> to Data_Out_A<3> are read from four IO lines onto a data bus Data_A<3:0>.

Also, when an active level (e.g., a high level) of selection signal Sel_B<0> is provided from a column coding circuit 108, each of the PB units 30_00 to 30_03 connects an IO line and an ECC bus (e.g., a first bus) (as will be described below, a data bus Data_B<19:0>). In this case, as illustrated in FIG. 3A, four read data bits Data_Out_A<0> to Data_Out_A<3> are read from four IO lines onto a data bus Data_B<3:0>.

Referring to FIG. 3B, each of PB units shown in FIG. 3A comprises eight bit circuits 51_1$a$ to 51_7$a$ (configured the same as those in FIG. 8), a multiplexer 52_$b$ (shown in FIG. 8), and a page buffer (PB) control circuit 60.

Below, a detailed circuit of a PB unit will be more fully described with reference to FIGS. 4 and 5. FIG. 5 shows a circuit of each of bit internal circuits 50_0 to 50_7 shown in FIG. 4. FIG. 5 shows a data sensing unit and a latch unit at a write operation and a driver unit for driving a signal line at a read operation. In particular, each of the bit internal circuits 50_0 to 50_7 is implemented using transistors and inverter circuits. In addition, a combination of bit circuits 51_0$a$ to 51_7$a$ and a multiplexer 52_$b$ shown in FIG. 3B corresponds to the bit internal circuits 50_0 to 50_7. That is, since a bit internal circuit is selected by a selection signal DIO, it partially has a function of a bit circuit and a multiplexer 52_$b$. Also, a bit internal circuit shown in FIG. 5 is the same as a bit internal circuit of a conventional PB unit shown in FIG. 11.

As illustrated in FIG. 5, a bit internal circuit 50_$i$ (i being an integer of 0 to 7) is formed of an inverter circuit 511, an inverter circuit 512, a transistor 513, a transistor 514, a transistor 515, a transistor 521, and a transistor 522. Here, the transistors 513, 514, 515, 521, and 522 may be an N-channel MOS transistor.

A latch unit of the bit internal circuit 50_$i$ is formed of the inverter circuits 511 and 512. Here, an input terminal of the inverter 511 and an output terminal of the inverter 512 are connected to a connection node N1, and an output terminal of the inverter 511 and an input terminal of the inverter 512 are connected to a connection node N2. The connection node N1 is connected to a memory cell transistor (not shown) through a bit line. Data that a memory cell transistor stores appears on the connection node N1 as Data_i at a read operation. Data that is to be stored in a memory cell transistor appears on the connection node N1 as Data_i at a write operation. For example, when a memory cell transistor stores a low level (data 0), a voltage of Data_i has a low level. When a memory cell transistor stores a high level (data 1), a voltage of Data_i has a high level.

In the bit internal circuit 50_$i$, a driver unit is formed of the transistors 515 and 522. The transistor 522 has a drain connected to a line of a read signal RD, a gate connected to a line of a selection signal DIO<$i$>, and a source connected to a drain of the transistor 515. The transistor 515 has a gate connected to the source of the transistor 522, a gate connected to the connection node N2, and a source grounded. Here, the selection signal DIO<$i$> (i being 0~7) is Sub BL Coding shown in FIG. 3A. For example, a column coding circuit 103 makes one of selection signals DIO<7:0> become high based on a 3-bit address signal provided from an address control circuit 85, or a column decoding circuit 108 makes one of the selection signals DIO<7:0> become high based on a 3-bit address signal provided from an ECC circuit 107. By this, one of bit internal circuits 50_0 to 50_7 shown in FIG. 4 is selected.

With the above-described structure, if a selection signal DIO<$i$> goes to a high level at a data read operation on a memory cell transistor, a logical level of the read signal RD is equal to that of Data_i. That is, for example, when Data_i is at a high level with the read signal RD being pre-charged to a high level, the transistor 515 is turned off, the transistor 522 is turned on, and the read signal RD retains a high level. When Data_i is at a low level, the transistor 515 is turned on, the transistor 522 is turned on, and the bit internal circuit 50_$i$ changes the read signal RD from a high level to a low level. A line of the read signal RD is connected to a PB control circuit 60 as shown in FIG. 4. At a first mode of operation (e.g., an ECC mode), a line of the read signal RD is connected to an ECC bus (e.g., a first data bus) in response to a selection signal Sel_B (a column address signal a column coding circuit 108 outputs). By this, Data_i of the bit internal circuit 50_$i$ is output on the ECC bus as a data read signal Data_Out_B.

Meanwhile, at a second mode of operation (e.g., a normal mode), a line of the read signal RD is connected to a data bus (e.g., a second data bus) in response to a selection signal Sel_A (a column address signal a column coding circuit 103 outputs). By this, Data_i of the bit internal circuit 50_$i$ is output on the data bus as a data read signal Data_Out_A.

Returning to FIG. 5, the transistors 513, 514, and 521 constitute a sensing unit of the bit internal circuit 50_$i$. The transistor 513 has a drain connected to the connection node N1, a gate connected to a line of a write signal DI, and a source connected to a drain of the transistor 521. The transistor 514 has a drain connected to the connection node N2, a gate connected to a line of a write signal nDI, and a source connected to the drain of the transistor 521. The transistor 521 has a drain connected to the source of the transistor 513 and the source of the transistor 513, a gate connected to a line of a selection signal DIO<i>, and a source grounded.

The lines of the write signals DI and nDI are connected to the PB control circuit 60 as shown in FIG. 4. As will be described below, as a data bus and an ECC bus are connected by the selection signal Sel_B at the first mode of operation, a data write signal Data_In_B is received from the ECC bus. By this, the PB control circuit 60 varies one of the write signals DI and nDI from a low level to a high level in response to a level of the data write signal Data_In_B. At this time, the other of the write signals DI and nDI retains a low level. At the second mode of operation, connection to the data bus is performed by the selection signal Sel_A, and a data write signal Data_In_A is received from the data bus. By this, the PB control circuit 60 varies one of the write signals DI and nDI from a low level to a high level in response to a level of the data write signal Data_In_A. At this time, the other of the write signals DI and nDI retains a low level.

With the above-described structure, if a selection signal DIO<i> goes to a high level at a data write operation on a memory cell transistor, a Data_i level of the bit internal circuit 50_i is decided according to levels of the write signals DI and nDI. More particular, when one of a data write signal Data_In_A and a data write signal Data_In_B is at a low level (data 0), the PB control circuit 60 outputs a high level of write signal DI and a low level of write signal nDI. By this, the transistor 513 is turned on and the transistor 514 is turned off. At this time, the connection node N1 is set to a low level and the connection node N2 is set to a high level, so that Data_i has the same logical low level (data 0) as that of a data bus.

When the data write signal Data_In_A or the data write signal Data_In_B is at a high level (data 1), the PB control circuit 60 outputs a low level of write signal DI and a high level of write signal nDI. By this, in the bit internal circuit 50_i, the transistor 513 is turned off and the transistor 514 is turned on. At this time, the connection node N1 is set to a high level and the connection node N2 is set to a low level, so that Data_i has the same logical high level (data 1) as that of a data bus.

Returning to FIG. 4, the PB control circuit 60 comprises a write unit performing a data transfer from a data bus to a page buffer and a read unit performing a data transfer from a page buffer to a data bus. The read unit of the PB control circuit 60 is formed of transistors 61a and 61b. The transistors 61a and 61b may be an NMOS transistor. The transistor 61a has a drain connected to a line of the read signal RD, a gate connected to a line of the selection signal Sel_A, and a source connected to a data bus (e.g., a second data bus). The transistor 61b has a drain connected to a line of the read signal RD, a gate connected to a line of the selection signal Sel_B, and a source connected to an ECC bus (e.g., a first data bus).

Here, the selection signal Sel_A may be a column address signal that a column coding circuit 103 generates in response to address bits, for example, an address Address A received from an address control circuit 85 shown in FIG. 1. The selection signal Sel_B may be a column address signal that a column coding circuit 108 generates in response to a part of address bits, for example, an address Address B received from an ECC circuit 107 shown in FIG. 1.

If a high level of selection signal Sel_B is received from the column coding circuit 108 at a data read operation of an ECC mode (e.g., a first mode of operation), the read unit of the PB control circuit 60 turns on the transistor 61b such that a line of the read signal RD is connected to the ECC bus. By this, data of memory cell transistors (Data_i of a bit internal circuit) stored in the bit internal circuits 50_0 to 50_7 are output to the ECC bus as a data read signal Data_Out_B.

If a high level of selection signal Sel_A is received from the column coding circuit 103 at a data read operation of a normal mode (e.g., a second mode of operation), the read unit of the PB control circuit 60 turns on the transistor 61a such that a line of the read signal RD is connected to the data bus. By this, data of memory cell transistors stored in the bit internal circuits 50_0 to 50_7 are output to the data bus as a data read signal Data_Out_A. The write unit of the PB control circuit 60, as illustrated in FIG. 4, comprises inverter circuits 62, 63, 67, NAND circuits 64 and 65, an OR circuit 66, and switches 68 and 69. The inverter circuit 62 is a logical inversion circuit, and has an output terminal connected to a line of the write signal DI and an input terminal connected to an output terminal of the NAND circuit 64. The inverter circuit 63 is a logical inversion circuit, and has an output terminal connected to a line of the write signal nDI and an input terminal connected to an output terminal of the NAND circuit 65.

The NAND circuit 64 is a 3-input 1-output NAND circuit, and has a first input terminal connected to a line of a write enable signal fDinEnable, a second input terminal connected to an output terminal of the OR circuit 66, and a third input terminal connected to an output terminal of the inverter circuit 67. An output terminal of the NAND circuit 64 is connected to an input terminal of the inverter circuit 62. The NAND circuit 65 is a 3-input 1-output NAND circuit, and has a first input terminal connected to a line of the write enable signal fDinEnable, a second input terminal connected to the output terminal of the OR circuit 66, and a third input terminal connected to a first input/output terminal of the switch 68 and a first input/output terminal of the switch 69. An output terminal of the NAND circuit 65 is connected to an input terminal of the inverter circuit 63.

The OR circuit 66 is a 2-input 1-output logic circuit, and has a first input terminal connected to a line of the selection signal Sel_B and a second input terminal connected to a line of the selection signal Sel_A. An output terminal of the OR circuit 66 is connected to the second input terminal of the NAND circuit 64 and the second input terminal of the NAND circuit 65. The inverter circuit 67 is a logical inversion circuit, and has an input terminal connected to the first input/output terminal of the switch 68 and the first input/output terminal of the switch 69 and an output terminal connected to the third input terminal of the NAND gate 64.

The switch 68 is a bidirectional switch, and has the first input/output terminal connected to the input terminal of the inverter circuit 67 and the third input terminal of the NAND circuit 65 and a second input/output terminal connected to the data bus. The switch 69 is a bidirectional switch, and has the first input/output terminal connected to the input terminal of the inverter circuit 67 and the third input terminal of the NAND circuit 65 and a second input/output terminal connected to the ECC bus. In addition, an input of the inverter circuit 67 is pulled up by a PMOS transistor such that an input of the inverter circuit 67 is not set to a "don't care" sate when any one of the bidirectional switches is unselected.

With the above-described structure, when the write enable signal fDinEnable is at a high level and the selection signal Sel_B is at a high level at a data write operation of the ECC mode (e.g., a first mode of operation), the write unit of the PB control circuit 60 turns on the switch 69 such that one of the write signals DI and nDI transitions from a low level to a high level in response to a level of the data write signal Data_In_B received from the ECC bus. More particular, when the data write signal Data_In_B is at a low level (data 0), the write signal DI transitions to a high level. By this, Data_i of one of the bit internal circuits 50_0 to 50_7 goes to a low level. Afterwards, data 0 is written at a memory cell transistor through a program operation.

Meanwhile, when the data write signal Data_In_B is at a high level (data 1), the write signal nDI transitions to a high level. By this, Data_i of one of the bit internal circuits 50_0 to 50_7 goes to a high level. Afterwards, data 1 is written at a memory cell transistor through a program operation.

If the write enable signal fDinEnable and the selection signal Sel_A go to a high level at a data write operation of a normal mode (e.g., a second mode of operation), the write unit of the PB control circuit 60 turns on the switch 68 such that one of the write signals DI and nDI transitions from a low level to a high level in response to a level of the data write signal Data_In_A received from the data bus. More particular, when the data write signal Data_In_A is at a low level (data 0), the write signal DI transitions to a high level. By this, Data_i of one of the bit internal circuits 50_0 to 50_7 goes to a low level. Afterwards, data 0 is written at a memory cell transistor through a program operation.

Meanwhile, when the data write signal Data_In_A is at a high level (data 1), the write signal nDI transitions to a high level. By this, Data_i of one of the bit internal circuits 50_0 to 50_7 goes to a high level. Afterwards, data 1 is written at a memory cell transistor through a program operation.

As described above, the PB control circuit 60 is a circuit that controls a data transfer between a data bus (a first data bus and a second data bus) and a memory cell transistor connected through a bit line to one, selected by the selection signal DIO<i>, from among the bit internal circuits 50_0 to 50_7 constituting a PB unit of a page buffer 102. The line of the read signal RD, the line of the write signal DI, and the line (IO line) of the write signal nDI are lines connecting the PB control circuit 60 and the bit internal circuits 50_0 to 50_7 constituting the PB unit, and are input/output lines for a data transfer of the PB unit.

In exemplary embodiments, the PB control circuit 60 transfers write data and read data between an input/output unit of the page buffer 102 and the first and second data buses (e.g., the ECC bus and the data bus). Returning to FIG. 3A, by the above-described PB control circuit 60, a PB 4IO unit 30_0 operates as follows. when a high level of selection signal Sel_A<0> is received from the column coding circuit 103, the PB 4IO unit 30_0 connects input/output lines IO_0 to IO_3 (marked by RD) of four page buffers to a 4-bit data bus Data_A<3:0>. By this, the PB 4IO unit 30_0 outputs the data read signals Data_Out_A<3> to Data_Out_A<0> (hereinafter, referred to as data read signals Data_Out_A<3:0>) on the data bus Data_A<3:0>.

When a high level of selection signal Sel_B<0> is received from the column coding circuit 108, the PB 4IO unit 30_0 connects input/output lines IO_0 to IO_3 of four page buffers to a 4-bit ECC bus Data_B<3:0> (here, referred to as data bus Data_B<3:0>). By this, the PB 4IO unit 30_0 outputs the data read signals Data_Out_B<3> to Data_Out_B<0> (hereinafter, referred to as data read signals Data_Out_B<3:0>) on the data bus Data_B<3:0>.

Returning to FIG. 2, by the above-described PB 4IO unit 30_0, a page buffer 102 and column coding circuits 103 and 108 (here, referred to as a data read model) operate as follows at a data read operation. also, input/output lines (e.g., data read lines RD shown in FIG. 4) of page buffers connected to PB 4IO units 30_1 to 30_9 shown in FIG. 2 are referred to as IO lines IO_4 to IO_7, IO lines IO_8 to IO_11, IO lines IO_12 to IO_15, IO lines IO_16 to IO_19, IO lines IO_20 to IO_23, IO lines IO_24 to IO_27, IO lines IO_28 to IO_31, IO lines IO_32 to IO_35, and IO lines IO_36 to IO_39. Also, the data bus has an 8-bit bus width, and is referred to as a data bus Data_A<7:0>. The ECC bus has a 20-bit bus width, and is referred to as a data bus Data_B<19:0>.

At the normal mode (e.g., the second mode of operation), the column coding circuit 103 sets one of column addresses of selection signals Sel_A<0> to Sel_A<4> to a high level and the remaining thereof to a low level and then the selection signals Sel_A<0> to Sel_A<4> to the data read model. For example, at the normal mode, 40-bit data of the IO lines IO_0 to IO_39 is sequentially output onto the data bus Data_A<7:0> by sequentially providing the selection signals Sel_A<0> to Sel_A<4> to the data read model.

When the selection Sel_A<0> goes to a high level, the transistor 61a of the PB control circuit 60 is turned on. At this time, the PB 4IO unit 30_0 and the PB 4IO unit 30_1 connect the IO lines IO_0 to IO_7 to the data bus Data_A<7:0>. By this, the PB 4IO unit 30_0 and the PB 4IO unit 30_1 output read data Data_Out_A<7:0> (data on the IO lines IO_0 to IO_7) on the data bus Data_A<7:0>.

When the selection Sel_A<1> goes to a high level, the transistor 61a of the PB control circuit 60 is turned on. At this time, the PB 4IO unit 30_2 and the PB 4IO unit 30_3 connect the IO lines IO_8 to IO_15 to the data bus Data_A<7:0>. By this, the PB 4IO unit 30_2 and the PB 4IO unit 30_3 output read data Data_Out_A<7:0> (data on the IO lines IO_8 to IO_15) on the data bus Data_A<7:0>.

When the selection Sel_A<2> goes to a high level, the transistor 61a of the PB control circuit 60 is turned on. At this time, the PB 4IO unit 30_4 and the PB 4IO unit 30_5 connect the IO lines IO_16 to IO_23 to the data bus Data_A<7:0>. By this, the PB 4IO unit 30_4 and the PB 4 IO unit 30_5 output read data Data_Out_A<7:0> (data on the IO lines IO_16 to IO_23) on the data bus Data_A<7:0>.

When the selection Sel_A<3> goes to a high level, the transistor 61a of the PB control circuit 60 is turned on. At this time, the PB 4IO unit 30_6 and the PB 4IO unit 30_7 connect the IO lines IO_24 to IO_31 to the data bus Data_A<7:0>. By this, the PB 4IO unit 30_6 and the PB 4IO unit 30_7 output read data Data_Out_A<7:0> (data on the IO lines IO_24 to IO_31) on the data bus Data_A<7:0>.

Finally, when the selection Sel_A<4> goes to a high level, the transistor 61a of the PB control circuit 60 is turned on. At this time, the PB 4IO unit 30_8 and the PB 4IO unit 30_9 connect the IO lines IO_32 to IO_39 to the data bus Data_A<7:0>. By this, the PB 4IO unit 30_8 and the PB 4IO unit 30_9 output read data Data_Out_A<7:0> (data on the IO lines IO_32 to IO_39) on the data bus Data_A<7:0>.

As described above, if the selection signal Sel_A is provided to the data read model five times, the PB 4IO units 30_0 to 30_9 connect the IO lines IO_0 to IO_39 to the data bus Data_A<7:0> by the 8-IO unit. By this, 40-bit data stored in memory cell transistors are read on the data bus through bit lines and IO lines IO_0 to IO_39.

At the ECC mode (e.g., the first mode of operation), the ECC circuit 107 sets one of column addresses of the selection signals Sel_B<0> and Sel_B<1> to a high level and the other to a low level and outputs them to the data read model. 40-bit data of the IO lines IO_0 to IO_39 is sequentially read on a data bus Data_B<19:0> by sequentially providing the selection signals Sel_B<0> and Sel_B<1> to the data read mode.

When the selection Sel_B<0> goes to a high level, the transistor 61b of the PB control circuit 60 is turned on. At this time, the PB 4IO unit 30_0, 30_2, 30_4, 30_6, and 30_8 connect the data bus Data_B<19:0> to IO lines IO_0 to IO_3, IO_8 to IO_11, IO_16 to IO_19, IO_24 to IO_27, and IO_32 to IO_35. By this, the PB 4IO unit 30_0, 30_2, 30_4, 30_6, and 30_8 output read data Data_Out_B<19:0> (data on the IO lines IO_0 to IO_3, IO_8 to IO_11, IO_16 to IO_19, IO_24 to IO_27, and IO_32 to IO_35) on the data bus Data_B<19:0>.

When the selection Sel_B<1> goes to a high level, the transistor 61a of the PB control circuit 60 is turned on. At this time, the PB 4IO unit 30_1, 30_3, 30_5, 30_7, and 30_9 connect the data bus Data_B<19:0> to IO lines IO_4 to IO_7, IO_12 to IO_15, IO_20 to IO_23, IO_28 to IO_31, and IO_36 to IO_39. By this, the PB 4IO unit 30_1, 30_3, 30_5, 30_7, and 30_9 output read data Data_Out_B<19:0> (data on the IO lines IO_4 to IO_7, IO_12 to IO_15, IO_20 to IO_23, IO_28 to IO_31, and IO_36 to IO_39) on the data bus Data_B<19:0>.

As described above, if the selection signal Sel_B is provided to the data read model two times, the PB 4IO units 30_0 to 30_9 connect the IO lines IO_0 to IO_39 to the data bus Data_B<19:0> by the 20-IO unit. By this, 40-bit data stored in memory cell transistors are read on the ECC bus through bit lines and IO lines IO_0 to IO_39. For example, when a selection signal is not provided five times at the normal mode, data on IO lines IO_0 to IO_3, IO_8 to IO_11, IO_16 to IO_19, IO_24 to IO_27, and IO_32 to IO_35 is not read on the data bus. If a selection signal (e.g., Sel_B<0>) is provided once at the ECC mode, data of the IO lines IO_0 to IO_3, IO_8 to IO_11, IO_16 to IO_19, IO_24 to IO_27, and IO_32 to IO_35 may be read out on the ECC bus.

Figure 6:
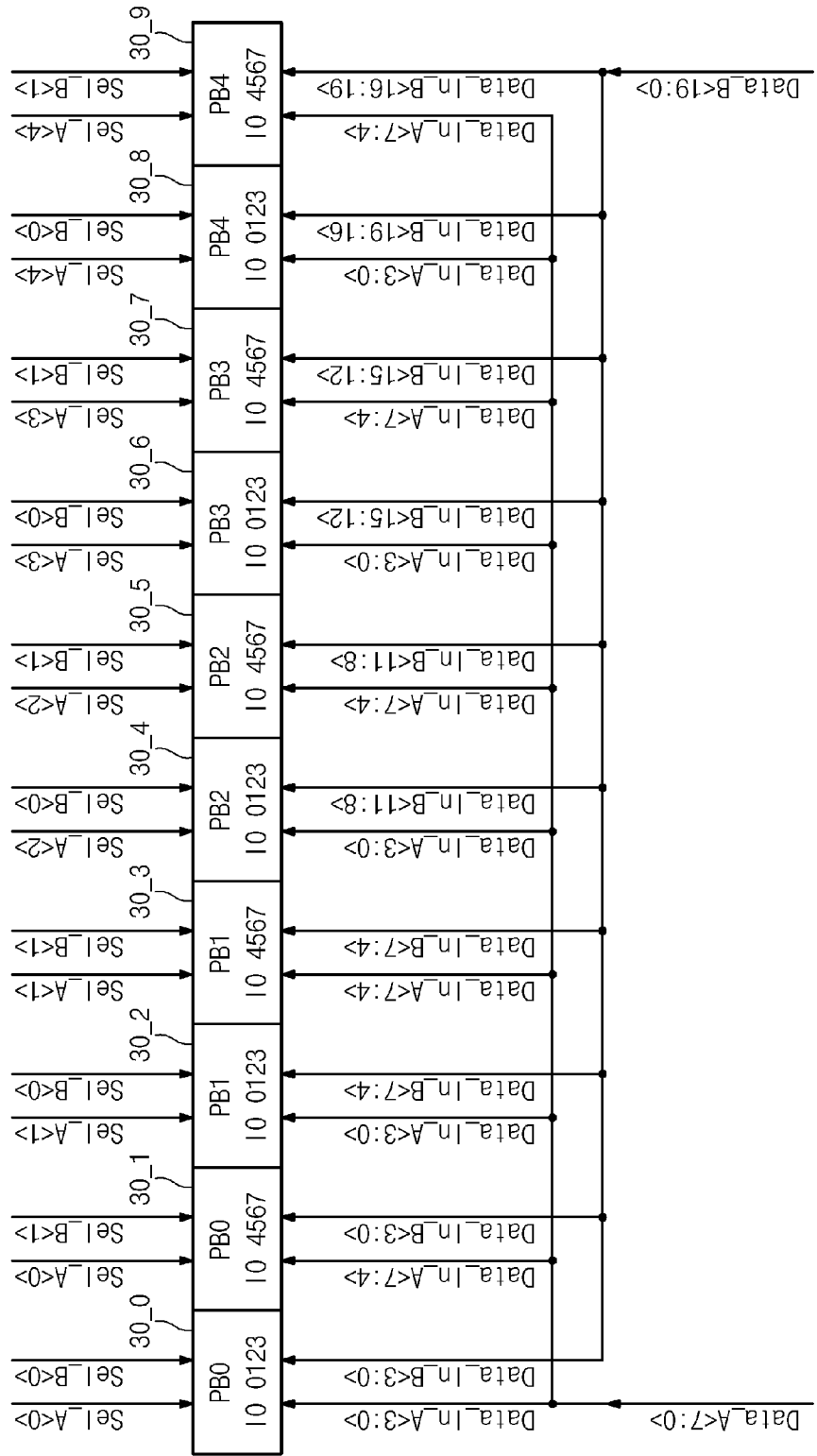
FIG. 6 is a diagram for describing a data write operation associated with a page buffer 102, a column coding circuit 103, and a column coding circuit 108 shown in FIG. 1.

FIG. 6 is a diagram for describing a data write operation of a portion corresponding to a page buffer 102 and column coding circuits 103 and 108 shown in FIG. 1. A data write operation of a page buffer 102 and column coding circuits 103 and 108 (here, referred to as a data write model) is performed by an operation of a PB 4 IO unit 30_0. A data transfer of the data write model is performed in a direction opposite to a direction shown in FIG. 2, and a description thereof is thus omitted.

In the data write model, for example, at a normal mode, data provided to IO lines IO_0 to IO_3, IO_8 to IO_11, IO_16 to IO_19, IO_24 to IO_27, and IO_32 to IO_35 is not written from a data bus when a selection signal is not provided five times. In this behalf, if a selection signal (e.g., Sel_B<0>) is provided once at the ECC mode, the remaining data is written on the IO lines IO_0 to IO_3, IO_8 to IO_11, IO_16 to IO_19, IO_24 to IO_27, and IO_32 to IO_35 from the ECC bus.

A semiconductor memory device (or, a semiconductor memory device) 10 of the inventive concepts comprises a first data bus Data_B<19:0>, a second data bus Data_A<7:0> being different in number from the first data bus and independent from the first data bus Data_B<19:0>, and a data transfer unit (e.g., a PB control circuit 60 of each of PB 4IO units 30_0 to 30_9). When a data transfer with memory cells is performed at the first mode of operation, the data transfer unit connects bit lines, being equal in number to the first data bus, from among a plurality of bit lines to the first data bus to transfer data. When a data transfer with memory cells is performed at the second mode of operation, the data transfer unit connects bit lines, being equal in number to the second data bus, from among a plurality of bit lines to the second data bus to transfer data.

If the number of bit lines is n (n being a common multiple of p and q being a natural number, p>q), the first data bus is q, and the second data bus is q. If (n/p) address signals are received at the first mode of operation, the data transfer unit connects p bit lines to the p first data bus. If (n/q) address signals are received at the second mode of operation, the data transfer unit connects q bit lines to the second data bus. Although the number n of physical bit lines is not a common multiple of p and q, the remaining may be used as dummy bit lines.

Also, the NAND flash memory 10 comprises a memory array 101, a page buffer 82 configured to read data from the memory array 101 by the page unit and to store read data read from the memory array 101, an ECC circuit 107 configured to correct an error on the read data transferred from the page buffer 82 and to write the error-corrected data back in the page buffer 82, and an IO pad (or, an interface unit) 106 configured to output the read data written back in the page buffer 82. An ECC bus is connected to the ECC circuit 107, and a data bus is connected to the IO pad 106.

In the NAND flash memory 10, the page buffer 82 stores write data received through the IO pad 106, and the ECC circuit 107 generates parity data on the write data transferred from the page buffer 82. The parity data and write data are written back in the page buffer.

By this, it is possible to control column coding, that is, addresses independently by preparing a plurality of data buses (e.g., the ECC bus and the data bus). In exemplary embodiments, it is possible to control addresses independently by forming a data bus to be independent from input/output lines of the page buffer 102 (e.g., IO_0 to IO_39), that is, a portion directly connected to the page buffer. Thus, the semiconductor memory device according to an embodiment of the inventive concepts obtains the following effects.

(1) A high-speed operation is implemented by widening a bus width at the first mode of operation (e.g., the ECC mode). There is described such a case that when a column address is received once, 8-bit data is transferred to DataBus at the second mode of operation (e.g., the normal mode) and 20-bit data is transferred at the ECC mode. A bus width is easily widened according to an input of Address_B, that is, column coding to the page buffer 102. For example, if two column addresses are used for 1024 PB units, it is possible to transfer data with the ECCBus being widened a 512-bit bus width at the ECC mode. Also, it is possible to form a data bus independent from a portion directly connected to the page buffer and to control addresses independently. For this reason, as compared with the case that data is transferred to an ECC circuit using a part of the data bus like a conventional technique, a high-speed data transfer is implemented. The reason is that there is not required a circuit (e.g., a first latch circuit 70 of a conventional example) associated with address control for separating a data transfer at the normal mode and a data transfer at the ECC mode.

(2) Freedom on address control and mapping is improved. At a normal mode, when 8-bit data is transferred using a column address, for example, data of IO lines IO_0 to IO_7 is transferred to DataBus by providing a selection signal Sel_A<0> to PB 4IO units 30_0 and 30_1. In this behalf, at an ECC mode, data on all addresses is transferred to the ECC circuit in a lump by allocating an address independent from the selection signals Sel_B<0> and Sel_B<1> to the PB 4IO units 30_0 and 30_1. For example, although normal data and parity data are assigned to different addresses of the selection signal Sel_A at a normal mode, they are assigned to the same address of the selection signal Sel_B at the ECC mode, and normal data and parity data are transferred to the ECC circuit in a lump. Thus, address control at the second mode of operation and address control at the first mode of operation are independent from each other, and freedom of address mapping is high.

Also, at the normal mode, a column address is used with respect to five selection signals Sel_A<0> to Sel_A<4>. At the ECC mode, a column address is used with respect to two selection signals Sel_B<0> and Sel_B<1>. This means that although a column address has a value not being 2n in case of the user specification of the normal mode, it is easy to change an address space of the ECC mode to a unit space having a value of 2n. By this, a code composition of the ECC circuit 107, for example, a code length (e.g., optimization on code length composition in case of cumulative coding) may be decided with freedom, and optimal performance is achieved.

(3) A design change is easily made.

In case of designing a product including an ECC circuit, it is assumed that a product is a derivation product and a product not including an ECC circuit is separately designed. In this case, data buses and column coding circuits associated with address control are independent with respect to the ECC mode and the normal mode. By this, it is possible to separate a circuit associated with the ECC mode and a circuit associated with the normal mode. Thus, it is easy to eliminate the circuit associated with the ECC mode. This means that a design change is easily made.

In the event that a bus width is widened from the second mode of operation to the first mode of operation, a high-speed data transfer is achieved, so that the freedom on address control is improved.

A semiconductor memory device of the inventive concepts comprises a first data bus Data_B<19:0>, a second data bus Data_A<7:0> being different in number from the first data bus and independent from the first data bus Data_B<19:0>, and a data transfer unit (e.g., PB 4IO units 30_0 to 30_9). When a data transfer with memory cells is performed at the first mode of operation, the data transfer unit connects bit lines, being equal in number to the first data bus, from among a plurality of bit lines to the first data bus to transfer data. When a data transfer with memory cells is performed at the second mode of operation, the data transfer unit connects bit lines, being equal in number to the second data bus, from among a plurality of bit lines to the second data bus to transfer data.

Second Embodiment

In a conventional NAND flash memory, as a storage characteristic of a memory element (a memory cell transistor) disappears during data preservation due to deterioration of a tunnel oxide film caused by a plurality of write operations, an error bit generation rate (an error rate) increases. In particular, in the NAND flash memory, an error rate increases in proportion to an increase in storage capacity of a memory cell, that is, scale-down of a fabrication process. For this reason, redundancy data (parity data) of an error correcting code (ECC) is added to data to be written, and the redundancy data is together written in a flash memory as a data stream. During a read operation, data is corrected using the redundancy data of the error correcting code. When an error bit is generated, data is corrected. A semiconductor memory device including an ECC circuit for ECC processing is disclosed in a patent reference 1, for example.

In the NAND flash memory, after fabrication, there are tested such a bit badness that data is not stored in a memory cell transistor, such a badness that a bit line connected to a memory cell transistor is connected with another bit line, or such a badness that a bit line is opened. In this case, data of a memory cell transistor is latched and amplified through a bit line, and the amplified data is output to the exterior. Or, a set including a page buffer for writing data at a memory cell, a bit line connected to the page buffer and a memory cell transistor connected to the bit line may be replaced with a normal set. This replacement is referred to as a redundancy technique. In a semiconductor memory device, an error bit is using ECC processing without replacing an error using the redundancy technique. With such a technique, however, an error correction capacity of the ECC processing repairing a memory cell transistor the data storage characteristic of which disappears due to deterioration is consumed when an error bit due to a fabrication process is repaired. For this reason, the error correction capacity of the ECC processing is lowered.

Figure 21:
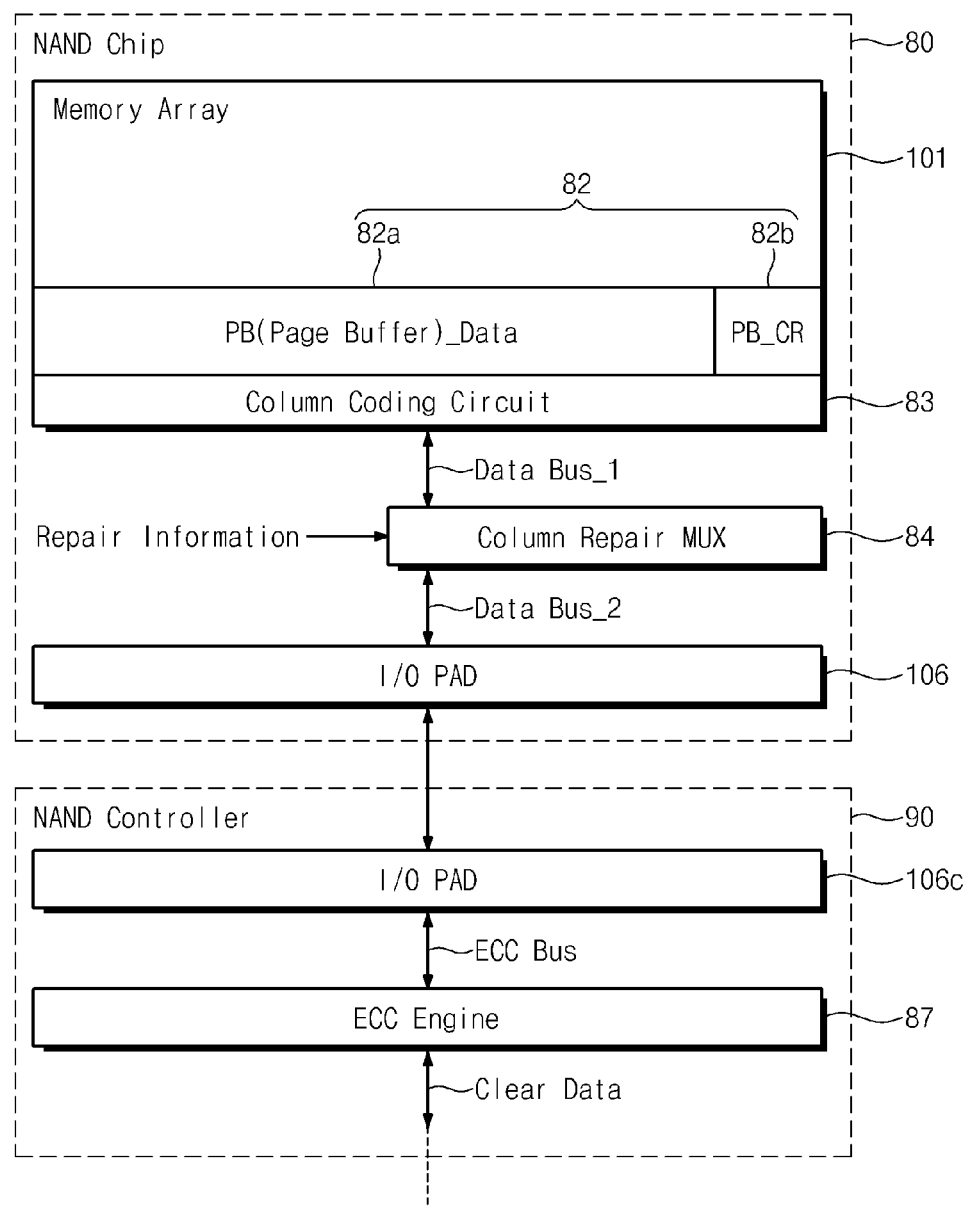
FIG. 21 is a block diagram showing a general NAND flash memory.

At present, repair processing of error bits and error correction processing using ECC processing are made independently as will be described below. FIG. 21 is a block diagram schematically illustrating a conventional NAND flash memory. In a NAND flash memory 80 shown in FIG. 21, ECC processing is executed by a NAND controller 90 (or, a memory controller) placed outside the NAND flash memory 80. The NAND flash memory 80 shown in FIG. 21 comprises a memory array 101, a page buffer 82, a column coding circuit 83, a column repair multiplexer (hereinafter, referred to as a column repair circuit) 84, and an I/O pad 106. The NAND controller 90 comprises an ECC engine (or, an ECC circuit) 87 and an I/O pad 106c.

The memory array 101 is configured to include a plurality of memory cell transistors. Each of the memory cell transistors stores 1-bit data. A plurality of memory cell transistors of the memory array 101 connected to the same word line forms a page. Data is written at and read from memory cell transistors in a page at the same time.

Figure 22:
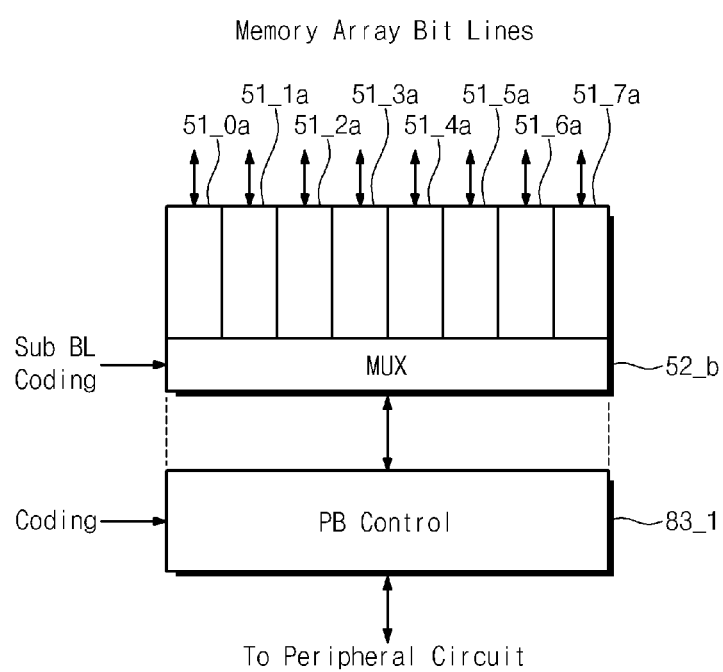
FIG. 22 is a diagram for describing a page buffer unit of a page buffer 82 shown in FIG. 21.
Figure 23:
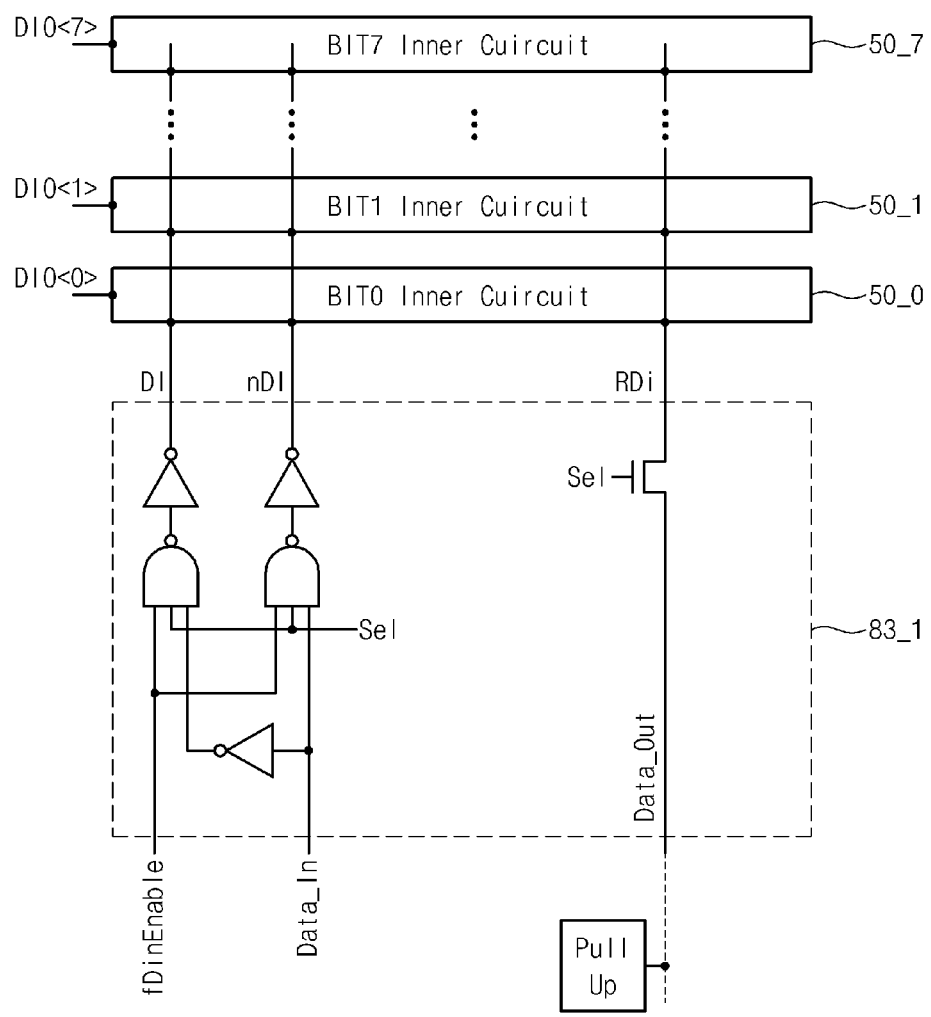
FIG. 23 is a circuit diagram showing a conventional page buffer unit.

The page buffer 82 is configured to store data corresponding to a page of the memory array 101. FIG. 22 is a diagram schematically illustrating a page buffer unit of a page buffer 82. FIG. 23 is a circuit diagram of a conventional page buffer unit. The page buffer 82 includes a page buffer unit shown in FIG. 22 in plurality. The page buffer unit comprises bit circuits 51_0a to 51_7a that are respectively connected to bit lines and store data read from memory cells through the bit lines or data to be written at memory cells through the bit lines.

A multiplexer 52_b receives a column address (Sub BL Coding) from a column coding circuit 83 shown in FIG. 21 and selects one of the bit circuits 51_0a to 51_7a based on the column address (indicating DIO<i> in FIG. 23). That is, the multiplexer 52_b connects one of eight bit lines to a PB control circuit 83_1.

The PB control circuit 83_1 receives a column address Coding (indicating a selection signal Sel in FIG. 23) from the column coding circuit 83 shown in FIG. 22 and connects a bit circuit selected by the multiplexer 52_b to a peripheral circuit through a data bus DataBus_1.

With the above-described structure, each memory cell transistor in a page is connected to a bit circuit of the page buffer 82 through a bit line. One, selected by a column address, from among the bit lines is connected to the data bus such that data is written at or read from a memory cell.

Returning to FIG. 21, the column coding circuit 83 generates column address signals (Sub BL Coding and Coding shown in FIG. 22) based on a column address received from an address control circuit (not shown). The column coding circuit 83 selects a page buffer unit in the page buffer 82 corresponding to the column address. Thereby, data is written at a memory cell transistor through the I/O pad 106, data buses DataBus_2 and DataBus_1, the bit circuit and the bit line. Also, data read from a memory cell is output to the exterior of the I/O pad 106 through the bit line, the bit circuit and the data buses DataBus_2 and DataBus_1.

Also, the page buffer 82 comprises PB (Page Buffer)_Data (hereinafter, referred to as a page buffer 82a) and PB_CR (hereinafter, referred to as a page buffer 82b). The page buffer 82a is a page buffer (e.g., a first page buffer) that amplifies a voltage of a bit line connected to a normal memory cell and latches the amplified result. In the event that a normal memory cell or a bit line connected to the page buffer 82a is abnormal, the page buffer 82b is a page buffer (e.g., a second page buffer) that is replaced together with a normal memory cell and a bit line. That is, in the event that one of page buffer units constituting the page buffer 82a is abnormal, the abnormal page buffer unit is repaired with one of page buffer units in the page buffer 82b.

The column repair circuit 84 is a circuit that repairs an abnormal page buffer unit with a page buffer unit of the page buffer 82b. For example, when a column address indicating a location of an abnormal page buffer is received at a data read operation on a memory cell transistor, the column repair circuit 84 controls the column coding circuit 83 such that a page buffer unit of the page buffer 82b is selected instead of the abnormal page buffer unit of the page buffer 82a. By this, data from a selected page buffer unit is read out to the exterior through the data buses DataBus_1 and DataBus_2 and the I/O pad 106.

A column address indicating a location of an abnormal page buffer is included in repair information shown in FIG. 21. The repair information is detected by the semiconductor test equipment (e.g., a memory tester) through a test operation executed after fabrication of the NAND flash memory 80. Afterwards, the detected repair information is stored in a storage area for system of the memory array 101 before shipment, for example.

Meanwhile, when a column address indicating a location of an abnormal page buffer is received for a data write operation on a memory cell transistor, the column repair circuit 84 controls the column coding circuit 83 such that a page buffer unit of the page buffer 82b is selected instead of the abnormal page buffer unit of the page buffer 82a. By this, data received from the I/O pad 106 is provided to a page buffer unit of the page buffer 82b through the data buses DataBus_2 and DataBus_1, not a page buffer unit of the abnormal page buffer unit.

The data buses DataBus_1 and DataBus_2 are lines through which data is transferred between the page buffer 82 and the I/O pad 106. Each of the data buses DataBus_1 and DataBus_2 are normally formed of 8 or 16 lines. The I/O pad (or, an interface unit) 106 are external terminals for data input/output between the NAND flash memory 80 and the NAND controller 90.

The I/O pad (or, an interface unit) 106c of the NAND controller 90 are external terminals for data input/output between the NAND flash memory 80 and the NAND controller 90. At a data read operation of the NAND flash memory 80, the ECC engine (or, an ECC circuit) 87 receives data provided from the NAND flash memory 80 through the I/O pad 106c. The data provided from the NAND flash memory 80 may be repaired data, but may include an error. The ECC circuit 87 performs ECC processing (or, decoding processing) on the received data based on own parity data, and outputs the error-corrected data (e.g., clear data) to the exterior. At a data write operation of the NAND flash memory 80, the ECC circuit 87 generates data received from the exterior and a page of data of the NAND flash memory 80 at which the received data is written, or parity data. The ECC circuit 87 internally stores the parity data, and outputs the write data to the NAND flash memory 80 through the I/O pad 106c.

As described above, since ECC processing is executed outside a conventional NAND flash memory, data when ECC processing is executed is data passing through the column repair circuit 84, that is, data after an abnormal column is repaired. However, since the NAND flash memory 80 does not transfer data to the exterior using a bus width of the I/O pad 106 at ECC processing, that a time for ECC processing is required is problematic. A manner of widening a bus width at ECC processing may be considered to shorten a time for the ECC processing. For example, a bus width of DataBus_1 and DataBus_2 of the NAND flash memory 80 may be considered.

However, if a bus width is doubled, to constantly maintain the repair efficiency on erroneous bits, the number of erroneous bits once provided to the column repair circuit 84 for repair may increase two times as compared with that before a bus width is widened. Thus, the size of the column repair circuit 84 may be doubled. Also, a circuit size of the I/O pad 106 increases. For example, the number of pads increases. In the event that a bus width is widened for high-speed ECC processing, a chip size increases to repair erroneous bits.

Also, the NAND flash memory 80 is configured to include the ECC circuit 87 for ECC processing. For example, a semiconductor memory device is configured such that the NAND flash memory 80 and the NAND controller 90 shown in FIG. 21 are integrated in a single chip, the I/O pads 106 and 106c are eliminated, and a portion for outputting clear data is formed of an I/O pad. In this case, however, if a bus width is widened for high-speed ECC processing, a chip size increases to repair erroneous bits as described above.

In addition, since data provided to the ECC circuit 87 is data after erroneous bit repairing, that is, data passing through the column repair circuit 84, a time for ECC processing becomes longer by a time taken to repair erroneous bits through the column repair circuit.

An object of the inventive concepts is directed to provide a semiconductor memory device that prevents an increase in a size of a repair circuit for replacing an abnormal page buffer associated with abnormal memory cells or bit lines with a normal page buffer and implements a high-speed data transfer to an ECC circuit.

A semiconductor memory device of the inventive concepts comprises a first data bus, a second data bus being different in number from the first data bus and independent from the first data bus, and a data transfer unit. When a data transfer with memory cells is performed at an ECC mode (e.g., a first mode of operation), the data transfer unit connects bit lines, being equal in number to the first data bus, from among a plurality of bit lines to the first data bus to transfer data. When a data transfer with memory cells is performed at a normal mode (e.g., a second mode of operation), the data transfer unit connects bit lines, being equal in number to the second data bus, from among a plurality of bit lines to the second data bus to transfer data. Also, the data transfer unit comprises a first page buffer that amplifies a voltage of a bit line connected to a normal memory cell and latches the amplified result, a second page buffer that is replaced together with a normal memory cell and a bit line when the normal memory cell or the bit line connected to the first page buffer is defective, and a third page buffer that amplifies a voltage of a bit line connected to a parity memory cell and latches the amplified result. Also, the second data bus is connected to the first and second page buffers, and the first data bus is connected to the first to third page buffers.

Also, the semiconductor memory device comprises a fourth page buffer that is replaced together with a parity memory cell and a bit line when the parity memory cell or the bit line connected to the third page buffer is defective, a first repair circuit that is connected to the second bus and repairs a page buffer, connected to a defective memory cell or bit line, from among the first page buffer with the second page buffer, a second repair circuit that is connected to the first bus and repairs a page buffer, connected to a defective memory cell or bit line, from among the third page buffer with the fourth page buffer, and an ECC circuit that is connected to the first data bus and corrects an error of output data of the first and second page buffers based on output data of the third and fourth page buffers.

Also, the semiconductor memory device comprises a PB control circuit 60 that sets an output of a page, connected to a defective memory cell or bit line, from among the first page buffer, to fixed data.

Also, when a memory cell or a bit line is defective, the PB control circuit does not allow writing from the first data bus.

Also, in a semiconductor memory device of the inventive concepts, during the first mode of operation, it is viewed as input data of the ECC circuit without a repair of a page buffer, corresponding to a defective memory cell or bit line, from among the first page buffer and the second page buffer existing for a repair at the second mode of operation.

Also, the semiconductor memory device of the inventive concepts includes n bit lines (n being a common multiple of p and q being a natural number, p>q). The first data bus is q, and the second data bus is q. If (n/p) address signals are received at the first mode of operation, a data transfer unit connects p bit lines to the p first data bus. If (n/q) address signals are received at the second mode of operation, the data transfer unit connects q bit lines to the second data bus. Although the number n of physical bit lines is not a common multiple of p and q, the remaining may be used as dummy bit lines.

The semiconductor memory device of the inventive concepts comprises a first data bus, a second data bus being different in number from the first data bus and independent from the first data bus, and a data transfer unit. When a data transfer with memory cells is performed at the first mode of operation, the data transfer unit connects bit lines, being equal in number to the first data bus, from among a plurality of bit lines to the first data bus to transfer data. When a data transfer with memory cells is performed at the second mode of operation, the data transfer unit connects bit lines, being equal in number to the second data bus, from among a plurality of bit lines to the second data bus to transfer data.

By this, a data bus connected to an output of the page buffer is prepared and used independently for the first mode of operation (e.g., an ECC mode) and the second mode of operation (e.g., a normal mode). A semiconductor memory device including an ECC circuit has a redundancy function for repairing a bad column. But, error correction is implemented by including data of the bad column and repaired data in normal data and transferring the normal data and parity data to the ECC circuit using the first mode of operation with a bus width being widened. For this reason, a circuit (e.g., a column repair circuit) repairing erroneous bits need not be placed between the ECC circuit and an output of the page buffer. By this, in the event that data is transferred to the ECC circuit with a bus width being widened at the first mode of operation, data need not pass through the column repair circuit. Thus, an operation of the column repair circuit is not performed. This means that a high-speed data transfer is achieved when ECC processing is executed. The second data bus may have a bus width corresponding to conventional repair efficiency. By this, a circuit size of the column repair circuit does not increase, so that an increase in a chip size is suppressed.

Figure 12:
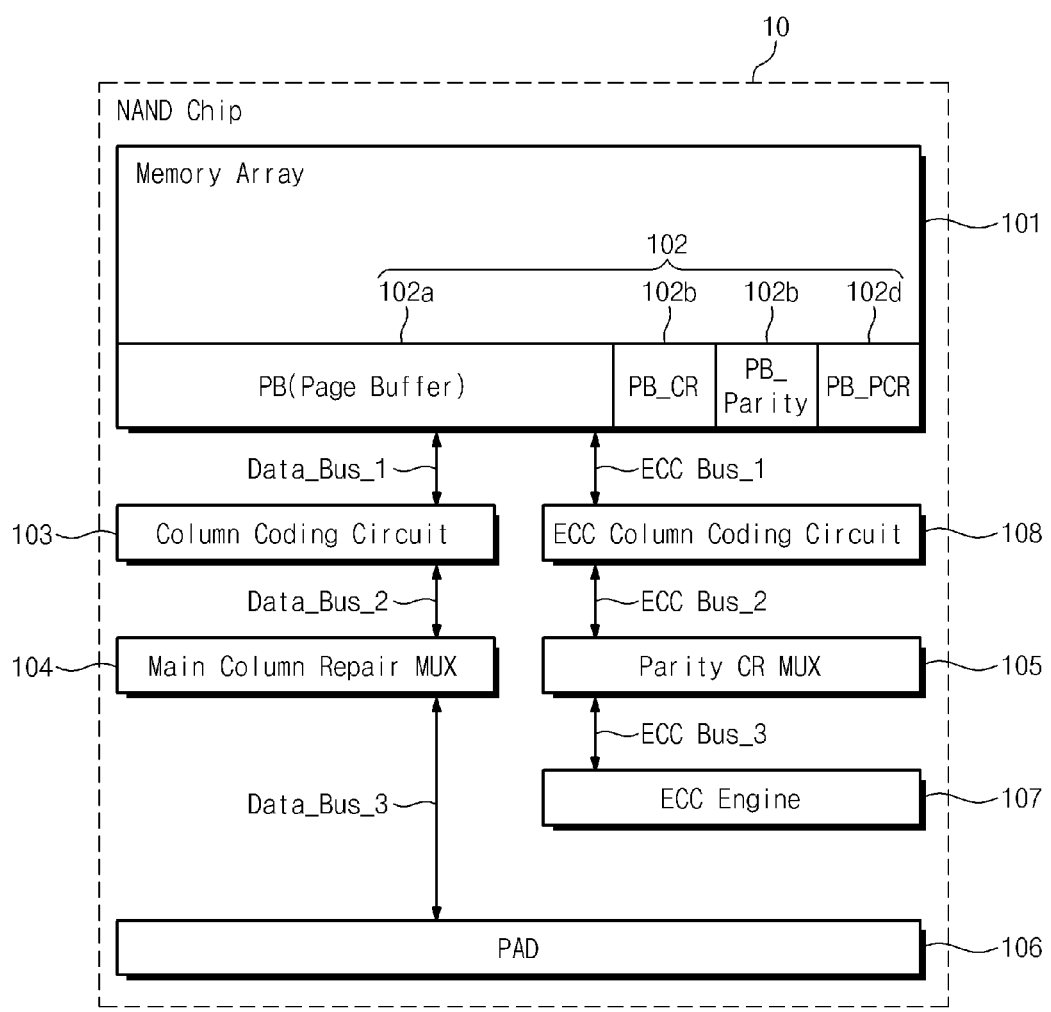
FIG. 12 is a block diagram schematically illustrating a NAND flash memory according to an embodiment of the inventive concepts.

FIG. 12 is a block diagram schematically illustrating a NAND flash memory according to an embodiment of the inventive concepts. Referring to FIG. 12, a NAND flash memory 10 comprises a memory array 101, a page buffer 102, a column coding circuit 103, a main column repair multiplexer (a column repair circuit) 104, a parity column repair circuit (Parity CRMUX) 105, an ECC column coding circuit 108, an I/O pad 106, and an ECC engine (or, an ECC circuit) 107. In FIG. 12, constituent elements that have the same function as those in FIG. 21 are marked by the same reference numerals, and a description thereof is thus omitted. In FIG. 12, DataBus_1, DataBus_2, and DataBus_3 (a second data bus) are lines through which data is exchanged between a page buffer 82 and the I/O pad 106. Below, such lines are referred to as a data bus. Also, ECCBus_1, ECCBus_2, ECCBus_3 (a first data bus) are lines through which data is exchanged between the page buffer 82 and the ECC circuit 107. Below, such lines are referred to as ECC_Bus.

The NAND flash memory 10 is different from a NAND flash memory shown in FIG. 21 in that it includes a column coding circuit 103 and an ECC coding circuit 108 instead of a column coding circuit 83. A column address is provided to the column coding circuit 103 and the ECC column coding circuit 108. The column coding circuit 103 and the ECC column coding circuit 108 output a selection signal Sel_A or a selection signal Sel_B to a PB control circuit 60 of the page buffer 102 to connect an output of a page buffer to either ECCBus_1 or DataBus_1 from a portion (e.g., a portion formed of a multiplexer 52_b and a PB control circuit 83_1 shown in FIG. 22) directly connected to the page buffer 102.

In particular, the ECC column coding circuit 108 receives a column address (hereinafter, marked by Address B) from an ECC circuit 107 and outputs the selection signal Sel_B on a PB control circuit 60 independently from a column address provided to the column coding circuit 103 from an address control circuit (not shown). In this case, an output of the page buffer 102 is connected to ECCBus_1. By this, address control is separately executed when an output of the page buffer 102 is connected to ECCBus_1 or DataBus_1.

In a conventional NAND flash memory, an output (a data bus) (hereinafter, referred to as an IO bus for distinction) of a page buffer is shared at a first mode of operation and a second mode of operation. In the NAND flash memory 10, the IO bus being an output of the page buffer is independently prepared without sharing at the first mode of operation and the second mode of operation.

By this, a path between an output of the page buffer and an input of the ECC circuit 107 does not include a circuit influencing a high-speed data transfer of a column repair circuit 104. That is, a data transfer is executed in high speed. Also, a second data bus is set to a bus width corresponding to conventional repair efficiency. By this, a circuit size of the column repair circuit 104 does not increase, so that an increase in a chip size is suppressed. In the event that a design of the NAND flash memory 10 is changed to that of a NAND flash memory not including an ECC circuit, it is possible to eliminate the ECC column coding circuit 108, the parity column repair circuit 104, ECCBus_1 to ECCBus_3, and the ECC circuit 107. This means that it is easy to design.

The page buffer 102, as shown in FIG. 12, comprises PB (Page Buffer) (hereinafter, referred to as a page buffer 102a), PB_CR (hereinafter, referred to as a page buffer 102b), PB_Parity (hereinafter, referred to as a page buffer 102c), and PB_PCR (hereinafter, referred to as a page buffer 102d). The page buffer 102a is a page buffer (e.g., a first page buffer) that amplifies a voltage of a bit line connected to a normal memory cell and latches the amplified result. When the selection signal Sel_A is received from the column coding circuit 103 at a data read operation of a normal mode (e.g., a second mode of operation), the page buffer 102a outputs the amplified result to the I/O pad 106 through DataBus_1, DataBus_2, and DataBus_3 (e.g., a second data bus) as read data Data_Out_A. Meanwhile, when the selection signal Sel_A is received from the ECC column coding circuit 108 at a data read operation of an ECC mode (e.g., a first mode of operation), the page buffer 102a outputs the amplified result to the ECC circuit 107 through ECCBus_1, ECCBus_2, and ECCBus_3 (e.g., a first data bus) as read data Data_Out_B.

If the selection signal Sel_A is received from the column coding circuit 103 at a data write operation of the normal mode, the page buffer 102a receives, as write data Data_In_A, write data through DataBus_3, DataBus_2, and DataBus_1. If the selection signal Sel_B is received from the ECC column coding circuit 108 at a data write operation of the ECC mode, the page buffer 102a receives, as write data Data_In_B, a result of ECC processing through ECCBus_3, ECCBus_2, and ECCBus_1.

The page buffer 102b is a page buffer (e.g., a second page buffer) that is replaced together with a normal memory cell and a bit line. That is, in the event that one of page buffer units constituting the page buffer 102a is abnormal, the abnormal page buffer unit is repaired with one of page buffer units in the page buffer 102b. The page buffer 102b operates substantially the same as that of the page buffer 102a, and a description thereof is thus omitted. The column repair circuit 104 is a circuit for replacing a page buffer unit of the page buffer 102a with a page buffer unit of the page buffer 102b. If a column address (e.g., a selection signal Sel_A) for selecting an abnormal page buffer unit of the page buffer 102a is provided to the column coding circuit 103, the column coding circuit 103 controls to select a page buffer unit of the page buffer 102b.

The page buffer 102c is a page buffer (e.g., a third page buffer) that amplifies a voltage of a bit line connected to a parity memory cell (formed of a memory cell transistor for ECC processing configured the same as a normal memory cell) and latches the amplified result. In addition, parity data a parity memory cell stores is not output to the exterior through the I/O pad 106 at a normal mode. Meanwhile, if a selection signal Sel_B is received from the ECC column coding circuit 108 at a data read operation of the ECC mode, the page buffer 102c outputs the amplified result to the ECC circuit 107 through ECCBus_1, ECCBus_2, and ECCBus_3 as read data Data_Out_B.

Also, parity data a parity memory cell stores is not received from the exterior through the I/O pad 106 at the normal mode. Meanwhile, if the selection signal Sel_B is received from the ECC column coding circuit 108 at a data write operation of the ECC mode, the page buffer 102c receives parity data being a result of ECC processing of the ECC circuit 107 through ECCBus_3, ECCBus_2, and ECCBus_1 as write data Data_Out_B.

The page buffer 102d is a page buffer (e.g., a fourth page buffer) that is replaced together with a parity memory cell and a bit line when the parity memory cell or the bit line connected to the page buffer 102c is abnormal. That is, in the event that one of page buffer units constituting the page buffer 102c is abnormal, the abnormal page buffer unit is repaired with one of page buffer units in the page buffer 102d. The page buffer 102d operates substantially the same as that of the page buffer 102c, and a description thereof is thus omitted.

The parity column repair circuit 105 is a circuit for replacing a page buffer unit of the page buffer 102c with a page buffer unit of the page buffer 102d. If a column address (e.g., a selection signal Sel_B) for selecting an abnormal page buffer unit of the page buffer 102c is provided to the ECC column coding circuit 108, the ECC column coding circuit 108 controls to select a page buffer unit of the page buffer 102d.

Figure 13:
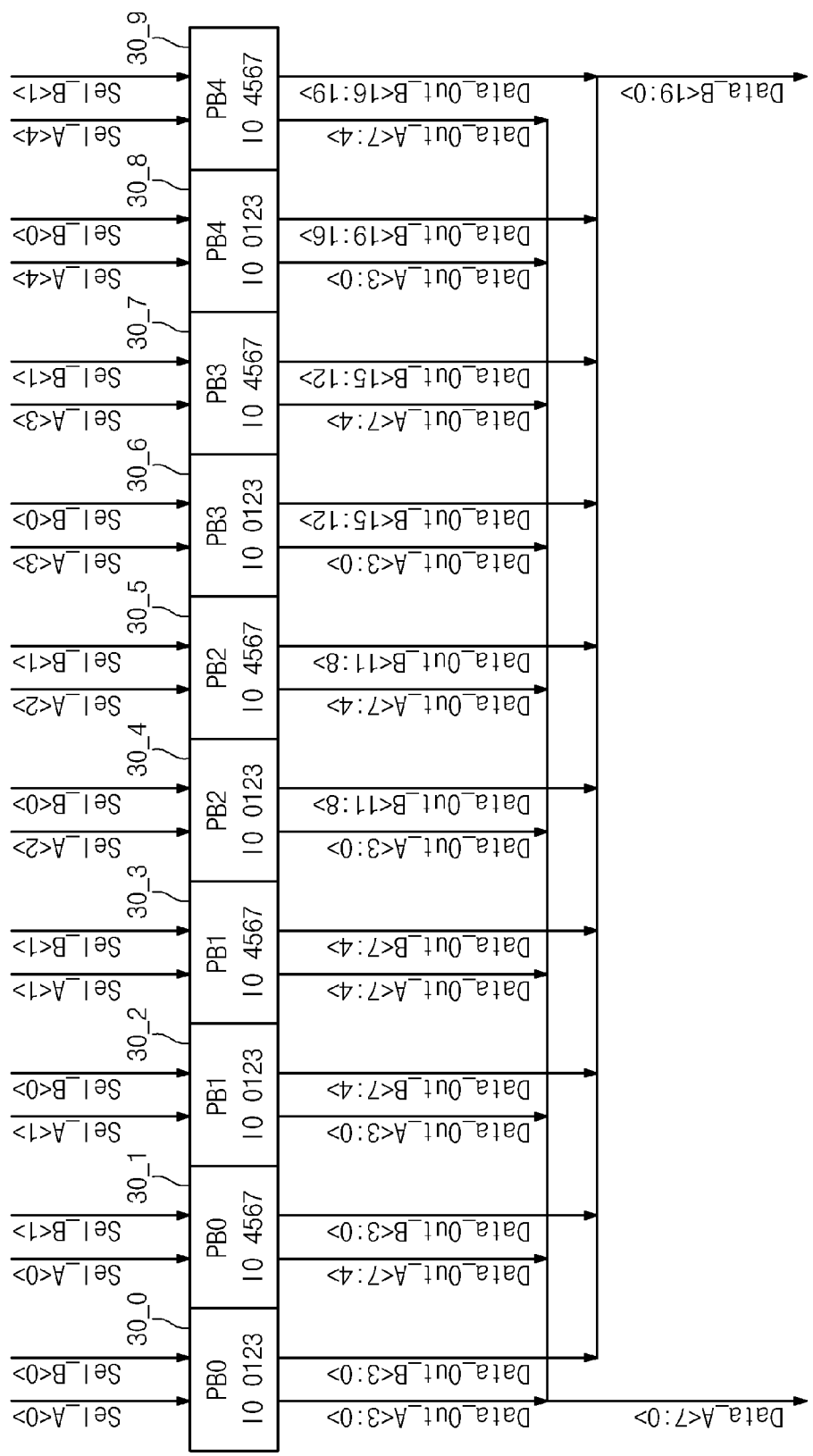
FIG. 13 is a diagram for describing a data read operation associated with a page buffer 102, a column coding circuit 103, and an ECC column coding circuit 108 shown in FIG. 12.
Figure 14A:
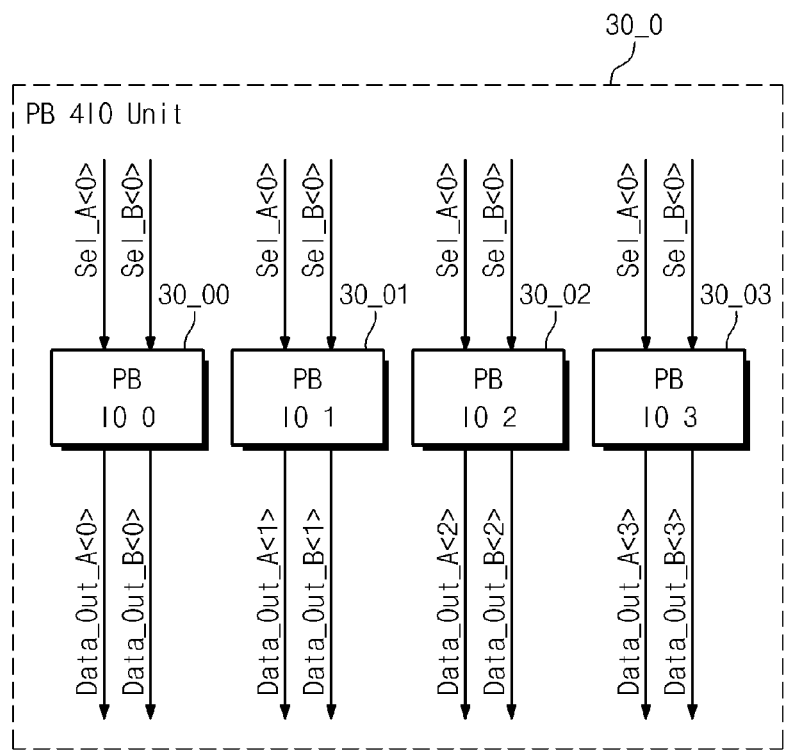
FIGS. 14A and 14B are diagrams for explaining an example of a PB unit shown in FIG. 13.
Figure 14B:
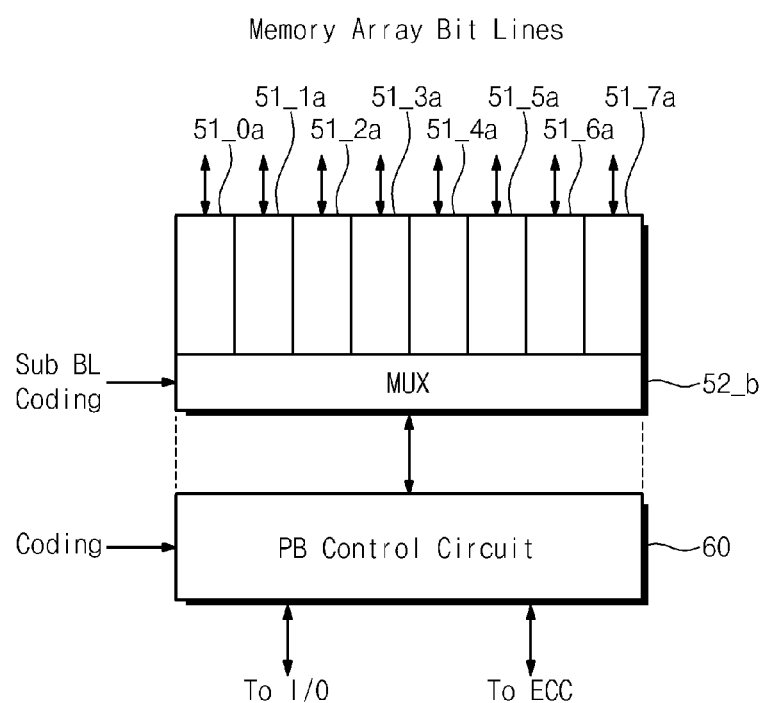
Figure 15:
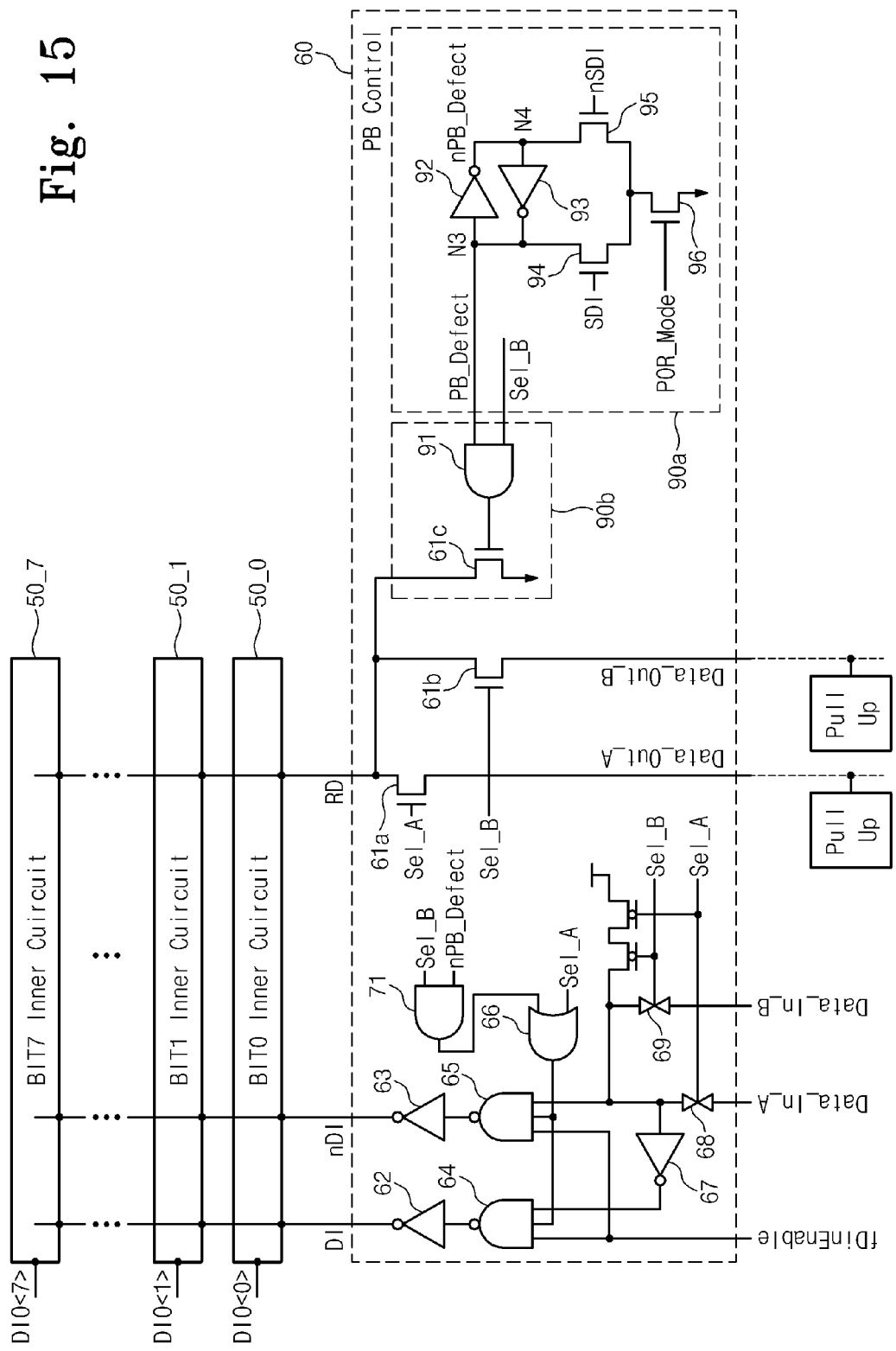
FIG. 15 is a circuit diagram showing an example of a PB unit shown in FIG. 13.
Figure 16:
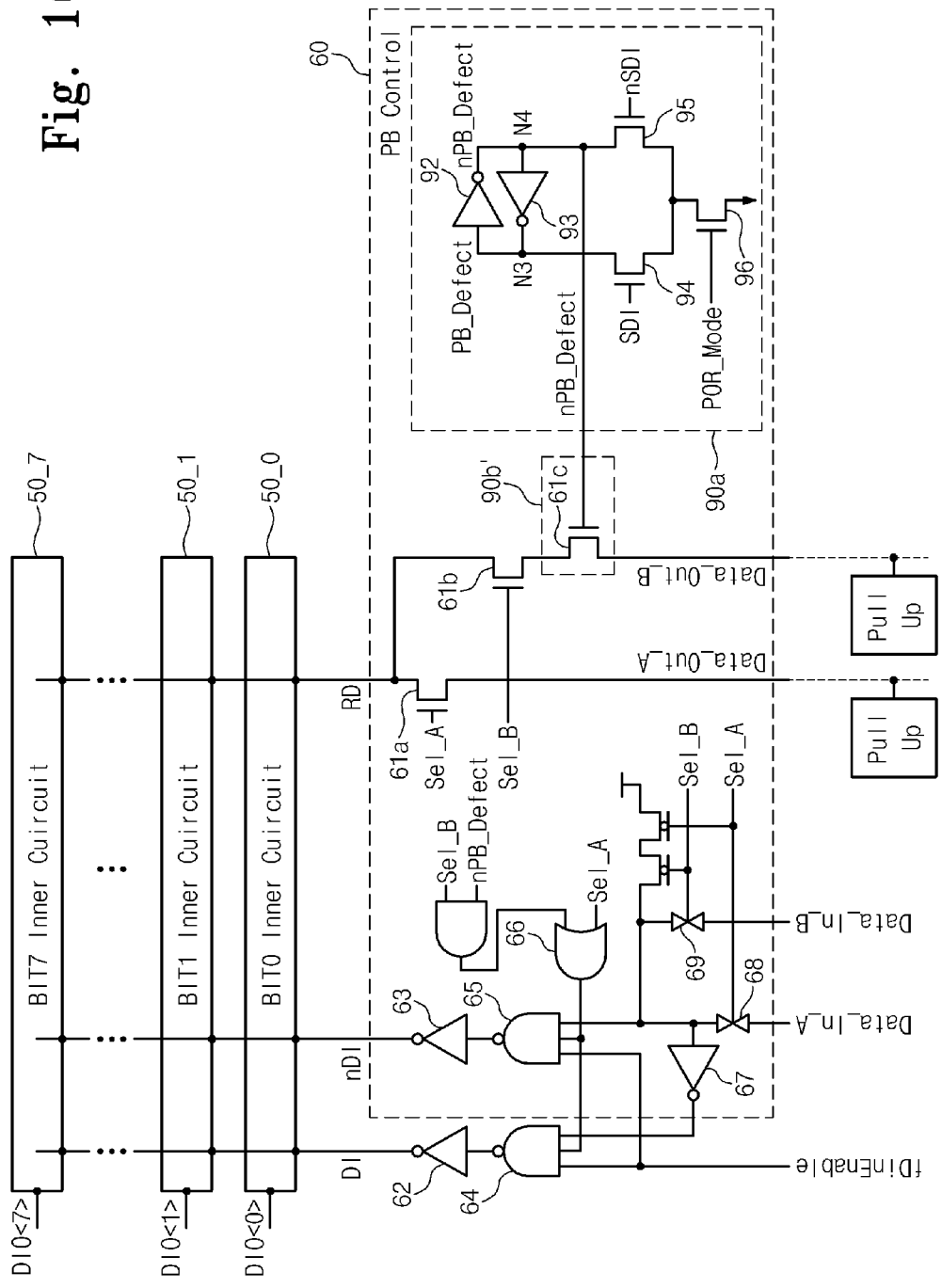
FIG. 16 is a circuit diagram showing another example of a PB unit shown in FIG. 13.
Figure 17:
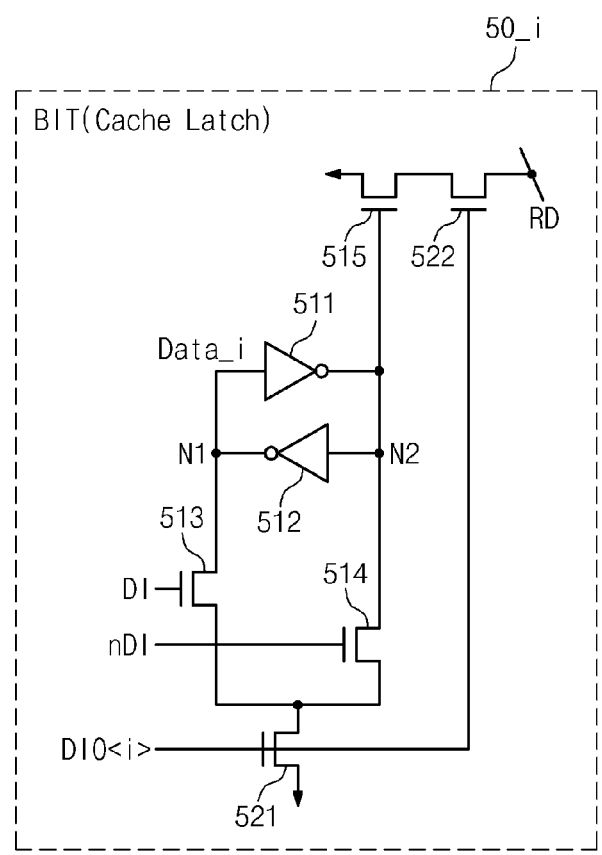
FIG. 17 is a circuit diagram showing an example of a bit internal circuit 50_i (i being an integer of 0 to 7) shown in FIGS. 15 and 16.

The page buffers 102a to 102d of the page buffer 102 are configured by the same circuit. Below, the circuit structure will be more fully described with reference to FIGS. 2 to 17. FIG. 13 is a diagram schematically illustrating a portion corresponding to a page buffer 102, a column coding circuit 103, and an ECC column coding circuit 108 shown in FIG. 12. FIGS. 14A and 14B are diagrams schematically illustrating a PB 4IO unit and a PB unit shown in FIG. 13. FIG. 15 is a circuit diagram schematically illustrating a PB unit. FIG. 16 is a circuit diagram schematically illustrating a PB unit according to another embodiment. FIG. 17 is a circuit diagram schematically illustrating a bit internal circuit 50_i (i being an integer of 0 to 7) shown in FIGS. 15 and 16.

Referring to FIG. 12, a portion corresponding to a page buffer 102, a column coding circuit 103, and an ECC column coding circuit 108 shown in FIG. 12 has a PB4IO unit that latches four data from four IO lines and writes data with respect to four IO lines.

In FIG. 13, there are shown ten PB4 IOs, that is, PB0 IO 0123 (PB 4IO unit) 30_0, PB0 IO 4567 (PB 4IO unit) 30_1, PB1 IO 0123 (PB 4IO unit) 30_2, PB1 IO 4567 (PB 4IO unit) 30_3, PB2 IO 0123 (PB 4IO unit) 30_4, PB2 IO 4567 (PB 4IO unit) 30_5, PB3 IO 0123 (PB 4IO unit) 30_6, PB3 IO 4567 (PB 4IO unit) 30_7, PB4 IO 0123 (PB 4IO unit) 30_8, and PB4 IO 4567 (PB 4IO unit) 30_9.

Here, an IO line is an input/output line installed between a multiplexer 52_b and a PB control circuit 60 of a PB unit as will be more fully described below. In exemplary embodiments, the IO line is electrically connected to any one of eight bit lines through a multiplexer 52_b and eight bit circuits 51_0a to 51_7a. That is, the IO line is a signal line through which memory cell transistor data or data read from a memory cell transistor is transferred.

Since PB 4IO units shown in FIG. 13 have the same structure, a PB 4IO unit 30_0 shown in FIG. 13 is illustrated in FIG. 14A. The PB 4IO unit 30_0 is formed of four PB units 30_00 to 30_03.

When an active level (e.g., a high level) of selection signal Sel_A<0> is provided from a column coding circuit 103, each of the PB units 30_00 to 30_03 connects an IO line and a data bus (e.g., a second bus) (as will be described below, a data bus Data_A<7:0>). In this case, as illustrated in FIG. 14A, four read data bits Data_Out_A<0> to Data_Out_A<3> are read from four IO lines onto a data bus Data_A<3:0>.

Also, when an active level (e.g., a high level) of selection signal Sel_B<0> is provided from an ECC column coding circuit 108, each of the PB units 30_00 to 30_03 connects an IO line and an ECC bus (e.g., a first bus) (as will be described below, a data bus Data_B<19:0>). In this case, as illustrated in FIG. 14A, four read data bits Data_Out_A<0> to Data_Out_A<3> are read from four IO lines onto a data bus Data_B<3:0>.

Referring to FIG. 14B, each of PB units shown in FIG. 14A comprises eight bit circuits 51_1a to 51_7a (configured the same as those in FIG. 22), a multiplexer 52_b (shown in FIG. 22), and a page buffer (PB) control circuit 60. First, a detailed circuit of a PB unit will be more fully described with reference to FIGS. 15 and 17. FIG. 17 shows a circuit of each of bit internal circuits 50_0 to 50_7 shown in FIG. 15. FIG. 17 shows a data sensing unit and a latch unit at a write operation and a driver unit for driving a signal line at a read operation.

In particular, each of the bit internal circuits 50_0 to 50_7 is implemented using transistors and inverter circuits. In addition, a combination of bit circuits 51_0a to 51_7a and a multiplexer 52__b shown in FIG. 14B corresponds to the bit internal circuits 50_0 to 50_7. That is, since a bit internal circuit is selected by a selection signal DIO, it partially has a function of a bit circuit and a multiplexer 52__b. Also, a bit internal circuit shown in FIG. 17 is the same as a bit internal circuit of a conventional PB unit shown in FIG. 22.

As illustrated in FIG. 17, a bit internal circuit 50__i (i being an integer of 0 to 7) is formed of an inverter circuit 511, an inverter circuit 512, a transistor 513, a transistor 514, a transistor 515, a transistor 521, and a transistor 522. Here, the transistors 513, 514, 515, 521, and 522 may be an N-channel MOS transistor.

A latch unit of the bit internal circuit 50__i is formed of the inverter circuits 511 and 512. Here, an input terminal of the inverter 511 and an output terminal of the inverter 512 are connected to a connection node N1, and an output terminal of the inverter 511 and an input terminal of the inverter 512 are connected to a connection node N2. The connection node N1 is connected to a memory cell transistor (not shown) through a bit line. Data that a memory cell transistor stores appears on the connection node N1 as Data_i at a read operation. Data that is to be stored in a memory cell transistor appears on the connection node N1 as Data_i at a write operation. For example, when a memory cell transistor stores a low level (data 0), a voltage of Data_i has a low level. When a memory cell transistor stores a high level (data 1), a voltage of Data_i has a high level.

In the bit internal circuit 50__i, a driver unit is formed of the transistors 515 and 522. The transistor 522 has a drain connected to a line of a read signal RD, a gate connected to a line of a selection signal DIO<i>, and a source connected to a drain of the transistor 515. The transistor 515 has a gate connected to the source of the transistor 522, a gate connected to the connection node N2, and a source grounded. Here, the selection signal DIO<i> (i being 0~7) is Sub BL Coding shown in FIG. 14A. For example, a column coding circuit 103 makes one of selection signals DIO<7:0> become high based on a 3-bit address signal provided from an address control circuit (not shown), or an ECC column decoding circuit 108 makes one of the selection signals DIO<i> become high based on a 3-bit address signal provided from an ECC circuit 107. By this, one of bit internal circuits 50_0 to 50_7 shown in FIG. 15 is selected.

With the above-described structure, if a selection signal DIO<i> goes to a high level at a data read operation on a memory cell transistor, a logical level of the read signal RD is equal to that of Data_i. That is, for example, when Data_i is at a high level with the read signal RD being pre-charged to a high level, the transistor 515 is turned off, the transistor 522 is turned on, and the read signal RD retains a high level. When Data_i is at a low level, the transistor 515 is turned on, the transistor 522 is turned on, and the bit internal circuit 50__i changes the read signal RD from a high level to a low level. A line of the read signal RD is connected to a PB control circuit 60 as shown in FIG. 15. At a first mode of operation (e.g., an ECC mode), a line of the read signal RD is connected to ECCBus in response to a selection signal Sel_B (a column address signal the ECC column coding circuit 108 outputs). By this, Data_i of the bit internal circuit 50__i is output on ECCBus as a data read signal Data_Out_B.

Meanwhile, at a second mode of operation (e.g., a normal mode), a line of the read signal RD is connected to DataBus in response to a selection signal Sel_A (a column address signal a column coding circuit 103 outputs). By this, Data_i of the bit internal circuit 50__i is output on DataBus as a data read signal Data_Out_A.

Returning to FIG. 17, the transistors 513, 514, and 521 constitute a sensing unit of the bit internal circuit 50__i. The transistor 513 has a drain connected to the connection node N1, a gate connected to a line of a write signal DI, and a source connected to a drain of the transistor 521. The transistor 514 has a drain connected to the connection node N2, a gate connected to a line of a write signal nDI, and a source connected to the drain of the transistor 521. The transistor 521 has a drain connected to the source of the transistor 513 and the source of the transistor 513, a gate connected to a line of a selection signal DIO<i>, and a source grounded.

The lines of the write signals DI and nDI are connected to the PB control circuit 60 as shown in FIG. 15. As will be described below, as a data bus and ECCBus are connected by the selection signal Sel_B at the first mode of operation, a data write signal Data_In_B is received from ECCBus. By this, the PB control circuit 60 varies one of the write signals DI and nDI from a low level to a high level in response to a level of the data write signal Data_In_B. At this time, the other of the write signals DI and nDI retains a low level. Meanwhile, at the second mode of operation, connection to DataBus is performed by the selection signal Sel_A, and a data write signal Data_In_A is received from DataBus. By this, the PB control circuit 60 varies one of the write signals DI and nDI from a low level to a high level in response to a level of the data write signal Data_In_A. At this time, the other of the write signals DI and nDI retains a low level.

With the above-described structure, if a selection signal DIO<i> goes to a high level at a data write operation on a memory cell transistor, a Data_i level of the bit internal circuit 50__i is decided according to levels of the write signals DI and nDI. More particular, when one of a data write signal Data_In_A and a data write signal Data_In_B is at a low level (data 0), the PB control circuit 60 outputs a high level of write signal DI and a low level of write signal nDI. By this, the transistor 513 is turned on and the transistor 514 is turned off. At this time, the connection node N1 is set to a low level and the connection node N2 is set to a high level, so that Data_i has the same logical low level (data 0) as that of a data bus.

When the data write signal Data_In_A or the data write signal Data_In_B is at a high level (data 1), the PB control circuit 60 outputs a low level of write signal DI and a high level of write signal nDI. By this, in the bit internal circuit 50__i, the transistor 513 is turned off and the transistor 514 is turned on. At this time, the connection node N1 is set to a high level and the connection node N2 is set to a low level, so that Data_i has the same logical high level (data 1) as that of a data bus.

Returning to FIG. 17, the PB control circuit 60 comprises a write unit performing a data transfer from a data bus to a page buffer and a read unit performing a data transfer from a page buffer to a data bus. The read unit of the PB control circuit 60 is formed of transistors 61a and 61b. The transistors 61a and 61b may be an NMOS transistor. The transistor 61a has a drain connected to a line of the read signal RD, a gate connected to a line of the selection signal Sel_A, and a source connected to DataBus (e.g., a second data bus). The transistor 61b has a drain connected to a line of the read signal RD, a gate connected to a line of the selection signal Sel_B, and a source connected to ECCBus (e.g., a first data bus).

Here, the selection signal Sel_A may be a column address signal that a column coding circuit 103 generates in response to address bits, for example, an address Address A received from an address control circuit (not shown). The selection signal Sel_B may be a column address signal that an ECC column coding circuit 108 generates in response to a part of address bits, for example, an address Address B received from an ECC circuit 107 shown in FIG. 12.

If a high level of selection signal Sel_B is received from the column ECC coding circuit 108 at a data read operation of an ECC mode (e.g., a first mode of operation), the read unit of the PB control circuit 60 turns on the transistor 61b such that a line of the read signal RD is connected to ECCBus. By this, data of memory cell transistors (Data_i of a bit internal circuit) stored in the bit internal circuits 50_0 to 50_7 are output to ECCBus as a data read signal Data_Out_B. If a high level of selection signal Sel_A is received from the column coding circuit 103 at a data read operation of a normal mode (e.g., a second mode of operation), the read unit of the PB control circuit 60 turns on the transistor 61a such that a line of the read signal RD is connected to DataBus. By this, data of memory cell transistors stored in the bit internal circuits 50_0 to 50_7 are output to DataBus as a data read signal Data_Out_A.

The read unit of the PB control circuit 60 has the following structure such that when a memory cell transistor or a bit line connected to a memory cell transistor is abnormal in the page buffers 102a and 102c, data provided to the ECC circuit 107 has fixed data (e.g., fixed to data 0) at a data read operation of an ECC mode. That is, the read unit of the PB control circuit 60 comprises a defect information storing unit 90a and a data fixing unit 90b as illustrated in FIG. 15.

The defect information storing unit 90a comprises inverter circuits 92 and 93 and transistors 94, 95, and 96. Here, the transistors 94, 95, and 96 may be an N-channel MOS transistor. A latch unit of the defect information storing unit 90a is formed of the inverter circuits 92 and 93. The inverter circuit 92 has an output terminal connected to a connection node N4 and an input terminal of the inverter 93 and an input terminal connected to a connection node N3 and an output terminal of the inverter circuit 94. The connection node N3 is connected to a first input terminal of the AND circuit 91. The connection node N3 provides a defect signal PB_Defect indicating that data stored in the latch unit is defective. The connection node N4 provides a defect signal nPB_Defect indicating that data stored in the latch unit is defective.

A sensing unit of the defect information storing unit 90a comprises transistors 94, 95, and 96. The transistor 94 has a drain connected to the connection node N3, a gate connected to a line of a defect information signal SDI, and a source connected to a drain of the transistor 96. The transistor 95 has a drain connected to the connection node N4, a gate connected to a line of a defect information signal nSDI, and a source connected to the drain of the transistor 96. The transistor 96 has a drain connected to the source of the transistor 94 and the source of the transistor 95, a gate connected to a line of a power-on reset signal POR_Mode, and a source grounded.

Here, the defect information signal SDI and the defect information signal nSDI are signals indicating whether a bit line connected to the PB control circuit 60 or a memory cell transistor connected to a corresponding bit line is defective. In the event that a test result executed after fabrication indicates that a bit line connected to the PB control circuit 60 is defective, the defect information signal SDI is set to data 0 (e.g., a low level) and the defect information signal nSDI is set to data 1 (e.g., a high level). Or, in the event that a test result executed after fabrication indicates that a bit line connected to the PB control circuit 60 is defective, the defect information signal SDI is set to a high level and the defect information signal nSDI is set to a low level. Before shipment, such defect information signals are stored at a storage area for system, for example, of the NAND flash memory 10 in connection with the selection signal Sel_B indicating a location of the PB control circuit 60. Also, the power-on reset signal POR_Mode is a signal maintaining a high level during a predetermined time period (e.g., a time period where the defect information signals are transferred to the PB control circuit 60 from the storage area for system) after the NAND flash memory 10 is powered up.

When the NAND flash memory 10 is powered up, the power-on reset signal POR_Mode goes to a high level. If a bit line connected to the PB control circuit 60 is defective, the defect information storing unit 90a turns off the transistor 94 and turns on the transistor 95. By this, the node N3 is set to a high level and the node N4 is set to a low level. In this case, the defect signal PB_Defect has a high level. Since the power-on reset signal POR_Mode goes to a low level after a transfer period, the defect information storing unit 90a maintains the defect signal PB_Defect at a high level during a period where a power is supplied to the NAND flash memory 10.

When the NAND flash memory 10 is powered up, the power-on reset signal POR_Mode goes to a high level. If a bit line connected to the PB control circuit 60 is not defective, the defect information storing unit 90a turns on the transistor 94 and turns off the transistor 95. By this, the node N3 is set to a low level and the node N4 is set to a high level. In this case, the defect signal PB_Defect has a low level. Since the power-on reset signal POR_Mode goes to a low level after a transfer period, the defect information storing unit 90a maintains the defect signal PB_Defect at a low level during a period where a power is supplied to the NAND flash memory 10.

The data fixing unit 90b is formed of the AND circuit 91 and a transistor 61c. Here, the transistor 61c is an NMOS transistor. The AND circuit 91 is a 2-input 1-output logic circuit. The AND circuit 91 has a first input terminal connected to the connection node N3 and a second input terminal connected to a line of the selection signal Sel_A, and an output terminal connected to a gate of the transistor 61c. The transistor 61c has a drain connected to a line of a read signal RD, a gate connected to the output terminal of the AND circuit 91, and a source grounded.

In the event that a bit line connected to the PB control circuit 60 is not defective, the defect signal PB_Defect has a low level. In this case, since the AND gate 91 outputs a low level of output signal, the transistor 61c of the data fixing unit 90b is turned off. That is, the data fixing unit 90b does not operate. Meanwhile, in the event that a bit line connected to the PB control circuit 60 is defective, the defect signal PB_Defect has a high level. When ECC is used, that is, at an ECC mode, if a high level of selection signal Sel_B is provided to the AND circuit 91, the AND circuit 91 outputs a high level of output signal, so that the transistor 61c is turned on. In this case, ECCBus_1 is grounded such that Data_Out_B is fixed to a low level (e.g., a GND level). That is, in the event that a bit line connected to the PB control circuit 60 is defective, at the ECC mode, the PB control circuit 60 acts as a data fixing circuit that outputs read data Data_Out_B having a fixed level (e.g., a low level) to ECCBus_1.

In addition, at a data read operation of a normal mode, since the PB control circuit 60 is selected by the selection signal Sel_A, the AND circuit 91 outputs a low-level signal. In this case, the data fixing unit 90b being an additional circuit does not operate. If the defect signal PB_Defect is directly provided to a gate of the transistor 91c without using the AND circuit 91, the read signal RD is fixed to a low level when a bit line connected to the PB control circuit 60 is defective. That is, the PB control circuit 60 acts as a data fixing circuit that outputs a fixed level (e.g., a low level) of read data Data_Out_A on DataBus_1 when the selection signal Sel_A is received at a normal mode and outputs a low level of read data Data_Out_B when the selection signal Sel_B is received at an ECC mode.

The defect information storing unit 90a and the data fixing unit 90b shown in FIG. 15 may be configured as illustrated in FIG. 16. FIG. 16 shows another circuit structure of a PB unit. In FIG. 16, constituent elements that are the same as those in FIG. 15 are marked by the same reference numerals, and a description thereof is thus omitted. The defect information storing unit 90a shown in FIG. 16 is configured the same as that shown in FIG. 15. But, the data fixing unit 90b shown in FIG. 15 is replaced with a data fixing unit 90b'. A signal on a connection node N4 of the defect information storing unit 90a is used as a defect signal nPB_Defect. The data fixing unit 90b' is formed of a transistor 61c. The transistor 61c has a source connected to ECCBus (e.g., a first data bus). The transistor 61b has a drain connected to a line of the read signal RD, a gate connected to a line of the selection signal Sel_B, and a source connected to a drain of the transistor 61c.

In the event that a bit line connected to the PB control circuit 60 is defective, the defect signal nPB_Defect has a low level. In this case, since the transistor 61c is turned off, a transfer path between the read signal RD and ECCBus_1 is blocked. For this reason, read data Data_Out_B is fixed to a high level through a pull-up circuit. Meanwhile, in the event that a bit line connected to the PB control circuit 60 is not defective, the defect signal nPB_Defect has a low level. In this case, since the transistor 61c is turned on. By this, the read signal RD, that is, data of a memory cell transistor is output onto ECCBus_1 such that it is read as read data Data_Out_B. As compared with a data fixing unit 90b, the data fixing unit 90b' has such a merit that an AND circuit is not required since the transistors 61b and 61c are connected in series between a line of the read signal RD and ECCBus_1.

In the data fixing unit 90b' shown in FIG. 16, if the transistor 61c is inserted between a line of the read signal RD and the transistor 61a and a drain of the transistor 61b, that is, between a line of the read signal RD and the PB control circuit 60, the PB control circuit 60 acts as a data fixing circuit that outputs a fixed level (e.g., a high level) of read data Data_Out_A to DataBus_1 in response to the selection signal Sel_A provided at the normal mode and a high level of read data Data_Out_B in response to the selection signal Sel_B provided at the ECC mode. As described above, in the event that a bit line connected to the PB control circuit 60 is defective, data Data_Out_A or Data_Out_B may have a low level or a high level of fixed value.

Returning to FIG. 15, the write unit of the PB control circuit 60 comprises inverter circuits 62, 63, 67, NAND circuits 64 and 65, an OR circuit 66, and switches 68 and 69. The inverter circuit 62 is a logical inversion circuit, and has an output terminal connected to a line of the write signal DI and an input terminal connected to an output terminal of the NAND circuit 64. The inverter circuit 63 is a logical inversion circuit, and has an output terminal connected to a line of the write signal nDI and an input terminal connected to an output terminal of the NAND circuit 65.

The NAND circuit 64 is a 3-input 1-output NAND circuit, and has a first input terminal connected to a line of a write enable signal fDinEnable, a second input terminal connected to an output terminal of the OR circuit 66, and a third input terminal connected to an output terminal of the inverter circuit 67. An output terminal of the NAND circuit 64 is connected to an input terminal of the inverter circuit 62. The NAND circuit 65 is a 3-input 1-output NAND circuit, and has a first input terminal connected to a line of the write enable signal fDinEnable, a second input terminal connected to the output terminal of the OR circuit 66, and a third input terminal connected to a first input/output terminal of the switch 68 and a first input/output terminal of the switch 69. An output terminal of the NAND circuit 65 is connected to an input terminal of the inverter circuit 63.

The OR circuit 66 is a 2-input 1-output logic circuit, and has a first input terminal connected to an output of an AND circuit 71 and a second input terminal connected to a line of the selection signal Sel_A. An output terminal of the OR circuit 66 is connected to the second input terminal of the NAND circuit 64 and the second input terminal of the NAND circuit 65. The AND circuit 71 logically combines the selection signal Sel_B and the defect signal nPB_Defect. By this, in a case where the defect signal nPB_Defect has a high level (not defective), the selection signal Sel_B has a high level. At this time, the second input terminal of the NAND circuit 65 has a high level, so that a write condition is satisfied. Meanwhile, in a case where the defect signal nPB_Defect has a low level (e.g., a defective page buffer), at a mode of operation of the selection signal Sel_B, the second input terminal of the NAND circuit 65 does not have a high level. Thus, a write condition is not satisfied. The inverter circuit 67 is a logical inversion circuit, and has an input terminal connected to the first input/output terminal of the switch 68 and the first input/output terminal of the switch 69 and an output terminal connected to the third input terminal of the NAND gate 64.

The switch 68 is a bidirectional switch, and has the first input/output terminal connected to the input terminal of the inverter circuit 67 and the third input terminal of the NAND circuit 65 and a second input/output terminal connected to DataBus. The switch 69 is a bidirectional switch, and has the first input/output terminal connected to the input terminal of the inverter circuit 67 and the third input terminal of the NAND circuit 65 and a second input/output terminal connected to ECCBus. In addition, an input of the inverter circuit 67 is pulled up by a PMOS transistor such that an input of the inverter circuit 67 is not set to a "don't care" state when any one of the bidirectional switches is unselected.

With the above-described structure, when at a data write operation of the ECC mode (e.g., a first mode of operation), the write enable signal fDinEnable is at a high level and the selection signal Sel_B is at a high level, the write unit of the PB control circuit 60 turns on the switch 69 such that one of the write signals DI and nDI transitions from a low level to a high level in response to a level of the data write signal Data_In_B received from ECCBus. More particular, when the data write signal Data_In_B is at a low level (data 0), the write signal DI transitions to a high level. By this, Data_i of one of the bit internal circuits 50_0 to 50_7 goes to a low level. Afterwards, data 0 is written at a memory cell transistor through a program operation.

Meanwhile, when the data write signal Data_In_B is at a high level (data 1), the write signal nDI transitions to a high level. By this, Data_i of one of the bit internal circuits 50_0 to 50_7 goes to a high level. Afterwards, data 1 is written at a memory cell transistor through a program operation.

If the write enable signal fDinEnable and the selection signal Sel_A go to a high level at a data write operation of a normal mode (e.g., a second mode of operation), the write unit of the PB control circuit 60 turns on the switch 68 such that one of the write signals DI and nDI transitions from a low level to a high level in response to a level of the data write signal Data_In_A received from DataBus. More particular, when the data write signal Data_In_A is at a low level (data 0), the write signal DI transitions to a high level. By this, Data_i of one of the bit internal circuits 50_0 to 50_7 goes to a low level. Afterwards, data 0 is written at a memory cell transistor through a program operation.

Meanwhile, when the data write signal Data_In_A is at a high level (data 1), the write signal nDI transitions to a high level. By this, Data_i of one of the bit internal circuits 50_0 to 50_7 goes to a high level. Afterwards, data 1 is written at a memory cell transistor through a program operation.

As described above, the PB control circuit 60 is a circuit that controls a data transfer between a data bus (a first data bus and a second data bus) and a memory cell transistor connected through a bit line to one, selected by the selection signal DIO<i>, from among the bit internal circuits 50_0 to 50_7 constituting a PB unit of a page buffer 102.

The line of the read signal RD, the line of the write signal DI, and the line (IO line) of the write signal nDI are lines connecting the PB control circuit 60 and the bit internal circuits 50_0 to 50_7 constituting the PB unit, and are input/output lines for a data transfer of the PB unit. Thus, the PB control circuit 60 transfers write data and read data between an input/output unit of the page buffer 102 and the first and second data buses ECCBus and DataBus.

Returning to FIG. 14A, by the above-described PB control circuit 60, a PB 4IO unit 30_0 operates as follows. When a high level of selection signal Sel_A<0> is received from the column coding circuit 103, the PB 4IO unit 30_0 connects input/output lines IO_0 to IO_3 (in FIG. 15, marked by RD) of four page buffers to a 4-bit data bus Data_A<3:0>. By this, the PB 4IO unit 30_0 outputs the data read signals Data_Out_A<3> to Data_Out_A<0> (hereinafter, referred to as data read signals Data_Out_A<3:0>) on the data bus Data_A<3:0>.

When a high level of selection signal Sel_B<0> is received from the ECC column coding circuit 108, the PB 4IO unit 30_0 connects input/output lines IO_0 to IO_3 of four page buffers to a 4-bit ECC bus Data_B<3:0> (here, referred to as data bus Data_B<3:0>). By this, the PB 4IO unit 30_0 outputs the data read signals Data_Out_B<3> to Data_Out_B<0> (hereinafter, referred to as data read signals Data_Out_B<3:0>) on the data bus Data_B<3:0>.

Returning to FIG. 13, by the above-described PB 4IO unit 30_0, a page buffer 102, a column coding circuit 103 and an ECC column coding circuit 108 (here, referred to as a data read model) operate as follows at a data read operation. Also, input/output lines (e.g., data read lines RD shown in FIG. 4) of page buffers connected to PB 4IO units 30_1 to 30_9 shown in FIG. 13 are referred to as IO lines IO_4 to IO_7, IO lines IO_8 to IO_11, IO lines IO_12 to IO_15, IO lines IO_16 to IO_19, IO lines IO_20 to IO_23, IO lines IO_24 to IO_27, IO lines IO_28 to IO_31, IO lines IO_32 to IO_35, and IO lines IO_36 to IO_39. Also, DataBus has an 8-bit bus width, and is referred to as a data bus Data_A<7:0>. ECCBus has a 20-bit bus width, and is referred to as a data bus Data_B<19:0>.

At the normal mode (e.g., the second mode of operation), the column coding circuit 103 sets one of column addresses of selection signals Sel_A<0> to Sel_A<4> to a high level and the remaining thereof to a low level and then the selection signals Sel_A<0> to Sel_A<4> to the data read model. For example, at the normal mode, 40-bit data of the IO lines IO_0 to IO_39 is sequentially output onto the data bus Data_A<7:0> by sequentially providing the selection signals Sel_A<0> to Sel_A<4> to the data read model.

When the selection Sel_A<0> goes to a high level, the transistor 61a of the PB control circuit 60 is turned on. At this time, the PB 4IO unit 30_0 and the PB 4IO unit 30_1 connect the IO lines IO_0 to IO_7 to the data bus Data_A<7:0>. By this, the PB 4IO unit 30_0 and the PB 4IO unit 30_1 output read data Data_Out_A<7:0> (data on the IO lines IO_0 to IO_7) on the data bus Data_A<7:0>.

When the selection Sel_A<1> goes to a high level, the transistor 61a of the PB control circuit 60 is turned on. At this time, the PB 4IO unit 30_2 and the PB 4IO unit 30_3 connect the IO lines IO_8 to IO_15 to the data bus Data_A<7:0>. By this, the PB 4IO unit 30_2 and the PB 4IO unit 30_3 output read data Data_Out_A<7:0> (data on the IO lines IO_8 to IO_15) on the data bus Data_A<7:0>.

When the selection Sel_A<2> goes to a high level, the transistor 61a of the PB control circuit 60 is turned on. At this time, the PB 4IO unit 30_4 and the PB 4IO unit 30_5 connect the IO lines IO_16 to IO_23 to the data bus Data_A<7:0>. By this, the PB 4IO unit 30_4 and the PB 4IO unit 30_5 output read data Data_Out_A<7:0> (data on the IO lines IO_16 to IO_23) on the data bus Data_A<7:0>.

When the selection Sel_A<3> goes to a high level, the transistor 61a of the PB control circuit 60 is turned on. At this time, the PB 4IO unit 30_6 and the PB 4IO unit 30_7 connect the IO lines IO_24 to IO_31 to the data bus Data_A<7:0>. By this, the PB 4IO unit 30_6 and the PB 4 IO unit 30_7 output read data Data_Out_A<7:0> (data on the IO lines IO_24 to IO_31) on the data bus Data_A<7:0>.

Finally, when the selection Sel_A<4> goes to a high level, the transistor 61a of the PB control circuit 60 is turned on. At this time, the PB 4IO unit 30_8 and the PB 4IO unit 30_9 connect the IO lines IO_32 to IO_39 to the data bus Data_A<7:0>. By this, the PB 4 IO unit 30_8 and the PB 4IO unit 30_9 output read data Data_Out_A<7:0> (data on the IO lines IO_32 to IO_39) on the data bus Data_A<7:0>.

As described above, if the selection signal Sel_A is provided to the data read model five times, the PB 4IO units 30_0 to 30_9 connect the IO lines IO_0 to IO_39 to the data bus Data_A<7:0> by the 8-IO unit. By this, 40-bit data stored in memory cell transistors are read on DataBus through bit lines and IO lines IO_0 to IO_39.

At the ECC mode (e.g., the first mode of operation), the ECC circuit 107 sets one of column addresses of the selection signals Sel_B<0> and Sel_B<1> to a high level and the other to a low level and outputs them to the data read model. 40-bit data of the IO lines IO_0 to IO_39 is sequentially read on a data bus Data_B<19:0> by sequentially providing the selection signals Sel_B<0> and Sel_B<1> to the data read mode.

When the selection Sel_B<0> goes to a high level, the transistor 61b of the PB control circuit 60 is turned on. At this time, the PB 4IO unit 30_0, 30_2, 30_4, 30_6, and 30_8 connect the data bus Data_B<19:0> to IO lines IO_0 to IO_3, IO_8 to IO_11, IO_16 to IO_19, IO_24 to IO_27, and IO_32 to IO_35. By this, the PB 4IO unit 30_0, 30_2, 30_4, 30_6, and 30_8 output read data Data_Out_B<19:0> (data on the IO lines IO_0 to IO_3, IO_8 to IO_11, IO_16 to IO_19, IO_24 to IO_27, and IO_32 to IO_35) on the data bus Data_B<19:0>.

When the selection Sel_B<1> goes to a high level, the transistor 61a of the PB control circuit 60 is turned on. At this time, the PB 4IO unit 30_1, 30_3, 30_5, 30_7, and 30_9 connect the data bus Data_B<19:0> to IO lines IO_4 to IO_7, IO_12 to IO_15, IO_20 to IO_23, IO_28 to IO_31, and IO_36 to IO_39. By this, the PB 4IO unit 30_1, 30_3, 30_5, 30_7, and 30_9 output read data Data_Out_B<19:0> (data on the IO lines IO_4 to IO_7, IO_12 to IO_15, IO_20 to IO_23, IO_28 to IO_31, and IO_36 to IO_39) on the data bus Data_B<19:0>.

As described above, if the selection signal Sel_B is provided to the data read model two times, the PB 4IO units 30_0 to 30_9 connect the IO lines IO_0 to IO_39 to the data bus Data_B<19:0> by the 20-IO unit. By this, 40-bit data stored in memory cell transistors are read on ECCBus through bit lines and IO lines IO_0 to IO_39. For example, when a selection signal is not provided five times at the normal mode, data on IO lines IO_0 to IO_3, IO_8 to IO_11, IO_16 to IO_19, IO_24 to IO_27, and IO_32 to IO_35 is not read on DataBus. If a selection signal (e.g., Sel_B<0>) is provided once at the ECC mode, data of the IO lines IO_0 to IO_3, IO_8 to IO_11, IO_16 to IO_19, IO_24 to IO_27, and IO_32 to IO_35 may be read out on ECCBus.

Figure 18:
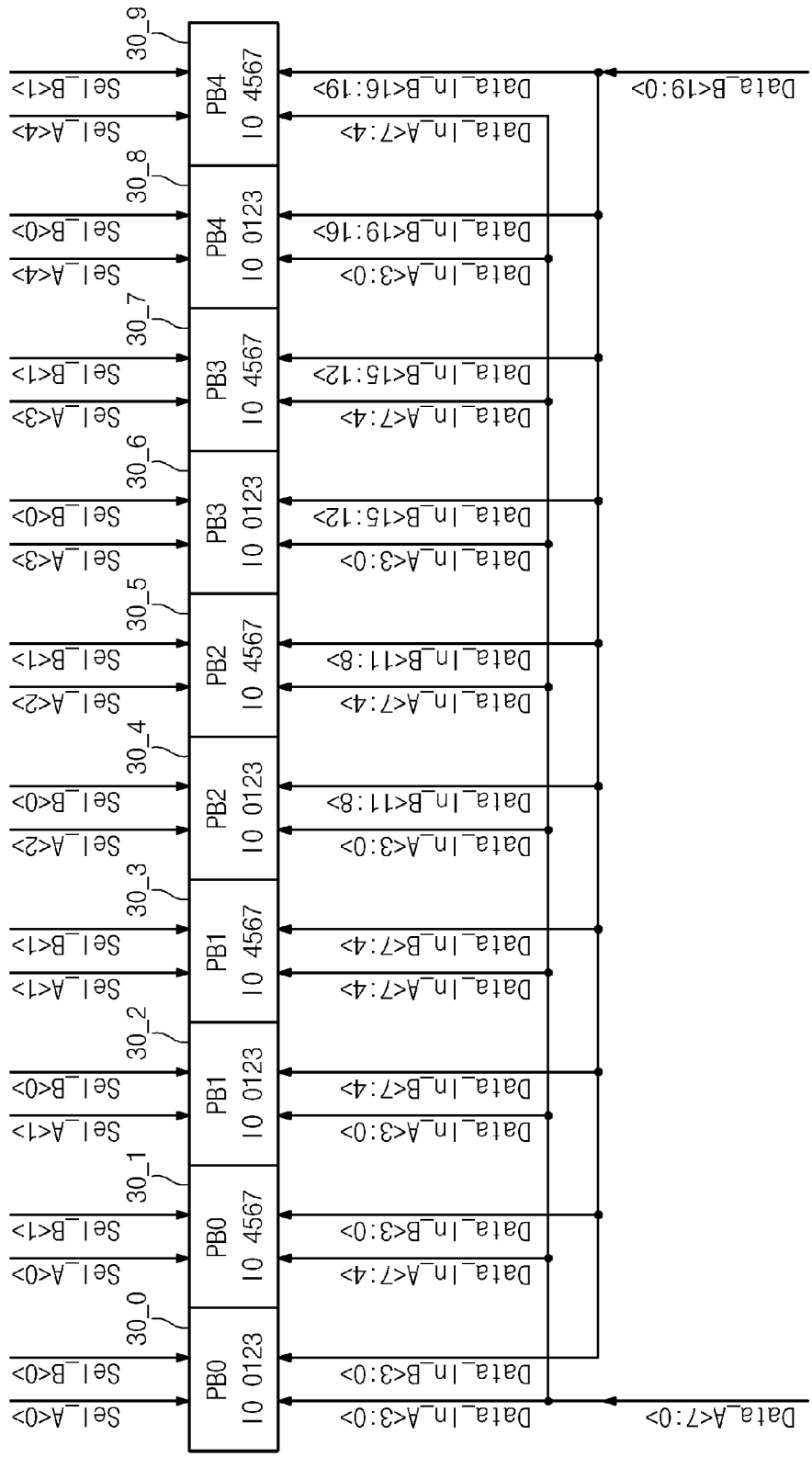
FIG. 18 is a diagram for describing a data write operation associated with a page buffer 102, a column coding circuit 103, and an ECC column coding circuit 108 shown in FIG. 12.

FIG. 18 is a diagram for describing a data write operation of a portion corresponding to a page buffer 102, a column coding circuit 103 and an ECC column coding circuit 108 shown in FIG. 12. A data write operation of a page buffer 102, a column coding circuit 103 and an ECC column coding circuit 108 (here, referred to as a data write model) is performed by an operation of a PB 4IO unit 30_0. A data transfer of the data write model is performed in a direction opposite to a direction shown in FIG. 12, and a description thereof is thus omitted.

In the data write model, for example, at a normal mode, data provided to IO lines IO_0 to IO_3, IO_8 to IO_11, IO_16 to IO_19, IO_24 to IO_27, and IO_32 to IO_35 is not written from DataBus when a selection signal is not provided five times. In this behalf, if a selection signal (e.g., Sel_B<0>) is provided once at the ECC mode, the remaining data is written on the IO lines IO_0 to IO_3, IO_8 to IO_11, IO_16 to IO_19, IO_24 to IO_27, and IO_32 to IO_35 from ECCBus.

A semiconductor memory device (or, a semiconductor memory device) 10 of the inventive concepts comprises a first data bus Data_B<19:0>, a second data bus Data_A<7:0> being different in number from the first data bus and independent from the first data bus Data_B<19:0>, and a data transfer unit (e.g., a PB control circuit 60 of each of PB 4IO units 30_0 to 30_9). When a data transfer with memory cells is performed at the first mode of operation, the data transfer unit connects bit lines, being equal in number to the first data bus, from among a plurality of bit lines to the first data bus to transfer data. When a data transfer with memory cells is performed at the second mode of operation, the data transfer unit connects bit lines, being equal in number to the second data bus, from among a plurality of bit lines to the second data bus to transfer data.

If the number of bit lines is n (n being a common multiple of p and q being a natural number, p>q), the first data bus is q, and the second data bus is q. If (n/p) address signals are received at the first mode of operation, the data transfer unit connects p bit lines to the p first data bus. If (n/q) address signals are received at the second mode of operation, the data transfer unit connects q bit lines to the second data bus.

Also, the NAND flash memory 10 comprises a memory array 101, a page buffer 82 configured to read data from the memory array 101 by the page unit and to store read data read from the memory array 101, an ECC circuit 107 configured to correct an error on the read data transferred from the page buffer 82 and to write the error-corrected data back in the page buffer 82, and an IO pad (or, an interface unit) 106 configured to output the read data written back in the page buffer 82. ECCBus is connected to the ECC circuit 107, and DataBus is connected to the IO pad 106.

In the NAND flash memory 10, the page buffer 82 stores write data received through the IO pad 106, and the ECC circuit 107 generates parity data on the write data transferred from the page buffer 82. The parity data and write data are written back in the page buffer.

By this, it is possible to control column coding, that is, addresses independently by preparing a plurality of data buses (e.g., ECCBus and DataBus). In exemplary embodiments, it is possible to control addresses independently by forming a data bus to be independent from input/output lines of the page buffer 102 (e.g., IO_0 to IO_39), that is, a portion directly connected to the page buffer. Thus, the semiconductor memory device according to an embodiment of the inventive concepts obtains the following effects.

(1) A high-speed operation is implemented by widening a bus width at the first mode of operation (e.g., the ECC mode). There is described such a case that when a column address is received once, 8-bit data is transferred to DataBus at the second mode of operation (e.g., the normal mode) and 20-bit data is transferred at the ECC mode. A bus width is easily widened according to an input of Address_B, that is, column coding to the page buffer 102. For example, if two column addresses are used for 1024 PB units, it is possible to transfer data with the ECCBus being widened a 512-bit bus width at the ECC mode. Also, it is possible to form a data bus independent from a portion directly connected to the page buffer and to control addresses independently. For this reason, as compared with the case that data is transferred to an ECC circuit using a part of the data bus like a conventional technique, a high-speed data transfer is implemented. The reason is that there is not required a circuit (e.g., a first latch circuit 70 of a conventional example) associated with address control for separating a data transfer at the normal mode and a data transfer at the ECC mode. In particular, in case of a defective PB unit, since the PB control circuit 60 transfers fixed data to the ECC circuit 107 through ECCBus, it is unnecessary to transfer data repaired through the column repair circuit 104 on ECC processing to the ECC circuit 107 through ECCBus. Also, it is unnecessary to dispose the column repair circuit 104 on ECCBus the bus width of which is widened. For this reason, a time taken to transfer data from a page buffer to an ECC circuit at ECC processing is shortened by a time taken for repair processing of the column repair circuit 104. Also, since it is unnecessary to widen a bus width of DataBus (e.g., a second data bus) at ECC processing, an increase in a circuit size of the column repair circuit 104 is suppressed.

(2) Freedom on address control and mapping is improved. At a normal mode, when 8-bit data is transferred using a column address, for example, data of IO lines IO_0 to IO_7 is transferred to DataBus by providing a selection signal Sel_A<0> to PB 4 IO units 30_0 and 30_1. In this behalf, at an ECC mode, data on all addresses is transferred to the ECC circuit in a lump by allocating an address independent from the selection signals Sel_B<0> and Sel_B<1> to the PB 4IO units 30_0 and 30_1. For example, although normal data and parity data are assigned to different addresses of the selection signal Sel_A at a normal mode, they are assigned to the same address of the selection signal Sel_B at the ECC mode, and normal data and parity data are transferred to the ECC circuit in a lump. Thus, address control at the second mode of operation and address control at the first mode of operation are independent from each other, and freedom of address mapping is high.

Also, at the normal mode, a column address is used with respect to five selection signals Sel_A<0> to Sel_A<4>. At the ECC mode, a column address is used with respect to two selection signals Sel_B<0> and Sel_B<1>. This means that although a column address has a value not being $2^n$ in case of the user specification of the normal mode, it is easy to change an address space of the ECC mode to a unit space having a value of $2^n$. By this, a code composition of the ECC circuit 107, for example, a code length (e.g., optimization on code length composition in case of cumulative coding) may be decided with freedom, and optimal performance is achieved.

(3) A design change is easily made. In case of designing a product including an ECC circuit, it is assumed that a product is a derivation product and a product not including an ECC circuit is separately designed. In this case, data buses and column coding circuits associated with address control are independent with respect to the ECC mode and the normal mode. By this, it is possible to separate a circuit associated with the ECC mode and a circuit associated with the normal mode. Thus, it is easy to eliminate the circuit associated with the ECC mode. This means that a design change is easily made.

Figure 19A:
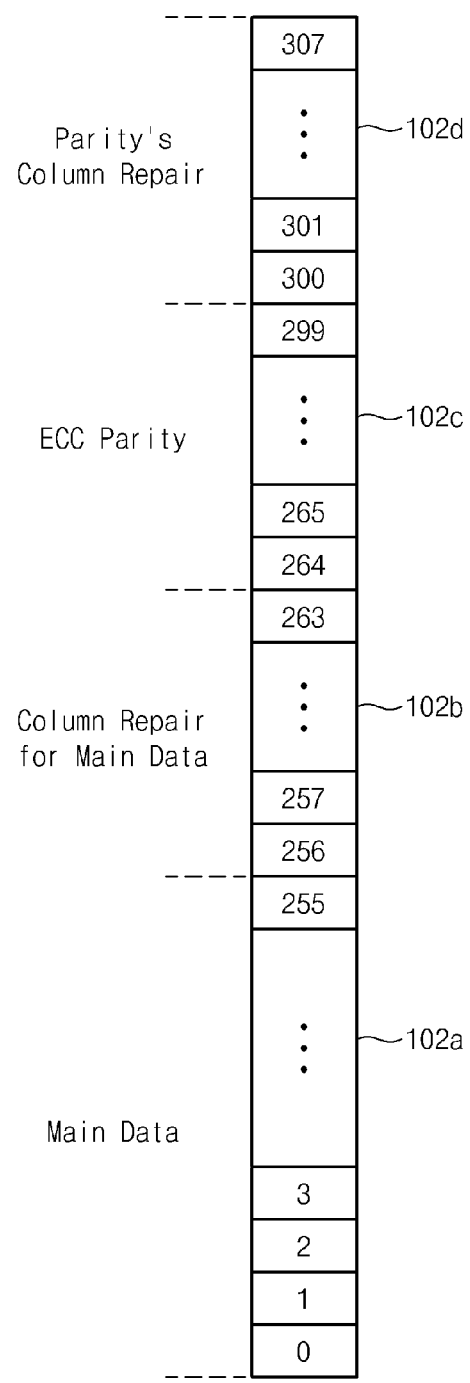
FIGS. 19A, 19B and 19C are diagrams for describing an example of page datas associated with a page buffer 102 shown in FIG. 12.
Figure 19B:
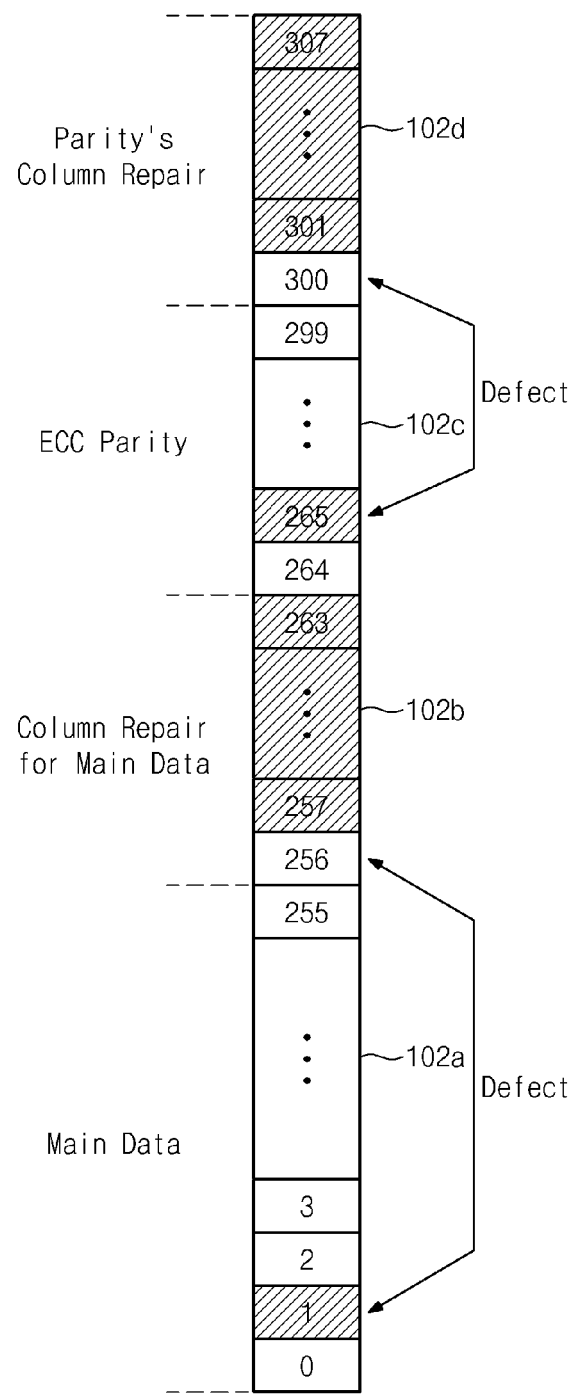
Figure 19C:
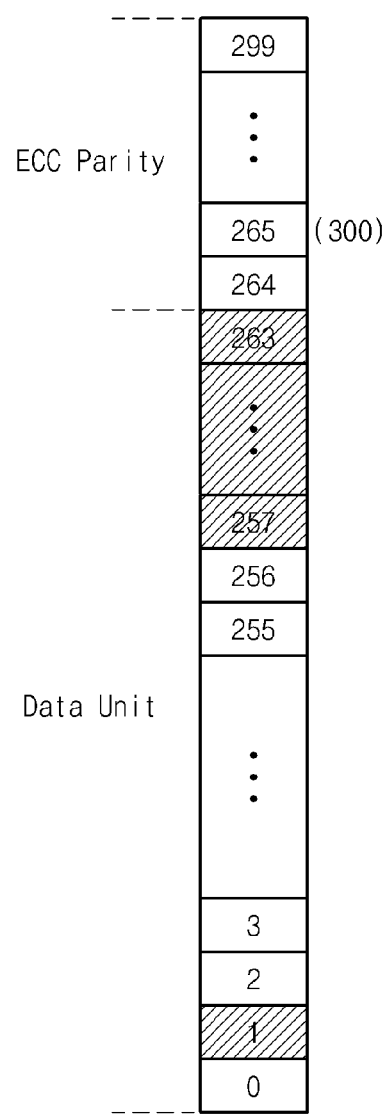
Figure 20A:
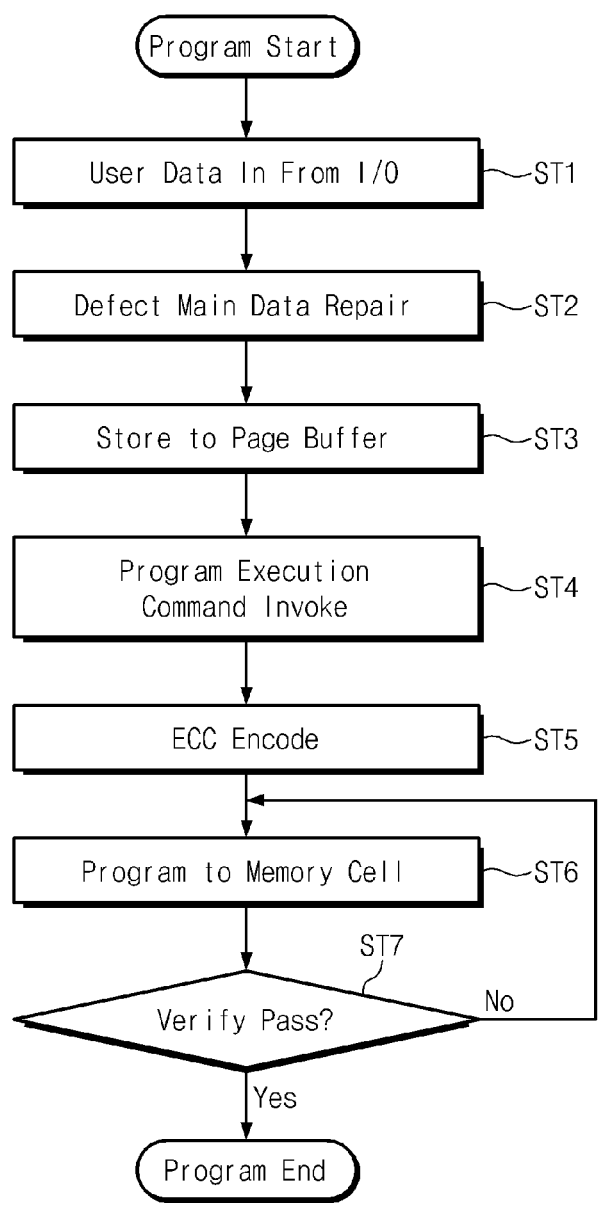
FIGS. 20A, 20B, 20C and 20D are flow charts for describing an operation of a page buffer 102 shown in FIG. 12.

FIGS. 19A, 19B and 19C are diagrams for describing page data associated with a page buffer 102. FIGS. 20A through 2D are flow charts for describing an operation of a page buffer 102. In FIG. 19A, there are schematically illustrated a page buffer 120a for main data (normal data), a page buffer 102b for column repair for main data (repair data of normal data), a page buffer 102c for ECC parity (parity data), and a page buffer 102d for parity's column repair (repair data of parity data). In FIG. 19A, numbers indicate PB units (e.g., a PB control circuit 60 and bit internal circuits 50_0 to 50_7 shown in FIGS. 15 and 16) constituting the page buffers 102a to 102d.

The numbers are numbers of selection signals Sel_A indicating locations of PB units, that is, Coding shown in FIG. 14B. that is, the page buffer 102a includes 256 PB units 0 to 255 for normal data, the page buffer 102b includes 8 PB units 256 to 263 for repair of normal data, the page buffer 102c includes 36 PB units 264 to 299 for parity data, and the page buffer 102d includes 8 PB units 300 to 307 for repair of parity data.

In FIG. 19B, there is illustrated an example in which when eight bit lines connected to a PB unit 1 of the page buffer 102a or memory cell transistors connected to eight bit lines are defective, the PB unit 1 of the page buffer 102a is replaced with a PB unit 256 of the page buffer 102b. Also, in FIG. 19B, there is illustrated an example in which when eight bit lines connected to a PB unit 265 of the page buffer 102c or memory cell transistors connected to eight bit lines are defective, the PB unit 265 of the page buffer 102c is replaced with a PB unit 300 of the page buffer 102d. PB units 257 to 263 of the page buffer 102b corresponding to a slashed portion in FIG. 19B are unused PB units, so that the PB units 257 to 263 are not selected by a column coding circuit 103 under a control of a column repair circuit 104. That is, the PB units 257 to 263 may be at an inactive state. PB units 301 to 307 of the page buffer 102d corresponding to a slashed portion in FIG. 19B are unused PB units, so that the PB units 301 to 307 are not selected by an ECC column coding circuit 108 under a control of a parity column repair circuit 105. That is, the PB units 301 to 307 may be at an inactive state.

At a normal mode, since the PB unit 1 of the page buffer 102a is not selected and the PB unit 256 replaced is selected by a selection signal Sel_A, read data Data_Out_A (e.g., data read from the PB unit 1) is output to an I/O pad 106 through DataBus_1, DataBus_2, and DataBus_3 (e.g., a second data bus). If write data is received from the I/O pad 106 at the normal mode, it is provided to the PB unit 255 through DataBus_3, DataBus_2, and DataBus_1 as the write data Data_A_In (data to be stored in the PB unit 1). As described above, a region of a page buffer where a user may provide a column address is from the PB unit 0 to the PB unit 255. That is, the PB unit 256 to 263 of the page buffer 102b, the PB units 264 to 299 of the page buffer 102c, and the PB units 300 to 307 of the page buffer 102d form a page buffer region that is inaccessible by a user.

The PB unit 1 of the page buffer 102a is selected by a selection signal Sel_B at an ECC mode, and read data Data_Out_B fixed to a low level or a high level is transferred to an ECC circuit 107 through ECCBus_1 and ECCBus_2 (e.g., a first data bus) to be used for ECC processing. Also, the repaired PB unit 256 is selected by the selection signal Sel_B, and read data Data_Out_B is transferred to the ECC circuit 107 through ECCBus_1, ECCBus_2, and ECCBus_3 to be used for ECC processing as read data of the PB unit 1 seen from the user. At the ECC mode, if the ECC processing is ended, data to be written back at the PB unit 1 is provided to the PB unit 255 through ECCBus_3, ECCBus_2, and ECCBus_1 (e.g., a first data bus) as write data Data_A_In. In addition, data, corresponding to PB units 0 to 255, from among ECC-processed data may be provided to the external device as clear data through a data bus Data_A.

The PB unit 265 of the page buffer 102c is selected by the selection signal Sel_B at the ECC mode, and read data Data_Out_B fixed to a low level or a high level is transferred to a parity column repair circuit 105 through ECCBus_1 and ECCBus_2 (e.g., data bus Data_B). Also, the repaired PB unit 300 is selected by the selection signal Sel_B, and read data Data_Out_B is transferred to the parity column repair circuit 105 through ECCBus_1 and ECCBus_2 to repair processing. At the ECC mode, if the ECC processing is ended, data to be written back at the PB unit 265 is provided to the parity column repair circuit 105 through ECCBus_3 for repair processing, and resultant data is then provided to the PB unit 300 through ECCBus_2 and ECCBus_1 (e.g., a first data bus) as write data Data_A_In. In addition, ECC-processed data is not output to the external device through the data bus Data_A as described above.

Figure 20B:
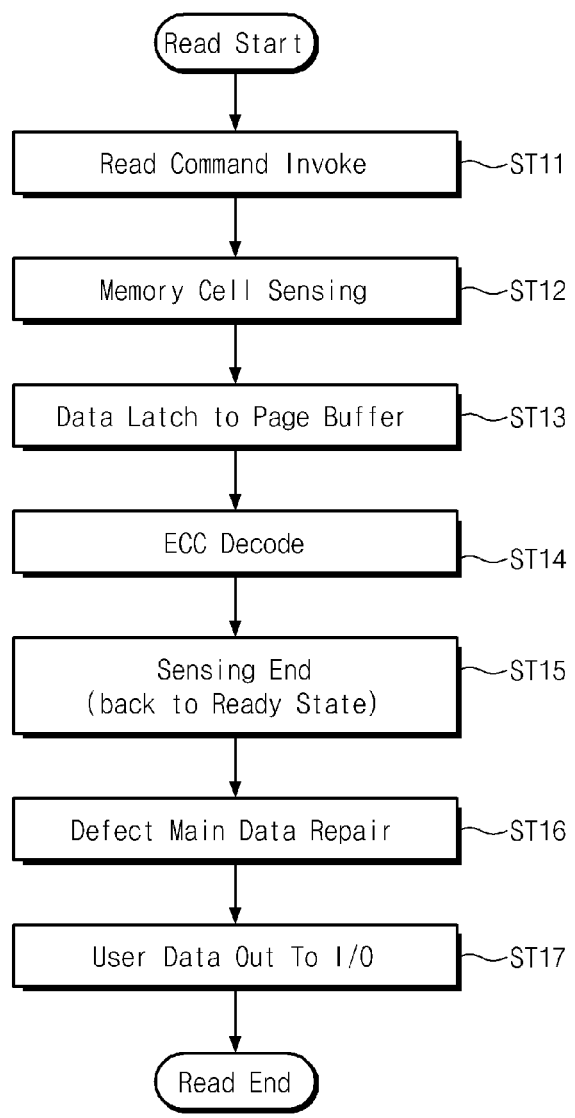
Figure 20C:
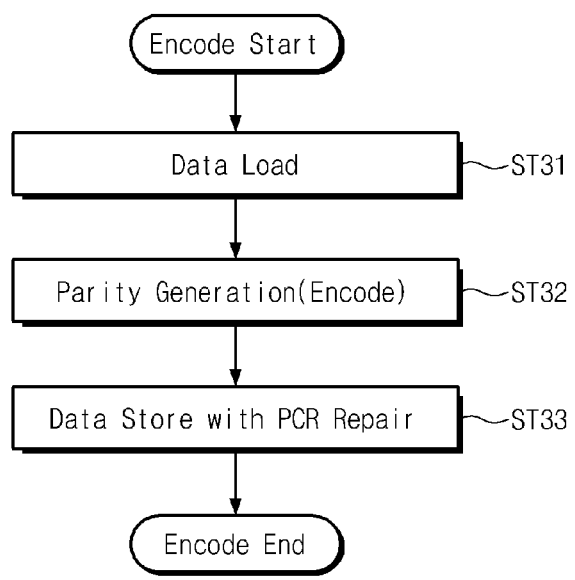
Figure 20D:
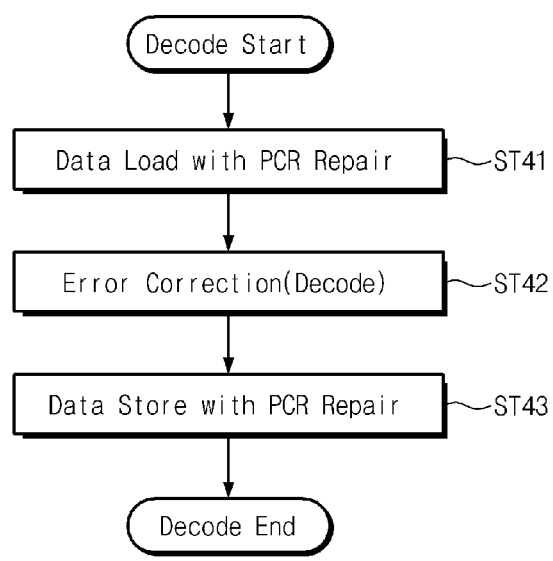

A data write operation to a memory cell transistor and a data read operation from a memory cell transistor are described with reference to FIG. 20A through 20D. FIG. 20A shows a data write operation, FIG. 20B shows a data read operation, FIG. 20C show an ECC encoding operation, and FIG. 20D shows an ECC decoding operation.

Data Write Operation

In step ST1, a user provides a NAND flash memory 10 with a predetermined command (e.g., a write command), an address (here, indicating a column address selecting a PB unit 1), and write data through an I/O pad 106. In step ST2, a repair of normal data is executed. More particular, a column coding circuit 103 selects a PB unit 256 instead of a PB unit 1 under a control of a column repair circuit 104 such that the write data is stored in the PB unit 256.

After a time elapses, the method proceeds step ST6 when a mode is a normal mode (e.g., a second operation mode) where the user invokes a program execution command. In step ST6, programming is executed such that data is transferred to a memory cell transistor from a page buffer through a bit line. In case of an ECC mode (e.g., a first mode of operation), the method proceeds to step ST5 to execute an ECC encoding operation as follows.

Here, FIG. 19C shows a code structure at ECC processing. A data unit is data stored in PB units 0 to 263, and a parity unit (ECC unit) is data stored in PB units 264 to 299. Data to be written in the PB unit 1 is stored in the PB unit 256, and data stored in memory cell transistors are read and stored in PB units 0 and 2 to 255 through connected thereto. In step ST31, data stored in the PB units 0 to 263 is provided to an ECC circuit 107 through ECCBus_1, ECCBus_2, and ECCBus_3 (e.g., a first data bus).

As described above, at this time, fixed data (e.g., L data in case of a PB control circuit 60 shown in FIG. 15 or H data in case of a PB control circuit 60 shown in FIG. 16) is provided from the PB unit 1 to the ECC circuit 107. Data that is data to be written in the PB unit but data written in the PB unit 256 is provided to the ECC circuit 107 from the PB unit 256. The ECC circuit 107 generates parity data through an encoding operation (ST32).

The ECC circuit 107 stores ECC-processed data in the PB units 0 to 263 (ST33). At this time, an ECC coding circuit 108 selects a PB unit 300 instead of a PB unit 265 under a control of a column repair circuit 105. By this, parity data to be written back in the PB unit 265 is stored in the PB unit 300. At encoding, data is not written back to the PB units 0 to 263. However, the same data may be written back. Parity data is written at PB units 264 to 307. A page buffer having an inactive state as a slashed portion in FIG. 19B is not written by a circuit shown in FIG. 15 or 16.

Since data Data_i to be written at a memory cell is latched by a latch unit of each PB unit, a memory cell transistor is programmed (ST6). Data is iteratively provided to a memory cell from a latch unit of each PB unit until a program operation is passed (ST7). If the program operation is passed, the iterative process is ended (ST7—Yes). If the program operation is not passed, the procedure goes to step ST6 for a program operation until the program operation is passed (ST7—No).

Data Read Operation

A user provides a predetermined command (e.g., a read command) and an address (e.g., a column address selecting the PB unit 1) (ST11). Data of a memory cell transistor is sensed by a latch unit of each PB unit and the sensed data is latched on a connection node N1 of a bit internal circuit show in FIG. 16 (ST12). Data_i is latched by the latch unit of the bit internal circuit (ST13). In case of a normal mode (e.g., a second mode of operation), the procedure goes to step ST15 to end a sensing operation. In case of an ECC mode (e.g., a first mode of operation), the procedure goes to step ST14 to perform an ECC decoding operation as follows.

Data stored in PB units 0 to 299 is provided to the ECC circuit 107 through ECCBus_1, ECCBus_2, and ECCBus_3 (e.g., a first data bus).

As described above, at this time, fixed data (e.g., L data in case of a PB control circuit 60 shown in FIG. 15 or H data in case of a PB control circuit 60 shown in FIG. 16) is provided from the PB unit 1 to the ECC circuit 107. Also, data that is data to be written in the PB unit 1 but data written in the PB unit 256 is provided to the ECC circuit 107 from the PB unit 256. Fixed data is provided from the PB unit 265 to the ECC circuit 107. Also, parity data that is data to be written in the PB unit 265 but data written in the PB unit 300 is provided to the ECC circuit 107 from the PB unit 300. Also, parity data that is data to be written in the PB unit 265 but data written in the PB unit 300 is provided to a parity column repair circuit 105 from the PB unit 300 through ECCBus_1 and ECCBus_2. After a repair operation, resultant data is provided to the ECC circuit 107 through ECCBus_3. The ECC circuit 107 corrects an error of data stored in the PB units 0 to 263 through a decoding operation, based on parity data (ST42).

The ECC circuit 107 stores ECC-processed data in the PB units 0 to 299 (ST43). ECC-processed data (e.g., error-corrected data) is stored in the PB units 0 to 263. Since parity data units of PB units 264 to 307 are not used by the user, ECC-processed data (e.g., error-corrected data) is not stored in the PB units 264 to 307. However, it is possible to store ECC-processed data (e.g., error-corrected data) in the PB units 264 to 307. The PB unit 300 is selected instead of the PB unit 265 under a control of a parity column repair circuit 105. By this, error-corrected parity data to be written back in the PB unit 265 is stored in the PB unit 300. A page buffer having an inactive state as a slashed portion in FIG. 19B is not written by a circuit shown in FIG. 15 or 16.

Since data Data_i to be written at a memory cell is latched by a latch unit of each PB unit shown in FIG. 17, a sensing operation is ended and it enters a readable state (ST15).

As a selection signal Sel_A is provided to the PB units 0 to 255, data stored therein is read through DataBus_1, DataBus_2, and DataBus_3.

At this time, a column coding circuit 103 selects the PB unit 256 instead of the PB unit 1 under a control of the column repair circuit 104. The PB unit 256 outputs data that is data to be written at the PB unit 1 but data written at the PB unit 256. That is, a defect column is repaired (ST16). As described above, write data written at memory cell transistors through the PB unit 1 according to a user's request is written at another memory cell after repairing. Also, an error of the written data is corrected and the error-corrected data is output from the I/O pad (ST17).

A semiconductor memory device of the inventive concepts comprises ECCBus_1 to ECCBus_3 (e.g., a first data bus), DataBus_1 to DataBus_3 (e.g., a second data bus) being different in number from the first data bus and independent from the first data bus, and a page buffer 102 (e.g., a data transfer unit). When a data transfer with memory cells is performed at an ECC mode (e.g., a first mode of operation), the page buffer connects bit lines, being equal in number to the first data bus, from among a plurality of bit lines to the first data bus to transfer data. When a data transfer with memory cells is performed at a normal mode (e.g., a second mode of operation), the page buffer connects bit lines, being equal in number to the second data bus, from among a plurality of bit lines to the second data bus to transfer data. Also, the data transfer unit comprises a page buffer 102a (e.g., a first page buffer) that amplifies a voltage of a bit line connected to a normal memory cell and latches the amplified result, a page buffer 102b (e.g., a second page buffer) that is replaced together with a normal memory cell and a bit line when the normal memory cell or the bit line connected to the first page buffer is defective, and a page buffer 102c (e.g., a third page buffer) that amplifies a voltage of a bit line connected to a parity memory cell and latches the amplified result. Also, the second data bus is connected to the first and second page buffers, and the first data bus is connected to the first to third page buffers.

Also, the semiconductor memory device comprises a page buffer 102 (e.g., a fourth page buffer) that is replaced together with a parity memory cell and a bit line when the parity memory cell or the bit line connected to the third page buffer is defective, a column repair circuit 104 (e.g., a first repair circuit) that is connected to the second bus and repairs a page buffer, connected to a defective memory cell or bit line, from among the first page buffer with the second page buffer, a parity column repair circuit 105 (e.g., a second repair circuit) that is connected to the first bus and repairs a page buffer, connected to a defective memory cell or bit line, from among the third page buffer with the fourth page buffer, and an ECC circuit 107 that is connected to the first data bus and corrects an error of output data of the first and second page buffers based on output data of the third and fourth page buffers.

Also, the semiconductor memory device comprises a PB control circuit 60 that sets an output of a page, connected to a defective memory cell or bit line, from among the first page buffer, to fixed data.

Also, when a memory cell or a bit line is defective, the PB control circuit does not allow writing from the first data bus.

Also, in a semiconductor memory device of the inventive concepts, during the first mode of operation, it is viewed as input data of the ECC circuit without a repair of a page buffer, corresponding to a defective memory cell or bit line, from among the first page buffer and the second page buffer existing for a repair at the second mode of operation.

Also, If the number of bit lines is n (n being a common multiple of p and q being a natural number, p>q), the first data bus is q, and the second data bus is q. If (n/p) address signals are received at the first mode of operation, the data transfer unit connects p bit lines to the p first data bus. If (n/q) address signals are received at the second mode of operation, the data transfer unit connects q bit lines to the second data bus. Although the number n of physical bit lines is not a common multiple of p and q, the remaining may be used as dummy bit lines.

With the inventive concepts, since it is easy to widen a bus width of the ECC bus (e.g., a first data bus) to the ECC circuit 107 (e.g., a bus width to the ECC circuit being 300 bits), also, a repair circuit (e.g., a column repair circuit 104) of a main data unit is unnecessary on the ECC bus. For this reason, it is possible to implement a high-speed data transfer at ECC processing. Also, since a size of a repair circuit of the main data unit is not increased unlike a conventional technique, an increase in chip size is suppressed and a cost for fabrication is lowered.

Also, in exemplary embodiments, there is described an embodiment where there is used a PCR repair system (e.g., a parity column repair circuit 105) dedicated to a parity unit having a size smaller than that of a repair circuit of the main data unit. However, the inventive concepts are not limited thereto. Only, the parity column repair circuit 105 is useful to repair a defect of the parity unit. In the event that the parity column repair circuit 105 is not used, the error correction capacity is damaged. The reason is that an error is corrected by probability of 50% (0 or 1) per bit of column. In this behalf, as described above, the ECC correction capacity is improved by repairing a defect of the parity unit using the parity column repair circuit 105.

Third Embodiment

There is provided a semiconductor memory device configured to prevent an increase in size of a repair circuit for replacing a page buffer associated with a defective memory cell or a defective bit line with a defect-free page buffer and to implement a high-speed data transfer of an ECC circuit. A data transfer unit comprises a page buffer 102a that amplifies a voltage of a bit line connected to a normal memory cell and latches the amplified result, a page buffer 102b that is replaced together with a normal memory cell and a bit line when the normal memory cell or the bit line connected to the page buffer 102a is defective, and a page buffer 102c that amplifies a voltage of a bit line connected to a parity normal memory cell and latches the amplified result. DataBus_1 is connected to the page buffers 102a and 102b, and DataBus_2 is connected to the page buffers 102a, 102b, and 102c.

In a conventional semiconductor memory device, a so-called data bus connecting an I/O pad (e.g., an interface unit) and a memory array is formed of a single bus when seen from a sense amplifier (referred to as a page buffer in a flash memory).

Figure 44:
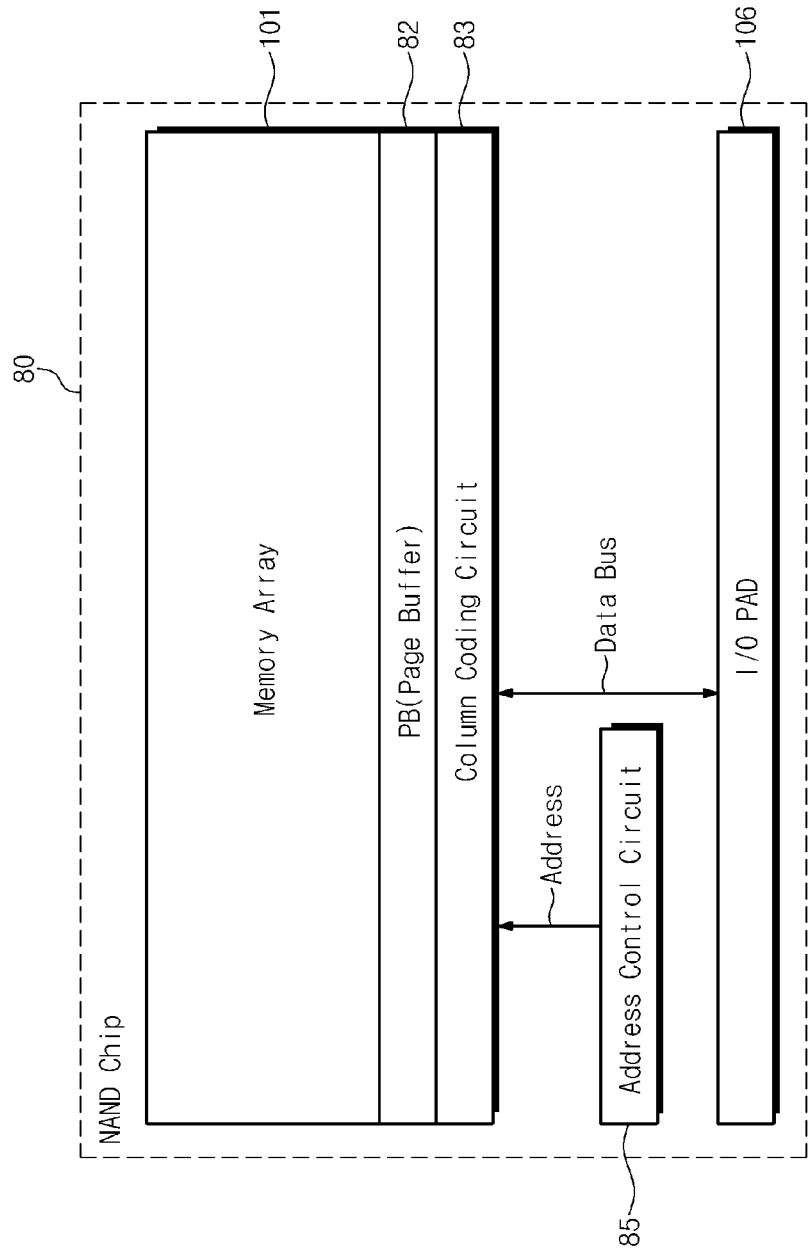
FIG. 44 is a block diagram showing a general NAND flash memory.

FIG. 44 is a block diagram schematically illustrating a conventional NAND flash memory. The NAND flash memory 80 shown in FIG. 44 comprises a memory array 101, a page buffer 82, a column coding circuit 83, an address control circuit 85, and an I/O pad 106. The memory array 101 is configured to include a plurality of memory cell transistors. Each of the memory cell transistors stores 1-bit data. A plurality of memory cell transistors of the memory array 101 connected to the same word line forms a page. Data is written at and read from memory cell transistors in a page at the same time.

Figure 45:
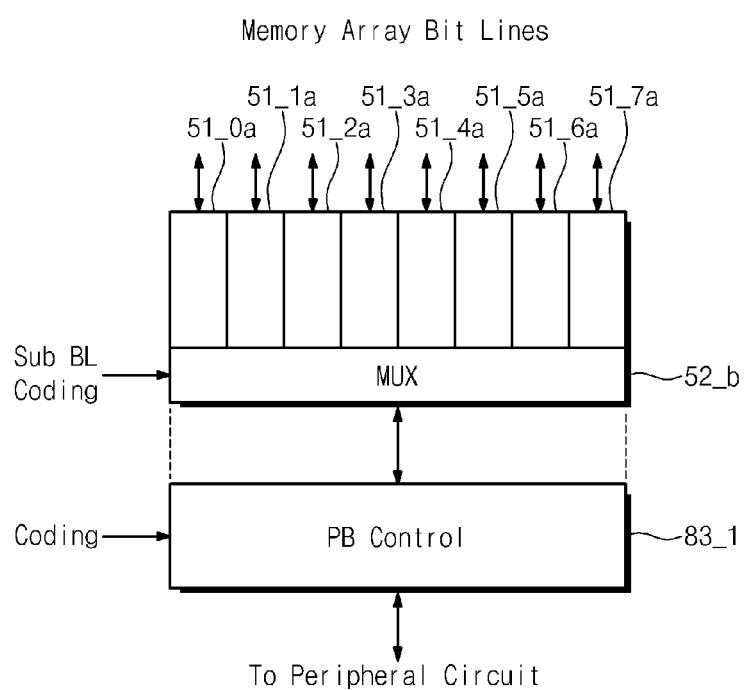
FIG. 45 is a diagram for describing a page buffer unit of a page buffer 82 shown in FIG. 44.
Figure 46:
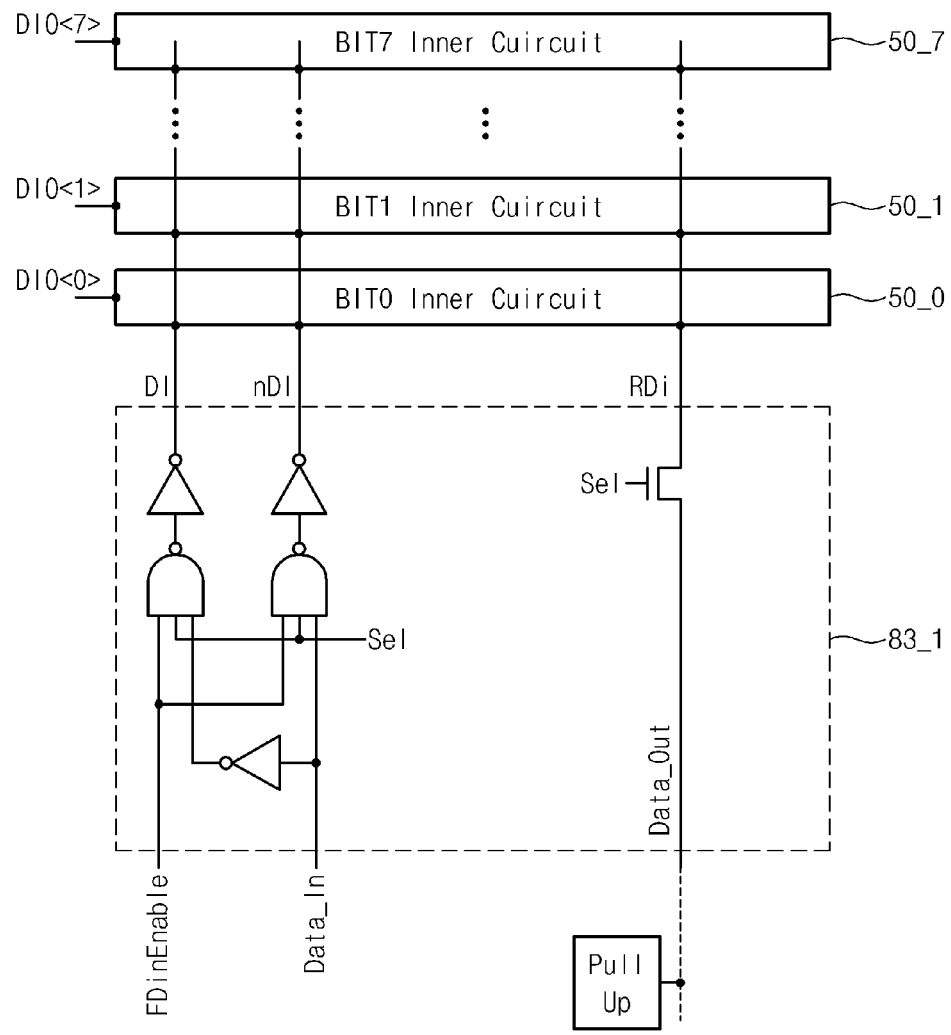
FIG. 46 is a circuit diagram showing a conventional page buffer unit.

The page buffer 82 is configured to store data corresponding to a page of the memory array 101. FIG. 45 is a diagram schematically illustrating a page buffer unit of a page buffer 82. FIG. 46 is a circuit diagram of a conventional page buffer unit. The page buffer 82 includes a page buffer unit shown in FIG. 45 in plurality. The page buffer unit comprises bit circuits 51_0a to 51_7a that are respectively connected to bit lines and store data read from memory cells through the bit lines or data to be written at memory cells through the bit lines.

A multiplexer 52_b receives a column address (Sub BL Coding) from a column coding circuit 83 shown in FIG. 44 and selects one of the bit circuits 51_0a to 51_7a based on the column address (indicating DIO<i> in FIG. 46). That is, the multiplexer 52_b connects one of eight bit lines to a PB control circuit 83_1.

The PB control circuit (or, a transfer unit) 83_1 receives a column address Coding (indicating a selection signal Sel in FIG. 46) from the column coding circuit 83 shown in FIG. 44 and connects a bit circuit selected by the multiplexer 52_b to a peripheral circuit through a data bus.

With the above-described structure, each memory cell transistor in a page is connected to a bit circuit of the page buffer 82 through a bit line. One, selected by a column address, from among the bit lines is connected to the data bus such that data is written at or read from a memory cell.

Returning to FIG. 44, the column coding circuit 83 generates column address signals (Sub BL Coding and Coding shown in FIG. 45) based on a column address received from an address control circuit 85. The column coding circuit 83 selects a page buffer unit in the page buffer 82 corresponding to the column address. Thereby, data is written at a memory cell transistor through the I/O pad 106, the data bus, the bit circuit and the bit line. Also, data read from a memory cell is output to the exterior of the I/O pad 106 through the bit line, the bit circuit and the data bus.

The data bus is a wiring used to input and output data between the page buffer 82 and the I/O pad 106 and is formed of 8 or 16 lines. The I/O pad (an interface unit) 106 is an external terminal for data input/output between the NAND flash memory 80 and the exterior.

In a NAND flash memory, as a storage characteristic of a memory element (a memory cell transistor) disappears during data preservation due to deterioration of a tunnel oxide film caused by a plurality of write operations, an error bit generation rate (an error rate) increases. In particular, in the NAND flash memory, an error rate increases in proportion to an increase in storage capacity of a memory cell, that is, scale-down of a fabrication process. For this reason, redundancy data (parity data) of an error correcting code (ECC) is added to data to be written, and the redundancy data is together written in a flash memory as a data stream. During a read operation, data is corrected using the redundancy data of the error correcting code. When an error bit is generated, data is corrected. The ECC may be processed outside or inside the NAND flash memory.

Figure 47:
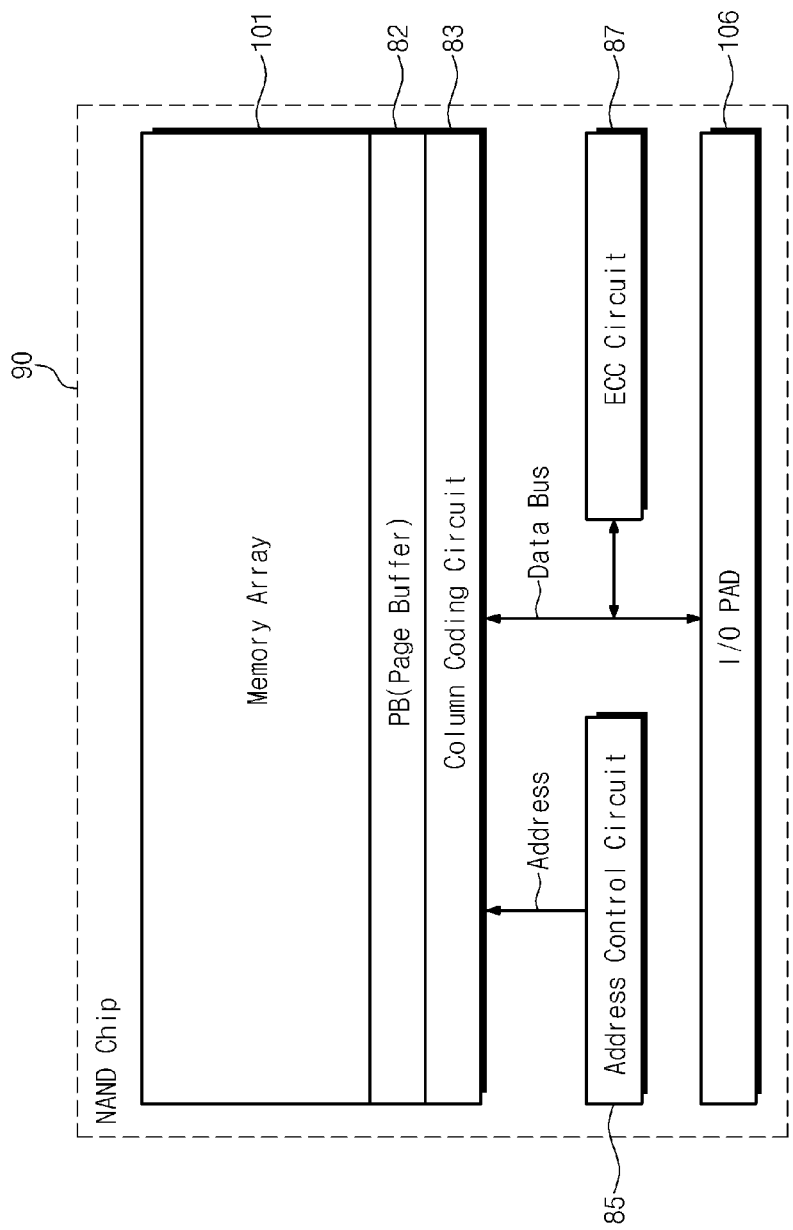
FIG. 47 is a block diagram schematically illustrating a NAND flash memory including an ECC circuit.

In the event that the ECC is processed outside the NAND flash memory 80, a memory controller connected through the I/O pad 106 processes the ECC. Meanwhile, in the event that the ECC is processed inside the NAND flash memory 80, the NAND flash memory 80 necessitates an error detecting and correcting circuit (an ECC unit). FIG. 47 is a block diagram schematically illustrating a NAND flash memory including an ECC circuit. In FIG. 47, constituent elements that are the same as those in FIG. 44 are marked by the same reference numerals, and a description thereof is thus omitted. A NAND flash memory 90 shown in FIG. 47 further comprises an ECC circuit 87 as compared with a NAND flash memory 80 shown in FIG. 44. The ECC circuit 87 is connected to a data bus.

When data is read from memory cell transistors, the ECC circuit 87 sequentially receives data (including normal data and redundancy data) corresponding to a page of memory cell transistors and to be stored in the page buffer 82 through the data bus, and determines whether an error exists at each bit, based on the page data. The ECC circuit 87 corrects data when an error exists, and sequentially writes corrected data back in each bit circuit of the page buffer 82 through the data bus. Afterwards, the address control circuit 85 provides a column address to the column coding circuit 83, the column coding circuit 83 selects a page buffer unit of the page buffer 82, and the corrected data stored in the page buffer 82 is read from the I/O pad 106.

When data is written at memory cell transistors, a page of normal data is provided from the page buffer 82 to the ECC circuit 87 and new data is simultaneously provided to the ECC circuit 87 from the I/O pad 106. Redundancy data is generated based on the page of normal data including the new data, the normal data and the redundancy data are written at the page buffer 82, and data is written at memory cell transistors through a write (program) operation.

In the NAND flash memory 90, when the ECC is processed, data is not output to the exterior using a bus width of the I/O pad 106 at a data read mode. For this reason, a time necessitates to process the ECC. To reduce a time taken to process the ECC, such a manner that a bus width is widened at processing of the ECC may be considered. For example, in a patent reference 1(JP Publication Number 2012-128921), there is disclosed a semiconductor memory device including a transfer unit that performs a data transfer between a page buffer and an ECC circuit using a first data bus at a first mode of operation and performs a data transfer using a part of the first data bus at a second mode of operation where the ECC is not processed.

Figure 48:
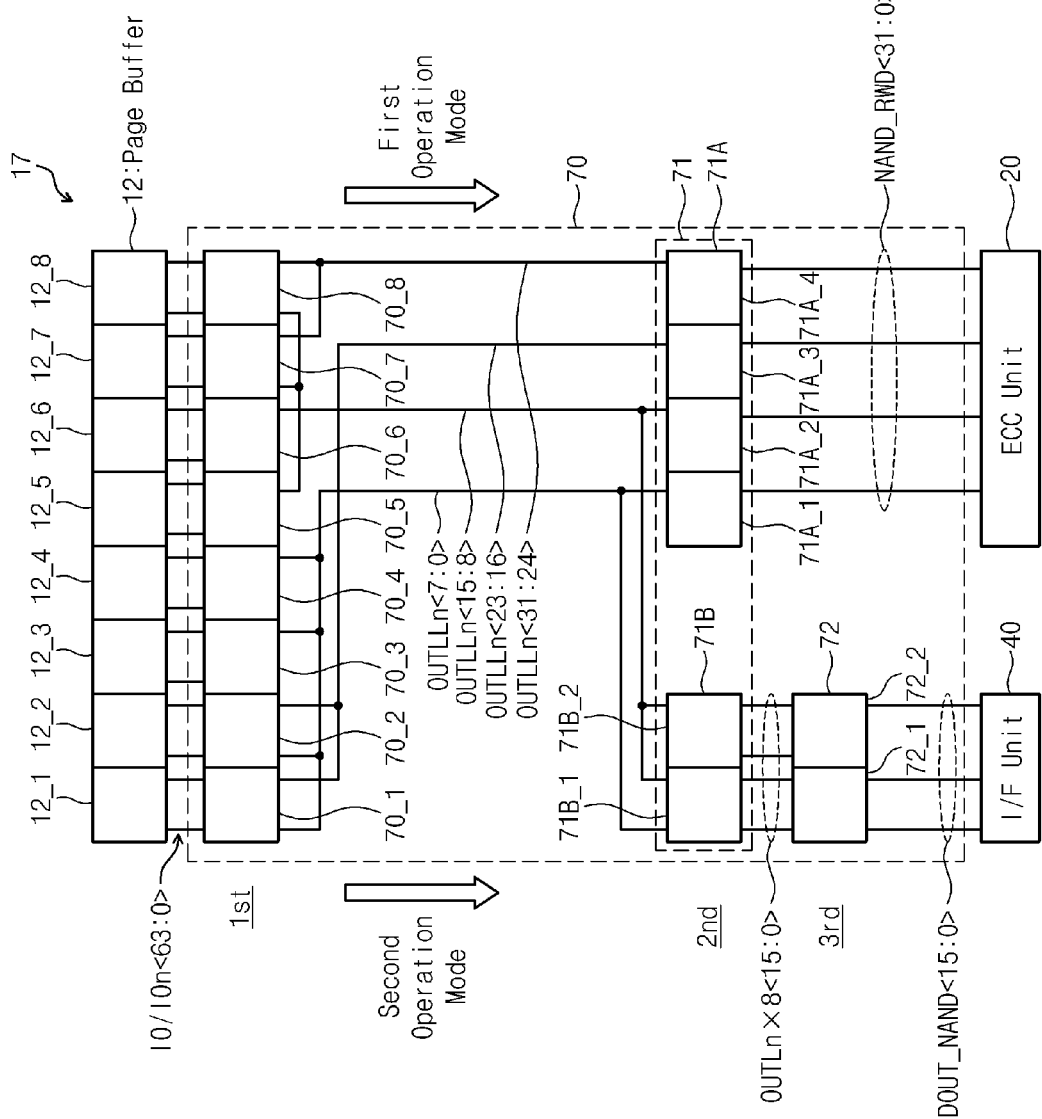
FIG. 48 is a block diagram schematically illustrating another example of a NAND flash memory including an ECC circuit.

FIG. 48 is a block diagram schematically illustrating another example of a NAND flash memory including an ECC circuit. FIG. 48 shows a transfer unit 17 disclosed in FIG. 26 of the aforementioned patent reference 1. In FIG. 48, modes of operation indicated by arrows are respectively referred to as a first mode of operation and a second mode of operation. For ease of description, page buffers respectively corresponding to 8 bits are marked by reference numerals 12_1 to 12_8, respectively. In FIG. 48, a box including a first latch circuit 70, a second latch circuit 71 (including 71A and 71B), and a third latch circuit 72 indicates an 8-bit latch circuit.

Below, an operation of the transfer unit 17 when a data read operation is performed will be described. The transfer unit 17 transfers read data from the page buffers 12_1 to 12_8 to latch circuits 71_1 to 70_8 through a data bus IO/IOn<63:0> during either one of a first mode of operation using an ECC unit 20 and a second mode of operation not using the ECC unit 20. Here, the latch circuit 70_1 is connected to the data bus IO/IOn<7:0>, the latch circuit 70_2 is connected to the data bus IO/IOn<15:8>, the latch circuit 70_3 is connected to the data bus IO/IOn<23:16>, and the latch circuit 70_4 is connected to the data bus IO/IOn<31:24>. The latch circuit 70_5 is connected to the data bus IO/IOn<39:32>, the latch circuit 70_6 is connected to the data bus IO/IOn<47:40>, the latch circuit 70_7 is connected to the data bus IO/IOn<55:48>, and the latch circuit 70_8 is connected to the data bus IO/IOn<63:56>.

At the second mode of operation, a column address is provided to the latch circuits 70_1 to 70_8 four times such that 64-bit data supplied to the latch circuits 70_1 to 70_8 is output to an 8-bit data bus OUTLLn<7:0> and an 8-bit data bus OUTLLn<15:8>. Here, column addresses supplied four times are called as follows. That is, column addresses supplied to the latch circuit 70_1 to 70_4 is referred to as column addresses CA1 to CA4. That is, the column addresses CA1 to CA4 are sequentially supplied to the latch circuit 70_1 to 70_4, so that each of 8-bit data stored in the latch circuit 70_1, 8-bit data stored in the latch circuit 70_2, 8-bit data stored in the latch circuit 70_3, and 8-bit data stored in the latch circuit 70_4 is transferred to the latch circuit 71_B1 through the 8-bit data bus OUTLLn<7:0>.

Also, the column addresses CA1 to CA4 are sequentially supplied to the latch circuit 70_5 to 70_8, so that each of 8-bit data stored in the latch circuit 70_5, 8-bit data stored in the latch circuit 70_6, 8-bit data stored in the latch circuit 70_7, and 8-bit data stored in the latch circuit 70_8 is transferred to the latch circuit 71B_2 through the 8-bit data bus OUTLLn<15:8>.

At the first mode of operation, a bus width is doubled to transfer data of the latch circuits 70_1 to 70_8 to the ECC unit 20. That is, a data bus OUTLLn<23:16> and a data bus OUTLLn<31:24> are installed to be substantially the same as the data buses OUTLLn<7:0> and OUTLLn<15:8>. With the above description, at the first mode of operation, the latch circuits 70_1 to 70_8 transfer stored data to the latch circuits 71A_1 to 71A_4 when the column addresses CA1 to CA4 are received. The column addresses CA1 and CA3 are first supplied to the latch circuits 70_1 to 70_8, and the column addresses CA2 and CA4 are then supplied to the latch circuits 70_1 to 70_8.

First, when the column addresses CA1 and CA3 are supplied at the same time, the latch circuits 70_1, 70_3, 70_5, and 70_7 transfer data. The latch circuit 70_1 transfers 8-bit data to the data bus OUTLLn<23:16> in response to the column address CA1 so as to be transferred to the latch circuit 71A_3. The latch circuit 70_3 transfers 8-bit data to the data bus OUTLLn<7:0> in response to the column address CA3 so as to be transferred to the latch circuit 71A_1. The latch circuit 70_5 transfers 8-bit data to the data bus OUTLLn<15:8> in response to the column address CA1 so as to be transferred to the latch circuit 71A_2. The latch circuit 70_7 transfers 8-bit data to the data bus OUTLLn<31:24> in response to the column address CA3 so as to be transferred to the latch circuit 71A_4.

When there are simultaneously received the column addresses CA2 and CA4 following the column addresses CA1 and CA3, the latch circuits 70_2, 70_4, 70_6, and 70_8 transfer data. The latch circuit 70_2 transfers 8-bit data to the data bus OUTLLn<23:16> in response to the column address CA2 so as to be transferred to the latch circuit 71A_3. The latch circuit 70_4 transfers 8-bit data to the data bus OUTLLn<7:0> in response to the column address CA4 so as to be transferred to the latch circuit 71A_1. The latch circuit 70_6 transfers 8-bit data to the data bus OUTLLn<15:8> in response to the column address CA2 so as to be transferred to the latch circuit 71A_1. The latch circuit 70_8 transfers 8-bit data to the data bus OUTLLn<31:24> in response to the column address CA4 so as to be transferred to the latch circuit 71A_4.

In the first mode of operation, the transfer unit 17 includes the first latch circuit 70 to latch data (e.g., 64-bit data of memory cell transistors) output from the page buffer 12 using the data bus IO/IOn<63:0> operating at the second mode of operation. As the number of column addresses supplied at the second mode of operation is set to be two times more than the number of column addresses supplied at the first mode of operation, the transfer unit 17 transfers data to the next-stage latch circuits 71A_1 to 71A_4 using a part of the data bus used at the second mode of operation.

It is possible to output data in high speed by using a data bus for the second mode of operation in common and widening a bus width at the first mode of operation. For this reason, a delay caused to operate a circuit (e.g., the latch circuit 70) for switching the second mode of operation (i.e., a normal mode) and the first mode of operation (i.e., an ECC mode) arises. As described above, at the ECC mode, an address decided to an address of a normal mode is supplied such that data is output to a bus the width of which is widened. A high-speed data transfer is delayed by a time needed for processing.

Also, when data is transferred, since an address of data transferred to a data bus is decided using an address of a normal mode, it is impossible to transfer data of an address selected by a user at the ECC mode. For example, referring to the above description, when all column addresses CA1 to CA4 are simultaneously selected, data of IO/IOn<63:32> or IO/IOn<31:0> is not transferred to the ECC circuit at the same time. In a conventional technique, when data is transferred, addresses are not controlled independently with respect to two modes of operation. That is, freedom on address control is low.

Further, in the event that a design of a NAND flash memory including such an ECC circuit is changed to a design of a NAND flash memory 80 (refer to FIG. 44) not including the ECC circuit, a design change is made to delete a function of the first mode of operation on the latch circuit 70 (e.g., to prevent data corresponding to two column addresses from being output at the same time). A design change is made such that data corresponding to two column addresses are prevented from being output at the same time. This is achieved through a design change of an address control circuit. In a conventional technique, a part of a data bus is shared with respect to the first mode of operation and the second mode of operation. For this reason, a design is complicated when a design change is made to delete an ECC function.

Also, in a conventional structure, a product (e.g., a NAND flash memory) has a first mode of operation and a second mode of operation. Before shipment, it is impossible to test each mode of operation under such a condition that a product (e.g., Pure NAND) including the second mode of operation and a product (e.g., EM NAND) including the first mode of operation are switched in operation. Therefore, the Pure NAND and the EM NAND are fabricated independently, and are tested before shipment. Or, inventory control is made according to an order. For this reason, it is difficult to improve productivity.

In the event that a bus width used at the first mode of operation is widened to a bus width used at the second mode of operation, a high-speed data transfer is achieved and freedom on address control is improved. The effects are achieved through a transfer unit of a semiconductor memory device according to the inventive concepts.

A semiconductor memory device comprises a first data bus; a second data bus being different in number from the first data bus and independent from the first data bus; and a data transfer unit, wherein when a data transfer with memory cells is performed at a first mode of operation, the data transfer unit connects bit lines, being equal in number to the first data bus, from among a plurality of bit lines to the first data bus to transfer data; wherein when a data transfer with memory cells is performed at a second mode of operation, the data transfer unit connects bit lines, being equal in number to the second data bus, from among the plurality of bit lines to the second data bus to transfer data, wherein the data transfer unit comprises a first page buffer which latches data of a bit line connected to a normal memory cell; and a second page buffer which latches data of a bit line connected to a parity memory cell, wherein the first data bus and the second data bus are connected to the first page buffer and the second page buffer, wherein the semiconductor memory device further comprises an ECC circuit which is connected to the first data bus and corrects an error of output data of the first page buffer based on output data of the second page buffer, wherein the first mode of operation is a mode where the first page buffer is accessed and also is a mode of operation for execution of ECC processing where at a data write operation, the ECC circuit generates parity data based on output data of the first page buffer and writes the parity data at the second page buffer and, at a data read operation, the ECC circuit corrects an error of data of the first page buffer based on parity data of the second page buffer and writes the corrected data back in the first page buffer; wherein the second mode of operation is a mode of operation where the ECC processing is not executed and the second page buffer is not accessed and the first page buffer is accessed, and wherein to select and execute one of the first mode of operation and the second mode of operation is electrically switchable.

In exemplary embodiments, the second page buffer is accessed through the second data bus at the second mode of operation.

In exemplary embodiments the semiconductor memory device further comprises a mask circuit which outputs fixed data instead of data output to an external device through the second data bus when the second page buffer is accessed at the second mode of operation.

The semiconductor memory device further comprises a third page buffer which is connected to the first and second data buses and is replaced together with a normal memory cell and a bit line when a normal memory cell or a bit line connected to the first page buffer is defective; a fourth page buffer which is connected to the first and second data buses and is replaced together with a parity memory cell and a bit line when a parity memory cell or a bit line connected to the second page buffer is defective; a first repair circuit which is connected to the second data bus and replaces a page buffer, associated with a defective memory cell or bit line, of the first page buffer with the third page buffer at the second mode of operation; and a second repair circuit which is connected to the first data bus and replaces a page buffer, associated with a defective memory cell or bit line, of the second page buffer with the fourth page buffer.

In exemplary embodiments, at the second mode of operation, the first repair circuit a page buffer, associated with a defective memory cell or bit line, of the second page buffer with the fourth page buffer.

In exemplary embodiments, the first repair circuit stores a column address indicating a location of a page buffer to repair a page buffer, associated with a defective memory cell or bit line, of the first page buffer and selects a page buffer to be replaced by the stored column address. The second repair circuit stores a column address indicating a location of a page buffer to repair a page buffer, associated with a defective memory cell or bit line, of the second page buffer and selects a page buffer to be replaced by the stored column address. The semiconductor memory device further comprises a bit conversion circuit which converts a column address the first repair circuit stores into a column address the second repair circuit stores.

In exemplary embodiments, the third page buffer and the fourth page buffer are selected by the first repair circuit and the second repair circuit, based on a switching signal indicating whether the semiconductor memory device operates at either one of the first and second modes of operation.

In exemplary embodiments, the semiconductor memory device further comprises a page buffer control circuit which outputs fixed data as an output of a page buffer, associated with a defective memory cell or bit line, from among the first to fourth page buffers. The page buffer control circuit does not allow a write operation from the first data bus when a memory cell or a bit line is defective.

In exemplary embodiments, when the number of bit lines is n (n being a common multiple of p and q being a natural number, p>q), the first data bus is q, and the second data bus is q. If (n/p) address signals are received at the first mode of operation, the data transfer unit connects p bit lines to the p first data bus. If (n/q) address signals are received at the second mode of operation, the data transfer unit connects q bit lines to the second data bus.

A semiconductor memory device comprises a first data bus; a second data bus being different in number from the first data bus and independent from the first data bus; and a data transfer unit. When a data transfer with memory cells is performed at a first mode of operation, the data transfer unit connects bit lines, being equal in number to the first data bus, from among a plurality of bit lines to the first data bus to transfer data. When a data transfer with memory cells is performed at a second mode of operation, the data transfer unit connects bit lines, being equal in number to the second data bus, from among the plurality of bit lines to the second data bus to transfer data.

By this, a data bus connected to an output of a page buffer is individually prepared for the first mode of operation (e.g., an ECC mode) and the second mode of operation (e.g., a normal mode). Thus, when data is transferred to an ECC circuit at the first mode of operation like a conventional technique, data does not pass through an unnecessary circuit. Thus, data is transferred in high speed by widening a bus width from a second data bus to a first data bus.

Also, in the transfer unit, a data bus used at the first mode of operation and a data bus used at the second mode of operation are independent from an output portion of a page buffer, and an address supplied at a data transfer of the first mode of operation is independent from an address supplied at a data transfer of the second mode of operation. Thus, freedom on address control and freedom on address mapping are improved. For example, in the event that normal data and parity data are transferred at the second mode of operation, their column addresses are different from each other. The reason is that areas where both data is stored are physically spaced apart from each other. Therefore, at the second mode of operation, the normal data is read using its column address, and the parity data is then read using its column address. However, at the first mode of operation, data is transferred with a bus width being widened. Thus, address control and address mapping are made such that the normal data and the parity data are simultaneously read to an ECC circuit using a column address.

Since a data bus used at the first mode of operation and a data bus used at the second mode of operation are prepared independently from an output portion of a page, it is easy to eliminate an ECC function (e.g., an ECC circuit) including a first data bus used at the first mode of operation. In this case, a design change is easily made.

A semiconductor memory device of the inventive concepts has the first mode of operation and the second mode of operation and electrically switches operations. Before shipment, each mode of operation is tested under such a condition that a product (e.g., Pure NAND) including the second mode of operation and a product (e.g., EM NAND) including the first mode of operation are switched in operation. Therefore, since inventory control is easily made according to an order, productivity is improved.

Figure 24:
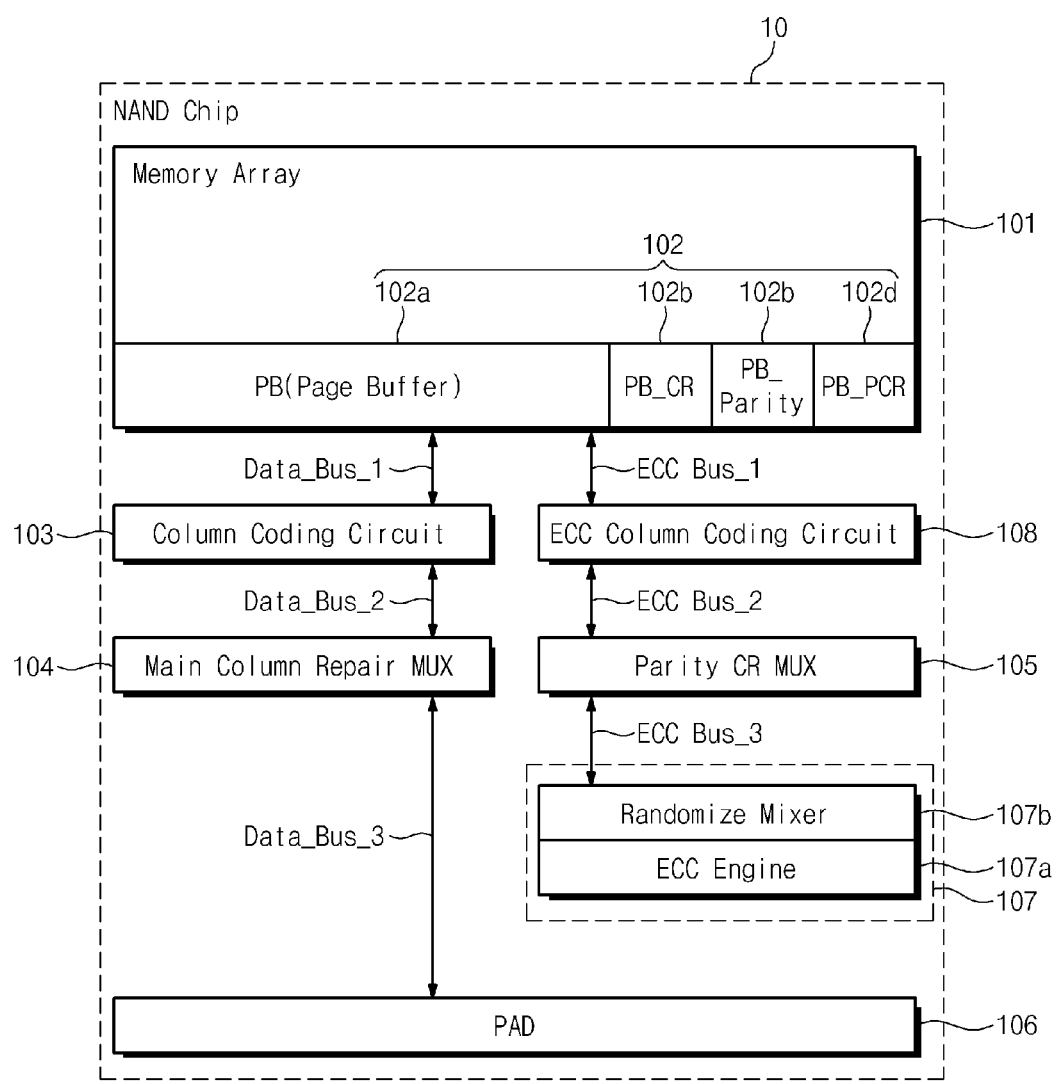
FIG. 24 is a block diagram schematically illustrating a NAND flash memory according to an embodiment of the inventive concepts.

FIG. 24 is a block diagram schematically illustrating a NAND flash memory according to an embodiment of the inventive concepts. Referring to FIG. 24, a NAND flash memory 10 comprises a memory array 101, a page buffer 102, a column coding circuit 103, a main column repair multiplexer (a column repair circuit) 104, a parity column repair circuit (Parity CRMUX) 105, an ECC column coding circuit 108, an I/O pad 106, an ECC engine (or, an ECC circuit) 107a, and a randomize mixer (a randomizer) 107b. Hereinafter, the ECC circuit 107a and the randomizer 107b are referred to as a randomizer and ECC circuit 107.

In FIG. 24, DataBus_1, DataBus_2, and DataBus_3 (a second data bus) are lines through which data is exchanged between a page buffer 82 and the I/O pad 106. Below, such lines are referred to as Data_Bus. The I/O pad (an interface unit) 106 is an external terminal for data input/output between the NAND flash memory 10 and a NAND controller controlling the NAND flash memory 10. Also, ECCBus_1, ECCBus_2, ECCBus_3 (a first data bus) are lines through which data is exchanged between the page buffer 82 and the randomizer and ECC circuit 107. Below, such lines are referred to as ECC_Bus.

The memory array 101 is configured to include a plurality of memory cell transistors. Each of the memory cell transistors stores 1-bit data. A plurality of memory cell transistors of the memory array 101 connected to the same word line forms a page. Data is written at and read from memory cell transistors in a page at the same time.

The NAND flash memory 10 includes a column coding circuit 103 and an ECC coding circuit 108. A column address is independently provided to the column coding circuit 103 or the ECC column coding circuit 108. The column coding circuit 103 and the ECC column coding circuit 108 output a selection signal Sel_A or a selection signal Sel_B to a PB control circuit 60 of the page buffer 102 to connect an output of a page buffer to either ECCBus_1 or DataBus_1 from a portion (e.g., a portion formed of a multiplexer 52_b and a PB control circuit 83_1 shown in FIG. 27B) directly connected to the page buffer 102.

The column coding circuit 83 generates column address signals (Sub BL Coding and Coding shown in FIG. 27B) based on a column address received from an address control circuit (not shown). The column coding circuit 83 selects a page buffer unit in the page buffer 102 corresponding to the column address. Thereby, data is written at a memory cell transistor through the I/O pad 106, data buses Data_Bus_3, Data Bus_2, and Data_Bus_1, the bit circuit and the bit line. Also, data read from a memory cell is output to the exterior of the I/O pad 106 through the bit line, the bit circuit and the data buses Data_Bus_1, Data_Bus_2, and Data Bus_3.

In particular, the ECC column coding circuit 108 receives a column address (hereinafter, marked by Address B) from an ECC circuit 107a and outputs the selection signal Sel_B to a PB control circuit 60 independently from a column address provided to the column coding circuit 103 from an address control circuit (not shown). In this case, an output of the page buffer 102 is connected to ECCBus_1. By this, address control is separately executed when an output of the page buffer 102 is connected to ECCBus_1 or Data_Bus_1.

In a conventional NAND flash memory, an output (a data bus) (hereinafter, referred to as an IO bus for distinction) of a page buffer is shared at a first mode of operation and a second mode of operation. In the NAND flash memory 10, the IO bus being an output of the page buffer is independently prepared without sharing at the first mode of operation and the second mode of operation.

By this, a path between an output of a page buffer and the randomizer and ECC circuit 107 does not need a circuit influencing a high-speed data transfer of the column repair circuit 104. That is, it is possible to transfer data in high speed. Also, a second data bus is set to a bus width to correspond to the conventional repair efficiency. By this, since the size of the column repair circuit 104 is not increased, an increase in chip size is suppressed. In the event that a design of the NAND flash memory 10 is changed to a design of a NAND flash memory not including an ECC circuit, it is possible to eliminate the ECC column coding circuit 108, the parity column repair circuit 105, the buses ECC Bus_1 to ECC Bus_3, and the randomizer and ECC circuit 107. That is, a design change is easily made.

The page buffer 102 is configured to store data corresponding to a page of the memory array 101. The page buffer 102, as shown in FIG. 24, comprises PB (Page Buffer) (hereinafter, referred to as a page buffer 102a), PB_CR (hereinafter, referred to as a page buffer 102b), PB_Parity (hereinafter, referred to as a page buffer 102c), and PB_PCR (hereinafter, referred to as a page buffer 102d). The page buffer 102a is a page buffer (e.g., a first page buffer) that amplifies a voltage of a bit line connected to a normal memory cell and latches the amplified result. When the selection signal Sel_A is received from the column coding circuit 103 at a data read operation of a normal mode (e.g., a second mode of operation), the page buffer 102a outputs the amplified result to the I/O pad 106 through DataBus_1, DataBus_2, and DataBus_3 (e.g., a second data bus) as read data Data_Out_A. Meanwhile, when the selection signal Sel_B is received from the ECC column coding circuit 108 at a data read operation of an ECC mode (e.g., a first mode of operation), the page buffer 102a outputs the amplified result to the randomizer and ECC circuit 107 through ECCBus_1, ECCBus_2, and ECCBus_3 (e.g., a first data bus) as read data Data_Out_B.

When the selection signal Sel_A is received from the column coding circuit 103 at a data write operation of the normal mode, the page buffer 102a receives write data provided from the I/O pad 106 through Data_Bus_3, Data Bus_2, and Data_Bus_1 as write data Data_In_A. Meanwhile, when the selection signal Sel_B is received from the ECC column coding circuit 108 at a data write operation of the ECC mode, the page buffer 102a receives a result of ECC processing of the ECC circuit 107a of the randomizer and ECC circuit 107 through ECCBus_3, ECCBus_2, and ECCBus_1 as write data Data_In_B.

The page buffer 102b is a page buffer (e.g., a third page buffer) that is replaced together with a normal memory cell and a bit line when the normal memory cell or the bit line connected to the page buffer 102a is defective. That is, in the event that one of page buffer units constituting the page buffer 102a is abnormal, the abnormal page buffer unit is repaired with one of page buffer units in the page buffer 102b. The page buffer 102b operates substantially the same as that of the page buffer 102a, and a description thereof is thus omitted.

The column repair circuit 104 is a circuit for replacing a page buffer unit of the page buffer 102a with a page buffer unit of the page buffer 102b. If a column address (e.g., a selection signal Sel_A) for selecting an abnormal page buffer unit of the page buffer 102a is provided to the column coding circuit 103, the column coding circuit 103 controls to select a page buffer unit of the page buffer 102b.

The page buffer 102c is a page buffer (e.g., a second page buffer) that amplifies a voltage of a bit line connected to a parity memory cell (formed of a memory cell transistor for ECC processing configured the same as a normal memory cell) and latches the amplified result. In addition, parity data a parity memory cell stores is not output to the exterior through the I/O pad 106 at a normal mode. Meanwhile, if a selection signal Sel_B is received from the ECC column coding circuit 108 at a data read operation of the ECC mode, the page buffer 102c outputs the amplified result to the ECC circuit 107 through ECCBus_1, ECCBus_2, and ECCBus_3 as read data Data_Out_B.

Also, parity data a parity memory cell stores is not received from the exterior through the I/O pad 106 at the normal mode. Meanwhile, if the selection signal Sel_B is received from the ECC column coding circuit 108 at a data write operation of the ECC mode, the page buffer 102c receives parity data being a result of ECC processing of the ECC circuit 107 through ECCBus_3, ECCBus_2, and ECCBus_1 as write data Data_Out_B.

The page buffer 102d is a page buffer (e.g., a fourth page buffer) that is replaced together with a parity memory cell and a bit line when the parity memory cell or the bit line connected to the page buffer 102c is abnormal. That is, in the event that one of page buffer units constituting the page buffer 102c is abnormal, the abnormal page buffer unit is repaired with one of page buffer units in the page buffer 102d. The page buffer 102d operates substantially the same as that of the page buffer 102c, and a description thereof is thus omitted.

The parity column repair circuit 105 is a circuit for replacing a page buffer unit of the page buffer 102c with a page buffer unit of the page buffer 102d. If a column address (e.g., a selection signal Sel_B) for selecting an abnormal page buffer unit of the page buffer 102c is provided to the ECC column coding circuit 108, the ECC column coding circuit 108 controls to select a page buffer unit of the page buffer 102d.

Figure 25:
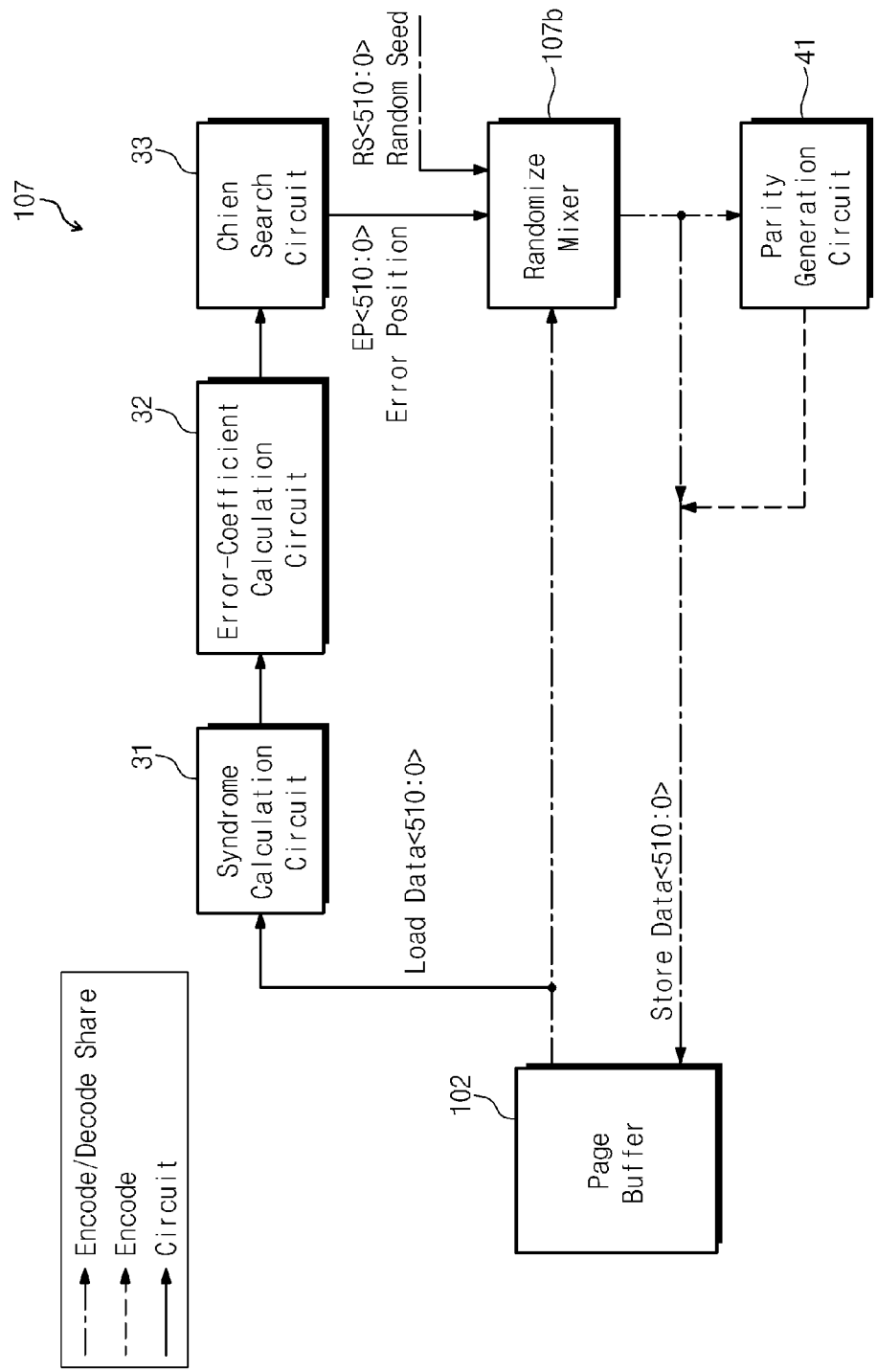
FIG. 25 is a block diagram schematically illustrating an example of a randomizer and ECC circuit 107 shown in FIG. 24.

FIG. 25 is a block diagram schematically illustrating a randomizer and ECC circuit 107. In exemplary embodiments, a randomizer and ECC circuit 107 is describing an ECC circuit using a Galois field operation represented as BCH code (Bose-Chaudhuri Hocquenghem code). Hamming code, Reed-Solomon code, etc. may be used as the BCH code.

Also, an error correction operation is performed by a 511-bit unit using the BCH code capable of correcting four bits of the 511-bit unit. Among the randomizer and ECC circuit 107, an ECC circuit 107a shown in FIG. 24 is configured to include a decoder unit for decoding data and an encoder unit for generating parity data. The decoder unit of the ECC circuit 107a is configured to include a syndrome calculation circuit 31, an error-coefficient calculation circuit 32, and a chien search circuit 33. At a data read operation of an ECC mode, the syndrome calculation circuit 31 receives data read from memory cells by a page buffer 102 as code data Load Data<510:0>, for example, by a sector unit.

The syndrome calculation circuit 31 calculates a syndrome by dividing the code data Load Data<510:0> by an independent minimal polynomial. The number of independent minimal polynomials used as the BCH code capable of correcting a 4-bit data error is 4. The syndrome calculation circuit 31 includes four syndrome calculation units respectively corresponding to four independent minimal polynomials. The syndrome calculation units calculate syndromes (e.g., S1, S3, S5, and S7), respectively.

The error-coefficient calculation circuit 32 uses the syndromes S1, S3, S5, and S7 to calculate coefficients (e.g., e4, e3, e2, e1, and e0) of an error location search equation every sector. The coefficients e4, e3, e2, e1, and e0 are coefficients of an error location search equation $\Lambda(x)$ (=e4×4+e3×3+e2×2+e1×1+e0). The error location search equation $\Lambda(x)$ is used by the chien search circuit 33 to determine whether an error exists at data read from the page buffer 102 every sector.

The chien search circuit 33 checks whether the error location search equation $\Lambda(x)$ is '0', by plugging an address indicating a location of the code data Load Data<510:0> as a plug-in value x in the error location search equation $\Lambda(x)$ using coefficients (e.g., coefficients e0 to e4 of the error location search equation) calculated by the error-coefficient calculation circuit 32. The chien search circuit 33 outputs an error detection signal EP<510:0> being a signal indicating an error position according to the checking result. In the error detection signal EP<510:0>, bits, corresponding to an erroneous bit, from among code data Load Data<510:0> have '1', and bits, corresponding to an error-free bit, from among code data Load Data<510:0> have '0'

At a data read operation of an ECC mode of the NAND flash memory 10, the randomizer 107b is supplied with code data Load Data<510:0> of the page buffer 102 at a location indicated by a column address when the ECC column coding circuit 108 provides a selection signal Sel_B (e.g., the column address) to the page buffer 102. The randomizer 107b obtains error-free data by EXORing the code data Load Data<510:0> and the error detection signal EP<510:0> such that an error-free bit is not inverted and an erroneous bit is inverted.

Also, the randomizer 107b EXORs the error-free data and a random seed RS<510:0> generated by a random seed generation circuit (not shown), that is, de-randomizes. The randomizer 107b restores the code data Load Data<510:0> to a state before encoding. The randomizer 107b writes the restored data Store Data<510:0> at the page buffer 102.

A data flow at a data read operation (decoding and de-randomizing) of an ECC mode is illustrated by a solid line (indicating a data flow at decoding) and an alternate long and short dash line (indicating a common data flow of encoding and decoding). Also, at a data read operation of the ECC mode, code data Store Data being data to be written at the page buffer 102 is expressed by an equation: Store Data= (Load Data)XOR(EP)XOR(RS). In the equation, 'Load Data' indicates code data being data read from the page buffer 102, 'EP' indicates an error detection signal, and 'RS' indicates a random seed. Also, at a data read operation of a normal mode, data of the code data Store Data except for parity data is output to the exterior through the I/O pad by providing a selection signal Sel_A (e.g., a column address) from the column coding circuit 103 to the page buffer 102.

An encoder unit 40 of the ECC circuit 107a has a parity generation circuit 41. The parity generation circuit 41 generates parity data by dividing randomized data provided from the randomizer 107b by generation polynomial and outputs the At a data write operation of an ECC mode parity data to the page buffer 102 (e.g., a page buffer 102c). (e.g., encoding and randomizing), the randomizer 107b randomizes code data Load Data<510:0> provided from the page buffer 102. At this time, in the randomizer 107b, the error detection signal EP<510:0> is fixed data (all '0'), that EP<510:0>=0. The randomizer 107b executes an exclusive OR operation on the code data Load Data<510:0>, the random seed RS<510:0> and the error detection signal EP<510:0> to generate code data Store Data to be output to the parity generation circuit 41.

The code data Store Data being data written at the parity generation circuit 41 is expressed, at decoding, by an equation: Store Data=(Load Data)XOR(EP)XOR(RS). In the equation, 'Load Data' indicates code data being data read from the page buffer 102, 'EP' indicates an error detection signal, and 'RS' indicates a random seed. Also, the parity generation circuit 41 generates parity data from the code data Store Data provided from the randomizer 107b. The randomizer 107b outputs the code data Store Data except for the parity data to the page buffer 102, and the parity generation circuit 41 outputs the parity data to the page buffer 102. Mixed data is written at the page buffer 102 as the code data Store Data.

The ECC circuit 107a and the randomizer 107b are integrated on the ECC bus as illustrated in FIG. 24. Thus, randomizing and encoding are simultaneously performed at ECC encoding, and decoding and de-randomizing are simultaneously performed at ECC decoding.

Figure 26:
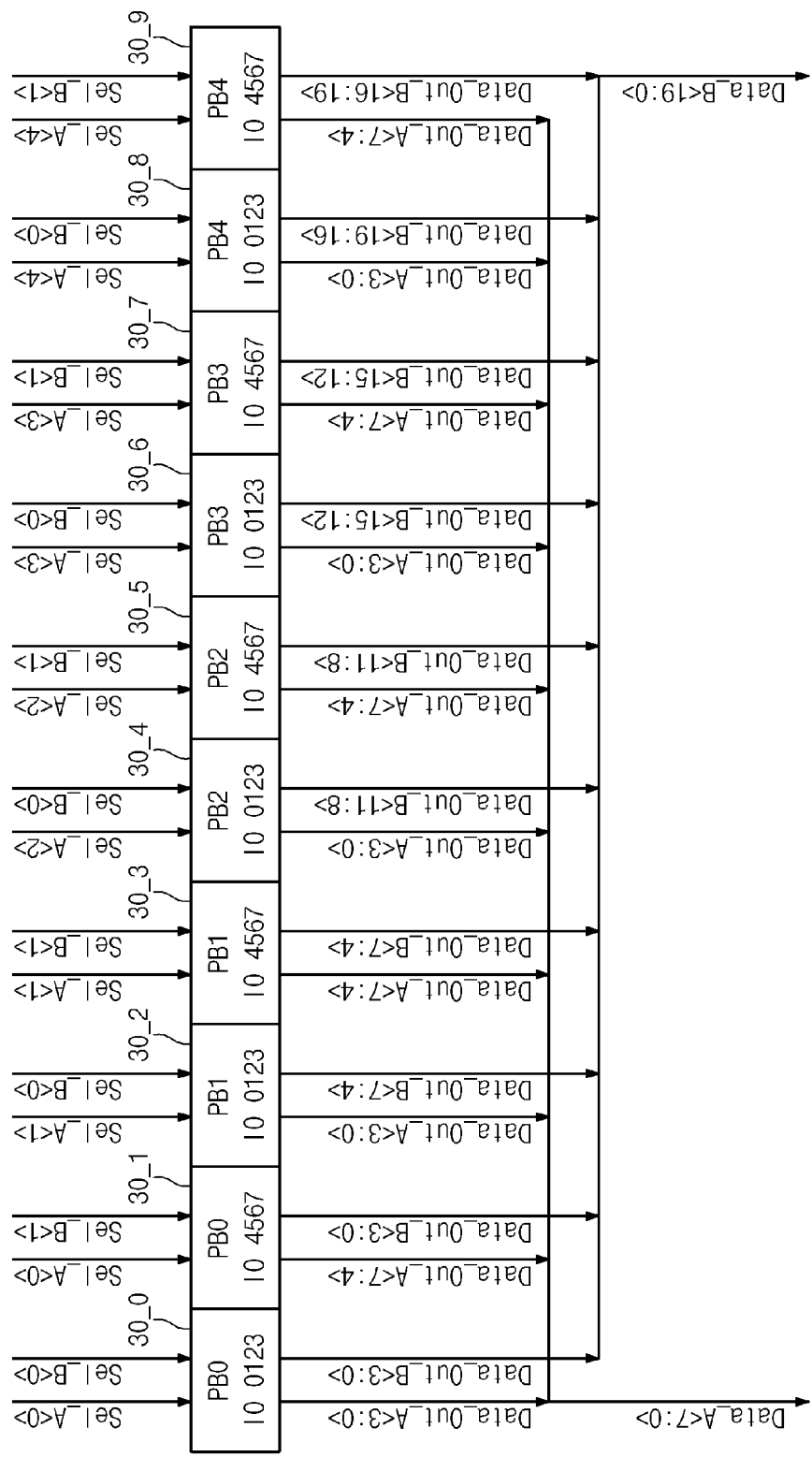
FIG. 26 is a diagram for describing a data write operation associated with a page buffer 102, a column coding circuit 103, and an ECC column coding circuit 108 shown in FIG. 24.
Figure 27A:
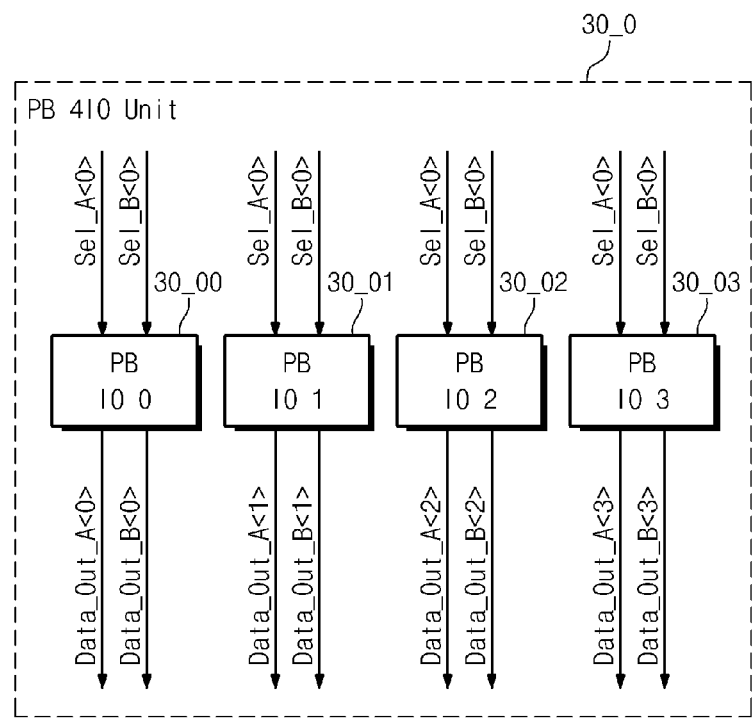
FIGS. 27A and 27B is a diagram showing an example of a PB unit shown in FIG. 26.
Figure 27B:
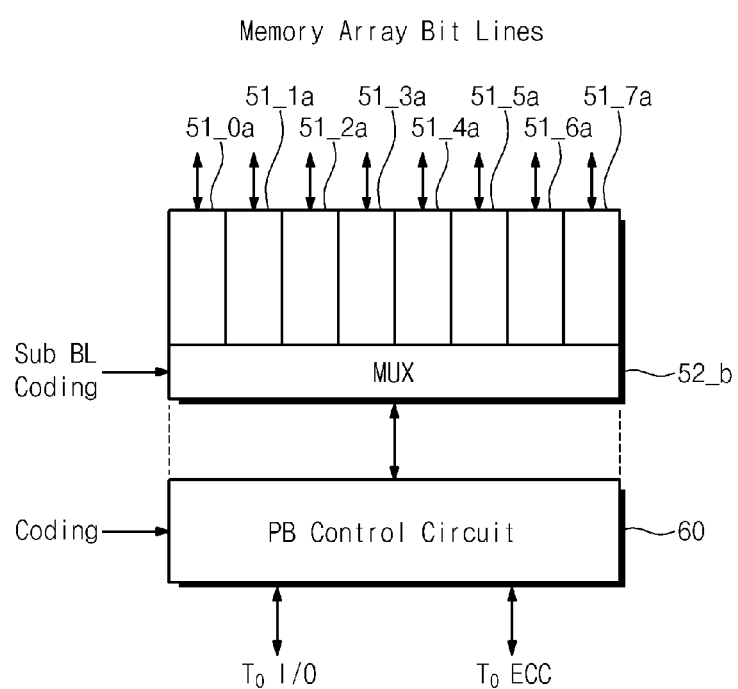
Figure 28:
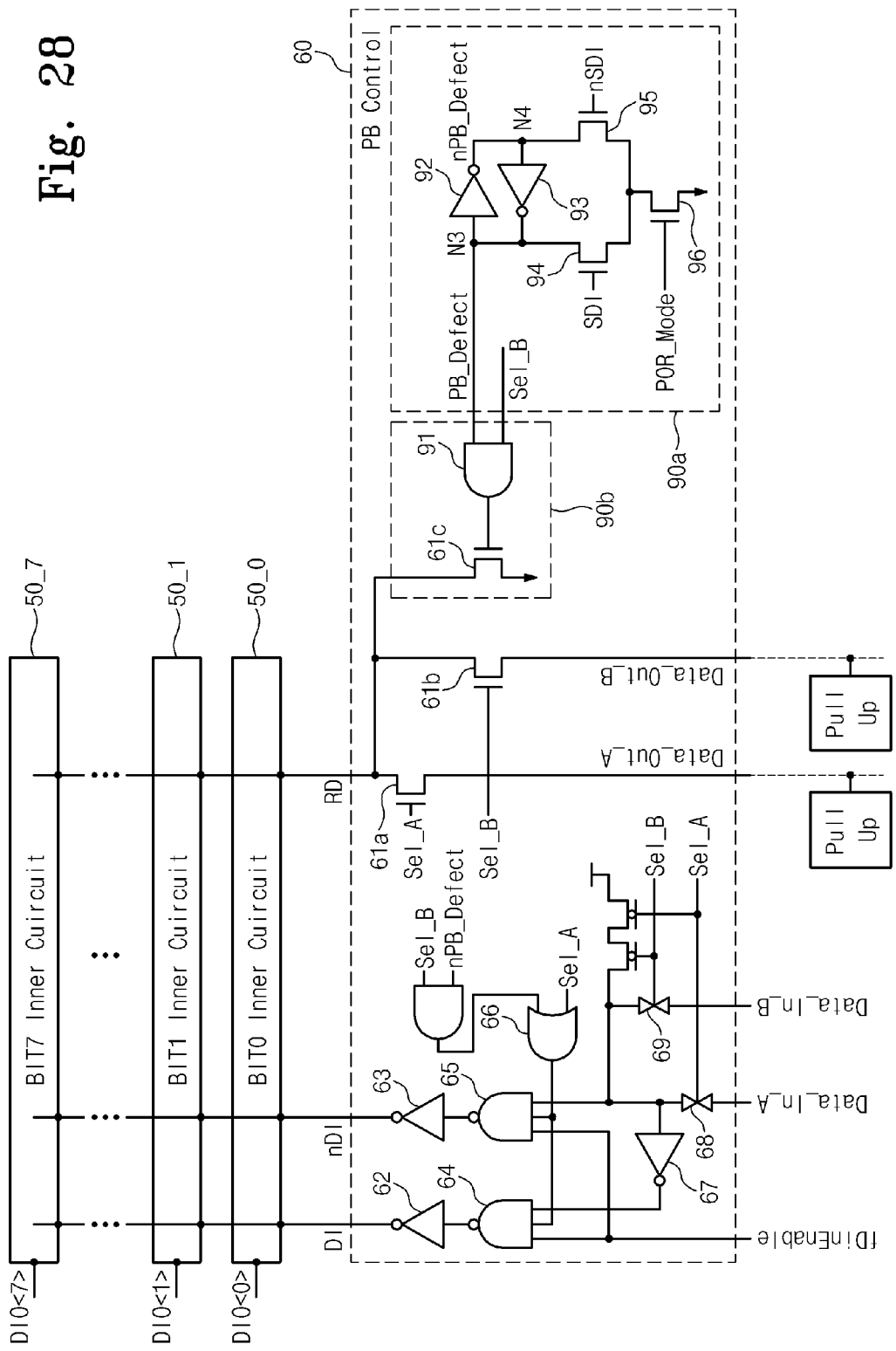
FIG. 28 is a circuit diagram showing an example of a PB unit shown in FIG. 26.
Figure 29:
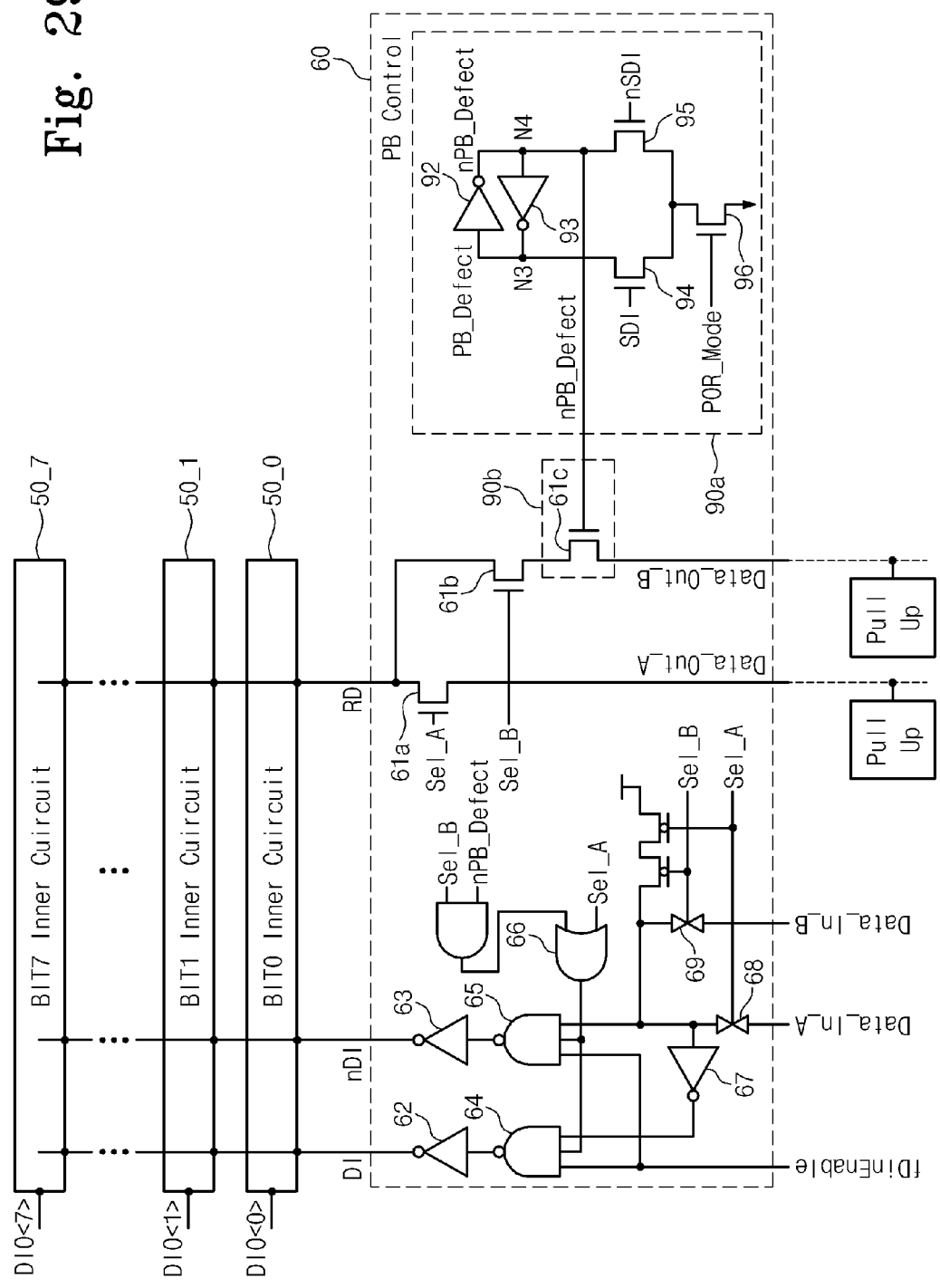
FIG. 29 is a circuit diagram showing another example of a PB unit shown in FIG. 26.

Returning to FIG. 24, page buffers 102a to 102d of the page buffer 102 are configured to have the same circuit structure, which is described with reference to FIGS. 3 to 30. FIG. 26 is a diagram schematically illustrating a portion corresponding to a page buffer 102, a column coding circuit 103, and an ECC column coding circuit 108 shown in FIG. 24. FIGS. 27A and 27B are diagrams schematically illustrating a PB 4IO unit and a PB unit shown in FIG. 25. FIG. 28 is a circuit diagram schematically illustrating a PB unit. FIG. 29 is a circuit diagram schematically illustrating a PB unit according to another embodiment of the inventive concepts. FIG. 7 is a circuit diagram schematically illustrating a bit internal circuit 50_i (i being an integer of 0 to 7) shown in FIGS. 28 and 29.

Referring to FIG. 25, a portion corresponding to a page buffer 102, a column coding circuit 103, and an ECC column coding circuit 108 shown in FIG. 24 has a PB4IO unit that latches four data from four IO lines and writes data with respect to four IO lines.

In FIG. 26, there are shown ten PB4 IOs, that is, PB0 IO 0123 (PB 4IO unit) 30_0, PB0 IO 4567 (PB 4IO unit) 30_1, PB1 IO 0123 (PB 4IO unit) 30_2, PB1 IO 4567 (PB 4IO unit) 30_3, PB2 IO 0123 (PB 4IO unit) 30_4, PB2 IO 4567 (PB 4IO unit) 30_5, PB3 IO 0123 (PB 4IO unit) 30_6, PB3 IO 4567 (PB 4IO unit) 30_7, PB4 IO 0123 (PB 4IO unit) 30_8, and PB4 IO 4567 (PB 4IO unit) 30_9.

Here, an IO line is an input/output line installed between a multiplexer 52_b and a PB control circuit 60 of a PB unit as will be more fully described below. In exemplary embodiments, the IO line is electrically connected to any one of eight bit lines through a multiplexer 52_b and eight bit circuits 51_0a to 51_7a. That is, the IO line is a signal line through which memory cell transistor data or data read from a memory cell transistor is transferred.

Since PB 4IO units shown in FIG. 26 have the same structure, a PB 4IO unit 30_0 shown in FIG. 26 is illustrated in FIG. 27A. The PB 4IO unit 30_0 is formed of four PB units 30_00 to 30_03.

When an active level (e.g., a high level) of selection signal Sel_A<0> is provided from a column coding circuit 103, each of the PB units 30_00 to 30_03 connects an IO line and a data bus (e.g., a second bus) (as will be described below, a data bus Data_A<7:0>). In this case, as illustrated in FIG. 27A, four read data bits Data_Out_A<0> to Data_Out_A<3> are read from four IO lines onto a data bus Data_A<3:0>.

Also, when an active level (e.g., a high level) of selection signal Sel_B<0> is provided from an ECC column coding circuit 108, each of the PB units 30_00 to 30_03 connects an IO line andan ECC bus (e.g., a first bus) (as will be described below, a data bus Data_B<19:0>). In this case, as illustrated in FIG. 27A, four read data bits Data_Out_B<0> to Data_Out_B<3> are read from four IO lines onto a data bus Data_B<3:0>.

Referring to FIG. 27B, PB units shown in FIG. 27A have the same circuit structure. Each of PB units shown in FIG. 27A comprises eight bit circuits 51_1a to 51_7a, a multiplexer 52_b, and a page buffer (PB) control circuit 60.

The multiplexer 52_b receives a column address signal Sub BL Coding from the column coding circuit 103 or the ECC column coding circuit 108 shown in FIG. 24. The multiplexer 52_b selects one of the bit circuits 51_1a to 51_7a based on the column address (e.g., a selection signal DIO<i> shown in FIG. 28). That is, the multiplexer 52_b connects one of eight bit lines to the PB control circuit 60.

Figure 30:
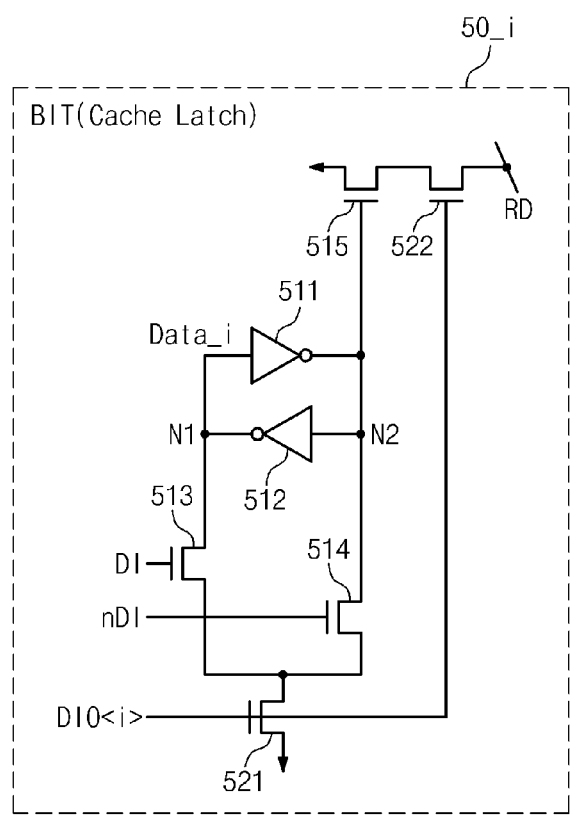
FIG. 30 is a circuit diagram showing a bit internal circuit 50_i (i being an integer of 0 to 7) shown in FIGS. 27 and 28.

First, a detailed circuit of a PB unit will be more fully described with reference to FIGS. 28 and 30. FIG. 30 shows a circuit of each of bit internal circuits 50_0 to 50_7 shown in FIG. 28. FIG. 30 shows a data sensing unit and a latch unit at a write operation and a driver unit for driving a signal line at a read operation. In particular, each of the bit internal circuits 50_0 to 50_7 is implemented using transistors and inverter circuits. In addition, a combination of bit circuits 51_0a to 51_7a and a multiplexer 52_b shown in FIG. 27B corresponds to the bit internal circuits 50_0 to 50_7. That is, since a bit internal circuit is selected by a selection signal DIO, it partially has a function of a bit circuit and a multiplexer 52_b.

As illustrated in FIG. 30, a bit internal circuit 50_i (i being an integer of 0 to 7, eight bit internal circuits having the same circuit structure) is formed of an inverter circuit 511, an inverter circuit 512, a transistor 513, a transistor 514, a transistor 515, a transistor 521, and a transistor 522. Here, the transistors 513, 514, 515, 521, and 522 may be an N-channel MOS transistor.

A latch unit of the bit internal circuit 50_i is formed of the inverter circuits 511 and 512. Here, an input terminal of the inverter 511 and an output terminal of the inverter 512 are connected to a connection node N1, and an output terminal of the inverter 511 and an input terminal of the inverter 512 are connected to a connection node N2. The connection node N1 is connected to a memory cell transistor (not shown) through a bit line. Data that a memory cell transistor stores appears on the connection node N1 as Data_i at a read operation. Data that is to be stored in a memory cell transistor appears on the connection node N1 as Data_i at a write operation. For example, when a memory cell transistor stores a low level (data 0), a voltage of Data_i has a low level. When a memory cell transistor stores a high level (data 1), a voltage of Data_i has a high level.

In the bit internal circuit 50_i, a driver unit is formed of the transistors 515 and 522. The transistor 522 has a drain connected to a line of a read signal RD, a gate connected to a line of a selection signal DIO<i>, and a source connected to a drain of the transistor 515. The transistor 515 has a gate connected to the source of the transistor 522, a gate connected to the connection node N2, and a source grounded. Here, the selection signal DIO<i> (i being 0~7) is Sub BL Coding shown in FIG. 27B. For example, a column coding circuit 103 makes one of selection signals DIO<7:0> become high based on a 3-bit address signal provided from an address control circuit (not shown), or an ECC column decoding circuit 108 makes one of the selection signals DIO<i> become high based on a 3-bit address signal provided from an ECC circuit 107. By this, one of bit internal circuits 50_0 to 50_7 shown in FIG. 28 is selected.

With the above-described structure, if a selection signal DIO<i> goes to a high level at a data read operation on a memory cell transistor, a logical level of the read signal RD is equal to that of Data_i. That is, for example, when Data_i is at a high level with the read signal RD being pre-charged to a high level, the transistor 515 is turned off, the transistor 522 is turned on, and the read signal RD retains a high level. When Data_i is at a low level, the transistor 515 is turned on, the transistor 522 is turned on, and the bit internal circuit 50_i changes the read signal RD from a high level to a low level.

A line of the read signal RD is connected to a PB control circuit 60 as shown in FIG. 28. At a first mode of operation (e.g., an ECC mode), a line of the read signal RD is connected to ECC Bus in response to a selection signal Sel_B (a column address signal the ECC column coding circuit 108 outputs). By this, Data_i of the bit internal circuit 50_i is output on ECC Bus as a data read signal Data_Out_B.

Meanwhile, at a second mode of operation (e.g., a normal mode), a line of the read signal RD is connected to Data Bus in response to a selection signal Sel_A (a column address signal a column coding circuit 103 outputs). By this, Data_i of the bit internal circuit 50_i is output on Data Bus as a data read signal Data_Out_A.

Returning to FIG. 30, the transistors 513, 514, and 521 constitute a sensing unit of the bit internal circuit 50_i. The transistor 513 has a drain connected to the connection node N1, a gate connected to a line of a write signal DI, and a source connected to a drain of the transistor 521. The transistor 514 has a drain connected to the connection node N2, a gate connected to a line of a write signal nDI, and a source connected to the drain of the transistor 521. The transistor 521 has a drain connected to the source of the transistor 513 and the source of the transistor 513, a gate connected to a line of a selection signal DIO<i>, and a source grounded.

The lines of the write signals DI and nDI are connected to the PB control circuit 60 as shown in FIG. 28. As will be described below, as a data bus and ECCBus are connected by the selection signal Sel_B at the first mode of operation, a data write signal Data_In_B is received from ECCBus. By this, the PB control circuit 60 varies one of the write signals DI and nDI from a low level to a high level in response to a level of the data write signal Data_In_B. At this time, the other of the write signals DI and nDI retains a low level.

Meanwhile, at the second mode of operation, connection to Data Bus is performed by the selection signal Sel_A, and a data write signal Data_In_A is received from Data Bus. By this, the PB control circuit 60 varies one of the write signals DI and nDI from a low level to a high level in response to a level of the data write signal Data_In_A. At this time, the other of the write signals DI and nDI retains a low level.

With the above-described structure, if a selection signal DIO<i> goes to a high level at a data write operation on a memory cell transistor, a Data_i level of the bit internal circuit 50_i is decided according to levels of the write signals DI and nDI. More particular, when one of a data write signal Data_In_A and a data write signal Data_In_B is at a low level (data 0), the PB control circuit 60 outputs a high level of write signal DI and a low level of write signal nDI. By this, the transistor 513 is turned on and the transistor 514 is turned off. At this time, the connection node N1 is set to a low level and the connection node N2 is set to a high level, so that Data_i has the same logical low level (data 0) as that of a data bus.

When the data write signal Data_In_A or the data write signal Data_In_B is at a high level (data 1), the PB control circuit 60 outputs a low level of write signal DI and a high level of write signal nDI. By this, in the bit internal circuit 50_i, the transistor 513 is turned off and the transistor 514 is turned on. At this time, the connection node N1 is set to a high level and the connection node N2 is set to a low level, so that Data_i has the same logical high level (data 1) as that of a data bus.

Returning to FIG. 30, the PB control circuit 60 comprises a write unit performing a data transfer from a data bus to a page buffer and a read unit performing a data transfer from a page buffer to a data bus. The read unit of the PB control circuit 60 is formed of transistors 61a and 61b. The transistors 61a and 61b may be an NMOS transistor. The transistor 61a has a drain connected to a line of the read signal RD, a gate connected to a line of the selection signal Sel_A, and a source connected to Data Bus (e.g., a second data bus). The transistor 61b has a drain connected to a line of the read signal RD, a gate connected to a line of the selection signal Sel_B, and a source connected to ECC Bus (e.g., a first data bus).

Here, the selection signal Sel_A may be a column address signal that a column coding circuit 103 generates in response to address bits, for example, an address Address A received from an address control circuit (not shown). The selection signal Sel_B may be a column address signal that an ECC column coding circuit 108 generates in response to a part of address bits, for example, an address Address B received from an ECC circuit 107 shown in FIG. 24.

If a high level of selection signal Sel_B is received from the column ECC coding circuit 108 at a data read operation of an ECC mode (e.g., a first mode of operation), the read unit of the PB control circuit 60 turns on the transistor 61b such that a line of the read signal RD is connected to ECC Bus. By this, data of memory cell transistors (Data_i of a bit internal circuit) stored in the bit internal circuits 50_0 to 50_7 are output to ECC Bus as a data read signal Data_Out_B.

If a high level of selection signal Sel_A is received from the column coding circuit 103 at a data read operation of a normal mode (e.g., a second mode of operation), the read unit of the PB control circuit 60 turns on the transistor 61a such that a line of the read signal RD is connected to Data Bus. By this, data of memory cell transistors stored in the bit internal circuits 50_0 to 50_7 are output to Data Bus as a data read signal Data_Out_A.

The read unit of the PB control circuit 60 has the following structure such that when a memory cell transistor or a bit line connected to a memory cell transistor is abnormal in the page buffers 102a and 102c, data provided to the ECC circuit 107 has fixed data (e.g., fixed to data 0) at a data read operation of an ECC mode. That is, the read unit of the PB control circuit 60 comprises a defect information storing unit 90a and a data fixing unit 90b as illustrated in FIG. 28.

The defect information storing unit 90a comprises inverter circuits 92 and 93 and transistors 94, 95, and 96. Here, the transistors 94, 95, and 96 may be an N-channel MOS transistor. A latch unit of the defect information storing unit 90a is formed of the inverter circuits 92 and 93. The inverter circuit 92 has an output terminal connected to a connection node N4 and an input terminal of the inverter 93 and an input terminal connected to a connection node N3 and an output terminal of the inverter circuit 94. The connection node N3 is connected to a first input terminal of the AND circuit 91. The connection node N3 provides a defect signal PB_Defect indicating that data stored in the latch unit is defective. The connection node N4 provides a defect signal nPB_Defect indicating that data stored in the latch unit is defective.

A sensing unit of the defect information storing unit 90a comprises transistors 94, 95, and 96. The transistor 94 has a drain connected to the connection node N3, a gate connected to a line of a defect information signal SDI, and a source connected to a drain of the transistor 96. The transistor 95 has a drain connected to the connection node N4, a gate connected to a line of a defect information signal nSDI, and a source connected to the drain of the transistor 96. The transistor 96 has a drain connected to the source of the transistor 94 and the source of the transistor 95, a gate connected to a line of a power-on reset signal POR_Mode, and a source grounded.

Here, the defect information signal SDI and the defect information signal nSDI are signals indicating whether a bit line connected to the PB control circuit 60 or a memory cell transistor connected to a corresponding bit line is defective. In the event that a test result executed after fabrication indicates that a bit line connected to the PB control circuit 60 is defective, the defect information signal SDI is set to data 0 (e.g., a low level) and the defect information signal nSDI is set to data 1 (e.g., a high level). Or, in the event that a test result executed after fabrication indicates that a bit line connected to the PB control circuit 60 is defective, the defect information signal SDI is set to a high level and the defect information signal nSDI is set to a low level. Before shipment, such defect information signals are stored at a storage area for system, for example, of the NAND flash memory 10 in connection with the selection signal Sel_B indicating a location of the PB control circuit 60. Also, the power-on reset signal POR_Mode is a signal maintaining a high level during a predetermined time period (e.g., a time period where the defect information signals are transferred to the PB control circuit 60 from the storage area for system) after the NAND flash memory 10 is powered up.

When the NAND flash memory 10 is powered up, the power-on reset signal POR_Mode goes to a high level. If a bit line connected to the PB control circuit 60 is defective, the defect information storing unit 90a turns off the transistor 94 and turns on the transistor 95. By this, the node N3 is set to a high level and the node N4 is set to a low level. In this case, the defect signal PB_Defect has a high level. Since the power-on reset signal POR_Mode goes to a low level after a transfer period, the defect information storing unit 90a maintains the defect signal PB_Defect at a high level during a period where a power is supplied to the NAND flash memory 10.

When the NAND flash memory 10 is powered up, the power-on reset signal POR_Mode goes to a high level. If a bit line connected to the PB control circuit 60 is not defective, the defect information storing unit 90a turns on the transistor 94 and turns off the transistor 95. By this, the node N3 is set to a low level and the node N4 is set to a high level. In this case, the defect signal PB_Defect has a low level. Since the power-on reset signal POR_Mode goes to a low level after a transfer period, the defect information storing unit 90a maintains the defect signal PB_Defect at a low level during a period where a power is supplied to the NAND flash memory 10.

The data fixing unit 90b is formed of the AND circuit 91 and a transistor 61c. Here, the transistor 61c is an NMOS transistor. The AND circuit 91 is a 2-input 1-output logic circuit. The AND circuit 91 has a first input terminal connected to the connection node N3 and a second input terminal connected to a line of the selection signal Sel_A, and an output terminal connected to a gate of the transistor 61c. The transistor 61c has a drain connected to a line of a read signal RD, a gate connected to the output terminal of the AND circuit 91, and a source grounded.

In the event that a bit line connected to the PB control circuit 60 is not defective, the defect signal PB_Defect has a low level. In this case, since the AND gate 91 outputs a low level of output signal, the transistor 61c of the data fixing unit 90b is turned off. That is, the data fixing unit 90b does not operate. Meanwhile, in the event that a bit line connected to the PB control circuit 60 is defective, the defect signal PB_Defect has a high level. When ECC is used, that is, at an ECC mode, if a high level of selection signal Sel_B is provided to the AND circuit 91, the AND circuit 91 outputs a high level of output signal, so that the transistor 61c is turned on. In this case, ECCBus_1 is grounded such that Data_Out_B is fixed to a low level (e.g., a GND level). That is, in the event that a bit line connected to the PB control circuit 60 is defective, at the ECC mode, the PB control circuit 60 acts as a data fixing circuit that outputs read data Data_Out_B having a fixed level (e.g., a low level) to ECCBus_1.

In addition, at a data read operation of a normal mode, since the PB control circuit 60 is selected by the selection signal Sel_A, the AND circuit 91 outputs a low-level signal. In this case, the data fixing unit 90b being an additional circuit does not operate. If the defect signal PB_Defect is directly provided to a gate of the transistor 91c without using the AND circuit 91, the read signal RD is fixed to a low level when a bit line connected to the PB control circuit 60 is defective. That is, the PB control circuit 60 acts as a data fixing circuit that outputs a fixed level (e.g., a low level) of read data Data_Out_A on DataBus_1 when the selection signal Sel_A is received at a normal mode and outputs a low level of read data Data_Out_B when the selection signal Sel_B is received at an ECC mode.

The defect information storing unit 90a and the data fixing unit 90b shown in FIG. 28 may be configured as illustrated in FIG. 29. FIG. 29 shows another circuit structure of a PB unit. In FIG. 29, constituent elements that are the same as those in FIG. 28 are marked by the same reference numerals, and a description thereof is thus omitted. The defect information storing unit 90a shown in FIG. 29 is configured the same as that shown in FIG. 28. But, the data fixing unit 90b shown in FIG. 28 is replaced with a data fixing unit 90b'. A signal on a connection node N4 of the defect information storing unit 90a is used as a defect signal nPB_Defect. The data fixing unit 90b' is formed of a transistor 61c. The transistor 61c has a source connected to ECCBus (e.g., a first data bus). The transistor 61b has a drain connected to a line of the read signal RD, a gate connected to a line of the selection signal Sel_B, and a source connected to a drain of the transistor 61c.

In the event that a bit line connected to the PB control circuit 60 is defective, the defect signal nPB_Defect has a low level. In this case, since the transistor 61c is turned off, a transfer path between the read signal RD and ECCBus_1 is blocked. For this reason, read data Data_Out_B is fixed to a high level through a pull-up circuit. Meanwhile, in the event that a bit line connected to the PB control circuit 60 is not defective, the defect signal nPB_Defect has a low level. In this case, since the transistor 61c is turned on. By this, the read signal RD, that is, data of a memory cell transistor is output onto ECCBus_1 such that it is read as read data Data_Out_B.

As compared with a data fixing unit 90b shown in FIG. 29, the data fixing unit 90b' has such a merit that an AND circuit is not required since the transistors 61b and 61c are connected in series between a line of the read signal RD and ECCBus_1.

In the data fixing unit 90b' shown in FIG. 29, if the transistor 61c is inserted between a line of the read signal RD and the transistor 61a and a drain of the transistor 61b, that is, between a line of the read signal RD and the PB control circuit 60, the PB control circuit 60 acts as a data fixing circuit that outputs a fixed level (e.g., a high level) of read data Data_Out_A to DataBus_1 in response to the selection signal Sel_A provided at the normal mode and a high level of read data Data_Out_B in response to the selection signal Sel_B provided at the ECC mode. As described above, in the event that a bit line connected to the PB control circuit 60 is defective, data Data_Out_A or Data_Out_B may have a low level or a high level of fixed value.

Returning to FIG. 28, the write unit of the PB control circuit 60 comprises inverter circuits 62, 63, 67, NAND circuits 64 and 65, an OR circuit 66, and switches 68 and 69. The inverter circuit 62 is a logical inversion circuit, and has an output terminal connected to a line of the write signal DI and an input terminal connected to an output terminal of the NAND circuit 64. The inverter circuit 63 is a logical inversion circuit, and has an output terminal connected to a line of the write signal nDI and an input terminal connected to an output terminal of the NAND circuit 65.

The NAND circuit 64 is a 3-input 1-output NAND circuit, and has a first input terminal connected to a line of a write enable signal fDinEnable, a second input terminal connected to an output terminal of the OR circuit 66, and a third input terminal connected to an output terminal of the inverter circuit 67. An output terminal of the NAND circuit 64 is connected to an input terminal of the inverter circuit 62. The NAND circuit 65 is a 3-input 1-output NAND circuit, and has a first input terminal connected to a line of the write enable signal fDinEnable, a second input terminal connected to the output terminal of the OR circuit 66, and a third input terminal connected to a first input/output terminal of the switch 68 and a first input/output terminal of the switch 69. An output terminal of the NAND circuit 65 is connected to an input terminal of the inverter circuit 63.

The OR circuit 66 is a 2-input 1-output logic circuit, and has a first input terminal connected to an output of an AND circuit 71 and a second input terminal connected to a line of the selection signal Sel_A. An output terminal of the OR circuit 66 is connected to the second input terminal of the NAND circuit 64 and the second input terminal of the NAND circuit 65. The AND circuit 71 logically combines the selection signal Sel_B and the defect signal nPB_Defect. By this, in a case where the defect signal nPB_Defect has a high level (not defective), the selection signal Sel_B has a high level. At this time, the second input terminal of the NAND circuit 65 has a high level, so that a write condition is satisfied. Meanwhile, in a case where the defect signal nPB_Defect has a low level (e.g., a defective page buffer), at a mode of operation of the selection signal Sel_B, the second input terminal of the NAND circuit 65 does not have a high level. Thus, a write condition is not satisfied. The inverter circuit 67 is a logical inversion circuit, and has an input terminal connected to the first input/output terminal of the switch 68 and the first input/output terminal of the switch 69 and an output terminal connected to the third input terminal of the NAND gate 64.

The switch 68 is a bidirectional switch, and has the first input/output terminal connected to the input terminal of the inverter circuit 67 and the third input terminal of the NAND circuit 65 and a second input/output terminal connected to Data Bus. The switch 69 is a bidirectional switch, and has the first input/output terminal connected to the input terminal of the inverter circuit 67 and the third input terminal of the NAND circuit 65 and a second input/output terminal connected to ECC Bus. In addition, an input of the inverter circuit 67 is pulled up by a PMOS transistor such that an input of the inverter circuit 67 is not set to a "don't care" state when any one of the bidirectional switches is unselected.

With the above-described structure, when at a data write operation of the ECC mode (e.g., a first mode of operation), the write enable signal fDinEnable is at a high level and the selection signal Sel_B is at a high level, the write unit of the PB control circuit 60 turns on the switch 69 such that one of the write signals DI and nDI transitions from a low level to a high level in response to a level of the data write signal Data_In_B received from ECC Bus. More particular, when the data write signal Data_In_B is at a low level (data 0), the write signal DI transitions to a high level. By this, Data_i of one of the bit internal circuits 50_0 to 50_7 goes to a low level. Afterwards, data 0 is written at a memory cell transistor through a program operation. Meanwhile, when the data write signal Data_In_B is at a high level (data 1), the write signal nDI transitions to a high level. By this, Data_i of one of the bit internal circuits 50_0 to 50_7 goes to a high level. Afterwards, data 1 is written at a memory cell transistor through a program operation.

If the write enable signal fDinEnable and the selection signal Sel_A go to a high level at a data write operation of a normal mode (e.g., a second mode of operation), the write unit of the PB control circuit 60 turns on the switch 68 such that one of the write signals DI and nDI transitions from a low level to a high level in response to a level of the data write signal Data_In_A received from DataBus. More particular, when the data write signal Data_In_A is at a low level (data 0), the write signal DI transitions to a high level. By this, Data_i of one of the bit internal circuits 50_0 to 50_7 goes to a low level. Afterwards, data 0 is written at a memory cell transistor through a program operation.

Meanwhile, when the data write signal Data_In_A is at a high level (data 1), the write signal nDI transitions to a high level. By this, Data_i of one of the bit internal circuits 50_0 to 50_7 goes to a high level. Afterwards, data 1 is written at a memory cell transistor through a program operation.

As described above, the PB control circuit 60 is a circuit that controls a data transfer between a data bus (a first data bus and a second data bus) and a memory cell transistor connected through a bit line to one, selected by the selection signal DIO<i>, from among the bit internal circuits 50_0 to 50_7 constituting a PB unit of a page buffer 102.

The line of the read signal RD, the line of the write signal DI, and the line (IO line) of the write signal nDI are lines connecting the PB control circuit 60 and the bit internal circuits 50_0 to 50_7 constituting the PB unit, and are input/output lines for a data transfer of the PB unit. Thus, the PB control circuit 60 transfers write data and read data between an input/output unit of the page buffer 102 and the first and second data buses ECC Bus and Data Bus.

Returning to FIG. 27A, by the above-described PB control circuit 60, a PB 4IO unit 30_0 operates as follows. When a high level of selection signal Sel_A<0> is received from the column coding circuit 103, the PB 4IO unit 30_0 connects input/output lines IO_0 to IO_3 (in FIG. 28, marked by RD) of four page buffers to a 4-bit data bus Data_A<3:0>. By this, the PB 4IO unit 30_0 outputs the data read signals Data_Out_A<3> to Data_Out_A<0> (hereinafter, referred to as data read signals Data_Out_A<3:0> ) on the data bus Data_A<3:0>.

When a high level of selection signal Sel_B<0> is received from the ECC column coding circuit 108, the PB 4IO unit 30_0 connects input/output lines IO_0 to IO_3 of four page buffers to a 4-bit ECC bus Data_B<3:0> (here, referred to as data bus Data_B<3:0>). By this, the PB 4IO unit 30_0 outputs the data read signals Data_Out_B<3> to Data_Out_B<0> (hereinafter, referred to as data read signals Data_Out_B<3: 0>) on the data bus Data_B<3:0>.

Returning to FIG. 26, by the above-described PB 4IO unit 30_0, a page buffer 102, a column coding circuit 103 and an ECC column coding circuit 108 (here, referred to as a data read model) operate as follows at a data read operation. Also, input/output lines (e.g., data read lines RD shown in FIGS. 28 and 29) of page buffers connected to PB 4IO units 30_1 to 30_9 shown in FIG. 26 are referred to as IO lines IO_4 to IO_7, IO lines IO_8 to IO_11, IO lines IO_12 to IO_15, IO lines IO_16 to IO_19, IO lines IO_20 to IO_23, IO lines IO_24 to IO_27, IO lines IO_28 to IO_31, IO lines IO_32 to IO_35, and IO lines IO_36 to IO_39. Also, Data Bus has an 8-bit bus width, and is referred to as a data bus Data_A<7:0>. ECC Bus has a 20-bit bus width, and is referred to as a data bus Data_B<:0>.

At the normal mode (e.g., the second mode of operation), the column coding circuit 103 sets one of column addresses of selection signals Sel_A<0> to Sel_A<4> to a high level and the remaining thereof to a low level and then the selection signals Sel_A<0> to Sel_A<4> to the data read model. For example, at the normal mode, 40-bit data of the IO lines IO_0 to IO_39 is sequentially output onto the data bus Data_A<7: 0> by sequentially providing the selection signals Sel_A<0> to Sel_A<4> to the data read model.

When the selection Sel_A<0> goes to a high level, the transistor 61a of the PB control circuit 60 is turned on. At this time, the PB 4IO unit 30_0 and the PB 4IO unit 30_1 connect the IO lines IO_0 to IO_7 to the data bus Data_A<7:0>. By this, the PB 4IO unit 30_0 and the PB 4IO unit 30_1 output read data Data_Out_A<7:0> (data on the IO lines IO_0 to IO_7) on the data bus Data_A<7:0>.

When the selection Sel_A<1> goes to a high level, the transistor 61a of the PB control circuit 60 is turned on. At this time, the PB 4IO unit 30_2 and the PB 4IO unit 30_3 connect the IO lines IO_8 to IO_15 to the data bus Data_A<7:0>. By this, the PB 4IO unit 30_2 and the PB 4 IO unit 30_3 output read data Data_Out_A<7:0> (data on the IO lines IO_8 to IO_15) on the data bus Data_A<7:0>.

When the selection Sel_A<2> goes to a high level, the transistor 61a of the PB control circuit 60 is turned on. At this time, the PB 4 IO unit 30_4 and the PB 4 IO unit 30_5 connect the IO lines IO_16 to IO_23 to the data bus Data_A<7:>. By this, the PB 4IO unit 30_4 and the PB 4IO unit 30_5 output read data Data_Out_A<7:0> (data on the IO lines IO_16 to IO_23) on the data bus Data_A<7:0>.

When the selection Sel_A<3> goes to a high level, the transistor 61a of the PB control circuit 60 is turned on. At this time, the PB 4IO unit 30_6 and the PB 4IO unit 30_7 connect the IO lines IO_24 to IO_31 to the data bus Data_A<7:0 >. By this, the PB 4IO unit 30_6 and the PB 4IO unit 30_7 output read data Data_Out_A<7:0> (data on the IO lines IO_24 to IO_31) on the data bus Data_A<7:0>.

Finally, when the selection Sel_A<4> goes to a high level, the transistor 61a of the PB control circuit 60 is turned on. At this time, the PB 4IO unit 30_8 and the PB 4IO unit 30_9 connect the IO lines IO_32 to IO_39 to the data bus Data_A<7:0>. By this, the PB 4 IO unit 30_8 and the PB 4IO unit 30_9 output read data Data_Out_A<7:0> (data on the IO lines IO_32 to IO_39) on the data bus Data_A<7:0>.

As described above, if the selection signal Sel_A is provided to the data read model five times, the PB 4IO units 30_0 to 30_9 connect the IO lines IO_0 to IO_39 to the data bus Data_A<7:0> by the 8-IO unit. By this, 40-bit data stored in memory cell transistors are read on Data Bus through bit lines and IO lines IO_0 to IO_39.

At the ECC mode (e.g., the first mode of operation), the ECC circuit 107 sets one of column addresses of the selection signals Sel_B<0> and Sel_B<1> to a high level and the other to a low level and outputs them to the data read model. 40-bit data of the IO lines IO_0 to IO_39 is sequentially read on a data bus Data_B<19:0> by sequentially providing the selection signals Sel_B<0> and Sel_B<1> to the data read mode.

When the selection Sel_B<0> goes to a high level, the transistor 61b of the PB control circuit 60 is turned on. At this time, the PB 4IO unit 30_0, 30_2, 30_4, 30_6, and 30_8 connect the data bus Data_B<19:0> to IO lines IO_0 to IO_3, IO_8 to IO_11, IO_16 to IO_19, IO_24 to IO_27, and IO_32 to IO_35. By this, the PB 4IO unit 30_0, 30_2, 30_4, 30_6, and 30_8 output read data Data_Out_B<19:0> (data on the IO lines IO_0 to IO_3, IO_8 to IO_11, IO_16 to IO_19, IO_24 to IO_27, and IO_32 to IO_35) on the data bus Data_B<19:0>.

When the selection Sel_B<1> goes to a high level, the transistor 61a of the PB control circuit 60 is turned on. At this time, the PB 4IO unit 30_1, 30_3, 30_5, 30_7, and 30_9 connect the data bus Data_B<19:0> to IO lines IO_4 to IO_7, IO_12 to IO_15, IO_20 to IO_23, IO_28 to IO_31, and IO_36 to IO_39. By this, the PB 4IO unit 30_1, 30_3, 30_5, 30_7, and 30_9 output read data Data_Out_B<19:0> (data on the IO lines IO_4 to IO_7, IO_12 to IO_15, IO_20 to IO_23, IO_28 to IO_31, and IO_36 to IO_39) on the data bus Data_B<19: 0>.

As described above, if the selection signal Sel_B is provided to the data read model two times, the PB 4IO units 30_0 to 30_9 connect the IO lines IO_0 to IO_39 to the data bus Data_B<19:0> by the 0-IO unit. By this, 40-bit data stored in memory cell transistors are read on ECC Bus through bit lines and IO lines IO_0 to IO_39. For example, when a selection signal is not provided five times at the normal mode, data on IO lines IO_0 to IO_3, IO_8 to IO_11, IO_16 to IO_19, IO_24 to IO_27, and IO_32 to IO_35 is not read on Data Bus. If a selection signal (e.g., Sel_B<0>) is provided once at the ECC mode, data of the IO lines IO_0 to IO_3, IO_8 to IO_11, IO_16 to IO_19, IO_24 to IO_27, and IO_32 to IO_35 may be read out on ECC Bus.

Figure 31:
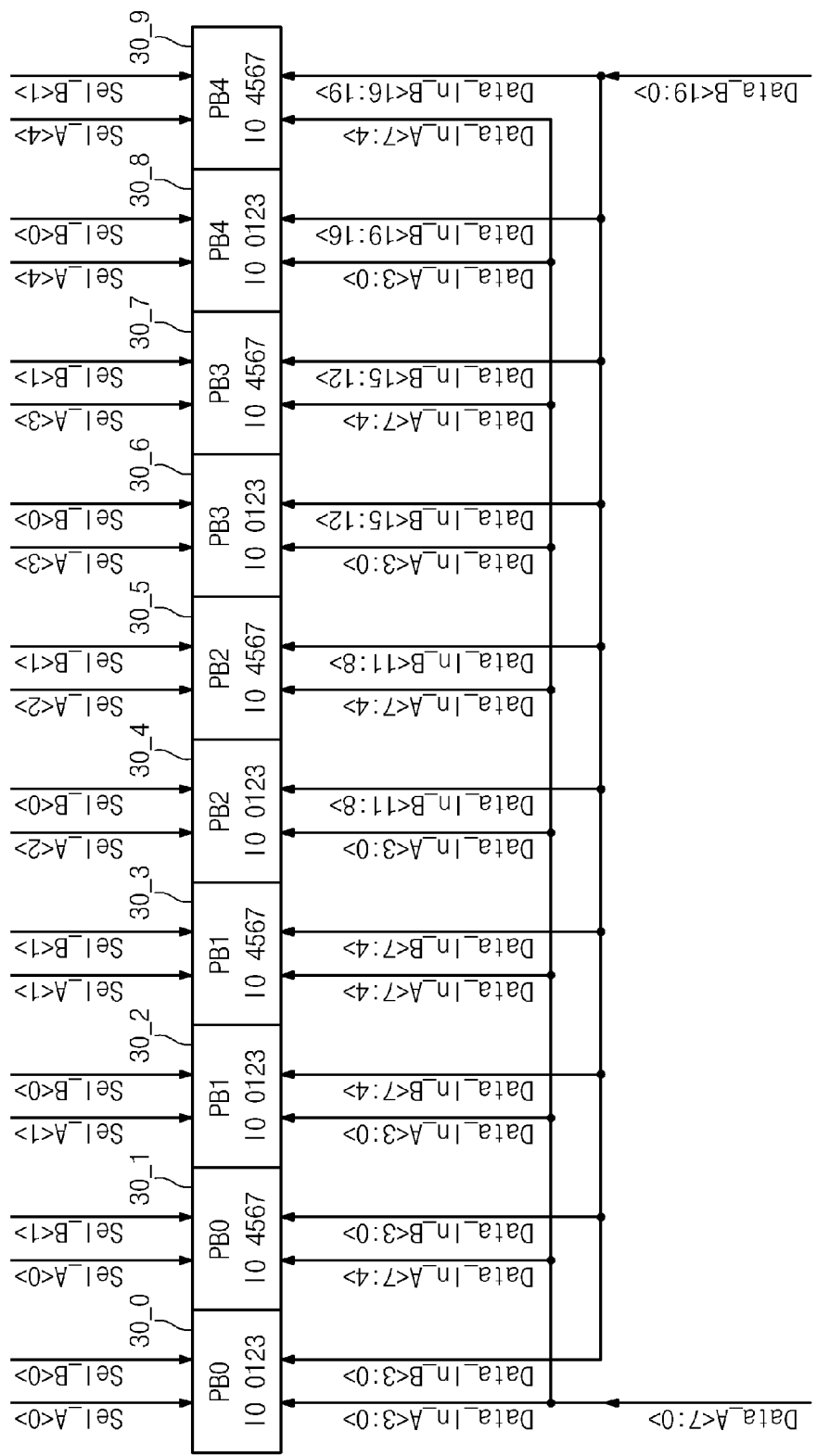
FIG. 31 is a diagram for describing a data write operation associated with a page buffer 102, a column coding circuit 103, and an ECC column coding circuit 108 shown in FIG. 24.

FIG. 31 is a diagram for describing a data write operation of a portion corresponding to a page buffer 102, a column coding circuit 103 and an ECC column coding circuit 108 shown in FIG. 24. A data write operation of a page buffer 102, a column coding circuit 103 and an ECC column coding circuit 108 (here, referred to as a data write model) is performed by an operation of a PB 4IO unit 30_0. A data transfer of the data write model is performed in a direction opposite to a direction shown in FIG. 31, and a description thereof is thus omitted.

In the data write model, for example, at a normal mode, data provided to IO lines IO_0 to IO_3, IO_8 to IO_11, IO_16 to IO_19, IO_24 to IO_27, and IO_32 to IO_35 is not written from Data Bus when a selection signal is not provided five times. In this behalf, if a selection signal (e.g., Sel_B<0>) is provided once at the ECC mode, the remaining data is written on the IO lines IO_0 to IO_3, IO_8 to IO_11, IO_16 to IO_19, IO_24 to IO_27, and IO_32 to IO_35 from ECC Bus.

A semiconductor memory device (or, a semiconductor memory device) 10 of the inventive concepts comprises a first data bus Data_B<19:0>, a second data bus Data_A<7:0> being different in number from the first data bus and independent from the first data bus Data_B<19:0>, and a data transfer unit (e.g., a PB control circuit 60 of each of PB 4IO units 30_0 to 30_9). When a data transfer with memory cells is performed at the first mode of operation, the data transfer unit connects bit lines, being equal in number to the first data bus, from among a plurality of bit lines to the first data bus to transfer data. When a data transfer with memory cells is performed at the second mode of operation, the data transfer unit connects bit lines, being equal in number to the second data bus, from among a plurality of bit lines to the second data bus to transfer data.

If the number of bit lines is n (n being a common multiple of p and q being a natural number, p>q), the first data bus is q, and the second data bus is q. If (n/p) address signals are received at the first mode of operation, the data transfer unit connects p bit lines to the p first data bus. If (n/q) address signals are received at the second mode of operation, the data transfer unit connects q bit lines to the second data bus.

Also, the NAND flash memory 10 comprises a memory array 101, a page buffer 82 configured to read data from the memory array 101 by the page unit and to store read data read from the memory array 101, an ECC circuit 107 configured to correct an error on the read data transferred from the page buffer 82 and to write the error-corrected data back in the page buffer 82, and an IO pad (or, an interface unit) 106 configured to output the read data written back in the page buffer 82. ECC Bus is connected to the ECC circuit 107, and Data Bus is connected to the IO pad 106.

In the NAND flash memory 10, the page buffer 82 stores write data received through the IO pad 106, and the ECC circuit 107 generates parity data on the write data transferred from the page buffer 82. The parity data and write data are written back in the page buffer.

By this, it is possible to control column coding, that is, addresses independently by preparing a plurality of data buses (e.g., ECC Bus and Data Bus). In exemplary embodiments, it is possible to control addresses independently by forming a data bus to be independent from input/output lines of the page buffer 102 (e.g., IO_0 to IO_39), that is, a portion directly connected to the page buffer. Thus, the semiconductor memory device according to an embodiment of the inventive concepts obtains the following effects.

(1) A high-speed operation is implemented by widening a bus width at the first mode of operation (e.g., the ECC mode). There is described such a case that when a column address is received once, 8-bit data is transferred to Data Bus at the second mode of operation (e.g., the normal mode) and 20-bit data is transferred at the ECC mode. A bus width is easily widened according to an input of Address_B, that is, column coding to the page buffer 102. For example, if two column addresses are used for 1024 PB units, it is possible to transfer data with the ECC Bus being widened a 512-bit bus width at the ECC mode. Also, it is possible to form a data bus independent from a portion directly connected to the page buffer and to control addresses independently. For this reason, as compared with the case that data is transferred to an ECC circuit using a part of the data bus like a conventional technique, a high-speed data transfer is implemented. The reason is that there is not required a circuit (e.g., a first latch circuit 70 of a conventional example) associated with address control for separating a data transfer at the normal mode and a data transfer at the ECC mode. In particular, in case of a defective PB unit, since the PB control circuit 60 transfers fixed data to the ECC circuit 107 through ECC Bus, it is unnecessary to transfer data repaired through the column repair circuit 104 on ECC processing to the ECC circuit 107 through ECC Bus. Also, it is unnecessary to dispose the column repair circuit 104 on ECC Bus the bus width of which is widened. For this reason, a time taken to transfer data from a page buffer to an ECC circuit at ECC processing is shortened by a time taken for repair processing of the column repair circuit 104. Also, since it is unnecessary to widen a bus width of Data Bus (e.g., a second data bus) at ECC processing, an increase in a circuit size of the column repair circuit 104 is suppressed.

(2) Freedom on address control and mapping is improved. At a normal mode, when 8-bit data is transferred using a column address, for example, data of IO lines IO_0 to IO_7 is transferred to Data Bus by providing a selection signal Sel_A<0> to PB4IO units 30_0 and 30_1. In this behalf, at an ECC mode, data on all addresses is transferred to the ECC circuit in a lump by allocating an address independent from the selection signals Sel_B<0> and Sel_B<1> to the PB 4IO units 30_0 and 30_1. For example, although normal data and parity data are assigned to different addresses of the selection signal Sel_A at a normal mode, they are assigned to the same address of the selection signal Sel_B at the ECC mode, and normal data and parity data are transferred to the ECC circuit in a lump. Thus, address control at the second mode of operation and address control at the first mode of operation are independent from each other, and freedom of address mapping is high.

Also, at the normal mode, a column address is used with respect to five selection signals Sel_A<0> to Sel_A<4>. At the ECC mode, a column address is used with respect to two selection signals Sel_B<0> and Sel_B<1>. This means that although a column address has a value not being $2^n$ in case of the user specification of the normal mode, it is easy to change an address space of the ECC mode to a unit space having a value of $2^n$. By this, a code composition of the ECC circuit 107, for example, a code length (e.g., optimization on code length composition in case of cumulative coding) may be decided with freedom, and optimal performance is achieved.

(3) A design change is easily made. In case of designing a product including an ECC circuit, it is assumed that a product is a derivation product and a product not including an ECC circuit is separately designed. In this case, data buses and column coding circuits associated with address control are independent with respect to the ECC mode and the normal mode. By this, it is possible to separate a circuit associated with the ECC mode and a circuit associated with the normal mode. Thus, it is easy to eliminate the circuit associated with the ECC mode. This means that a design change is easily made.

Figure 32A:
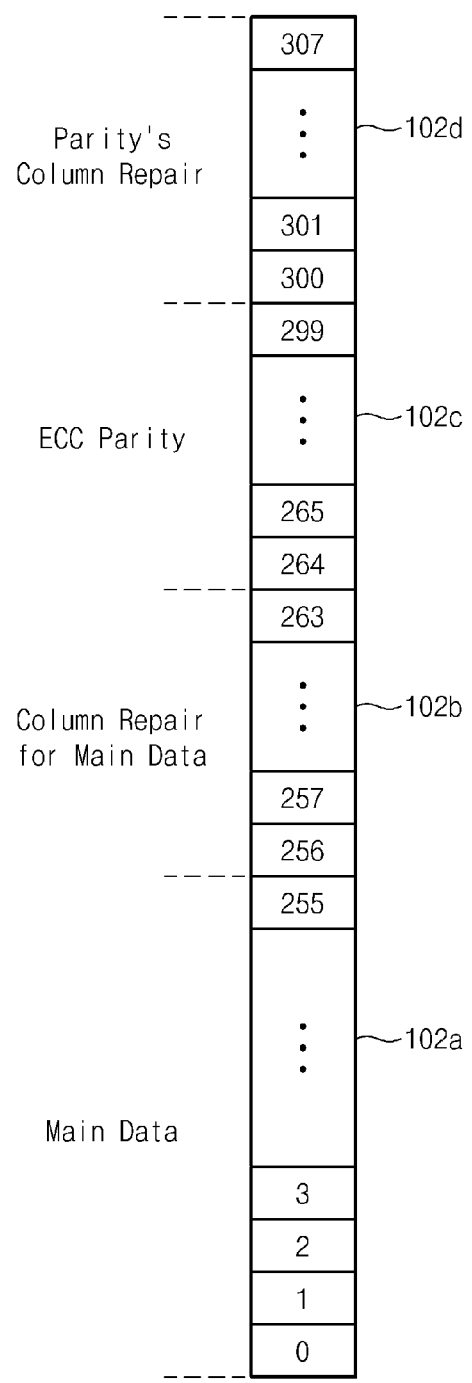
FIGS. 32A, 32B and 32C are diagrams for describing a data page associated with a page buffer 102 of FIG. 24.
Figure 32B:
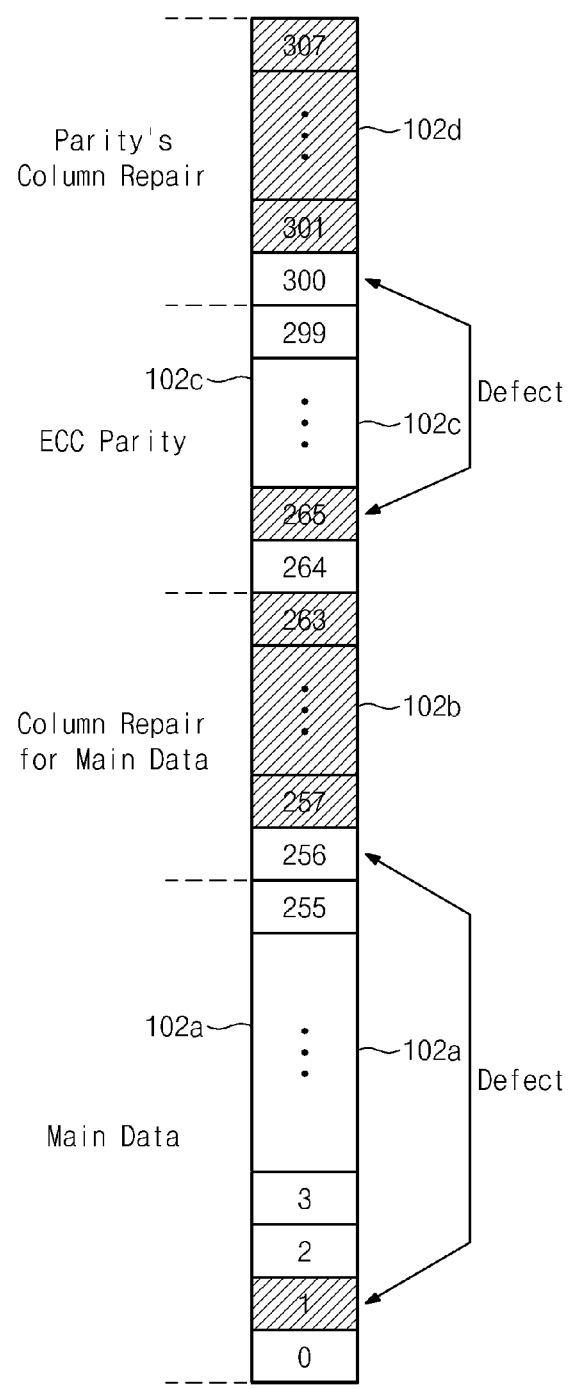
Figure 32C:
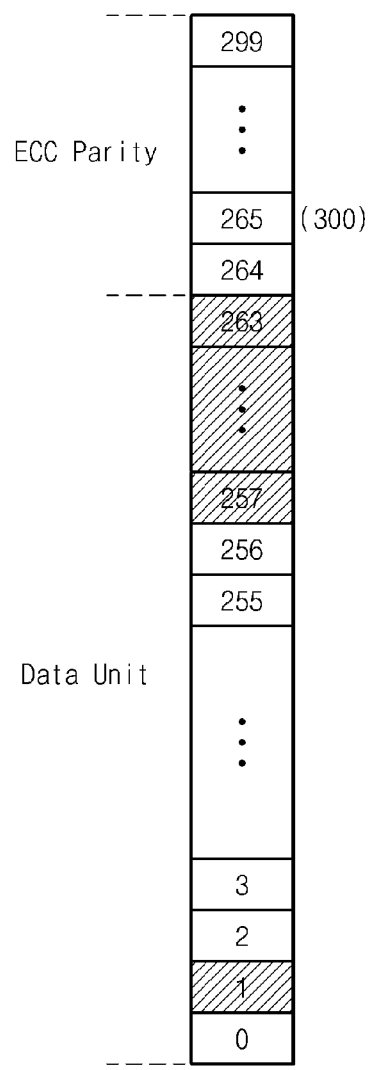

An example where a NAND flash memory shown in FIG. 24 operates at the first mode of operation and the second mode of operation is described with reference to a page buffer 102 and an operation flow chart. FIG. 32A through 32C are diagrams for describing each page buffer of a page buffer 102. FIGS. 33A through 33D are flow charts for describing an operation of a page buffer 102. In FIG. 32A, there are schematically illustrated a page buffer 120a for main data (normal data), a page buffer 102b for column repair for main data (repair data of normal data), a page buffer 102c for ECC parity (parity data), and a page buffer 102d for parity's column repair (repair data of parity data). In FIG. 32A, numbers indicate PB units (e.g., a PB control circuit 60 and bit internal circuits 50_0 to 50_7 shown in FIGS. 28 and 29) constituting the page buffers 102a to 102d. The numbers are numbers of selection signals Sel_A indicating locations of PB units, that is, Coding shown in FIG. 27B. That is, the page buffer 102a includes 256 PB units 0 to 255 for normal data, the page buffer 102b includes 8 PB units 256 to 263 for repair of normal data, the page buffer 102c includes 36 PB units 264 to 299 for parity data, and the page buffer 102d includes 8 PB units 300 to 307 for repair of parity data.

In FIG. 32B, there is illustrated an example in which when eight bit lines connected to a PB unit 1 of the page buffer 102a or memory cell transistors connected to eight bit lines are defective, the PB unit 1 of the page buffer 102a is replaced with a PB unit 256 of the page buffer 102b. Also, in FIG. 32B, there is illustrated an example in which when eight bit lines connected to a PB unit 265 of the page buffer 102c or memory cell transistors connected to eight bit lines are defective, the PB unit 265 of the page buffer 102c is replaced with a PB unit 300 of the page buffer 102d. PB units 257 to 263 of the page buffer 102b corresponding to a slashed portion in FIG. 32B are unused PB units, so that the PB units 257 to 263 are not selected by a column coding circuit 103 under a control of a column repair circuit 104. That is, the PB units 257 to 263 may be at an inactive state. PB units 301 to 307 of the page buffer 102d corresponding to a slashed portion in FIG. 32B are unused PB units, so that the PB units 301 to 307 are not selected by an ECC column coding circuit 108 under a control of a parity column repair circuit 105. That is, the PB units 301 to 307 may be at an inactive state.

At a normal mode, since the PB unit 1 of the page buffer 102a is not selected and the PB unit 256 replaced is selected by a selection signal Sel_A, read data Data_Out_A (e.g., data read from the PB unit 1) is output to an I/O pad 106 through DataBus_1, DataBus_2, and DataBus_3 (e.g., a second data bus). If write data is received from the I/O pad 106 at the normal mode, it is provided to the PB unit 255 through DataBus_3, DataBus_2, and DataBus_1 as the write data Data_A_In (data to be stored in the PB unit 1). As described above, a region of a page buffer where a user may provide a column address is from the PB unit 0 to the PB unit 255. That is, the PB unit 256 to 263 of the page buffer 102b, the PB units 264 to 299 of the page buffer 102c, and the PB units 300 to 307 of the page buffer 102d form a page buffer region that is inaccessible by a user.

The PB unit 1 of the page buffer 102a is selected by a selection signal Sel_B at an ECC mode, and read data Data_Out_B fixed to a low level or a high level is transferred to an ECC circuit 107 through ECCBus_1 and ECCBus_2 (e.g., a first data bus) to be used for ECC processing. Also, the repaired PB unit 256 is selected by the selection signal Sel_B, and read data Data_Out_B is transferred to the ECC circuit 107 through ECCBus_1, ECCBus_2, and ECCBus_3 to be used for ECC processing as read data of the PB unit 1 seen from the user. At the ECC mode, if the ECC processing is ended, data to be written back at the PB unit 1 is provided to the PB unit 255 through ECCBus_3, ECCBus_2, and ECCBus_1 (e.g., a first data bus) as write data Data_A_In. In addition, data, corresponding to PB units 0 to 255, from among ECC-processed data may be provided to the external device as clear data through a data bus Data_A.

The PB unit 265 of the page buffer 102c is selected by the selection signal Sel_B at the ECC mode, and read data Data_Out_B fixed to a low level or a high level is transferred to a parity column repair circuit 105 through ECCBus_1 and ECCBus_2 (e.g., data bus Data_B). Also, the repaired PB unit 300 is selected by the selection signal Sel_B, and read data Data_Out_B is transferred to the parity column repair circuit 105 through ECCBus_1 and ECCBus_2 to repair processing. At the ECC mode, if the ECC processing is ended, data to be written back at the PB unit 265 is provided to the parity column repair circuit 105 through ECCBus_3 for repair processing, and resultant data is then provided to the PB unit 300 through ECCBus_2 and ECCBus_1 (e.g., a first data bus) as write data Data_B_In. In addition, ECC-processed data is not output to the external device through the data bus Data_A as described above.

Figure 33A:
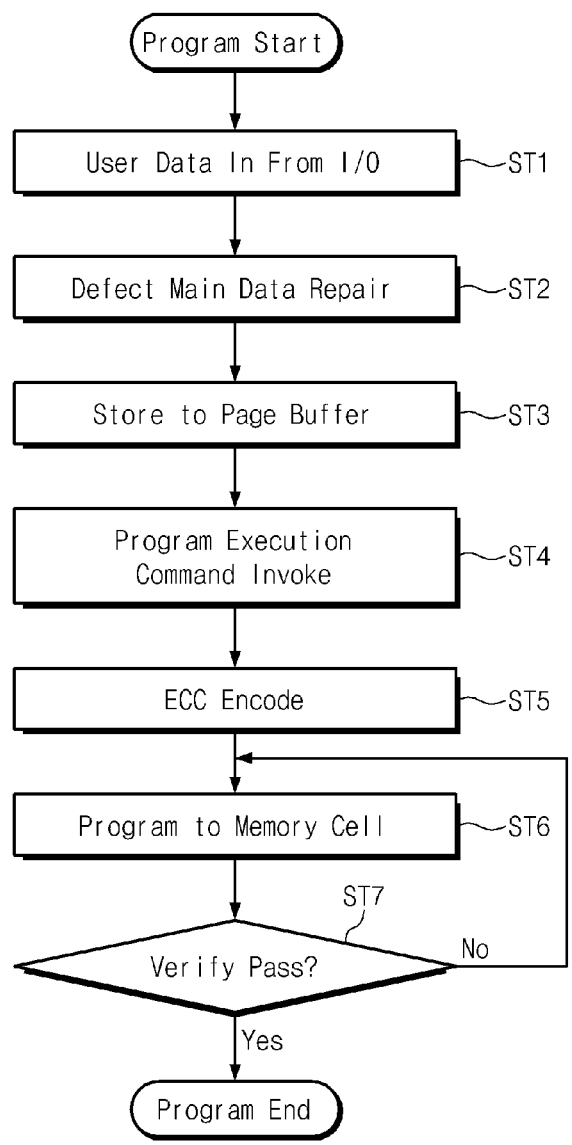
FIGS. 33A, 33B, 33C and 33D are flow charts for describing an operation of a page buffer 102 shown in FIG. 24.
Figure 33B:
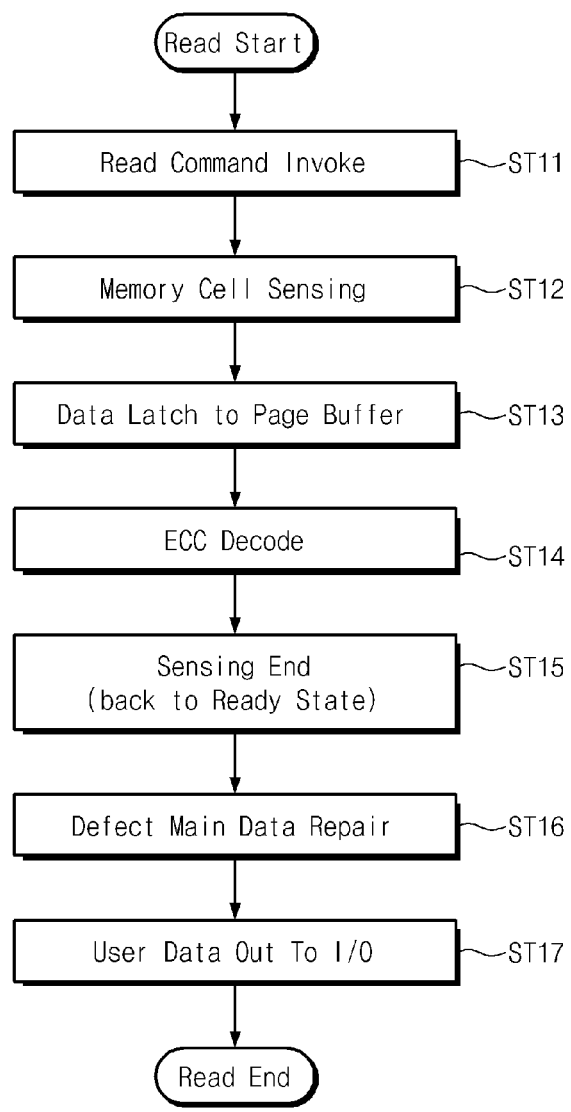
Figure 33C:
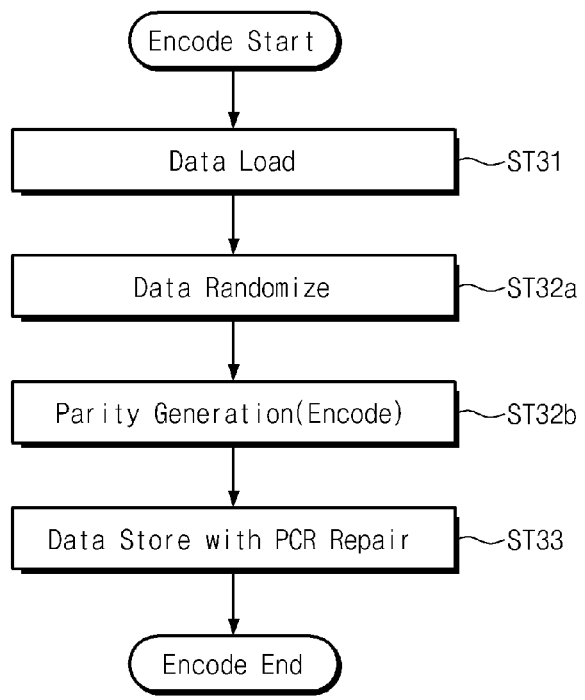
Figure 33D:
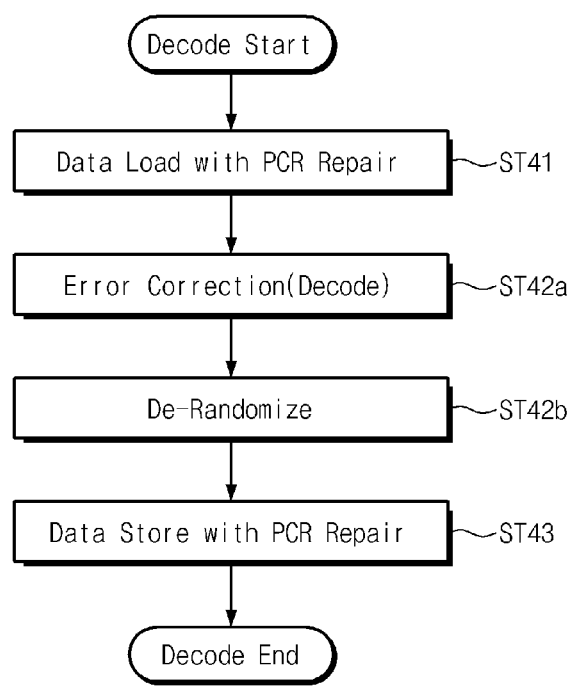

A data write operation to a memory cell transistor and a data read operation from a memory cell transistor are described with reference to FIG. 33A through 33D. FIG. 33A shows a data write operation, FIG. 33B shows a data read operation, FIG. 33C show a randomizing and encoding operation of a randomizer and ECC circuit 107 shown in FIG. 25, and FIG. 33D shows a de-randomizing and decoding operation of a randomizer and ECC circuit 107 shown in FIG. 25. An operation of the page buffer 102 at an ECC mode is in detail described mainly based on a repair operation.

Data Write Operation

In step ST1, a user provides a NAND flash memory 10 with a predetermined command (e.g., a write command), an address (here, indicating a column address selecting a PB unit 1), and write data through an I/O pad 106. In step ST2, a repair of normal data is executed. More particular, a column coding circuit 103 selects a PB unit 256 instead of a PB unit 1 under a control of a column repair circuit 104 such that the write data is stored in the PB unit 256.

After a time elapses, the method proceeds step ST6 when a mode is a normal mode (e.g., a second operation mode) where the user invokes a program execution command. In step ST6, programming is executed such that data is transferred to a memory cell transistor from a page buffer through a bit line. In case of an ECC mode (e.g., a first mode of operation), the method proceeds to step ST5 to execute an ECC encoding operation as follows.

Here, FIG. 32C shows a code structure at ECC processing. A data unit is data stored in PB units 0 to 263, and a parity unit (ECC unit) is data stored in PB units 264 to 299. Data to be written in the PB unit 1 is stored in the PB unit 256, and data stored in memory cell transistors are read and stored in PB units 0 and 2 to 255 through connected thereto. In step ST31, data stored in the PB units 0 to 263 is provided to a randomizer and ECC circuit 107 through ECCBus_1, ECCBus_2, and ECCBus_3 (e.g., a first data bus).

As described above, at this time, fixed data (e.g., L data in case of a PB control circuit 60 shown in FIG. 28 or H data in case of a PB control circuit 60 shown in FIG. 29) is provided from the PB unit 1 to the randomizer and ECC circuit 107. Data that is data to be written in the PB unit but data written in the PB unit 256 is provided to the ECC circuit 107 from the PB unit 256. A randomizer 107b performs a data randomizing operation (ST32a) and outputs randomized data to an ECC circuit 107a. The ECC circuit 107a generates parity data by encoding the randomized data (ST32b).

The randomizer and ECC circuit 107 writes ECC-processed data back in the PB units 0 to 307 (ST33). Here, data of the randomizer 107b (refer to FIG. 25) is written back in PB units 0 to 263, and data of a parity generation circuit 41 is written back in PB units 264 to 307. At this time, an ECC coding circuit 108 selects a PB unit 300 instead of a PB unit 265 under a control of a column repair circuit 105. By this, parity data to be written back in the PB unit 265 is stored in the PB unit 300. Data randomized data in step S32a is written at the PB units 0 to 263, and parity data is written at the PB units 264 and 307 (refer to a slashed portion in FIG. 32B). Data is not written at an inactive page buffer by a circuit shown in FIG. 28 or 29.

Since data Data_i to be written at a memory cell is latched by a latch unit (refer to FIG. 30) of each PB unit, a memory cell transistor is programmed (ST6). Data is iteratively provided to a memory cell from a latch unit of each PB unit until a program operation is passed (ST7). If the program operation is passed, the iterative process is ended (ST7—Yes). If the program operation is not passed, the procedure goes to step ST6 for a program operation until the program operation is passed (ST7—No).

Data Read Operation

A user provides a predetermined command (e.g., a read command) and an address (e.g., a column address selecting the PB unit 1) (ST11). Data of a memory cell transistor is sensed by a latch unit of each PB unit and the sensed data is latched on a connection node N1 of a bit internal circuit show in FIG. 29 (ST12). Data_i is latched by the latch unit of the bit internal circuit (ST13). In case of a normal mode (e.g., a second mode of operation), the procedure goes to step ST15 to end a sensing operation. In case of an ECC mode (e.g., a first mode of operation), the procedure goes to step ST14 to perform an ECC decoding operation as follows.

Data stored in PB units 0 to 299 is provided to the randomizer and ECC circuit 107 through ECC Bus_1, ECC Bus_2, and ECC Bus_3 (a first data bus) (ST41). As described above, at this time, fixed data (e.g., L data in cased of a PB control circuit 60 shown in FIG. 28 or H data in case of a PB control circuit 60 shown in FIG. 29) is provided to a syndrome calculation circuit 31 of the ECC circuit 107a (refer to FIG. 25) from the PB unit 1. Also, data that is data to be written at the PB unit 1 but data to be written at the PB unit 256 is provided to the syndrome calculation circuit 31 of the ECC circuit 107a from the PB unit 256. Also, parity data that is data to be written at the PB unit 300 but data to be written at the PB unit 265 is provided to the parity column repair circuit 105 from the PB unit 265 through ECC Bus_1 and ECC Bus_2 for repairing, and resultant data is provided to the syndrome calculation circuit 31 of the ECC circuit 107a through ECC Bus_3. The randomizer and ECC circuit 107 corrects an error of data stored in PB units 0 to 263 by performing a decoding operation based on parity data (ST42a). The randomizer 107b de-randomizes error-corrected data after ECC processing (ST42b).

The randomizer and ECC circuit 107 stores de-randomized data in the PB units 0 to 307 (ST43). Here, the randomizer 107b writes data back in the PB units 0 to 307, and ECC-processed data (e.g., error-corrected data) is stored in the PB units 0 to 263. Since parity data units of PB units 264 to 307 are not used by the user, ECC-processed data (e.g., error-corrected data) is not stored in the PB units 264 to 307. Since a unit is not used with respect to a parity data unit of PB units 264 to 307, error-corrected data may not be written back or may be written back. The PB unit 300 is selected instead of the PB unit 265 under a control of a parity column repair circuit 105. By this, error-corrected parity data to be written back in the PB unit 265 is stored in the PB unit 300. A page buffer having an inactive state as a slashed portion in FIG. 19B is not written by a circuit shown in FIG. 28 or 29.

In each PB unit, data Data_i to be written at a memory cell is latched by a latch unit shown in FIG. 30, so that a sensing operation is ended (ST15). As a selection signal Sel_A is provided to the PB units 0 to 255, data stored therein is read through DataBus_1, DataBus_2, and DataBus_3. At this time, a column coding circuit 103 selects the PB unit 256 instead of the PB unit 1 under a control of the column repair circuit 104. The PB unit 256 outputs data that is data to be written at the PB unit 1 but data written at the PB unit 256. That is, a defect column is repaired (ST16). As described above, write data written at memory cell transistors through the PB unit 1 according to a user's request is written at another memory cell after repairing. Also, an error of the written data is corrected and the error-corrected data is output from the I/O pad (ST17).

A semiconductor memory device comprises ECC Bus_1~3 (a first data bus); Data Bus_1~3 (a second data bus) being different in number from the first data bus and independent from the first data bus; and a page buffer (a data transfer unit), wherein when a data transfer with memory cells is performed at a first mode of operation (an ECC mode), the data transfer unit connects bit lines, being equal in number to the first data bus, from among a plurality of bit lines to the first data bus to transfer data; wherein the data transfer unit comprises a page buffer 102a (a first page buffer) which amplifies a voltage of a bit line connected to a normal memory cell and latches the amplified result; a page buffer 102b (a second page buffer) which is replaced together with a normal memory cell and a bit line when a normal memory cell or a bit line connected to the first page buffer is defective; and a page buffer 102c (a third page buffer) which amplifies a voltage of a bit line connected to a parity memory cell and latches the amplified result, and wherein the second data bus is connected to the first and third page buffers and the first data bus is connected to the first to third page buffers.

The semiconductor memory device further comprises a page buffer 102d (a fourth page buffer) which is connected to the first data bus and is replaced together with a parity memory cell and a bit line when a parity memory cell or a bit line connected to the first page buffer is defective. The semiconductor memory device further comprises a column repair circuit 104 (a first repair circuit) which is connected to the second data bus and replaces a page buffer, associated with a defective memory cell or bit line, of the first page buffer with the third page buffer. The semiconductor memory device further comprises a parity column repair circuit 105 (a second repair circuit) which is connected to the first data bus and replaces a page buffer, associated with a defective memory cell or bit line, of the second page buffer with the fourth page buffer. The semiconductor memory device further comprises an ECC circuit 107a which is connected to the first data bus and corrects an error of data from the first and third page buffers based on data from the second and fourth page buffers. The semiconductor memory device further comprises a page buffer control circuit which outputs fixed data as an output of a page buffer, associated with a defective memory cell or bit line, of the first page buffer.

Also, the page buffer control circuit does not allow a write operation from the first data bus when a memory cell or a bit line is defective.

Also, the first mode of operation is a mode of operation where input data of the ECC circuit is output as output data without repairing on a page buffer, associated with a defective memory cell or bit line, from among the first page buffer and the second page buffer used for a repair at the second mode of operation.

Also, when the number of bit lines is n (n being a common multiple of p and q being a natural number, p>q), the first data bus is q, and the second data bus is q. If (n/p) address signals are received at the first mode of operation, the data transfer unit connects p bit lines to the p first data bus. If (n/q) address signals are received at the second mode of operation, the data transfer unit connects q bit lines to the second data bus. Although the number n of physical bit lines is not a common multiple of p and q, the remaining may be used as dummy bit lines.

With the inventive concepts, since it is easy to widen a bus width of the ECC bus (e.g., a first data bus) to the ECC circuit 107 (e.g., a bus width to the ECC circuit being 300 bits), also, a repair circuit (e.g., a column repair circuit 104) of a main data unit is unnecessary on the ECC bus. For this reason, it is possible to implement a high-speed data transfer at ECC processing. Also, since a size of a repair circuit of the main data unit is not increased unlike a conventional technique, an increase in chip size is suppressed and a cost for fabrication is lowered.

Also, in exemplary embodiments, there is described an embodiment where there is used a PCR repair system (e.g., a parity column repair circuit 105) dedicated to a parity unit having a size smaller than that of a repair circuit of the main data unit. However, the inventive concepts are not limited thereto. Only, the parity column repair circuit 105 is useful to repair a defect of the parity unit. In the event that the parity column repair circuit 105 is not used, the error correction capacity is damaged. The reason is that an error is corrected by probability of 50% (0 or 1) per bit of column. In this behalf, as described above, the ECC correction capacity is improved by repairing a defect of the parity unit using the parity column repair circuit 105.

Also, the semiconductor memory device is configured such that the first mode of operation and the second mode of operation are electrically switched. For example, it is possible to write a switching signal (0 or 1) through an I/O pad 106 at an operation mode conversion flag installed at a nonvolatile memory area (not shown). If the switching signal is set to 1, a NAND flash memory 10 is viewed as an EM NAND product and operates at the ECC mode (e.g., a first mode of operation). On the other hand, if the switching signal is set to 0, the NAND flash memory 10 is viewed as a Pure NAND product and operates at the normal mode (e.g., a second mode of operation).

Also, the switching flag is configured such that the switching signal is written using a test mode not opened to a user. A maker sets the NAND flash memory 10 to either one of the EM NAND and the Pure NAND using a test mode after the NAND flash memory 10 is fabricated. Therefore, before shipment, the NAND flash memory 10 is set to the Pure NAND having the second mode of operation or the EM NAND having the first mode of operation and is tested. Or, inventory control is made according to an order of products. For this reason, it is difficult to improve productivity.

Below, there is described an embodiment of a semiconductor memory device which is helpful to suppress an increases of chip size, to simplify a test operation and to improve productivity.

Parity Area Open

Figure 34A:
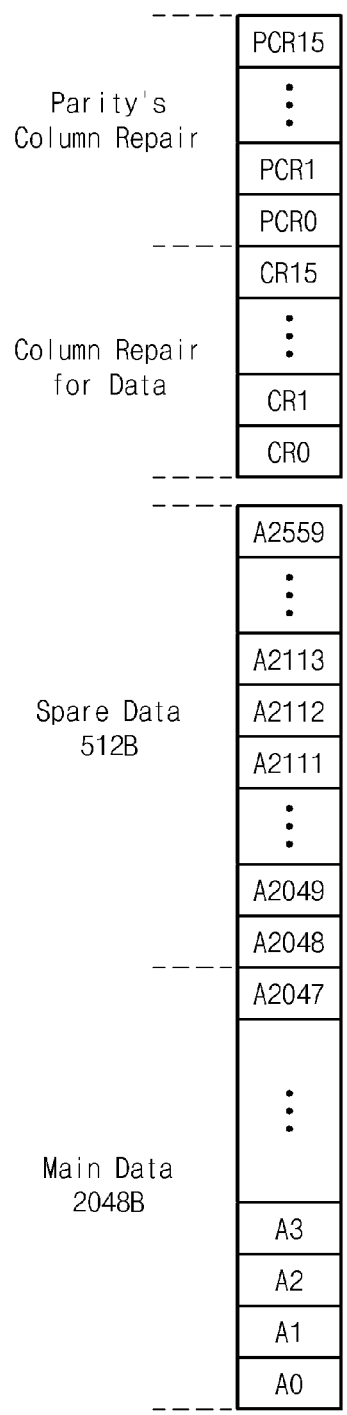
FIGS. 34A and 34B are diagrams for describing another example of page data associated with a page buffer 102 shown in FIG. 24.
Figure 34B:
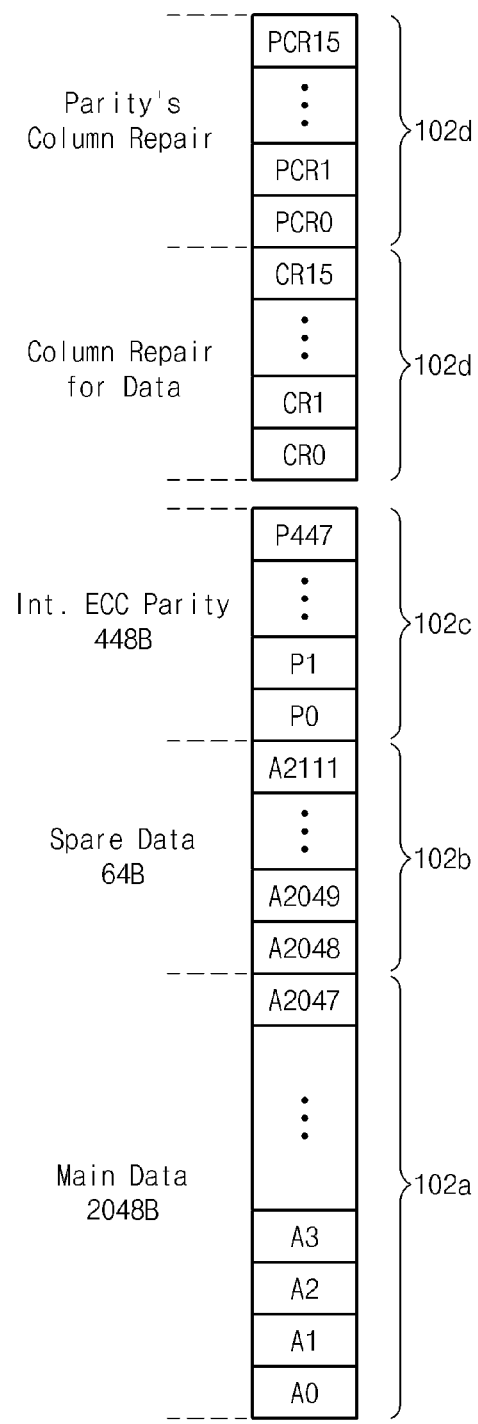

FIGS. 34A and 34B are diagrams for describing page data associated with a page buffer 102 according to another embodiment of the inventive concepts. A page buffer 102 is formed of page buffers 102a and 102d as shown in FIG. 24. Here, FIG. 34A shows allocation of column addresses of Pure NAND (e.g., a second mode of operation) in the page buffer 102, and FIG. 34B shows allocation of column addresses of EM NAND (e.g., a first mode of operation) in the page buffer 102.

In FIG. 34A, there is illustrated a structure of the page buffer 102 at EM NAND. FIG. 34B schematically shows a page buffer 102a for main data (or, normal data) and spare data and a page buffer 102b for column repair for main data (or, repair data of normal data and spare data). FIG. 34B schematically shows a page buffer 102c for ECC parity (or, parity data) and a page buffer 102d for parity's column repair (or, repair data of parity data). spare data of EM NAND, for example, is data such as a parity area used for external low-level ECC processing, the number of program execution operations performed in a NAND flash memory 10, the number of bits corrected by the ECC processing, etc. In a user of the NAND flash memory 10, such data may be valuable information indicating the lifetime of the NAND flash memory 10. That is, the user may use an area of a memory array 101 including the page buffer 102a for normal data and spare data.

Meanwhile, in Pure NAND, as illustrated in FIG. 34A, an area of the memory array 101 including the page buffer 102c is opened for spare data, and is used as an area where parity data other than the valuable information is stored at ECC processing of an external controller together with the area of the memory array 101 including the page buffer 102a.

In FIGS. 34A and 34B, there are illustrated numbers corresponding to eight PB units (e.g., a circuit formed of a PB control circuit and bit internal circuits 50_0 to 50_7 shown in FIGS. 28 and 29) constituting the page buffers 102a to 102d. The numbers is Coding shown in FIG. 27B, that is, numbers of a selection signal Sel_A or a selection signal Sel_B indicating a location of a PB unit.

As illustrated in FIG. 34B, in a NAND flash memory 10 as EM NAND, the page buffer 102a includes 8 PB units (hereinafter, referred to as PB 8IO units) for normal data and spare data and 1221 PB 8IO units A0 to A2111. The page buffer 102b has 16 PB 8IO units CR0 to CR15 as the PB 8IO units for repair of normal data. The page buffer 102c 448 PB 8IO units P0 to P447 as the PB 8IO units for parity data. The page buffer 102d includes 16 PB 8IO units PCR0 to PCR15 as the PB 8IO units for repair of parity data.

Here, the page buffer 102c shown in FIG. 34B may use 448 PB 8IO units A2012 to A2559 as PB 8IO units for spare data in Pure NAND shown in FIG. 34A. That is, the Pure NAND has column addresses A0 to A25559 (2048+512). The size of data corresponding to one column address is 1 Byte. In the Pure NAND, a pure main data area is A0 to A2047, and an external ECC parity area and another information area is the above-described spare area, which is accessed using column addresses A2048 to A2559.

That is, in the Pure NAND shown in FIG. 34A, a user provides a column address (e.g., A0 to A2559 shown in FIG. 34A) corresponding to the selection signal Sel_A through an I/O pad 106. By this, a column coding circuit 103 outputs the selection signal Sel_A to the page buffers 102a and 102c, and data is accessed through the I/O pad 106. Also, a data access according to an embodiment of the inventive concepts means an operation where the selection signal Sel_A is provided from the column coding circuit 103 to a PB control circuit 60 of a page buffer and data is written at a memory cell transistor through a data bus (e.g., a second data bus) and a bit line connected to the PB control circuit 60 and an operation where data is read from a memory cell transistor.

Meanwhile, column addresses A0 to A2047 is allocated to a data unit of EM NAND like the Pure NAND. But, in case of a spare unit, since a chip includes an ECC circuit 107a, external ECC processing is unnecessary and low-level ECC processing does not need a parity area. Therefore, only 64 B is allocated to a spare area as shown in FIG. 34B. Thus, in the Pure NAND, an area to which column addresses A2112 to A2559 are allocated may be allocated for internal ECC parity. Also, physically, an area of the Pure NAND to which column addresses A2112 to A2559 are allocated and an area of the EM NAND to which column addresses P0 to P447 are allocated may have identical memory cells. That is, in the EM NAND shown in FIG. 34B, an area where a column address starts from 'A' is an area that is accessible by an external device. meanwhile, an area where a column address starts from 'P' is an area for embedded ECC parity, an area where a column address starts from 'CR' is a column repair area for main and spare data, and an area where a column address starts from 'PCR' is a column repair area for embedded ECC parity. Such areas are inaccessible from the outside of the EM NAND.

That is, in the EM NAND shown in FIG. 34B, a user provides a column address (e.g., A0 to A2111 shown in FIG. 34B) corresponding to the selection signal Sel_A through the I/O pad 106. By this, the column coding circuit 108 enables a data access to the page buffer 102a through the I/O pad 106 using the selection signal Sel_A.

Only, at an access (e.g., a data write operation) of the EM NAND, data read from memory cell transistors is partially revised by externally provided data by a PB control circuit 60 of the page buffer 102a. An ECC column coding circuit 108 outputs the selection signal Sel_B to the page buffer 102a, and data of the page buffer 102a is provided to a randomizer and ECC circuit 107 through an ECC bus (e.g., a first data bus) for randomization and ECC processing. The ECC column coding circuit 108 outputs the selection signal Sel_B to the page buffer 102c, and parity data thus generated is stored in the page buffer 102c. Afterwards, memory cell transistors are programmed.

Meanwhile, at an access (e.g., a data write operation) of the EM NAND, the ECC column coding circuit 108 outputs the selection signal Sel_B to the page buffers 102a and 102c. by this, data read from memory cell transistors by PB control circuits 60 of the page buffers 102a and 102c is provided to the randomizer and ECC circuit 107 through an ECC bus (e.g., a first data bus) for ECC processing and de-randomization. The ECC column coding circuit 108 outputs the selection signal Sel_B to the page buffer 102a, and the de-randomized (e.g., data after decoding) is written at the page buffer 102a. afterwards, the column coding circuit 103 outputs the selection signal Sel_A to the page buffer 102a, and data of the page buffer 102a is output to the exterior through a data bus (e.g., a second data bus) and the I/O pad 106.

In a control circuit (not shown in FIG. 24), switching between the Pure NAND and the EM NAND is made by a manufacturer after shipment of the NAND flash memory 10. For example, during a test mode not published to a user, data '1' or '0' provided from the exterior through the I/O pad 106 may be written at a nonvolatile storage unit (e.g., flag) of a control circuit. In the event that the flag stores '0', the control circuit controls each circuit such that the NAND flash memory 10 acts as the Pure NAND. In the event that the flag stores '1', the control circuit controls each circuit such that the NAND flash memory 10 acts as the EM NAND.

That is, in the event that the NAND flash memory 10 is fabricated as the Pure NAND, an inaccessible page buffer 102c of the NAND flash memory 10 fabricated as the EM NAND is accessed through a user data access operation after shipment.

As described above, column addresses A0 to A2111 are used in common by the Pure NAND and the EM NAND by changing a spare area of the Pure NAND to a parity unit for embedded ECC. Such changing is limited to a portion following the column address A2111. That is, it is possible to open a parity area for on-chip ECC and to allocate the opened area to a spare area of a user. For example, the Pure NAND necessitates a spare area for external ECC corresponding to about 20% (this value being variable by process generation) of a main area. However, since a parity unit of the EM NAND is used, overhead does not arise. With the inventive concepts, it is possible to suppress an increase in a chip area by a size corresponding to a spare area. That is, an increase in cost for chip fabrication is suppressed and productivity is improved.

Mask Control Function

Meanwhile, in the EM NAND shown in FIG. 34B, if a user accesses an area exceeding a usable data area (e.g., column addresses A0 to A2111), embedded ECC parity data is accessed, and data being random with respect to external system is output. This means that the external system is confused. For this reason, in the event that the user accesses an area of column addresses P0 to P447 exceeding a usable data area of column addresses A0 to A2111, mask control is made as follows.

Figure 35:
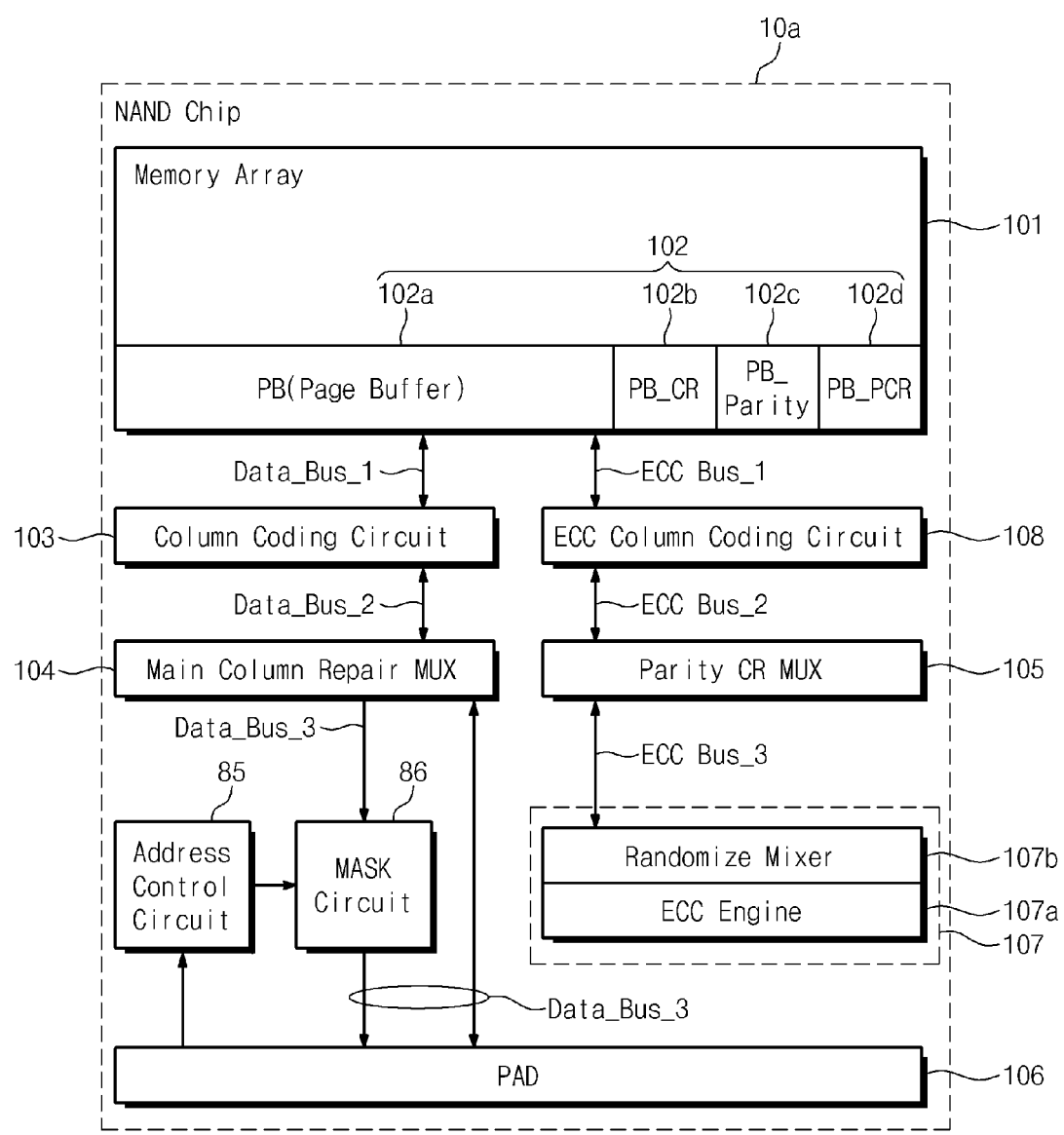
FIG. 35 is a block diagram schematically illustrating another example of a NAND flash memory.

FIG. 35 is a block diagram schematically illustrating a NAND flash memory device according to another embodiment of the inventive concepts. FIG. 16 is a diagram schematically illustrating a mask circuit of a NAND flash memory 10 shown in FIG. 35.

In FIG. 35, constituent elements that are identical to those of a NAND flash memory shown in FIG. 24 are marked by the same reference numerals, and a description thereof is thus omitted.

The NAND flash memory 10 shown in FIG. 35 has an address control circuit 85 and a mask circuit 86. Although not shown in FIG. 24, the address control circuit 85 is a circuit that supplies a column address, which a user inputs through an IO pad 106, to a column coding circuit 83, like a conventional technique (shown in FIGS. 44 and 47). In response to a column address supplied from the address control circuit 85, the column coding circuit 83 selects a page buffer unit of a page buffer 102 (e.g., page buffer units corresponding to A0 to A2559 in FIG. 34) corresponding to the input column address. By this, a PB control circuit 60 of the page buffer 102 is connected with a data bus, so that data from a memory cell transistor is output to the IO pad 106 or data to be written at a memory cell transistor is received from the IO pad 106.

In addition to the above-descried basic function, the address control circuit 85 shown in FIG. 35 includes a well-known comparison circuit. If a column address exceeds a final address of a page buffer 102a, that is, is A2112, for example, the address control circuit 85 outputs a high level of final address signal to the mask circuit 86.

Figure 36A:
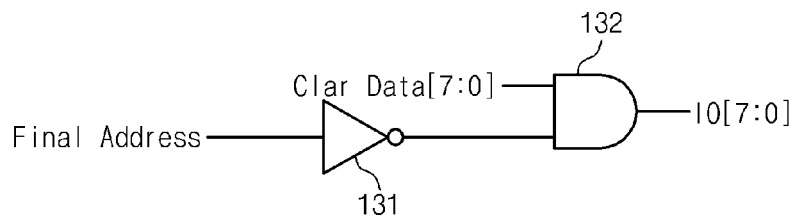
FIGS. 36A, 36B and 36C are diagrams for describing a mask control scheme of a NAND flash memory 10 shown in FIG. 35.

The mask circuit 86 is configured as illustrated in FIG. 36A. That is, as illustrated in FIG. 36A, the mask circuit 86 comprises an inverter circuit 131 and an AND circuit 132. An input of the inverter circuit 131 is connected to the comparison circuit of the address control circuit 85 to receive the final address signal, and the inverter circuit 131 outputs an inverted version of final address signal to a second input terminal the AND circuit 132. A first input terminal of the AND circuit 132 is connected to receive data Clear Data[7:0] that is provided from a column repair circuit 104 through a data bus Data_Bus_3 and is error-free data after ECC processing. An output terminal of the AND circuit 132 is connected to the I/O pad 106 through the data bus Data_Bus_3 as illustrated in FIG. 35.

With the above-described structure, the comparison circuit of the address control circuit 85 determines whether a column address reaches a decided final address (e.g., A2111) and outputs the final address signal to the mask circuit 86. By this, in the event that a column address indicating a page buffer unit is decided as an address following the final address (e.g., decided as an address after A2112 indicating a first page buffer unit of a page buffer 102c), the mask circuit 86 masks data of the page buffer 102c and outputs fixed data 0 (IO [7:0]=00h).

Figure 36B:
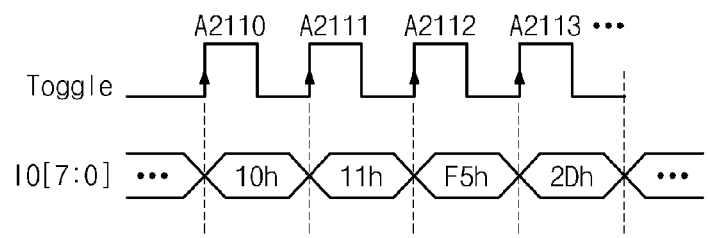
Figure 36C:
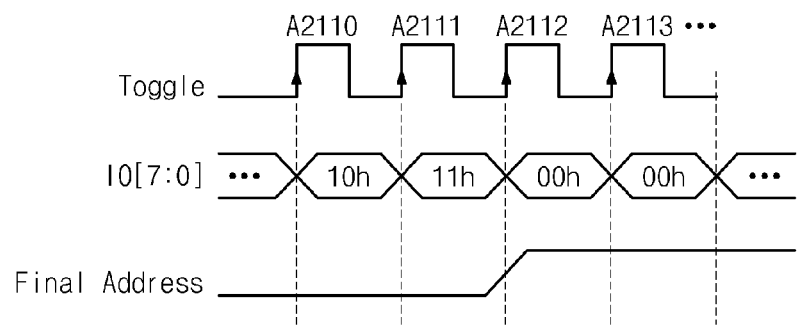

FIGS. 36B and 36C are operation timing diagrams when a mask control operation is performed and when a mask control operation is not performed.

As illustrated in FIG. 36B, in the event that a NAND flash memory 10 shown in FIG. 35 performs a burst read operation without a mask control operation, an internal column address is increased by an external toggle on a column address like FIG. 3. Data IO[8:0] is output to the I/O pad 106 at a rise edge of a toggle. Also, the burst read operation is a mode of operation where read data is sequentially output by supplying a column address after driving a word line in response to an active command at the same time with supplying of a row address.

Here, in EM NAND (e.g., a first mode of operation), since data after a column address A2112 is embedded ECC parity data, random data is provided to an external system. That is, the external system is confused. As illustrated in FIG. 36C, if a column address reaches an embedded ECC parity area (i.e., a page buffer 102c), data of the page buffer 102c is masked and fixed data 0 (IO [7:0]=00h) is output. As described above, in the EM NAND of the inventive concepts, if a read operation on data exceeding a conventional final address is requested, the such a problem that parity information of ECC processing appears at the I/O pad 106 regardless of an address space other than a user-accessible area is prevented by the mask control function.

First Redundancy Control Function

In the EM NAND (e.g., a product having a first mode of operation), if a parity area (e.g., a page buffer 102c) is defective, a defective page buffer unit is replaced with a page buffer unit of a page buffer 102d. In Pure NAND (e.g., a product having a second mode of operation), if a defect exists at the page buffer 102c, a defective area is opened as a spare data area as described above. For this reason, a repair is performed by a general redundancy system. In exemplary embodiments, repair techniques on a partial address space (e.g., a parity data area) are different every product. This will be more fully described with reference to FIGS. 37A through 37C.

Figure 37A:
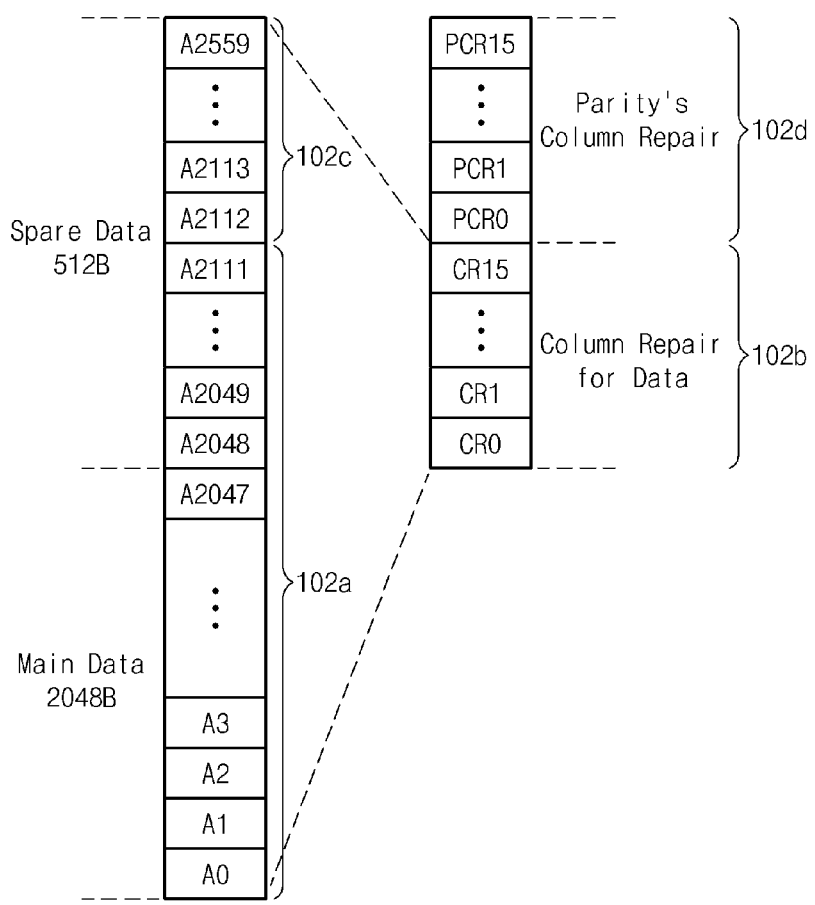
FIGS. 37A, 37B and 37C are diagrams for describing a redundancy control scheme of a NAND flash memory 10 shown in FIG. 35.
Figure 37B:
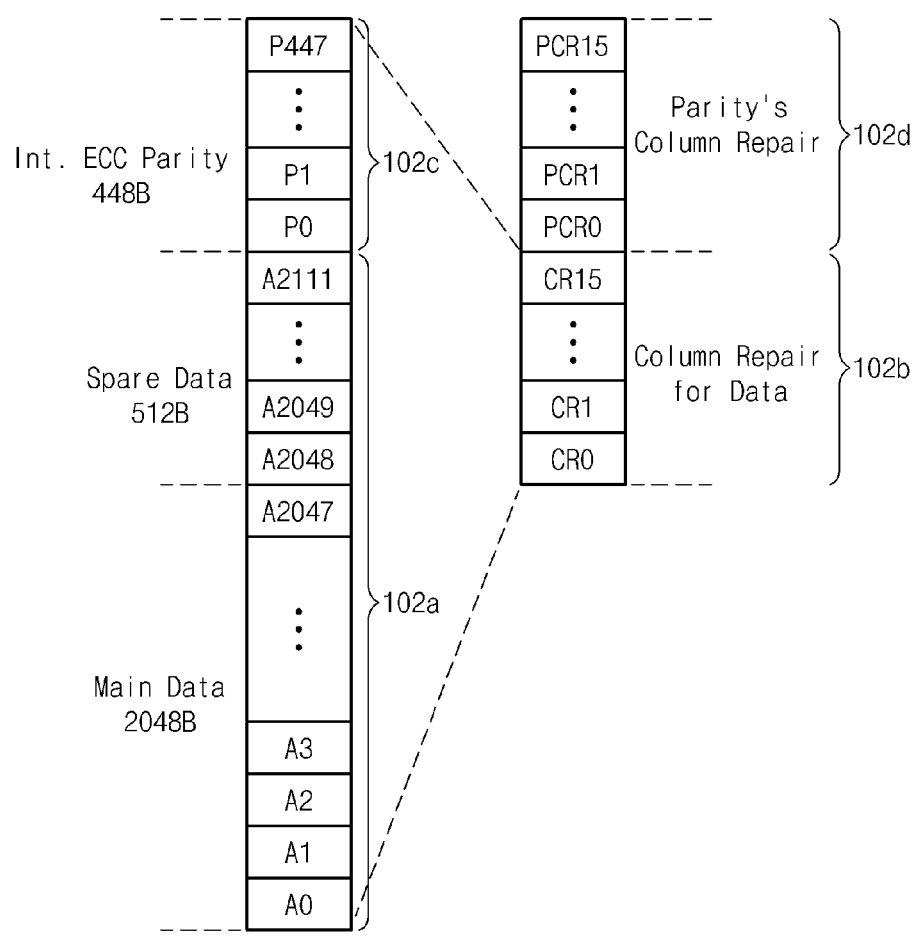
Figure 37C:
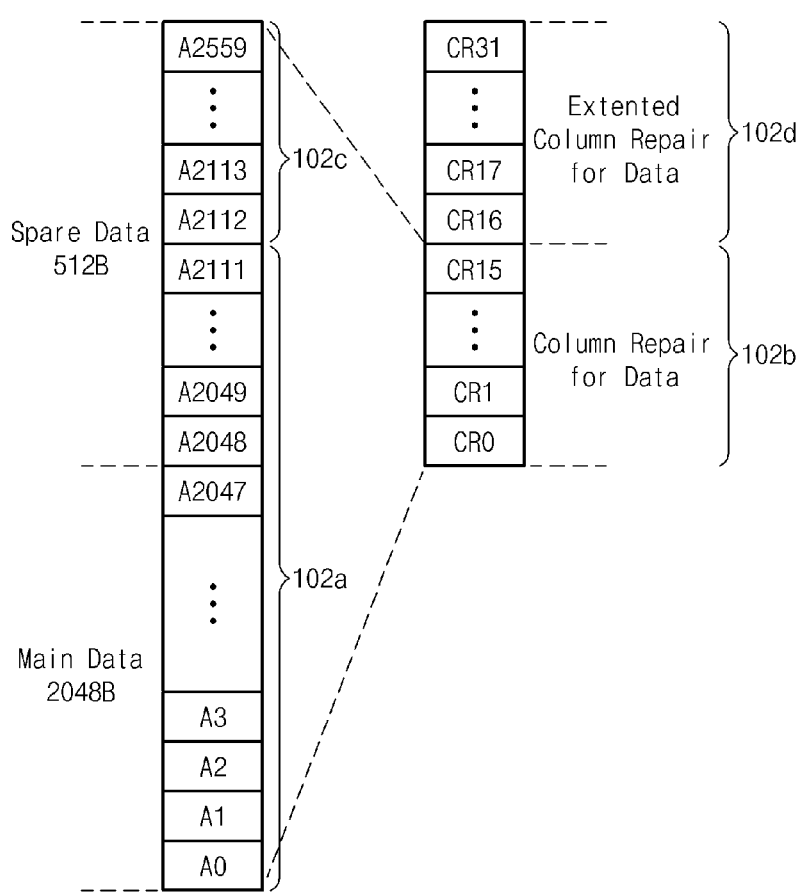

FIGS. 37A through 37C are diagrams for describing a redundancy control technique of a NAND flash memory 10. FIG. 37A shows allocation of page buffers repaired according to a first redundancy control technique when a column address is allocated to a page buffer 102 in Pure NAND (e.g., a second mode of operation). FIG. 37B shows allocation of page buffers repaired according to a first redundancy control technique when a column address is allocated to a page buffer 102 in EM NAND (e.g., a first mode of operation). Below, a detailed structure is described.

In the Pure NAND, as illustrated in FIG. 37A, defective bits (defect) of a main data area and a spare data area (e.g., PB 8IO units, bit lines and memory cell transistors selected by column addresses A0 to A2559) are repaired by page buffer units of a page buffer 102b in the form including page buffer units. Also, in this case, a repair on page buffer units of a page buffer 102d is not performed. More particular, if PB 8IO units A0 to A2559 includes a PB 8IO unit associated with a defective memory cell or bit line, a column address (A0 to A2559) of the defective PB 8IO unit is detected at a wafer-level test operation and is written at a dedicated area of a memory array 101.

Column addresses (A0 to A2559) of defective PB 8IO units written at the dedicated area of the memory array 101 are transferred and latched to a column repair circuit 104 of a NAND flash memory 10 at power-up of the Pure NAND. As will be described below, a column repair manner is described using an example where a selection system of PB 8IO units is controlled. However, the inventive concepts are applicable to a well-known manner where a column is repaired through switching of a data bus without selection control of PB 8IO units. At a data read operation, if a column address of a defective PB 8IO unit is received, the column repair circuit 104 controls a column coding circuit 103 such that a selection signal Sel_A is not output to the defective PB 8IO unit. The column coding circuit 103 outputs a selection signal Sel_B for selecting a PB 8IO unit of a page buffer 102b instead of the defective PB 8IO unit.

As described above, at a data read operation of the Pure NAND, defective PB 8IO units of the page buffers 102a and 102c are not selected by the selection signal Sel_A, and repaired PB 8IO units of the page buffer 102b are selected by the selection signal Sel_A. By this, read data Data_Out_A (e.g., data read from a defective PB 8IO unit) is output to an I/O pad 106 through a data bus (e.g., a second data bus). Also, at a data write operation of the Pure NAND, if write data is received from the I/O pad 106, it is provided to a PB 8IO unit of the page buffer 102b corresponding to a repair place through the data bus as write data Data_A_In (e.g., data to be written at the defective PB 8IO unit).

Meanwhile, in EM NAND, as illustrated I FIG. 37B, defective bits (defect) of a main data area and a spare data area (e.g., PB 8IO units, bit lines, and memory cell transistors selected by column addresses A0 to A2111) are repaired using page buffer units of the page buffer 102b in the form including page buffer units. Also, an ECC parity unit (e.g., PB 8IO units, bit lines, and memory cell transistors selected by column addresses P0 to P447) are repaired using page buffer units of the page buffer 102d in the form including page buffer units. That is, in the NAND flash memory 10, an area of the Pure NAND selected by column addresses A2112 to A2559 is repaired using an area including the page buffer 102b in case of the Pure NAND and using an area including the page buffer 102d in case of the EM NAND.

More particular, if PB 8IO units A0 to A2111 l includes a PB 8IO unit associated with a defective memory cell or bit line, like the Pure NAND, a column address (e.g., max 16 column addresses of A0 to A2111) of the defective PB 8IO unit is detected at a wafer-level test operation and is written at a dedicated area of a memory array 101. A column address (e.g., max 16 column addresses of A0 to A2111) of the defective PB 8IO unit written at a dedicated area of a memory array 101 is transferred and latched to a column repair circuit 104 of a NAND flash memory 10 at power-up of the EM NAND. At a data write operation, if a column address of a defective PB 8IO unit is received, the column repair circuit 104 controls a column coding circuit 103 such that a selection signal Sel_A is not output to the defective PB 8IO unit. The column coding circuit 103 outputs a selection signal Sel_A for selecting a PB 8IO unit of a page buffer 102b instead of the defective PB 8IO unit.

Also, if PB 8IO units P0 to P447 (e.g., column address A2112 to A2559 in the Pure NAND) includes a PB 8IO unit associated with a defective memory cell or bit line, a column address (e.g., max 16 column addresses of P0 to P447) of the defective PB 8IO unit is detected at a wafer-level test operation and is written at a dedicated area of a memory array 101. A column address (e.g., max 16 column addresses of P0 to P447) of the defective PB 8IO unit written at a dedicated area of a memory array 101 is transferred and latched to a parity column repair circuit 105 of a NAND flash memory 10 at power-up of the EM NAND. At an ECC processing operation, if a column address of a defective PB 8IO unit is received, the parity column repair circuit 105 controls an ECC column coding circuit 108 such that a selection signal Sel_B is output to the defective PB 8IO unit. The column coding circuit 103 outputs a selection signal Sel_B for selecting a PB 8IO unit of a page buffer 102d.

At a data write operation of the EM NAND, like the Pure NAND, a defective PB 8IO unit of the page buffer 102a is not selected by the selection signal Sel_A, and a PB 8IO unit of the page buffer 102b as a repair place is selected by the selection signal Sel_A. By this, in the EM NAND, if write data is received from the I/O pad 106, it is provided to the PB 8IO unit of the page buffer 102b corresponding to a repair place through a data bus as write data Data_A_In (e.g., data to be written at the defective PB 8I unit). At ECC encoding, a defective PB 8IO unit of the page buffer 102a outputs fixed data (refer to FIG. 28 or 29) to an ECC bus in response to a selection signal Sel_B. Also, a PB 8IO unit of the page buffer 102b outputs data to be written at the defective PB 8IO unit to the ECC bus in response to the selection signal Sel_B. An ECC circuit 107a and a randomizer 107b randomize and encode data received from the ECC bus to generate parity data.

The parity data thus generated is written back at the page buffer 102c. Assuming a PB 8IO unit of the page buffer 102c is defective. If an address of the defective PB 8IO unit of the page buffer 102 is equal to the selection signal Sel_B, the parity column repair circuit 105 controls the ECC column coding circuit such that a PB 8IO unit of the page buffer 102d is selected by the selection signal Sel_B. By this, the parity data is provided to a PB 8IO unit of the page buffer 102d corresponding to a pair place as write data Data_B_In (e.g., data to be written at a defective PB 8IO unit). Also, the ECC column coding circuit 108 outputs the selection signal Sel_B to the defective PB 8IO unit of the page buffer 102c under a control of the parity column repair circuit 105. But, since data is not written by a circuit shown in FIG. 28 or 29, parity data is not updated. Afterwards, programming is executed such that data is written at memory cell transistors of the page buffer 102.

Also, at a data read operation of the EM NAND, first, since decoding and de-randomizing are performed, a PB 8IO unit of the page buffer 102 is selected by the selection signal Sel_B. A defective PB 8IO unit of the page buffer 102a outputs fixed data to the ECC bus by a circuit shown in FIG. 28 or 29, and a PB 8IO unit of the page buffer 102b outputs data to be written at a defective PB 8IO unit of the original page buffer 102a to the ECC bus. Also, a defective PB 8IO unit of the page buffer 102c outputs fixed data to the ECC bus by a circuit shown in FIG. 28 or 29, and a PB 8IO unit of the page buffer 102d outputs data to be written at a defective PB 8IO unit of the original page buffer 102c to the ECC bus.

The ECC circuit 107a and the randomizer 107b decode and de-randomize data received from the ECC bus, and write error-corrected data back at a PB 8IO unit of the page buffer 102a and a PB 8IO unit of the page buffer 102b. Here, the parity column repair circuit 105 does not store a column address of a defective PB 8IO unit of the page buffer 102a that the column repair circuit 104 stores (here, the parity column repair circuit 105 stores a column address of a defective PB 8IO unit of the page buffer 102c). Therefore, under a control of the parity column repair circuit 105, the ECC column coding circuit 108 outputs the selection signal Sel_B to a defective PB 8IO unit of the page buffer 102a and a PB 8IO unit of the page buffer 102b. Only, since a defective PB 8IO unit of the page buffer 102a is configured such that data is not written by the selection signal Sel_B, data (e.g., fixed data) is not written back. Data to be written back at a defective PB 8IO unit of the page buffer 102a is written back at a normal PB 8IO unit of the page buffer 102b corresponding to a repair place.

Afterwards, at a data read operation to the I/O pad 106 of the EM NAND, like the Pure NAND, a defective PB 8IO unit of the page buffer 102a is not selected by the selection signal Sel_A, and a PB 8IO unit of the page buffer 102b corresponding to a repair place is selected by the selection signal Sel_A. By this, read data Data_Out_A (e.g., data to be read from a defective PB 8IO unit) is output to the I/O pad 106 through a data bus (e.g., a second data bus).

As described above, in a product (on-chip ECC) being the EM NAND, a defect of a parity area including the page buffer 102c is repaired using an area for parity repair, that is, an area including the page buffer 102d. However, in a product being the Pure NAND, if an area including the page buffer 102c is defective, such an area is opened to a user as a spare data area, so that a repair is performed by a general redundancy system. Thus, a partial address space, that is, repair schemes of the EM NAND and the Pure NAND on a parity area including the page buffer 102c are different from each other.

Second Redundancy Control Function

Here, in a product being the Pure NAND, there is described such a manner that there is opened an area including the page buffer 102d as a repair place when an area including the page buffers 102a and 102c is defective and an area including the page buffer 102b is expanded. That is, in the Pure NAND using a first redundancy control function, there is proposed such a manner that the page buffer 102d shown in FIG. 37A is not used but the page buffer 102d is efficiently utilized in a product being the Pure NAND. This will be more fully described with reference to FIG. 37C. FIG. 37C shows allocation of page buffers repaired according to a second redundancy control manner when a column address of the Pure NAND (e.g., a second mode of operation) is allocated in a page buffer 102.

As illustrated in FIG. 37C, in the event that a memory cell including a PB 8IO unit (e.g., a page buffer unit selected by a selection signal Sel_A) of PB 8IO units A2112 to A2559 of the Pure NAND is defective, a page buffer 102d (e.g., PB 8IO units PCR0 to PCR15 shown in FIG. 37B) corresponding to a repair place is opened. The PB 8IO units PCR0 to PCR15 are repaired by PB 8IO units CR16 to CR31 through a column repair circuit 104.

As will be in detail described below, if a PB 8IO unit, corresponding to a defective memory cell or bit line, of PB 8IO units A0 to A2559 is defective, a column address (A0 to A2559) of the defective PB 8IO unit is detected at a wafer-level test operation and is written at a dedicated area of a memory array 101. A column addresses (A0 to A2559) of defective PB 8IO units written at the dedicated area of the memory array 101 is transferred and latched to a column repair circuit 104 of a NAND flash memory 10 at power-up of the Pure NAND.

At a data read operation, if a column address of a defective PB 8IO unit is received, the column repair circuit 104 controls a column coding circuit 103 such that a selection signal Sel_A is not output to the defective PB 8IO unit. The column coding circuit 103 outputs a selection signal Sel_B for selecting a PB 8IO unit of a page buffer 102b or a page buffer 102d instead of the defective PB 8IO unit. Also, in connection with a data read operation and a data write operation of the Pure NAND, a first redundancy control operation is implemented by switching a repair place into the page buffer 102b or the page buffer 102d, and a description thereof is thus omitted.

Meanwhile, if PB 8IO units A0 to A2111 includes a PB 8IO unit associated with a defective memory cell or bit line, like the Pure NAND, a column address (e.g., max 16 column addresses of A0 to A2111) of the defective PB 8IO unit is detected at a wafer-level test operation and is written at a dedicated area of a memory array 101. A column address (e.g., max 16 column addresses of A0 to A2111) of the defective PB 8IO unit written at a dedicated area of a memory array 101 is transferred and latched to a column repair circuit 104 of a NAND flash memory 10 at power-up of the EM NAND. At a data write operation, if a column address of a defective PB 8IO unit is received, the column repair circuit 104 controls a column coding circuit 103 such that a selection signal Sel_A is not output to the defective PB 8IO unit. The column coding circuit 103 outputs a selection signal Sel_A for selecting a PB 8IO unit of a page buffer 102b instead of the defective PB 8IO unit.

Also, if PB 8IO units P0 to P447 (e.g., column address A2112 to A2559 in the Pure NAND) includes a PB 8IO unit associated with a defective memory cell or bit line, a column address (e.g., max 16 column addresses of P0 to P447) of the defective PB 8IO unit is detected at a wafer-level test operation and is written at a dedicated area of a memory array 101. A column address (e.g., max 16 column addresses of P0 to P447) of the defective PB 8IO unit written at a dedicated area of a memory array 101 is transferred and latched to a parity column repair circuit 105 of a NAND flash memory 10 at power-up of the EM NAND. At an ECC processing operation, if a column address of a defective PB 8IO unit is received, the parity column repair circuit 105 controls an ECC column coding circuit 108 such that a selection signal Sel_B is output to the defective PB 8IO unit. The column coding circuit 103 outputs a selection signal Sel_B for selecting a PB 8IO unit of a page buffer 102d.

As described above, in a product being the Pure NAND, there is opened an area including the page buffer 102d as a repair place when an area including the page buffers 102a and 102c is defective, and an area including the page buffer 102b is expanded. Therefore, in case of the Pure NAND shown in FIG. 37A, only 16 PB 8IO units are used for repair with respect to column addresses A0 to A2559. But, in case of the inventive concepts, since 32 PB 8IO units are used for repair with respect to column addresses A0 to A2559, a repair probability is improved.

Also, a data read operation and a data write operation of the EM NAND follows the first redundancy control scheme, and a description thereof is thus omitted. Only, as understood from the above description, since a column address of a defective PB 8IO unit of an opened page buffer 102c is duplicatedly stored in both a column repair circuit 104 and a parity column repair circuit 105, an embodiment for bettering such a problem will be described below.

Address Scan Function

A desirable state of a defective page buffer unit (here, a defective PB 8IO unit) viewed as the case that a memory cell transistor or a bit line connected thereto is defective is as follows. That is, it is desirable to set defective page buffer units to an inactive state with respect a data unit (e.g., an area including a page buffer 102a and a page buffer 102c). Also, in page buffer nits of an area including the page buffer 102b and the page buffer 102d as a repair place, desirably, a page buffer unit expanded as a repair place is only activated and a page buffer unit not predetermined for repair is inactivated. In other words, it is desirable to minimize the number of page buffer units to be activated. If a page buffer unit not predetermined for repair is at an active state, it is a verify target of programming and erasing. This means that a circuit (e.g., a page buffer unit, a bit line, and a memory cell transistor) that need not operate is activated. Thus, the amount of current consumed is unnecessarily increased. For this reason, it is desirable to set a page buffer unit that need not operate, to an inactive state. A technique for implementing the above-described desirable state will be described below.

In a data unit, inactivation of a defective PB 8IO unit, inactivation of a page buffer unit, not used for repair, from among page buffer units of an area including a page buffer 102b and a page buffer 102d, and activation of a page buffer unit expanded as a repair place are implemented by executing an address scan control operation. Here, the address scan control operation is an operation of converting information (e.g., a data write signal Data_In_A or Data_In_B shown in FIG. 28 or 29) indicating whether a page buffer unit is defective into a column address (e.g., a selection signal Sel_A or Sel_B) and transferring the column address to a PB control circuit 60 shown in FIG. 28 or 29.

Figure 38A:
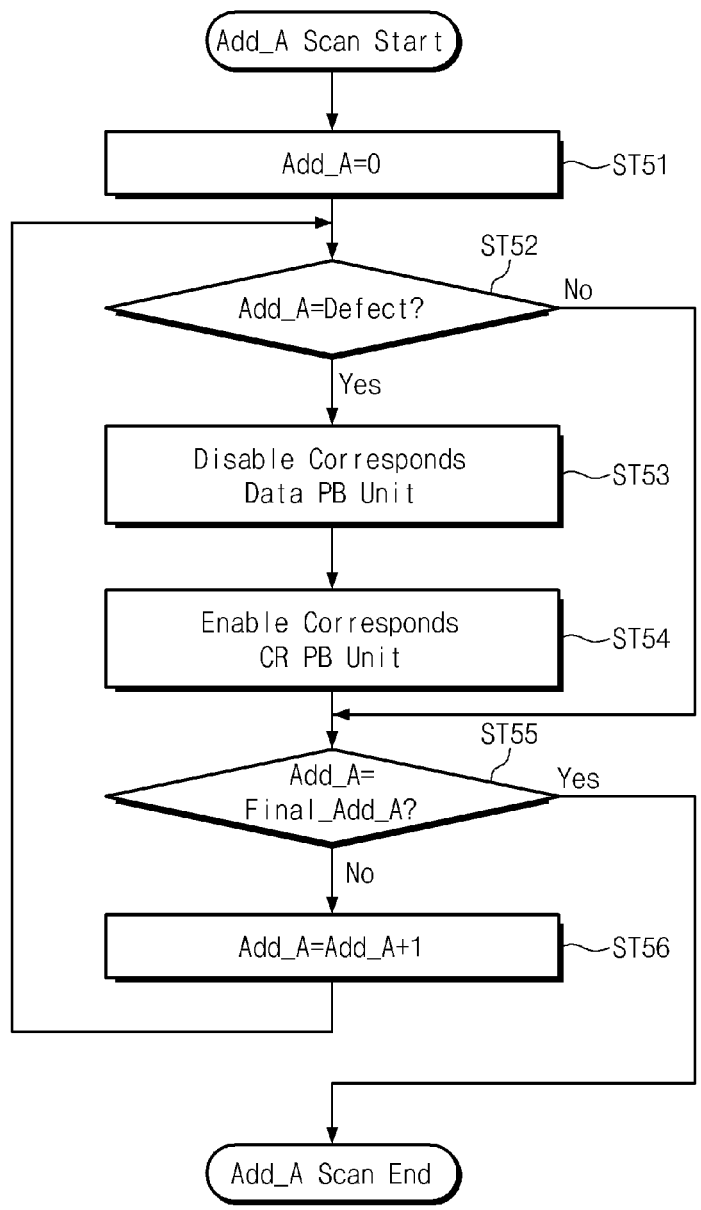
FIGS. 38A and 38B are flow charts for describing an address scan control operation.
Figure 38B:
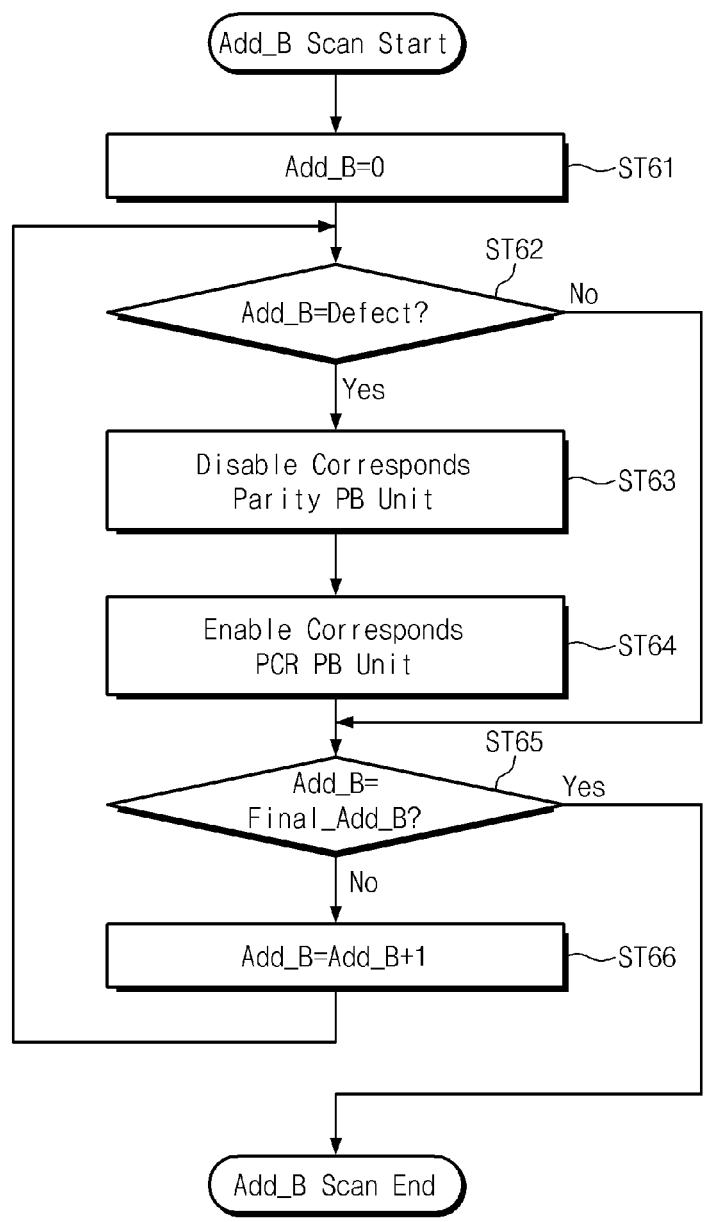
Figure 39:
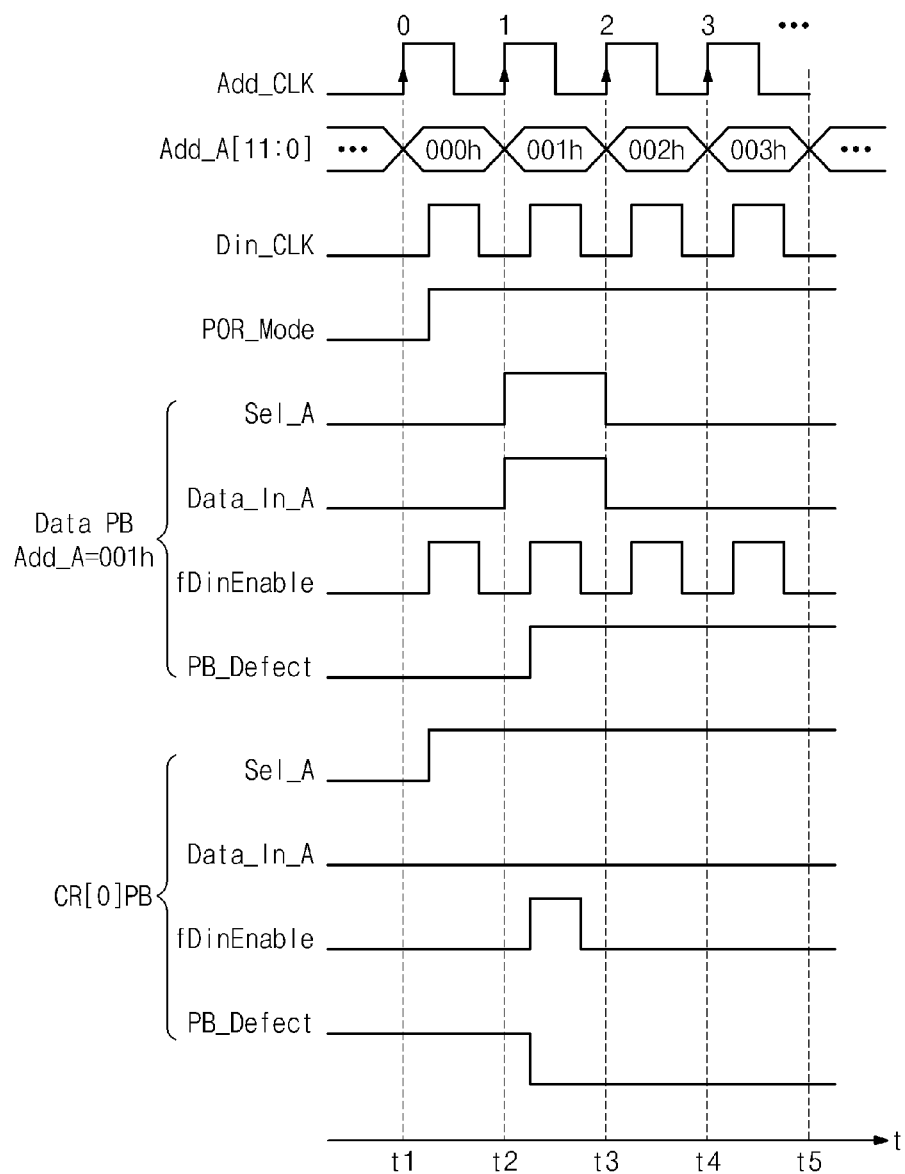
FIG. 39 is a timing diagram for further describing an address scan control operation.

Below, an address scan control technique is described with reference to FIGS. 38A through 40. FIGS. 38A and 38B are flow charts of an address scan control method. FIG. 39 is a timing diagram of an address scan control operation. FIG. 40 is a diagram schematically illustrating an address map of a column address Add_B.

Here, a circuit being an address scan control target is a PB control circuit 60 (e.g., a circuit shown in FIG. 28 or 29) of each page buffer unit. Below, the inventive concepts are described under the assumption that the PB control circuit 60 shown in FIG. 28 is a circuit being an address scan control target. Also, it is assumed that in the PB control circuit 60 shown in FIG. 28, an output terminal of an inverter circuit 62 and a gate terminal of a transistor 94 are short-circuited and an output terminal of an inverter circuit 63 and a gate terminal of a transistor 95 are short-circuited. That is, referring to the PB control circuit 60, in the event that a power-on reset signal POR_Mode has a high level, write signals DI and nDI, defect information signals SDI and nSDI and defect signals PB_Defect and nPB_Defect have the following relation. That is, when the write signal DI goes to a high level (the write signal nDI maintaining a low level), the defect information signal SDI goes to a high level (the defect information signal nSDI maintaining a low level), the defect signal PB_Defect goes to a low level, and the defect information signal nPB_Defect goes to a high level. This condition of the signals means that the PB control circuit 60 is good. Meanwhile, the write signal DI maintains a low level (the write signal nDI going to a high level), the defect information signal SDI maintains to a low level (the defect information signal nSDI going to a high level), the defect signal PB_Defect goes to a high level, and the defect information signal nPB_Defect goes to a low level. This condition of the signals means that the PB control circuit 60 is bad.

Also, there is described Add_A Scan where information indicating whether a page buffer unit is defective is converted to a selection signal Sel_A with respect to a page buffer unit (here, a PB 8IO unit shown in FIG. 37A) of a column address (hereinafter, referred to as ADD_A). More particular, Add_A Scan is executed under a condition of the following circuit operation.

That is, an address control circuit 85 shown in FIG. 35 increments a column address ADD_A[11:0] from an initial value (e.g., all '0': 00h) in synchronization with a rising edge of a clock signal Add_CLK provided from a control circuit (not shown) or an external device.

Also, the address control circuit 85 outputs the column address ADD_A[11:0] to a column repair circuit 104. The column repair circuit 104 compares the column address ADD_A[11:0] with defect bit information (e.g., a defect column address ADD_A of a defective PB 8IO unit) stored before execution of an address scan operation Based on the comparison result, the column repair circuit 104 controls a column coding circuit 103 to output a selection signal Sel_A to a PB 8IO unit.

Also, the column repair circuit 104 outputs a write enable signal fDinEnable and write data Data_In_A to a PB 8IO unit corresponding to a column address ADD_A in synchronization with a rising edge of a clock signal DIn_CLK received from a control circuit (not shown) or an external device. Also, a control circuit (not shown) may provide the write enable signal fDinEnable, a data input circuit connected to the I/O circuit 106 may provide the write data Data_In_A, or an external tester may provide the write data Data_In_A through the I/O pad 106. Also, a period of the clock signal DIn_CLK is equal to that of a clock signal ADD_CLK, and a rising edge and a falling edge are delayed by a quarter of a period.

That is, the column coding circuit 103 is controlled by the column repair circuit 104 according to a comparison result of the column repair circuit 104, and outputs a selection signal Sel_A to a PB 8IO unit. Also, the column repair circuit 104 outputs write data Data_In_A to a PB 8IO unit, based on its own comparison result.

An embodiment where Add_A Scan on Pure NAND shown in FIG. 37A is executed is described using a flow chart shown in FIGS. 38A and 38B and a timing diagram shown in FIG. 39. Also, in FIG. 39, "DATA PB Add_A=001h" is a PB 8IO unit A1 of a page buffer 102a shown in FIG. 37A, and "CR [0]PB" is a PB 8IO unit CR0 of a page buffer 102b shown in FIG. 37A.

Here, a PB 8IO unit A1 of the page buffer 102a is a defective page buffer unit and is inactivated by Add_A Scan. Other PB 8IO units A0 and A2 to A2559 are activated by Add_A Scan. Also, a PB 8IO unit CR0 of the page buffer 102b is inactivated by Add_A Scan, and other PB 8IO units CR1 to CR15 are activated by Add_A Scan.

Also, it is necessary to prepare defect bit information (here, a defect column address ADD_A'=001h being an address of a defective PB 8IO unit A1) before execution of Address Scan. In general, the defect bit information is stored in a nonvolatile system area. When a power is supplied or an external specific command (e.g., a reset command, etc.) is received, the defect bit information is transferred to the column repair circuit 104 (or, a parity column repair circuit 105 in case of Add_B Scan). Here, it is assumed that at power-up, a power-on reset signal POR_Mode goes to a high level and the defect column address ADD_A'=001h is transferred to the column repair circuit 104.

Also, the column repair circuit 104 controls the column coding circuit 103 to sequentially output a selection signal Sel_A synchronized with a rising edge of the clock signal Add_CLK to PB 8IO units A0 to A2559. Meanwhile, during an interval of Add_A Scan, the column repair circuit 104 controls the column coding circuit 103 to continue to output a high level of selection signal Sel_A to PB 8IO units CR0 to CR15. Also, the column repair circuit 104 outputs the write enable signal fDinEnable to the PB 8IO units A0 to A2559 in synchronization with a rising edge of the clock signal DIn_CLK. Meanwhile, the column repair circuit 104 sets to a low level as a default state the write enable signal fDinEnable with respect to the PB 8IO units CR0 to CR15, during an interval of Add_A Scan. However, in the event that a comparison result indicates 'MISS', the column repair circuit 104 outputs write enable signal fDinEnable to the PB 8IO units CR0 to CR15 in synchronization with a rising edge of the clock signal DIn_CLK.

First, at power-up, a control circuit (not shown) or a power-on reset signal generating circuit outputs a high level of power-on reset signal POR_Mode. Also, the power-on reset signal POR_Mode has a high level during an interval of Add_A Scan such that a transistor 96 of a PB control circuit 60 is turned on. At t1, the address control circuit 85 outputs a column address ADD_A [11:0]=000h (e.g., an initial value) to the column repair circuit 104 in synchronization with a rising edge of the clock signal Add_CLK (ST51 shown in FIGS. 38A).

The column repair circuit 104 compares the input column address ADD_A [11:0] and a defect column address ADD_A' (ST52). Here, the column repair circuit 104 outputs a comparison result indicating that the input column address ADD_A [11:0] is not equal to the defect column address ADD_A'=001 h.

Also, when the input column address ADD_A [11:0] is not equal to the defect column address ADD_A'=001h, the column repair circuit 104 maintains write data Data_In_A at a low level. Also, the column repair circuit 104 controls the column coding circuit 103 such that a selection signal Sel_A provided to a PB 8IO unit A0 transitions to a high level. That is, the PB 8IO unit A0 is selected. Also, the write enable signal fDinEnable transitions to a high level under a control of the column repair circuit 104.

By this, a PB control circuit 60 of the PB 8IO unit A0 latches a low level of defect signal PB_Defect (indicating that the PB 8IO unit A0 is good) (not shown in FIG. 39). That is, in a product being Pure NAND, the PB 8IO unit A0 is activated. That is, if selected by the column coding circuit 103, it is possible to receive write data Data_In_A at a data write operation and to output read data Data_Out_A.

Meanwhile, in a PB 8IO unit of PB 8IO units CR0 to CR15, the write enable signal fDinEnable maintains a low level. Therefore, the PB control circuit 60 of each PB 8IO unit latches a high level (e.g., a default state) of defect signal PB_Defect. The default state is implemented by such a manner that the column repair circuit 104 controls the column coding circuit 103 to supply a high level of selection signal Sel_A or a high level of write data Data_In_A and a high level of write data Data_In_A to the PB 8IO units CR0 to CR15 in a lump prior to a start of Add_A Scan.

Then, in the column repair circuit 104, if a comparison result indicates 'MISS', the procedure goes to step ST55 (No). Then, the address control circuit 85 determines whether a column address Add_A output to the column repair circuit 104 is equal to a final address (e.g., a final column address Final_Add_A) (ST55). Here, since Final_Add_A=9FFh (=2559), the procedure goes to step ST56 (ST55—No) as a consequence of determining that the column address Add_A output to the column repair circuit 104 is not equal to a final address. The address control circuit 85 increments a column address Add_A output to the column repair circuit 104 by 1 (00h) (ST56). Here, the column address Add_A=000h is incremented by 1, and the column address Add_A[11:0] =001h is output to the column repair circuit 104.

Then, the column repair circuit 104 compares the input column address Add_A[11:0] and the defect column address ADD_A' (ST52). Here, the input column address Add_A[11: 0]=001h is equal to the defect column address ADD_A'=001h. Thus, the procedure goes to step ST53 (Yes).

Then, the column repair circuit 104 inactivates a PB 8IO unit of a page buffer 102a corresponding to the defect address ADD_A' (ST53). Here, since both addresses are equal to each other, write data Data_In_A transitions from a low level to a high level under a control of the column repair circuit 104 (t2 shown in FIG. 39). Also, the column repair circuit 104 controls the column coding circuit 103 such that the selection signal Sel_A provided to a PB 8IO unit A1 transitions to a high level for selection of the PB 8IO unit A1. Also, the column repair circuit 104 sets the write enable signal fDinEnable to a high level. By this, the PB control circuit 60 of the PB 8IO unit A1 latches a high level of defect signal PB_Defect (indicating that the PB 8IO unit A0 is bad). That is, in a product being the Pure NAND, the PB 8IO unit A1 is inactivated. That is, since not selected by the column coding circuit 103, write data Data_In_A is not received at a data write operation and read data Data_Out_A is not output at a data read operation.

Also, the column repair circuit 104 activates a PB 8IO unit of the page buffer 102b as a repair place of a PB 8IO unit of the page buffer 102a corresponding to the defect column address ADD_A' (ST54). First, since both addresses are equal to each other, the column repair circuit 104 maintains a low level of write data Data_In_A (ST52). Also, under a control of the column repair circuit 104, the write enable signal fDinEnable supplied to a PB 8IO unit CR0 transitions to a high level. By this, the PB control circuit 60 of the PB 8IO unit CR0 latches a low level of detect signal PB_Defect (indicating that the PB 8IO unit CR0 is good). That is, in a product being the Pure NAND, the PB 8IO unit CR0 is activated. That is, the column coding circuit 103 selects a PB 8IO unit A1 as a repair place. In a data write operation, write data Data_In_A to be written at an original PB 8IO unit A1 is received. At a data read operation, read data Data_In_A to be read from an original PB 8IO unit A1 is output.

Operations of the above-described steps ST56 and ST52 to ST54 are iterated until in the address control circuit 85, a column address Add_A output to the column repair circuit 104 is equal to a final address (e.g., a final column address Final_Add_A). If a column address Add_A output to the column repair circuit 104 is equal to a final address Final_Add_A=9FFh(=2559), Add_A Scan is ended (ST55— Yes).

With the above-described Add_A Scan, in the Pure NAND, according to a state of a defective PB 8IO unit, defective page buffer units of a data unit (e.g., an area including page buffers 102a and 102c) are all inactivated. Also, in page buffer units of an area including the page buffer 102b as a repair place, page buffer units to be expanded as a repair place are only activated. In this case, page buffer units not predetermined for repair are inactivated.

Also, as described above, in the Pure NAND, coding (e.g., selection of a page buffer unit) and repairing of a defective page buffer unit (e.g., repairing using a page buffer unit of the page buffer 102b) are made by the column coding circuit 103, the column repair circuit 104, and the address control circuit 85 shown in FIG. 28. Also, by Add_A Scan, as described above, defective page buffer units are all inactivated, and page buffer units not predetermined for repair are inactivated. A system of the inventive concepts is configured such that electrical switching between the Pure NAND and the EM NAND is made using a product information bit of the Pure NAND and the EM NAND. In the EM NAND, coding (e.g., selection of a page buffer unit) and repairing of a defective page buffer unit (e.g., repairing using a page buffer unit of the page buffer 102d) are made by the ECC column coding circuit 108, the repair column repair circuit 105, and the randomizer and ECC circuit 107 shown in FIG. 28. Also, by Add_B Scan, as described above, defective page buffer units are all inactivated, and page buffer units not predetermined for repair are inactivated.

Individual Scanning on Column Addresses Add_A and Add_B

In the EM NAND, each page buffer unit is selected based on an address map of column addresses Add_B shown in FIG. 40. As illustrated in FIG. 40, in the EM NAND, it is possible to select PB 8IO units A0 to A2111 (PB 8IO units of a page buffer 102a) and PB 8IO units CR0 to CR15 (PB 8IO units of a page buffer 102c) shown FIG. 37B using a column address Add_B.

Add_B Scan of the Pure NAND is described using a flow chart shown in FIG. 38B so as to correspond to Add_A Scan of the Pure NAND shown in FIG. 38A. Also, there is described an embodiment where Add_A Scan is performed under a condition of Add_A=2111 and Add_B Scan is performed under a condition of Add_B=15. Since the Pure NAND and the EM NAND are electrically switched, at a test operation before shipment, Add_A Scan on an operation associated with a data unit A0 to A2111 (e.g., PB 8IO units A0 to A2111) of the Pure NAND is executed, and Add_B Scan is executed after switching into the EM NAND. In Add_B Scan, a defective parity PB (e.g., a defective PB 8IO unit) of a parity unit P0 to P447 (e.g., PB 8IO units CR0 to CR447) are inactivated, and PCR (PB 8IO units PCR0 to PCR15 of the page buffer 102d) being a repair target is activated.

Also, Add_B Scan is executed under a condition of the following circuit operation so as to correspond to the Pure NAND. That is, a randomizer and ECC circuit 107 shown in FIG. 35 increments a column address ADD_A[3:0] from an initial value (e.g., all '0':00h) in synchronization with a rising edge of a clock signal Add_CLK provided from a control circuit (not shown). Also, the randomizer and ECC circuit 107 outputs the column address ADD_A[3:0] to a parity column repair circuit 105. The parity column repair circuit 105 compares the column address ADD_A[3:0] with defect bit information (e.g., a defect column address ADD_B' of a defective PB 8IO unit) stored before execution of an address scan operation Based on the comparison result, the parity column repair circuit 105 controls an ECC column coding circuit 108 to output a selection signal Sel_B to a PB 8IO unit. Also, the parity column repair circuit 105 outputs a write enable signal fDinEnable and write data Data_In_B to a PB 8IO unit corresponding to a column address ADD_B in synchronization with a rising edge of a clock signal DIn_CLK received from a control circuit (not shown). Also, a control circuit (not shown) may provide the write enable signal fDinEnable or an external tester may provide the write data Data_In_B through the I/O pad 106. Also, a period of the clock signal DIn_CLK is equal to that of a clock signal ADD_CLK, and a rising edge and a falling edge are delayed by a quarter of a period. That is, the ECC column coding circuit 108 is controlled by the parity column repair circuit 105 according to a comparison result of the parity column repair circuit 105, and outputs a selection signal Sel_B to a PB 8IO unit. Also, the parity column repair circuit 105 outputs write data Data_In_B to a PB 8IO unit, based on its own comparison result.

An embodiment where Add_A Scan on EM NAND shown in FIG. 37B is executed is described using a flow chart shown in FIG. 38B. Here, a PB 8IO unit A1 of the page buffer 102a is a defective page buffer unit and is inactivated by Add_A Scan. Other PB 8IO units A0 and A2 to A2111 are activated by Add_A Scan. Also, a PB 8IO unit CR0 of the page buffer 102b is activated by Add_A Scan, and other PB 8IO units CR1 to CR15 are inactivated by Add_A Scan. Also, like the Pure NAND, it is necessary to prepare defect bit information (here, a defect column address ADD_B' being a column address of a defective PB 8IO unit P0 to P447 of a page buffer 102c) before execution of Address Scan. In general, the defect bit information is transferred to the parity column repair circuit 105 in case of Add_B Scan. Here, it is assumed that at power-up, a power-on reset signal POR_Mode goes to a high level and the defect column address ADD_B' is transferred to the parity column repair circuit 105.

Also, the parity column repair circuit 105 controls the ECC column coding circuit 108 to sequentially output a selection signal Sel_B synchronized with a rising edge of the clock signal Add_CLK to PB 8IO units P0 to P447. Meanwhile, during an interval of Add_B Scan, the parity column repair circuit 105 controls the ECC column coding circuit 108 to continue to output a high level of selection signal Sel_B to PB 8IO units PCR0 to PCR15. Also, the parity column repair circuit 105 outputs the write enable signal fDinEnable to the PB 8IO units A0 to A2111 and P0 to P447 in synchronization with a rising edge of the clock signal DIn_CLK. Meanwhile, the parity column repair circuit 105 sets to a low level as a default state the write enable signal fDinEnable with respect to the PB 8IO units PCR0 to PCR15 as a repair place, during an interval of Add_B Scan. However, in the event that a comparison result indicates 'HIT', the column repair circuit 104 outputs write enable signal fDinEnable to the PB 8IO units PCR0 to PCR15 in synchronization with a rising edge of the clock signal DIn_CLK.

First, at power-up, a control circuit (not shown) or a power-on reset signal generating circuit outputs a high level of power-on reset signal POR_Mode. Also, the power-on reset signal POR_Mode has a high level during an interval of Add_B Scan such that a transistor 96 of a PB control circuit 60 is turned on. The randomizer and ECC circuit 107 outputs a column address ADD_B [3:0]=000h (e.g., an initial value) to the parity column repair circuit 105 in synchronization with a rising edge of the clock signal Add_CLK (ST61 shown in FIGS. 38B).

The parity column repair circuit 105 compares the input column address ADD_B [3:0] and a defect column address ADD_B' (ST62). Here, the column repair circuit 104 outputs a comparison result indicating that the input column address ADD_B[3:0]=000h is not equal to the defect column address ADD_B'.

Also, when both addresses are not equal to each other, the parity column repair circuit 105 maintains write data Data_In_B at a low level. Also, the parity column repair circuit 105 controls the ECC column coding circuit 108 such that a selection signal Sel_B provided to a PB 8IO unit B0 (e.g., PB 8IO units A0, A16 to A2096, P0, and P16 to P432) transitions to a high level. That is, the PB 8IO unit B0 is selected. Also, the write enable signal fDinEnable transitions to a high level under a control of the parity column repair circuit 105. Only, the parity column repair circuit 105 maintains the write enable signal fDinEnable provided to PB 8IO units A0 and A16 to A2096 at a low level. The reason is that their PB 8IO units are previously activated or inactivated by Add_A Scan.

By this, in PB control circuits 60 of the PB 8IO unit P0 and P16 to P432 of the PB 8IO unit B0, there is latched a low level of defect signal PB_Defect (indicating that the PB 8IO unit P0 and P16 to P432 are good). That is, in a product being EM NAND, the PB 8IO unit P0 and P16 to P43 of the PB 8IO unit B0 is activated. That is, if selected by the ECC column coding circuit 108, it is possible to receive write data Data_In_B at a parity data write operation of ECC processing and to output read data Data_Out_B at a parity data read operation of ECC processing.

Meanwhile, in a PB 8IO unit of PB 8IO units PCR0 to PCR15, the write enable signal fDinEnable maintains a low level. Therefore, the PB control circuit 60 of each PB 8IO unit latches a high level (e.g., a default state) of defect signal PB_Defect. The default state is implemented by such a manner that the parity column repair circuit 105 controls the ECC column coding circuit 108 to supply a high level of selection signal Sel_B and a high level of write data Data_In_B and a high level of write data Data_In_B to the PB 8IO units PCR0 to PCR15 in a lump prior to a start of Add_B Scan.

Then, in the parity column repair circuit 105, if a comparison result indicates 'MISS', the procedure goes to step ST62 (No). Then, the randomizer and ECC circuit 107 determines whether a column address Add_B output to the parity column repair circuit 105 is equal to a final address (e.g., a final column address Final_Add_B) (ST55). Here, since Final_Add_A=00Fh(=15), the procedure goes to step ST66 (ST55—No) as a consequence of determining that the column address Add_B is not equal to the final address. The randomizer and ECC circuit 107 increments a column address Add_A output to the parity column repair circuit 105 by 1 (00h) (ST66). Here, the column address Add_B=000h is incremented by 1, and the column address Add_B[3:0]=001h is output to the parity column repair circuit 105.

Then, the parity column repair circuit 105 compares the input column address Add_B[3:0] and the defect column address ADD_B' (ST62). Here, the input column address Add_B[11:0]=001h is determined to be equal to the defect column address ADD_B'. Thus, the procedure goes to step ST63 (ST62—Yes).

Then, the parity column repair circuit 105 inactivates a PB 8IO unit of a page buffer 102c corresponding to the defect address ADD_B'(ST63). Here, since both addresses are equal to each other, in a PB 8IO unit of the page buffer 102c corresponding to the defect column address ADD_B', write data Data_In_B transitions from a low level to a high level under a control of the parity column repair circuit 105. Also, the parity column repair circuit 105 controls the ECC column coding circuit 108 such that the selection signal Sel_B provided to a PB 8IO unit B1 (PB 8IO units A1 and A17 to A2097, P1 and P17 to P433 shown in FIG. 40) transitions to a high level for selection of the PB 8IO unit A1. Also, the column repair circuit 104 sets the write enable signal fDinEnable to a high level for selection of the PB 8IO unit B1. Also, the parity column repair circuit 105 makes the write enable signal fDinEnable transition to a high level. Only, the parity column repair circuit 105 maintains the write enable signal fDinEnable provided to the PB 8IO units A1 and A17 to A2097 at a low level. The reason is that their PB 8IO units are previously activated or inactivated by Add_A Scan.

By this, in the PB control circuit 60 of the PB 8IO unit of the page buffer 102c corresponding to the defect column address ADD_B', there is latched a high level of defect signal PB_Defect (indicating that the PB 8IO unit is bad). That is, in a product being the EM NAND, the PB 8IO unit A1 of the page buffer 102c corresponding to the defect column address ADD_B' is inactivated. That is, since not selected by the ECC column coding circuit 108, write data Data_In_B is not received at a data write operation and fixed data is output as read data Data_Out_B at a data read operation.

Also, the parity column repair circuit 105 activates a PB 8IO unit of the page buffer 102d as a repair place of a PB 8IO unit of the page buffer 102c corresponding to the defect column address ADD_B' (ST64). First, since both addresses are equal to each other, the parity column repair circuit 105 maintains a low level of write data Data_In_B (ST62). Also, under a control of the parity column repair circuit 105, the write enable signal fDinEnable supplied to a PB 8IO unit PCR0 transitions to a high level.

By this, the PB control circuit 60 of the PB 8IO unit PCR0 latches a low level of detect signal PB_Defect (indicating that the PB 8IO unit PCR0 is good). That is, in a product being the EM NAND, the PB 8IO unit PCR0 is activated. That is, the ECC column coding circuit 108 selects a PB 8IO unit of the page buffer 102c corresponding to the defect column address ADD_B' as a repair place. In a data write operation, write data Data_In_B to be written at a PB 8IO unit of an original page buffer 102c is received. At a data read operation, read data Data_In_B to be read from a PB 8IO unit of an original page buffer 102c is output.

Operations of the above-described steps ST66 and ST62 to ST64 are iterated until in the randomizer and ECC circuit 107, a column address Add_B output to the parity column repair circuit 105 is equal to a final address (e.g., a final column address Final_Add_B). If a column address Add_B output to the parity column repair circuit 105 is equal to a final address Final_Add_B=00Fh(=15), Add_B Scan is ended (ST65—Yes).

With the above-described Add_B Scan, in the EM NAND, according to a state of a defective PB 8IO unit, defective page buffer units of a data unit (e.g., an area including the page buffer 102a) and a parity unit (e.g., area including the page buffer 102c) are all inactivated. Also, in page buffer units of an area including the page buffer 102c as a repair place, page buffer units to be expanded as a repair place are only activated. In this case, page buffer units not predetermined for repair are inactivated.

Figure 41A:
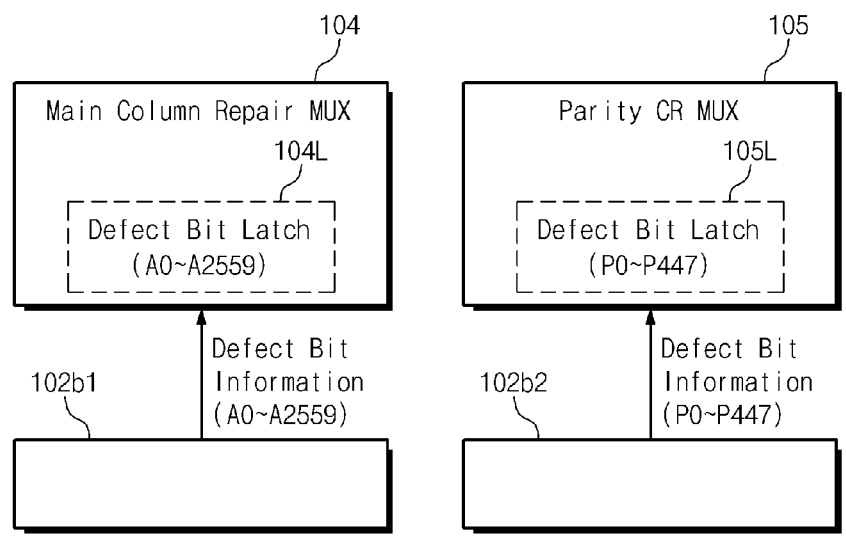
FIGS. 41A and 41B is a diagram for describing a transfer of stored defect bit information.
Figure 41B:
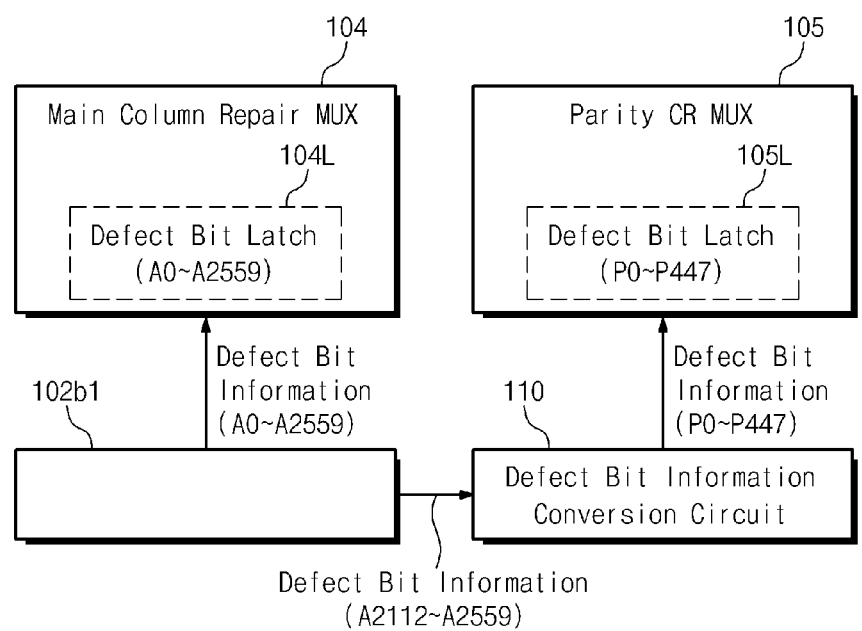

In case of the above-described address scan operation, at an initialization sequence after power-on, defect bit information stored in a nonvolatile system area is transferred to the column repair circuit 104 at Add_A Scan and to the parity column repair circuit 105 at Add_B Scan. FIGS. 41A and 41B are diagrams schematically illustrating an embodiment where stored defect bit information is transferred. FIG. 41A shows an embodiment where stored defect bit information is transferred at the above-described address scan operation.

As illustrated in FIG. 41A, the column repair circuit 104 has Defect Bit Latch (A0 A2559) (hereinafter, referred to as a latch circuit) 104L that stores defect bit information at Add_A Scan. Here, the defect bit information at Add_A Scan may be column addresses (e.g., a plurality of bit information of A0 to A2559) of defective PB 8IO units of page buffers 102a and 102c in Pure NAND shown in FIG. 37A. Also, the parity column repair circuit 105 has Defect Bit Latch (P0 P447) (hereinafter, referred to as a latch circuit) 105L that stores defect bit information at Add_B Scan. Here, the defect bit information at Add_B Scan may be column addresses (e.g., a plurality of bit information of P0 to P447) of defective PB 8IO units of the page buffer 102c in EM NAND shown in FIG. 37B.

Also, a nonvolatile system area 102b1 stores defect bit information obtained through Add_A Scan, that is, a result of a test operation on a NAND flash memory 10 performed to detect a column address (e.g., a plurality of bit information of A0 to A2559) of a defective PB 8IO unit with it being electrically switched into a Pure NAND product. Also, the nonvolatile system area 102b1 is formed of some blocks of a memory array 101 of the NAND flash memory 10, for example.

Also, a nonvolatile system area 102b2 stores defect bit information obtained through Add_B Scan, that is, a result of a test operation on a NAND flash memory 10 performed to detect a column address (e.g., a plurality of bit information of P0 to P447) of a defective PB 8IO unit with it being electrically switched into an EM NAND product. Also, like the nonvolatile system area 102b1, the nonvolatile system area 102b2 is formed of some blocks of the memory array 101 of the NAND flash memory 10, for example.

In the event that there is selected such a manner that an address scan operation is independently performed with respect to the above-described column addresses Add_A and Add_B, defect bit information at execution of Add_A Scan is stored in the nonvolatile system area 102b1, and defect bit information at execution of Add_B Scan is stored in the nonvolatile system area 102b2. Also, defect bit information at execution of Add_A Scan and defect bit information at execution of Add_B Scan are transferred to the column repair circuit 104 and the parity column repair circuit 105, respectively.

With the above-described manner, Referring to FIGS. 37A and 37B, in the event that a PB 8IO unit A2112 of the Pure NAND using a column address Add_A is defective, a PB 8IO unit P0 of the EM NAND using a column address Add_B being the physically same PB 8IO unit is defective. In this case, with respect to a physically same defect, two addresses, that is, the defect column address Add_A and the defect column address Add_B are respectively stored in two areas, that is, the nonvolatile system area 102$b1$ and the nonvolatile system area 102$b2$ as defect information. It is possible to simplify a test process where defect bit information is detected and stored before shipment by focusing defect information on the nonvolatile system area 102$b1$.

FIG. 41B is a diagram showing such a state that defect bit information is focused on mapping of a column address Add_A. Here, at a transfer to the parity column repair circuit 105, mapping information of a column address Add_A is converted to mapping information of a column address Add_B by a detect bit information conversion circuit 110. In both the Pure NAND and the EM NAND, since defect bit information is focused on a column address Add_A, it is possible to simplify a test process where defect bit information is detected and stored before shipment.

Below, such a manner that an address scan operation is completed only by Add_A Scan is described.

Manner of Completion Only Using Add_A Scan

In case of such a manner that an address scan operation is independently performed with respect to the above-described column addresses Add_A and Add_B, address scan operations Add_A Scan and Add_B Scan are performed every address mapping. However, there is proposed an Add_A Scan-focused system. For ease of description, it is assumed that a NAND flash memory 10 is configured to include a column redundancy (CR) structure of Pure NAND shown in FIG. 37C. In the NAND flash memory 10, a latch circuit 104L of a column repair circuit 104 shown in FIGS. 41A and 41B latches defect column address information Add_A from A0 to A2559 regardless of whether the NAND flash memory 10 is set to the Pure NAND or to the EM NAND.

FIG. 42 is a diagram showing a transfer path of defect bit information from a latch circuit 104L of a column repair circuit 104 to a PB 8IO unit. Referring to FIG. 42, a latch circuit 104L is a component for latch defect information, and has latches respectively corresponding to PB 8IO units CR0 to CR15 and latches respectively corresponding to PB 8IO units PCR0 to PCR15. A latch corresponding to each unit comprises an address information storing unit to store a column address of a defect bit and an enable bit storing unit indicating whether to repair a defect bit. In exemplary embodiments, a latch corresponding to each unit further comprises an IO information storing unit to latch defect IO information. In case of the Pure NAND shown in FIG. 37C, a latch corresponding to each of the PB 8IO units CR0 to CR15 stores defect bit information of a column address A0 to A2111, and a latch corresponding to each of the PB 8IO units PCR0 to PCR15 stores defect bit information of A2112 to A2559.

As described above, during an address scan operation, if defect bit information is equal to a column address Add_A provided to the column repair circuit 104, a comparison result signal CR Hit being a comparison result of a comparison circuit of the column repair circuit 104 shown in FIG. 42 goes to a high level. By this, each driver (e.g., a page buffer driver) of the column repair circuit 104 transfers defect bit information (e.g., a write enable signal fDinEnable) to each PB 8IO unit.

With the above structure, it is possible to transfer defect information indicating whether to activate or inactivate to corresponding CR/PCR by performing the above-described Add_A Scan operation within a range from A0 to A2559. Also, it is possible to use the same scan manner (e.g., Add_A Scan) regardless of whether the NAND flash memory 10 is switched to the EM NAND or to the Pure NAND. Thus, it is possible to shorten a test time after fabrication and to improve productivity.

Another Manner of Completion Only Using Add_A Scan

In an embodiment described with reference to FIG. 42, a column repair circuit 104 need include a component that stores defect bit information of PB 8IO units CR0 to CR15 and PB 8IO units PCR0 to PCR15. However the column repair circuit 104 may be bettered by increasing the number of latches. This will be more fully described below. In exemplary embodiments, at initialization (e.g., power-on), a manner of selecting a page buffer unit (e.g., a PB IO unit) as a target to which defect information is transferred at an address scan operation, based on electrical information indicating whether to use an on-chip ECC (i.e., information indicating whether a NAND flash memory 10 is switched into Pure NAND or into EM NAND).

There is described an embodiment where the inventive concepts are applied to the Pure NAND shown in FIG. 37A. The Pure NAND shown in FIG. 14A may be a system where PB 8IO units CR0 to CR15 of a page buffer 102$b$ are used as a repair place with respect to PB 8IO units A2112 to A 2559.

Figure 43A:
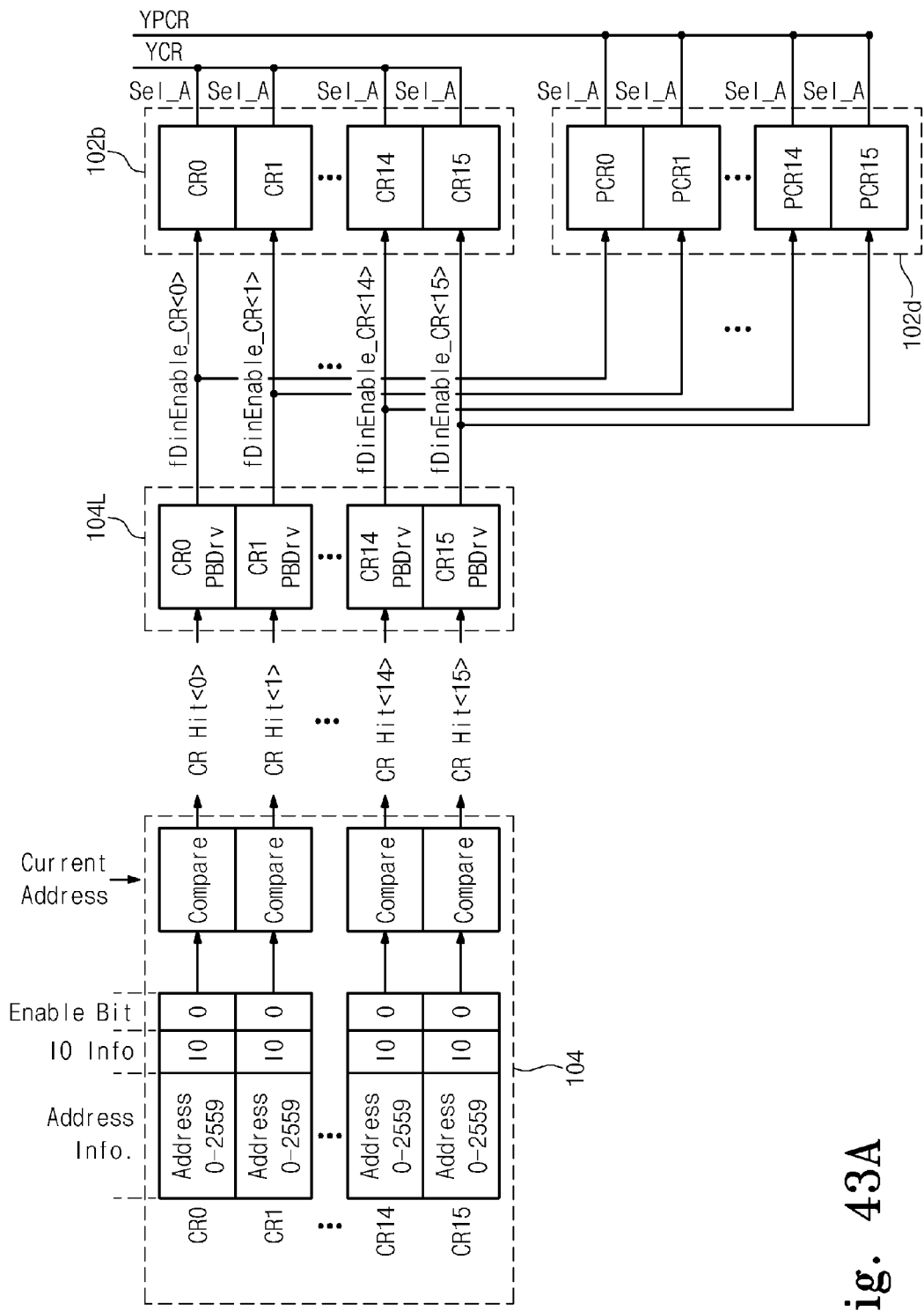

FIGS. 43A and 43B are diagrams showing a transfer path of defect bit information from a latch circuit 104L of a column repair circuit 104 to a PB 8IO unit according to another embodiment of the inventive concepts.

As illustrated in FIG. 43A, as compared with FIG. 42, latches for defect bit information of PB 8IO units PCR0 to PCR 15, comparison circuits and PB drivers are eliminated. Here, selection signals YPCR and YCR may be selection signals of PB control circuits 60. The selection signal YPCR is connected to a terminal of a selection signal Sel_A of PB control units 60 of the PB 8IO units PCR0 to PCR15, and the selection signal YCR is connected to a terminal of the selection signal Sel_A of PB control units 60 of the PB 8IO units CR0 to CR15 (refer to 28 or 29). That is, it is possible to control whether to select a PB 8IO unit of a page buffer 102$b$ or a PB 8IO unit of a page buffer 102$d$ by using one of the selection signals YPCR and YCR.

As illustrated in FIG. 43B, whether to use the selection signal YPCR or the selection signal YCR is decided according to an address (e.g., a column address) and a product. In the event that the NAND flash memory 10 is Pure NAND, the selection signal YCR is provided to a terminal of the selection signal Sel_A of the PB control units 60 of the PB 8IO units CR0 to CR15 as a repair place. Meanwhile in the event that the NAND flash memory 10 is EM NAND, the selection signal YCR is provided to a terminal of the selection signal Sel_A of the PB control units 60 of the PB 8IO units CR0 to CR15 as a repair place with respect to PB 8IO units A0 to A2111. Also, the selection signal YPCR is provided to a terminal of the selection signal Sel_A of the PB control units 60 of the PB 8IO units PCR0 to PCR15 as a repair place with respect to PB 8IO units A2112 to A2559. With this structure, Add_A Scan is only used with respect to the EM NAND.

In exemplary embodiments, a manner of controlling the selection signals YPCR and YCR is switched to one of the Pure NAND and the EM NAND based on electrically stored product information (switching signal). Latches for defect bit information, comparison circuits and PB drivers shown in FIG. 43A are circuits that are used in a conventional Pure NAND product. In exemplary embodiments, it is possible to implement a switching means of page buffer units (e.g., PB 8IO units CR0 to CR1 and PB 8IO units PCR0 to PCR15) of the Pure NAND and the EM NAND by adding a selection control on the selection signals YPCR and YCR. Also, as described above, since latches for defect bit information, comparison circuits and PB drivers are reduced, an increase in chip size is suppressed and productivity is improved.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor memory device comprising:
a first data bus having a first width;
a second data bus which is separate from the first data bus and which has a second width which is different from the first width; and
a data transfer unit configured to operate in a first operational mode for transferring data from memory cells and a second operational mode for transferring data from the memory cells, the memory cells connected to a plurality of bit lines,
wherein, in the first operational mode, the data transfer unit connects a first number of bit lines from among the plurality of bit lines to the first data bus to transfer the data, the first number being equal to the first width; and
wherein, in the second operational mode, the data transfer unit connects a second number of bit lines from among the plurality of bit lines to the second data bus to transfer the data, the second number being equal to the second width.

2. The semiconductor memory device of claim 1, wherein the first width is p and the second width is q, where p and q are natural numbers and p>q, and wherein the plurality of bit lines is n bit lines, where n is a natural number and a common multiple of p and q,
wherein when (n/p) address signals are received, the data transfer unit connects p bit lines to the first data bus in the first operational mode, and
wherein when (n/q) address signals are received, the data transfer unit connects q bit lines to the second data bus in the second operational mode.

3. The semiconductor memory device of claim 1, further comprising:
a memory array;
a page buffer which reads data from the memory array in a page unit and stores the read data;
an ECC unit which corrects an error of the read data provided from the page buffer and writes the corrected data back in the page buffer; and
an interface unit which outputs the read data written back in the page buffer, and
wherein the first data bus is connected to the ECC unit and the second data bus is connected to the interface unit.

4. The semiconductor memory device of claim 3, wherein the page buffer stores write data provided to the interface unit, and
wherein the ECC unit generates parity data on the write data transferred from the page buffer and writes the parity data and the write data back in the page buffer.

5. The semiconductor memory device of claim 3, wherein the memory array is a NAND flash memory cell array.

6. A semiconductor memory device comprising:
a first data bus having a first width;
a second data bus which is separate from the first data bus and which has a second width which is different from the first width; and
a data transfer unit configured to operate in a first operational mode for transferring data from memory cells and a second operational mode for transferring data from the memory cells, the memory cells connected to a plurality of bit lines,
wherein, in the first operational mode, the data transfer unit connects a first number of bit lines from among the plurality of bit lines to the first data bus to transfer the data, the first number being equal to the first width; and
wherein, in the second operational mode, the data transfer unit connects a second number of bit lines from among the plurality of bit lines to the second data bus to transfer the data, the second number being equal to the second width,
wherein the data transfer unit comprises:
a first page buffer which amplifies a voltage of a bit line connected to a normal memory cell and latches the amplified result;
a second page buffer which is replaced together with a normal memory cell and a bit line when a normal memory cell or a bit line connected to the first page buffer is defective; and
a third page buffer which amplifies a voltage of a bit line connected to a parity memory cell and latches the amplified result,
wherein the second data bus is connected to the first and second page buffers and the first data bus is connected to the first to third page buffers.

7. The semiconductor memory device of claim 6, further comprising:
a fourth page buffer which is connected to the first data bus and is replaced together with a parity memory cell and a bit line when a parity memory cell or a bit line connected to the first page buffer is defective;
a first repair circuit which is connected to the second data bus and replaces a page buffer, associated with a defective memory cell or bit line, of the first page buffer with the second page buffer;
a second repair circuit which is connected to the first data bus and replaces a page buffer, associated with a defective memory cell or bit line, of the third page buffer with the fourth page buffer; and
an ECC circuit which is connected to the first data bus and corrects an error of data from the first and second page buffers based on data from the third and fourth page buffers.

8. The semiconductor memory device of claim 7, further comprising:
a page buffer control circuit which outputs fixed data as an output of a page buffer, associated with a defective memory cell or bit line, of the first page buffer.

9. The semiconductor memory device of claim 8, wherein the page buffer control circuit does not allow a write operation from the first data bus when a memory cell or a bit line is defective.

10. The semiconductor memory device of claim 7, wherein the first operational mode is a mode of operation in which input data of the ECC circuit is output as output data without repairing on a page buffer, associated with a defective memory cell or bit line, from among the first page buffer and the second page buffer used for a repair at the second operational mode.

11. The semiconductor memory device of claim 6, wherein the first width is p and the second width is q, where p and q are natural numbers and p>q, and wherein the plurality of bit lines is n bit lines, where n is a natural number and a common multiple of p and q,
- wherein when (n/p) address signals are received, the data transfer unit connects p bit lines to the first data bus in the first operational mode, and
- wherein when (n/q) address signals are received, the data transfer unit connects q bit lines to the second data bus in the second operational mode.

12. A semiconductor memory device comprising:
a first data bus having a first width;
a second data bus which is separate from the first data bus and which has a second width which is different from the first width; and
a data transfer unit configured to operate in a first operational mode for transferring data from memory cells and a second operational mode for transferring data from the memory cells, the memory cells connected to a plurality of bit lines,
wherein, in the first operational mode, the data transfer unit connects a first number of bit lines from among the plurality of bit lines to the first data bus to transfer the data, the first number being equal to the first width; and
wherein, in the second operational mode, the data transfer unit connects a second number of bit lines from among the plurality of bit lines to the second data bus to transfer the data, the second number being equal to the second width,
wherein the data transfer unit comprises a first page buffer which latches data of a bit line connected to a normal memory cell; and a second page buffer which latches data of a bit line connected to a parity memory cell,
wherein the first data bus and the second data bus are connected to the first page buffer and the second page buffer,
wherein the semiconductor memory device further comprises:
an ECC circuit which is connected to the first data bus and corrects an error of output data of the first page buffer based on output data of the second page buffer,
wherein the first operational mode is a mode of operation in which the first page buffer is accessed and is also a mode of operation for execution of ECC processing where at a data write operation, the ECC circuit generates parity data based on output data of the first page buffer and writes the parity data at the second page buffer and, at a data read operation, the ECC circuit corrects an error of data of the first page buffer based on parity data of the second page buffer and writes the corrected data back in the first page buffer;
wherein the second operational mode is a mode of operation in which the ECC processing is not executed and the second page buffer is not accessed and the first page buffer is accessed, and
wherein selection and execution one of the first operational mode and the second operational mode electrically switchable.

13. The semiconductor memory device of claim 12, wherein the second page buffer is accessed through the second data bus at the second operational mode.

14. The semiconductor memory device of claim 12, further comprising:
a mask circuit which outputs fixed data instead of data output to an external device through the second data bus when the second page buffer is accessed at the second operational mode.

15. The semiconductor memory device of claim 12, further comprising:
a third page buffer which is connected to the first and second data buses and is replaced together with a normal memory cell and a bit line when a normal memory cell or a bit line connected to the first page buffer is defective;
a fourth page buffer which is connected to the first and second data buses and is replaced together with a parity memory cell and a bit line when a parity memory cell or a bit line connected to the second page buffer is defective;
a first repair circuit which is connected to the second data bus and replaces a page buffer, associated with a defective memory cell or bit line, of the first page buffer with the third page buffer at the second operational mode; and
a second repair circuit which is connected to the first data bus and replaces a page buffer, associated with a defective memory cell or bit line, of the second page buffer with the fourth page buffer.

16. The semiconductor memory device of claim 15, wherein at the second operational mode, the first repair circuit replaces a page buffer, associated with a defective memory cell or bit line, of the second page buffer with the fourth page buffer.

17. The semiconductor memory device of claim 15, wherein the first repair circuit stores a column address indicating a location of a page buffer to repair a page buffer, associated with a defective memory cell or bit line, of the first page buffer and selects a page buffer to be replaced by the stored column address;
wherein the second repair circuit stores a column address indicating a location of a page buffer to repair a page buffer, associated with a defective memory cell or bit line, of the second page buffer and selects a page buffer to be replaced by the stored column address; and
the semiconductor memory further comprising:
a bit conversion circuit which converts a column address that the first repair circuit stores into a column address that the second repair circuit stores.

18. The semiconductor memory device of claim 17, wherein the third page buffer and the fourth page buffer are selected by the first repair circuit and the second repair circuit, based on a switching signal indicating whether the semiconductor memory device operates in either one of the first and second operational modes.

19. The semiconductor memory device of claim 15, further comprising:
a page buffer control circuit which outputs fixed data as an output of a page buffer, associated with a defective memory cell or bit line, from among the first to fourth page buffers, and
wherein the page buffer control circuit does not allow a write operation from the first data bus when a memory cell or a bit line is defective.

20. The semiconductor memory device of claim 12, wherein the first width is p and the second width is q, where p and q are natural numbers and p>q, and wherein the plurality of bit lines is n bit lines, where n is a natural number and a common multiple of p and q,
   wherein when (n/p) address signals are received, the data transfer unit connects p bit lines to the first data bus in the first operational mode, and
   wherein when (n/q) address signals are received, the data transfer unit connects q bit lines to the second data bus in the second operational mode.

* * * * *